US011393988B2

(12) United States Patent
Stoessel et al.

(10) Patent No.: US 11,393,988 B2
(45) Date of Patent: Jul. 19, 2022

(54) METAL COMPLEXES

(71) Applicant: Merck Patent GmbH, Darmstadt (DE)

(72) Inventors: Philipp Stoessel, Frankfurt am Main (DE); Nils Koenen, Darmstadt (DE)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 15/116,898

(22) PCT Filed: Jan. 13, 2015

(86) PCT No.: PCT/EP2015/000043
§ 371 (c)(1),
(2) Date: Aug. 5, 2016

(87) PCT Pub. No.: WO2015/117718
PCT Pub. Date: Aug. 13, 2015

(65) Prior Publication Data
US 2017/0170413 A1 Jun. 15, 2017

(30) Foreign Application Priority Data
Feb. 5, 2014 (EP) ..................... 14000417

(51) Int. Cl.
H01L 51/00 (2006.01)
C07F 15/00 (2006.01)
C09K 11/06 (2006.01)
C09K 11/02 (2006.01)
H01L 51/50 (2006.01)

(52) U.S. Cl.
CPC ...... *H01L 51/0085* (2013.01); *C07F 15/0033* (2013.01); *C07F 15/0086* (2013.01); *C09K 11/025* (2013.01); *C09K 11/06* (2013.01); *H01L 51/0087* (2013.01); *C09K 2211/1007* (2013.01); *C09K 2211/107* (2013.01); *C09K 2211/1011* (2013.01); *C09K 2211/1014* (2013.01); *C09K 2211/1022* (2013.01); *C09K 2211/1029* (2013.01); *C09K 2211/1044* (2013.01); *C09K 2211/1048* (2013.01); *C09K 2211/1059* (2013.01); *C09K 2211/1062* (2013.01); *C09K 2211/1074* (2013.01); *C09K 2211/1088* (2013.01); *C09K 2211/185* (2013.01); *H01L 51/5016* (2013.01); *H01L 2251/5384* (2013.01); *Y02E 10/549* (2013.01)

(58) Field of Classification Search
CPC ...................... C07F 15/0033; H01L 51/0085
See application file for complete search history.

(56) References Cited

U.S. PATENT DOCUMENTS

| 2006/0014047 | A1* | 1/2006 | Takiguchi | C07F 15/0033 428/690 |
| 2007/0231600 | A1* | 10/2007 | Kamatani | C07F 15/0033 428/690 |
| 2011/0282059 | A1* | 11/2011 | Baranoff | C09K 11/06 546/5 |
| 2012/0068170 | A1* | 3/2012 | Pflumm | C07D 209/82 257/40 |
| 2013/0082209 | A1 | 4/2013 | Stoessel et al. | |
| 2014/0070180 | A1 | 3/2014 | Choi et al. | |
| 2015/0263297 | A1 | 9/2015 | Stoessel et al. | |
| 2015/0318498 | A1 | 11/2015 | Stoessel et al. | |
| 2015/0333280 | A1 | 11/2015 | Stoessel et al. | |
| 2015/0349277 | A1 | 12/2015 | Stoessel et al. | |

FOREIGN PATENT DOCUMENTS

| CN | 1023939296 A | 2/2013 |
| JP | 2007269734 A | 10/2007 |
| JP | 2008075043 A | 4/2008 |
| JP | 2013531652 A | 8/2013 |
| JP | 2014055131 A | 3/2014 |
| JP | 2016507490 A | 3/2016 |
| JP | 2016507491 A | 3/2016 |
| JP | 2016508127 A | 3/2016 |
| WO | 2011157339 A1 | 12/2011 |
| WO | 2014008982 A1 | 1/2014 |
| WO | WO-2014/094960 A1 | 6/2014 |
| WO | WO-2014/094962 A2 | 6/2014 |

OTHER PUBLICATIONS

Lee et al., Highly Efficient Green-Emitting Electrophosphorescent Iridium Complexes with Enhanced Steric Hindrance, Journal of Nanoscience and Nanotechnology, 2009, 9, 7099-7103. (Year: 2009).*
Lee et al., "Highly Efficient Green-Emitting Electrophosphorescent Iridium Complexes with Enhanced Steric Hindrance", J. Nanosci. Nanotechnol., vol. 9, No. 12, pp. 7099-7103 (2009).
Stoessel et al., "Transition metal cyclometalated 2-arylbenimidazole complexes as blue phosphorescent materials for organic light-emitting devices", Chemical Abs. Service, 2011. XP002736158.
Stoessel et al., "Metal complexes with heterocyclic ligands and their preparation and use in electronic devices", Chemical Abs. Service, 2014. XP002736159.
Lee et al., "Highly efficient green-emitting electrophosphorescent iridium complexes with enhanced steric hindrance", Chemical Abs Service, 2009. XP002736160.
Office Action dated Sep. 7, 2018 in Japanese Patent Application No. 2016-550250 (4 pages).
Office Action dated Sep. 20, 2018 in Taiwanese Patent Application No. 104103451 (7 pages).

* cited by examiner

*Primary Examiner* — Jennifer A Boyd
*Assistant Examiner* — Sean M DeGuire
(74) *Attorney, Agent, or Firm* — Faegre Drinker Biddle & Reath LLP

(57) ABSTRACT

The present invention relates to metal complexes and to electronic devices, in particular organic electroluminescent devices, comprising these metal complexes.

14 Claims, No Drawings

METAL COMPLEXES

RELATED APPLICATIONS

This application is a national stage entry, filed pursuant to 35 U.S.C. § 371, of PCT/EP2015/000043, filed Jan. 13, 2015, which claims the benefit of European Patent Application No. 14000417.7, filed Feb. 5, 2014, which is incorporated herein by reference in its entirety.

The present invention relates to metal complexes which are suitable for use as emitters in organic electroluminescent devices.

In organic electroluminescent devices (OLEDs), the emitting materials employed are increasingly organometallic complexes which exhibit phosphorescence instead of fluorescence (M. A. Baldo et al., Appl. Phys. Lett. 1999, 75, 4-6). For quantum-mechanical reasons, an up to four-fold increase in energy and power efficiency is possible using organometallic compounds as phosphorescence emitters. In general, there is still a need for improvement, in particular with respect to efficiency, operating voltage and lifetime, in the case of OLEDs which exhibit triplet emission. This applies, in particular, to OLEDs which emit in the relatively short-wave region, i.e. green and in particular blue.

According to the prior art, the triplet emitters employed in phosphorescent OLEDs are, in particular, iridium and platinum complexes. The iridium complexes employed are, in particular, bis- and tris-ortho-metallated complexes with aromatic ligands, where the ligands are bonded to the metal via a negatively charged carbon atom and a neutral nitrogen atom or via a negatively charged carbon atom and a neutral carbene carbon atom. Examples of such complexes are tris(phenylpyridyl)iridium(III) and derivatives thereof (for example in accordance with US 2002/0034656 or WO 2010/027583). The literature discloses a multiplicity of related ligands and iridium or platinum complexes, such as, for example, complexes with 1- or 3-phenylisoquinoline ligands (for example in accordance with EP 1348711 or WO 2011/028473), with 2-phenylquinolines (for example in accordance with WO 2002/064700 or WO 2006/095943) or with phenylcarbenes (for example in accordance with WO 2005/019373). Platinum complexes are known, for example, from WO 2003/040257. Although good results have already been achieved with metal complexes of this type, further improvements are still desirable here.

The object of the present invention is therefore the provision of novel metal complexes which are suitable as emitters for use in OLEDs. In particular, the object is to provide emitters which exhibit improved properties with respect to efficiency, operating voltage, lifetime, colour coordinates and/or colour purity, i.e. width of the emission band. It is furthermore an object of the present invention to provide metal complexes which have increased oxidation stability, in particular in solution. This is therefore desirable, in particular, since it is known that ortho-metallated iridium complexes in particular are good sensitisers for the generation of singlet oxygen, which is in turn a very aggressive oxidant which is able to attack the metal complexes themselves.

Furthermore, there is still a need for improvement in the case of many metal complexes in accordance with the prior art with respect to the sublimability and solubility. In particular, tris-ortho-metallated complexes frequently have high sublimation temperatures, owing to the high molecular weight, which may in turn result in thermal decomposition during sublimation. In addition, a multiplicity of metal complexes in accordance with the prior art are not sufficiently soluble to enable processing from solution from common organic solvents.

Surprisingly, it has been found that certain metal chelate complexes, described in greater detail below, which contain at least one condensed-on aliphatic 6- or 7-membered ring without benzylic protons achieve this object and are very suitable for use in an organic electroluminescent device. The present invention therefore relates to these metal complexes and to organic electroluminescent devices which comprise these complexes.

EP 1191613 discloses iridium complexes which contain an aliphatic ring condensed onto the coordinating phenyl group of a phenylpyridine ligand. However, the complexes disclosed in this document have high oxidation sensitivity, in particular in solution, meaning that further improvements would be desirable here. Furthermore, improvements with respect to the properties of the complexes on use in an organic electroluminescent device are also still desirable here.

US 2007/0231600 discloses iridium complexes which contain a six-membered ring condensed onto each of the two coordinating aryl or heteroaryl groups. However, compounds containing purely aliphatic six-membered rings without benzylic protons are not disclosed.

K. H. Lee et al. (Journal of Nanoscience and Nanotechnology 2009, 9, 7099-7103) disclose a heteroleptic Ir(ppy)$_2$(acac) complex which contains a condensed-on tetramethylcyclohexane ring. Owing to the frequently shorter lifetime of heteroleptic complexes containing acetylacetonate as co-ligand, tris-ortho-metallated complexes are preferred, since they generally have a longer lifetime. However, the tris-ortho-metallated complexes have the disadvantage that they sublime at higher temperature compared with acetylacetonate complexes owing to the higher molecular weight, which may also result, depending on the precise structure of the complex, in thermal decomposition during sublimation or during vapour deposition during the production of the organic electroluminescent device. Further improvements are therefore desirable here.

The invention thus relates to a compound of the formula (1),

formula (1)

which contains a moiety $M(L)_n$ of the formula (2):

formula (2)

where the following applies to the symbols and indices used:
M is iridium or platinum;
CyC is an aryl or heteroaryl group having 5 to 18 aromatic ring atoms or a fluorene group, each of which is coordinated to M via a carbon atom and each of which may be substituted by one or more radicals R and each of which is connected to CyD via a covalent bond;
CyD is a heteroaryl group having 5 to 18 aromatic ring atoms, which is coordinated to M via a neutral nitrogen atom or via a carbene carbon atom and which may be substituted by one or more radicals R and which is connected to CyC via a covalent bond;
R is on each occurrence, identically or differently, H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $P(=O)(R^1)_2$, $S(=O)R^1$, S(=O)$_2$R$^1$, OSO$_2$R$^1$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which may be substituted by one or more radicals R$^1$, where one or more non-adjacent CH$_2$ groups may be replaced by R$^1$C=CR$^1$, C≡C, Si(R$^1$)$_2$, C=O, NR$^1$, O, S or CONR$^1$ and where one or more H atoms may be replaced by D, F, Cl, Br, I or CN, or an aromatic or heteroaromatic ring system having 5 to 60 aromatic ring atoms, which may in each case be substituted by one or more radicals R$^1$, or an aryloxy or heteroaryloxy group having 5 to 40 aromatic ring atoms, which may be substituted by one or more radicals R$^1$, or an aralkyl or heteroaralkyl group having 5 to 40 aromatic ring atoms, which may be substituted by one or more radicals R$^1$, or a diarylamino group, diheteroarylamino group or arylheteroarylamino group having 10 to 40 aromatic ring atoms, which may be substituted by one or more radicals R$^1$; two adjacent radicals R here may also form a mono- or polycyclic, aliphatic, aromatic or heteroaromatic ring system with one another;

R$^1$ is on each occurrence, identically or differently, H, D, F, Cl, Br, I, N(R$^2$)$_2$, CN, NO$_2$, Si(R$^2$)$_3$, B(OR$^2$)$_2$, C(=O)R$^2$, P(=O)(R$^2$)$_2$, S(=O)R$^2$, S(=O)$_2$R$^2$, OSO$_2$R$^2$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which may be substituted by one or more radicals R$^2$, where one or more non-adjacent CH$_2$ groups may be replaced by R$^2$C=CR$^2$, C≡C, Si(R$^2$)$_2$, C=O, NR$^2$, O, S or CONR$^2$ and where one or more H atoms may be replaced by D, F, Cl, Br, I, CN or NO$_2$, or an aromatic or heteroaromatic ring system having 5 to 60 aromatic ring atoms, which may in each case be substituted by one or more radicals R$^2$, or an aryloxy or heteroaryloxy group having 5 to 40 aromatic ring atoms, which may be substituted by one or more radicals R$^2$, or an aralkyl or heteroaralkyl group having 5 to 40 aromatic ring atoms, which may be substituted by one or more radicals R$^2$, or a diarylamino group, diheteroarylamino group or arylheteroarylamino group having 10 to 40 aromatic ring atoms, which may be substituted by one or more radicals R$^2$; two or more adjacent radicals R$^1$ here may form a mono- or polycyclic, aliphatic ring system with one another;

R$^2$ is on each occurrence, identically or differently, H, D, F or an aliphatic, aromatic and/or heteroaromatic hydrocarbon radical having 1 to 20 C atoms, in which, in addition, one or more H atoms may be replaced by F; two or more substituents R$^2$ here may also form a mono- or polycyclic, aliphatic ring system with one another;

L' is, identically or differently on each occurrence, a bidentate ligand which is bonded to M via one carbon atom and one nitrogen atom or via two carbon atoms;

n is 1, 2 or 3 for M=iridium and is 1 or 2 for M=platinum;
m is 0, 1 or 2 for M=iridium and is 0 or 1 for M=platinum;
CyC and CyD here may also be linked to one another via a group selected from C(R$^1$)$_2$, C(R$^1$)$_2$—C(R$^1$)$_2$, NR$^1$, O or S;
a plurality of ligands L here may also be linked to one another or L may be linked to L' via a single bond or a divalent or trivalent bridge and thus form a tetradentate or hexadentate ligand system;
characterised in that CyD and/or CyC contain two adjacent carbon atoms, each of which is substituted by radicals R, where the respective radicals R, together with the C atoms, form a ring of the following formula (3):

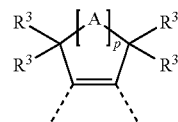

formula (3)

where R$^1$ and R$^2$ have the meanings given above, the dashed bonds indicate the linking of the two carbon atoms in the ligand, and furthermore:

A is, identically or differently on each occurrence, C(R$^1$)$_2$, O, S, NR$^3$ or C(=O), with the proviso that two heteroatoms in the group -(A)$_p$- are not bonded directly to one another;

R$^3$ is, identically or differently on each occurrence, a straight-chain alkyl or alkoxy group having 1 to 20 C atoms, a branched or cyclic alkyl or alkoxy group having 3 to 20 C atoms, each of which may be substituted by one or more radicals R$^2$, where one or more non-adjacent CH$_2$ groups may be replaced by R$^2$C=CR$^2$, C≡C, Si(R$^2$)$_2$, C=O, NR$^2$, O, S or CONR$^2$ and where one or more H atoms may be replaced by D or F, or an aromatic or heteroaromatic ring system having 5 to 24 aromatic ring atoms, which may in each case be substituted by one or more radicals R$^2$, or an aryloxy or heteroaryloxy group having 5 to 24 aromatic ring atoms, which may be substituted by one or more radicals R$^2$, or an aralkyl or heteroaralkyl group having 5 to 24 aromatic ring atoms, which may be substituted by one or more radicals R$^2$; two radicals R$^3$ which are bonded to the same carbon atom may form an aliphatic or aromatic ring system with one another here and thus form a spiro system; furthermore, R$^3$ may form an aliphatic ring system with an adjacent radical R or R$^1$;

p is, identically or differently on each occurrence, 2 or 3.

The presence of a moiety of the formula (3), i.e. a condensed-on aliphatic six- or seven-membered ring, is essential to the invention. As is evident from the above-mentioned formula (3), the 6- or 7-membered ring formed by the four C atoms and the groups A contains no benzylic protons, since R$^3$ is not equal to hydrogen. In the structure of the formula (3) depicted above and the further embodiments of this structure mentioned as preferred, a double bond is formally depicted between the two carbon atoms. This represents a simplification of the chemical structure, since these two carbon atoms are bonded into the aromatic or heteroaromatic system of the ligand and the bond between these two carbon atoms is thus formally between the bond order of a single bond and that of a double bond. The drawing-in of the formal double bond should thus not be interpreted as limiting for the structure, but instead it is apparent to the person skilled in the art that this means an aromatic bond.

"Adjacent carbon atoms" here means that the carbon atoms are bonded directly to one another. Furthermore, "adjacent radicals" in the definition of the radicals means that these radicals are bonded to the same carbon atom or to adjacent carbon atoms.

If adjacent radicals in the structures according to the invention form an aliphatic ring system, it is then preferred for this aliphatic ring system to contain no acidic benzylic protons. This can be achieved by the carbon atoms of the aliphatic ring system which are bonded directly to an aryl or heteroaryl group being fully substituted and not containing any bonded hydrogen atoms. This can furthermore also be achieved by the carbon atoms of the aliphatic ring system which are bonded directly to an aryl or heteroaryl group being the bridgeheads of a bi- or polycyclic structure. The protons bonded to bridgehead carbon atoms are, owing to the spatial structure of the bi- or polycycle, significantly less acidic than benzylic protons on carbon atoms which are not bonded in a bi- or polycyclic structure and for the purposes of the present invention are regarded as non-acidic protons.

An aryl group in the sense of this invention contains 6 to 40 C atoms; a heteroaryl group in the sense of this invention contains 2 to 40 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, etc.

An aromatic ring system in the sense of this invention contains 6 to 60 C atoms in the ring system. A heteroaromatic ring system in the sense of this invention contains 1 to 60 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be interrupted by a non-aromatic unit (preferably less than 10% of the atoms other than H), such as, for example, a C, N or O atom or a carbonyl group. Thus, for example, systems such as 9,9'-spirobifluorene, 9,9-diarylfluorene, triarylamine, diaryl ether, stilbene, etc., are also intended to be taken to be aromatic ring systems in the sense of this invention, as are systems in which two or more aryl groups are interrupted, for example, by a linear or cyclic alkyl group or by a silyl group. Furthermore, systems in which two or more aryl or heteroaryl groups are bonded directly to one another, such as, for example, biphenyl or terphenyl, are likewise intended to be taken to be an aromatic or heteroaromatic ring system.

A cyclic alkyl, alkoxy or thioalkoxy group in the sense of this invention is taken to mean a monocyclic, bicyclic or polycyclic group.

For the purposes of the present invention, a $C_1$- to $C_{40}$-alkyl group, in which, in addition, individual H atoms or $CH_2$ groups may be substituted by the above-mentioned groups, is taken to mean, for example, the radicals methyl, ethyl, n-propyl, i-propyl, cyclopropyl, n-butyl, i-butyl, s-butyl, t-butyl, cyclobutyl, 2-methylbutyl, n-pentyl, s-pentyl, tert-pentyl, 2-pentyl, neopentyl, cyclopentyl, n-hexyl, s-hexyl, tert-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octa-dec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)-cyclohex-1-yl and 1-(n-decyl)cyclohex-1-yl. An alkenyl group is taken to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is taken to mean, for example, ethynyl, propynyl, butynyl, pentynyl, hexynyl, heptynyl or octynyl. A $C_1$- to $C_{40}$-alkoxy group is taken to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system having 5-60 aromatic ring atoms, which may also in each case be substituted by the radicals mentioned above and which may be linked to the aromatic or heteroaromatic ring system via any desired positions, is taken to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Preference is given to compounds of the formula (1), characterised in that they are uncharged, i.e. are electrically neutral. This is achieved in a simple manner by selecting the charge of the ligands L and L' in such a way that they compensate the charge of the complexed metal atom M.

In a preferred embodiment of the present invention, CyC is an aryl or heteroaryl group having 5 to 14 aromatic ring atoms, particularly preferably 6 to 13 aromatic ring atoms, very particularly preferably having 6 to 10 aromatic ring atoms, especially preferably having 6 aromatic ring atoms, which is coordinated to M via a carbon atom and which may be substituted by one or more radicals R and which is bonded to CyD via a covalent bond.

Preferred embodiments of the group CyC are the structures of the following formulae (CyC-1) to (CyC-19), where the group CyC is in each case bonded to CyD at the position denoted by # and is coordinated to the metal M at the position denoted by *,

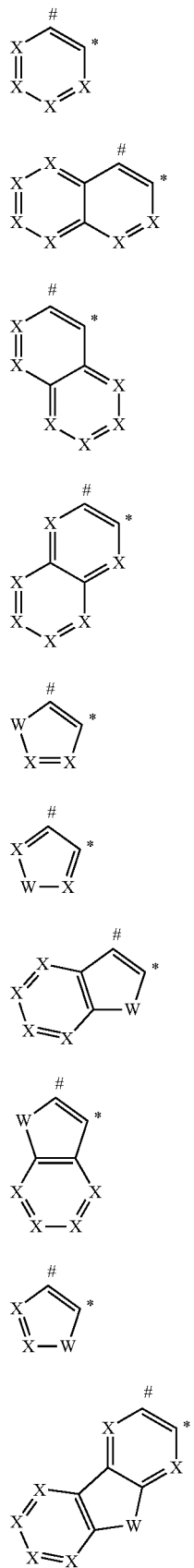
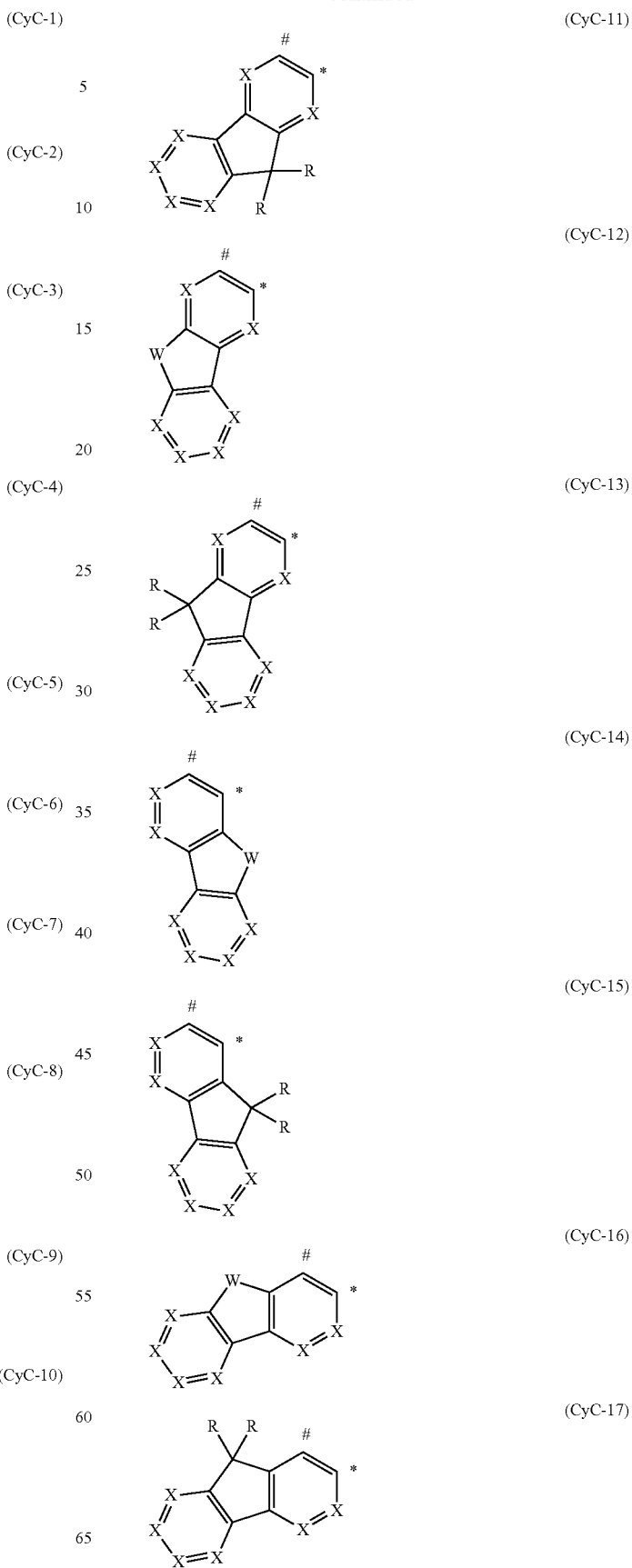

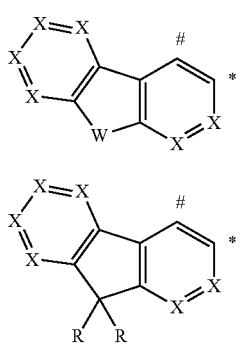 (CyC-18)

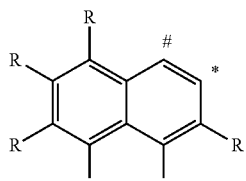 (CyC-2a)

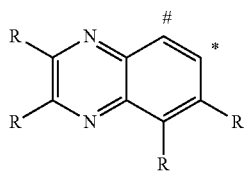 (CyC-19)

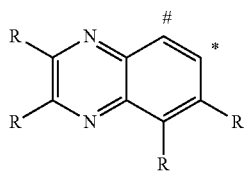 (CyC-2b)

where R has the meanings given above and the following applies to the other symbols used:

X is on each occurrence, identically or differently, CR or N;

W is on each occurrence, identically or differently, NR, O or S.

If the group of the formula (3) is bonded to CyC, two adjacent groups X in CyC stand for CR and, together with the radicals R which are bonded to these carbon atoms, form a group of the formula (3) mentioned above or described in greater detail below.

Preferably a maximum of three symbols X in CyC stand for N, particularly preferably a maximum of two symbols X in CyC stand for N, very particularly preferably a maximum of one symbol X in CyC stands for N. Especially preferably all symbols X stand for CR.

Particularly preferred groups CyC are the groups of the following formulae (CyC-1a) to (CyC-19a),

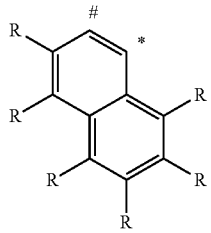 (CyC-3a)

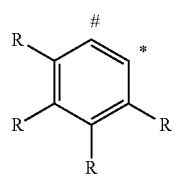 (CyC-1a)

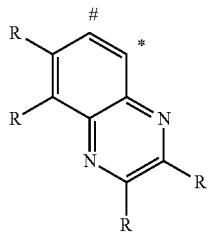 (Cyc-3b)

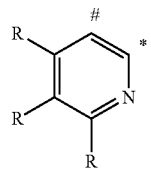 (CyC-1b)

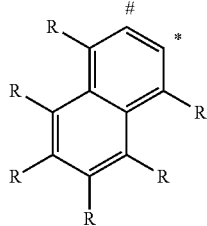 (CyC-4a)

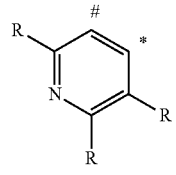 (CyC-1c)

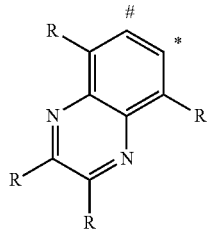 (CyC-4b)

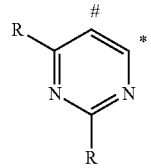 (CyC-1d)

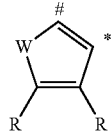 (CyC-5a)

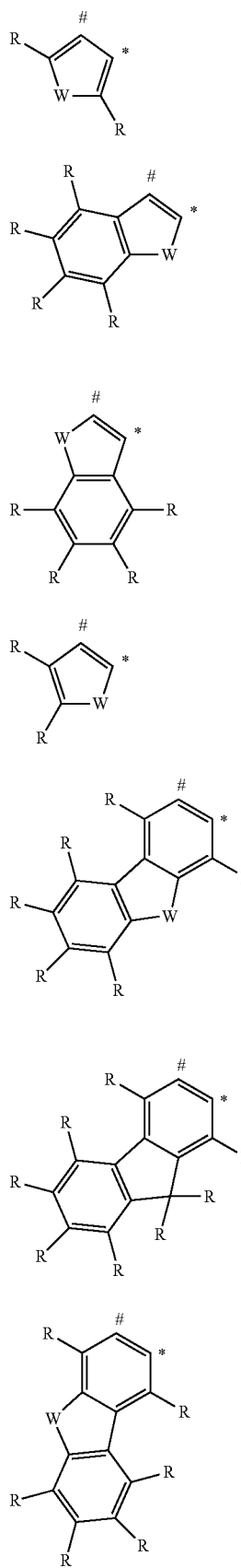
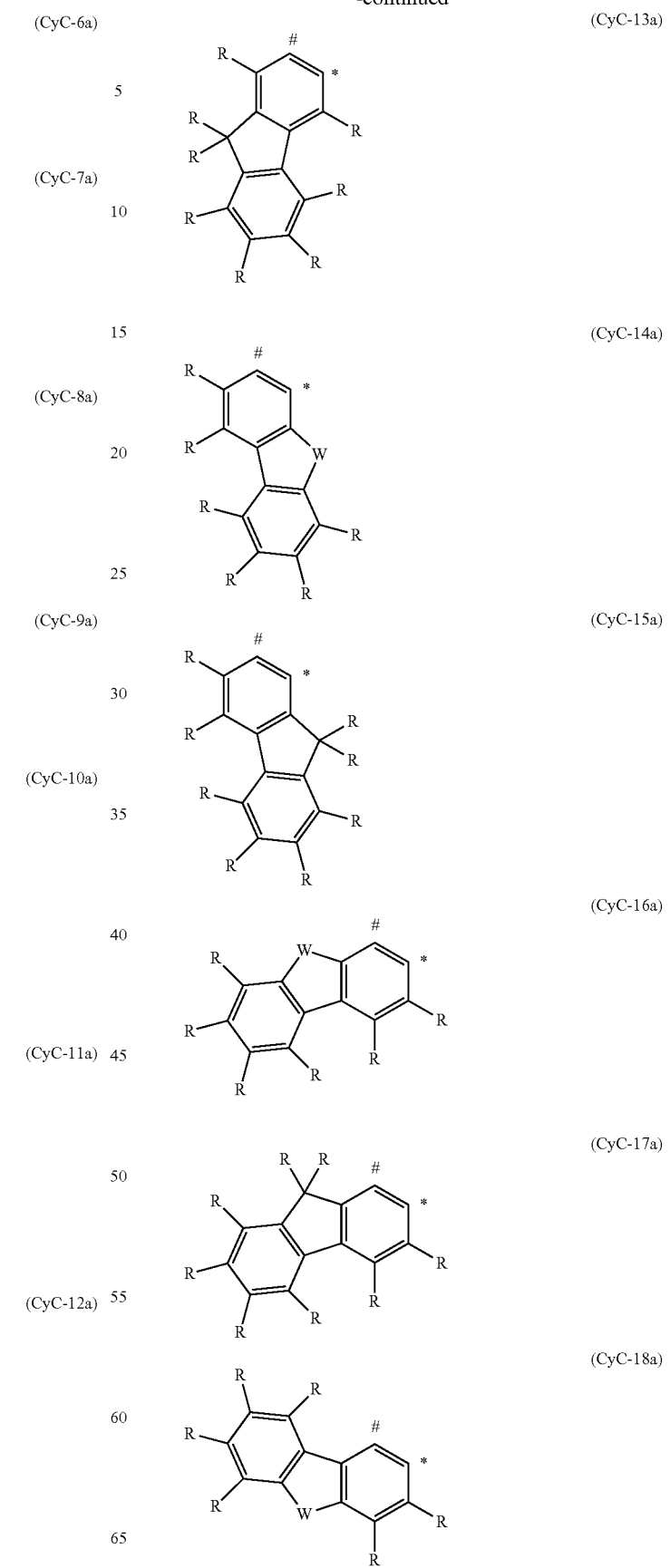

(CyC-19a)

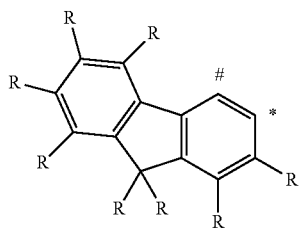

where the symbols used have the meanings given above. If the group of the formula (3) is present on CyC, two adjacent radicals R, together with the carbon atoms to which they are bonded, form a ring of the formula (3).

Preferred groups amongst the groups (CyC-1) to (CyC-19) are the groups (CyC-1), (CyC-3), (CyC-8), (CyC-10), (CyC-12), (CyC-13) and (CyC-16), and particular preference is given to the groups (CyC-1a), (CyC-3a), (CyC-8a), (CyC-10a), (CyC-12a), (CyC-13a) and (CyC-16a).

In a further preferred embodiment of the invention, CyD is a heteroaryl group having 5 to 13 aromatic ring atoms, particularly preferably having 5 to 10 aromatic ring atoms, which is coordinated to M via a neutral nitrogen atom or via a carbene carbon atom and which may be substituted by one or more radicals R and which is bonded to CyC via a covalent bond.

Preferred embodiments of the group CyD are the structures of the following formulae (CyD-1) to (CyD-10), where the group CyD is in each case bonded to CyC at the position denoted by # and is coordinated to the metal M at the position denoted by *, (CyD-1)

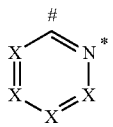

(CyD-2)

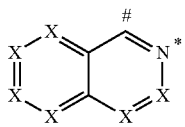

(CyD-3)

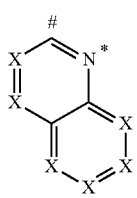

(CyD-4)

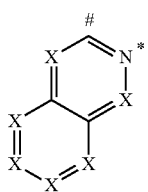

(CyD-5)

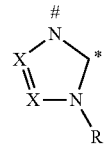

(CyD-6)

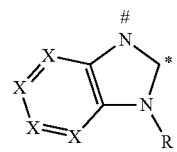

(CyD-7)

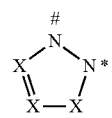

(CyD-8)

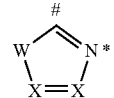

(CyD-9)

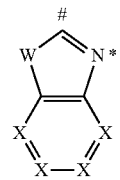

(CyD-10)

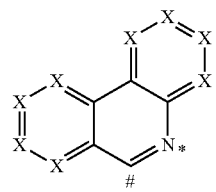

where X, W and R have the meanings given above.

If the group of the formula (3) is bonded to CyD, two adjacent groups X in CyD stand for CR and, together with the radicals R which are bonded to these carbon atoms, form a group of the formula (3) mentioned above or described in greater detail below.

Preferably a maximum of three symbols X in CyD stand for N, particularly preferably a maximum of two symbols X in CyD stand for N, very particularly preferably a maximum of one symbol X in CyD stands for N. Especially preferably all symbols X stand for CR.

Particularly preferred groups CyD are the groups of the following formulae (CyD-1a) to (CyD-10a), (CyD-1a)

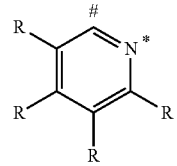

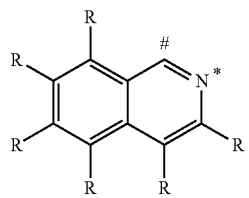
(CyD-2a)

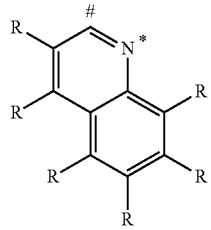
(CyD-3a)

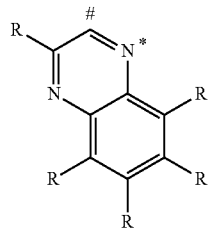
(CyD-3b)

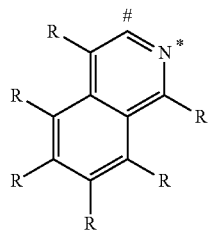
(CyD-4a)

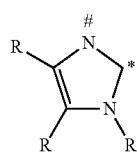
(CyD-5a)

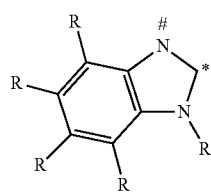
(CyD-6a)

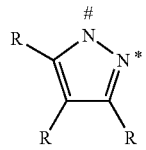
(CyD-7a)

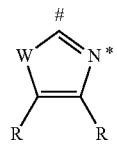
(CyD-8a)

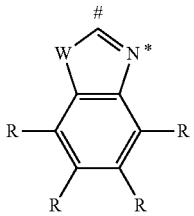
(CyD-9a)

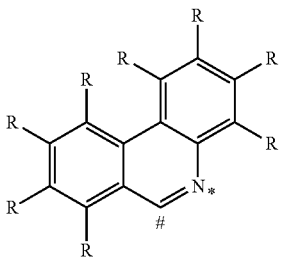
(CyD-10a)

where the symbols used have the meanings given above. If the group of the formula (3) is present on CyD, two adjacent radicals R, together with the carbon atoms to which they are bonded, form a ring of the formula (3).

Preferred groups amongst the groups (CyD-1) to (CyD-10) are the groups (CyD-1), (CyD-3), (CyD-4), (CyD-5) and (CyD-6), and particular preference is given to the groups (CyD-1a), (CyD-3a), (CyD-4a), (CyD-5a) and (CyD-6a).

In a preferred embodiment of the present invention, CyC is an aryl or heteroaryl group having 5 to 14 aromatic ring atoms and at the same time CyD is a heteroaryl group having 5 to 13 aromatic ring atoms. Particularly preferably, CyC is an aryl or heteroaryl group having 6 to 13 aromatic ring atoms, preferably having 6 to 10 aromatic ring atoms, in particular having 6 aromatic ring atoms, and at the same time CyD is a heteroaryl group having 5 to 10 aromatic ring atoms. CyC and CyD here may be substituted by one or more radicals R.

The above-mentioned preferred groups CyC and CyD can be combined with one another as desired. The following combinations of CyC and CyD are thus suitable in the ligand L:

| No. | CyC | CyD |
|---|---|---|
| 1 | CyC-1 | CyD-1 |
| 2 | CyC-1 | CyD-2 |
| 3 | CyC-1 | CyD-3 |
| 4 | CyC-1 | CyD-4 |
| 5 | CyC-1 | CyD-5 |
| 6 | CyC-1 | CyD-6 |
| 7 | CyC-1 | CyD-7 |
| 8 | CyC-1 | CyD-8 |
| 9 | CyC-1 | CyD-9 |
| 10 | CyC-1 | CyD-10 |
| 11 | CyC-2 | CyD-1 |
| 12 | CyC-2 | CyD-2 |
| 13 | CyC-2 | CyD-3 |
| 14 | CyC-2 | CyD-4 |
| 15 | CyC-2 | CyD-5 |
| 16 | CyC-2 | CyD-6 |
| 17 | CyC-2 | CyD-7 |
| 18 | CyC-2 | CyD-8 |
| 19 | CyC-2 | CyD-9 |
| 20 | CyC-2 | CyD-10 |
| 21 | CyC-3 | CyD-1 |
| 22 | CyC-3 | CyD-2 |
| 23 | CyC-3 | CyD-3 |

-continued

| No. | CyC | CyD |
|---|---|---|
| 24 | CyC-3 | CyD-4 |
| 25 | CyC-3 | CyD-5 |
| 26 | CyC-3 | CyD-6 |
| 27 | CyC-3 | CyD-7 |
| 28 | CyC-3 | CyD-8 |
| 29 | CyC-3 | CyD-9 |
| 30 | CyC-3 | CyD-10 |
| 31 | CyC-4 | CyD-1 |
| 32 | CyC-4 | CyD-2 |
| 33 | CyC-4 | CyD-3 |
| 34 | CyC-4 | CyD-4 |
| 35 | CyC-4 | CyD-5 |
| 36 | CyC-4 | CyD-6 |
| 37 | CyC-4 | CyD-7 |
| 38 | CyC-4 | CyD-8 |
| 39 | CyC-4 | CyD-9 |
| 40 | CyC-4 | CyD-10 |
| 41 | CyC-5 | CyD-1 |
| 42 | CyC-5 | CyD-2 |
| 43 | CyC-5 | CyD-3 |
| 44 | CyC-5 | CyD-4 |
| 45 | CyC-5 | CyD-5 |
| 46 | CyC-5 | CyD-6 |
| 47 | CyC-5 | CyD-7 |
| 48 | CyC-5 | CyD-8 |
| 49 | CyC-5 | CyD-9 |
| 50 | CyC-5 | CyD-10 |
| 51 | CyC-6 | CyD-1 |
| 52 | CyC-6 | CyD-2 |
| 53 | CyC-6 | CyD-3 |
| 54 | CyC-6 | CyD-4 |
| 55 | CyC-6 | CyD-5 |
| 56 | CyC-6 | CyD-6 |
| 57 | CyC-6 | CyD-7 |
| 58 | CyC-6 | CyD-8 |
| 59 | CyC-6 | CyD-9 |
| 60 | CyC-6 | CyD-10 |
| 61 | CyC-7 | CyD-1 |
| 62 | CyC-7 | CyD-2 |
| 63 | CyC-7 | CyD-3 |
| 64 | CyC-7 | CyD-4 |
| 65 | CyC-7 | CyD-5 |
| 66 | CyC-7 | CyD-6 |
| 67 | CyC-7 | CyD-7 |
| 68 | CyC-7 | CyD-8 |
| 69 | CyC-7 | CyD-9 |
| 70 | CyC-7 | CyD-10 |
| 71 | CyC-8 | CyD-1 |
| 72 | CyC-8 | CyD-2 |
| 73 | CyC-8 | CyD-3 |
| 74 | CyC-8 | CyD-4 |
| 75 | CyC-8 | CyD-5 |
| 76 | CyC-8 | CyD-6 |
| 77 | CyC-8 | CyD-7 |
| 78 | CyC-8 | CyD-8 |
| 79 | CyC-8 | CyD-9 |
| 80 | CyC-8 | CyD-10 |
| 81 | CyC-9 | CyD-1 |
| 82 | CyC-9 | CyD-2 |
| 83 | CyC-9 | CyD-3 |
| 84 | CyC-9 | CyD-4 |
| 85 | CyC-9 | CyD-5 |
| 86 | CyC-9 | CyD-6 |
| 87 | CyC-9 | CyD-7 |
| 88 | CyC-9 | CyD-8 |
| 89 | CyC-9 | CyD-9 |
| 90 | CyC-9 | CyD-10 |
| 91 | CyC-10 | CyD-1 |
| 92 | CyC-10 | CyD-2 |
| 93 | CyC-10 | CyD-3 |
| 94 | CyC-10 | CyD-4 |
| 95 | CyC-10 | CyD-5 |
| 96 | CyC-10 | CyD-6 |
| 97 | CyC-10 | CyD-7 |
| 98 | CyC-10 | CyD-8 |
| 99 | CyC-10 | CyD-9 |
| 100 | CyC-10 | CyD-10 |
| 101 | CyC-11 | CyD-1 |
| 102 | CyC-11 | CyD-2 |
| 103 | CyC-11 | CyD-3 |
| 104 | CyC-11 | CyD-4 |
| 105 | CyC-11 | CyD-5 |
| 106 | CyC-11 | CyD-6 |
| 107 | CyC-11 | CyD-7 |
| 108 | CyC-11 | CyD-8 |
| 109 | CyC-11 | CyD-9 |
| 110 | CyC-11 | CyD-10 |
| 111 | CyC-12 | CyD-1 |
| 112 | CyC-12 | CyD-2 |
| 113 | CyC-12 | CyD-3 |
| 114 | CyC-12 | CyD-4 |
| 115 | CyC-12 | CyD-5 |
| 116 | CyC-12 | CyD-6 |
| 117 | CyC-12 | CyD-7 |
| 118 | CyC-12 | CyD-8 |
| 119 | CyC-12 | CyD-9 |
| 120 | CyC-12 | CyD-10 |
| 121 | CyC-13 | CyD-1 |
| 122 | CyC-13 | CyD-2 |
| 123 | CyC-13 | CyD-3 |
| 124 | CyC-13 | CyD-4 |
| 125 | CyC-13 | CyD-5 |
| 126 | CyC-13 | CyD-6 |
| 127 | CyC-13 | CyD-7 |
| 128 | CyC-13 | CyD-8 |
| 129 | CyC-13 | CyD-9 |
| 130 | CyC-13 | CyD-10 |
| 131 | CyC-14 | CyD-1 |
| 132 | CyC-14 | CyD-2 |
| 133 | CyC-14 | CyD-3 |
| 134 | CyC-14 | CyD-4 |
| 135 | CyC-14 | CyD-5 |
| 136 | CyC-14 | CyD-6 |
| 137 | CyC-14 | CyD-7 |
| 138 | CyC-14 | CyD-8 |
| 139 | CyC-14 | CyD-9 |
| 140 | CyC-14 | CyD-10 |
| 141 | CyC-15 | CyD-1 |
| 142 | CyC-15 | CyD-2 |
| 143 | CyC-15 | CyD-3 |
| 144 | CyC-15 | CyD-4 |
| 145 | CyC-15 | CyD-5 |
| 146 | CyC-15 | CyD-6 |
| 147 | CyC-15 | CyD-7 |
| 148 | CyC-15 | CyD-8 |
| 149 | CyC-15 | CyD-9 |
| 150 | CyC-15 | CyD-10 |
| 151 | CyC-16 | CyD-1 |
| 152 | CyC-16 | CyD-2 |
| 153 | CyC-16 | CyD-3 |
| 154 | CyC-16 | CyD-4 |
| 155 | CyC-16 | CyD-5 |
| 156 | CyC-16 | CyD-6 |
| 157 | CyC-16 | CyD-7 |
| 158 | CyC-16 | CyD-8 |
| 159 | CyC-16 | CyD-9 |
| 160 | CyC-16 | CyD-10 |
| 161 | CyC-17 | CyD-1 |
| 162 | CyC-17 | CyD-2 |
| 163 | CyC-17 | CyD-3 |
| 164 | CyC-17 | CyD-4 |
| 165 | CyC-17 | CyD-5 |
| 166 | CyC-17 | CyD-6 |
| 167 | CyC-17 | CyD-7 |
| 168 | CyC-17 | CyD-8 |
| 169 | CyC-17 | CyD-9 |
| 170 | CyC-17 | CyD-10 |
| 171 | CyC-18 | CyD-1 |
| 172 | CyC-18 | CyD-2 |
| 173 | CyC-18 | CyD-3 |
| 174 | CyC-18 | CyD-4 |
| 175 | CyC-18 | CyD-5 |
| 176 | CyC-18 | CyD-6 |
| 177 | CyC-18 | CyD-7 |

| No. | CyC | CyD |
|---|---|---|
| 178 | CyC-18 | CyD-8 |
| 179 | CyC-18 | CyD-9 |
| 180 | CyC-18 | CyD-10 |
| 181 | CyC-19 | CyD-1 |
| 182 | CyC-19 | CyD-2 |
| 183 | CyC-19 | CyD-3 |
| 184 | CyC-19 | CyD-4 |
| 185 | CyC-19 | CyD-5 |
| 186 | CyC-19 | CyD-6 |
| 187 | CyC-19 | CyD-7 |
| 188 | CyC-19 | CyD-8 |
| 189 | CyC-19 | CyD-9 |
| 190 | CyC-19 | CyD-10 |

It is particularly preferred for the groups CyC and CyD mentioned above as particularly preferred to be combined with one another. The following combinations of CyC and CyD are thus preferred in the ligand L

| No. | C | N |
|---|---|---|
| 1 | CyC-1a | CyD-1a |
| 2 | CyC-1a | CyD-2a |
| 3 | CyC-1a | CyD-3a |
| 4 | CyC-1a | CyD-4a |
| 5 | CyC-1a | CyD-5a |
| 6 | CyC-1a | CyD-6a |
| 7 | CyC-1a | CyD-7a |
| 8 | CyC-1a | CyD-8a |
| 9 | CyC-1a | CyD-9a |
| 10 | CyC-1a | CyD-10a |
| 11 | CyC-2a | CyD-1a |
| 12 | CyC-2a | CyD-2a |
| 13 | CyC-2a | CyD-3a |
| 14 | CyC-2a | CyD-4a |
| 15 | CyC-2a | CyD-5a |
| 16 | CyC-2a | CyD-6a |
| 17 | CyC-2a | CyD-7a |
| 18 | CyC-2a | CyD-8a |
| 19 | CyC-2a | CyD-9a |
| 20 | CyC-2a | CyD-10a |
| 21 | CyC-3a | CyD-1a |
| 22 | CyC-3a | CyD-2a |
| 23 | CyC-3a | CyD-3a |
| 24 | CyC-3a | CyD-4a |
| 25 | CyC-3a | CyD-5a |
| 26 | CyC-3a | CyD-6a |
| 27 | CyC-3a | CyD-7a |
| 28 | CyC-3a | CyD-8a |
| 29 | CyC-3a | CyD-9a |
| 30 | CyC-3a | CyD-10a |
| 31 | CyC-4a | CyD-1a |
| 32 | CyC-4a | CyD-2a |
| 33 | CyC-4a | CyD-3a |
| 34 | CyC-4a | CyD-4a |
| 35 | CyC-4a | CyD-5a |
| 36 | CyC-4a | CyD-6a |
| 37 | CyC-4a | CyD-7a |
| 38 | CyC-4a | CyD-8a |
| 39 | CyC-4a | CyD-9a |
| 40 | CyC-4a | CyD-10a |
| 41 | CyC-5a | CyD-1a |
| 42 | CyC-5a | CyD-2a |
| 43 | CyC-5a | CyD-3a |
| 44 | CyC-5a | CyD-4a |
| 45 | CyC-5a | CyD-5a |
| 46 | CyC-5a | CyD-6a |
| 47 | CyC-5a | CyD-7a |
| 48 | CyC-5a | CyD-8a |
| 49 | CyC-5a | CyD-9a |
| 50 | CyC-5a | CyD-10a |
| 51 | CyC-6a | CyD-1a |
| 52 | CyC-6a | CyD-2a |
| 53 | CyC-6a | CyD-3a |
| 54 | CyC-6a | CyD-4a |
| 55 | CyC-6a | CyD-5a |
| 56 | CyC-6a | CyD-6a |
| 57 | CyC-6a | CyD-7a |
| 58 | CyC-6a | CyD-8a |
| 59 | CyC-6a | CyD-9a |
| 60 | CyC-6a | CyD-10a |
| 61 | CyC-7a | CyD-1a |
| 62 | CyC-7a | CyD-2a |
| 63 | CyC-7a | CyD-3a |
| 64 | CyC-7a | CyD-4a |
| 65 | CyC-7a | CyD-5a |
| 66 | CyC-7a | CyD-6a |
| 67 | CyC-7a | CyD-7a |
| 68 | CyC-7a | CyD-8a |
| 69 | CyC-7a | CyD-9a |
| 70 | CyC-7a | CyD-10a |
| 71 | CyC-8a | CyD-1a |
| 72 | CyC-8a | CyD-2a |
| 73 | CyC-8a | CyD-3a |
| 74 | CyC-8a | CyD-4a |
| 75 | CyC-8a | CyD-5a |
| 76 | CyC-8a | CyD-6a |
| 77 | CyC-8a | CyD-7a |
| 78 | CyC-8a | CyD-8a |
| 79 | CyC-8a | CyD-9a |
| 80 | CyC-8a | CyD-10a |
| 81 | CyC-9a | CyD-1a |
| 82 | CyC-9a | CyD-2a |
| 83 | CyC-9a | CyD-3a |
| 84 | CyC-9a | CyD-4a |
| 85 | CyC-9a | CyD-5a |
| 86 | CyC-9a | CyD-6a |
| 87 | CyC-9a | CyD-7a |
| 88 | CyC-9a | CyD-8a |
| 89 | CyC-9a | CyD-9a |
| 90 | CyC-9a | CyD-10a |
| 91 | CyC-10a | CyD-1a |
| 92 | CyC-10a | CyD-2a |
| 93 | CyC-10a | CyD-3a |
| 94 | CyC-10a | CyD-4a |
| 95 | CyC-10a | CyD-5a |
| 96 | CyC-10a | CyD-6a |
| 97 | CyC-10a | CyD-7a |
| 98 | CyC-10a | CyD-8a |
| 99 | CyC-10a | CyD-9a |
| 100 | CyC-10a | CyD-10a |
| 101 | CyC-11a | CyD-1a |
| 102 | CyC-11a | CyD-2a |
| 103 | CyC-11a | CyD-3a |
| 104 | CyC-11a | CyD-4a |
| 105 | CyC-11a | CyD-5a |
| 106 | CyC-11a | CyD-6a |
| 107 | CyC-11a | CyD-7a |
| 108 | CyC-11a | CyD-8a |
| 109 | CyC-11a | CyD-9a |
| 110 | CyC-11a | CyD-10a |
| 111 | CyC-12a | CyD-1a |
| 112 | CyC-12a | CyD-2a |
| 113 | CyC-12a | CyD-3a |
| 114 | CyC-12a | CyD-4a |
| 115 | CyC-12a | CyD-5a |
| 116 | CyC-12a | CyD-6a |
| 117 | CyC-12a | CyD-7a |
| 118 | CyC-12a | CyD-8a |
| 119 | CyC-12a | CyD-9a |
| 120 | CyC-12a | CyD-10a |
| 121 | CyC-13a | CyD-1a |
| 122 | CyC-13a | CyD-2a |
| 123 | CyC-13a | CyD-3a |
| 124 | CyC-13a | CyD-4a |
| 125 | CyC-13a | CyD-5a |
| 126 | CyC-13a | CyD-6a |
| 127 | CyC-13a | CyD-7a |
| 128 | CyC-13a | CyD-8a |
| 129 | CyC-13a | CyD-9a |
| 130 | CyC-13a | CyD-10a |

| No. | C | N |
|---|---|---|
| 131 | CyC-14a | CyD-1a |
| 132 | CyC-14a | CyD-2a |
| 133 | CyC-14a | CyD-3a |
| 134 | CyC-14a | CyD-4a |
| 135 | CyC-14a | CyD-5a |
| 136 | CyC-14a | CyD-6a |
| 137 | CyC-14a | CyD-7a |
| 138 | CyC-14a | CyD-8a |
| 139 | CyC-14a | CyD-9a |
| 140 | CyC-14a | CyD-10a |
| 141 | CyC-15a | CyD-1a |
| 142 | CyC-15a | CyD-2a |
| 143 | CyC-15a | CyD-3a |
| 144 | CyC-15a | CyD-4a |
| 145 | CyC-15a | CyD-5a |
| 146 | CyC-15a | CyD-6a |
| 147 | CyC-15a | CyD-7a |
| 148 | CyC-15a | CyD-8a |
| 149 | CyC-15a | CyD-9a |
| 150 | CyC-15a | CyD-10a |
| 151 | CyC-16a | CyD-1a |
| 152 | CyC-16a | CyD-2a |
| 153 | CyC-16a | CyD-3a |
| 154 | CyC-16a | CyD-4a |
| 155 | CyC-16a | CyD-5a |
| 156 | CyC-16a | CyD-6a |
| 157 | CyC-16a | CyD-7a |
| 158 | CyC-16a | CyD-8a |
| 159 | CyC-16a | CyD-9a |
| 160 | CyC-16a | CyD-10a |
| 161 | CyC-17a | CyD-1a |
| 162 | CyC-17a | CyD-2a |
| 163 | CyC-17a | CyD-3a |
| 164 | CyC-17a | CyD-4a |
| 165 | CyC-17a | CyD-5a |
| 166 | CyC-17a | CyD-6a |
| 167 | CyC-17a | CyD-7a |
| 168 | CyC-17a | CyD-8a |
| 169 | CyC-17a | CyD-9a |
| 170 | CyC-17a | CyD-10a |
| 171 | CyC-18a | CyD-1a |
| 172 | CyC-18a | CyD-2a |
| 173 | CyC-18a | CyD-3a |
| 174 | CyC-18a | CyD-4a |
| 175 | CyC-18a | CyD-5a |
| 176 | CyC-18a | CyD-6a |
| 177 | CyC-18a | CyD-7a |
| 178 | CyC-18a | CyD-8a |
| 179 | CyC-18a | CyD-9a |
| 180 | CyC-18a | CyD-10a |
| 181 | CyC-19a | CyD-1a |
| 182 | CyC-19a | CyD-2a |
| 183 | CyC-19a | CyD-3a |
| 184 | CyC-19a | CyD-4a |
| 185 | CyC-19a | CyD-5a |
| 186 | CyC-19a | CyD-6a |
| 187 | CyC-19a | CyD-7a |
| 188 | CyC-19a | CyD-8a |
| 189 | CyC-19a | CyD-9a |
| 190 | CyC-19a | CyD-10a |

As described above, it is essential to the invention that CyD and/or CyC or the preferred embodiments indicated above contain two adjacent carbon atoms, each of which is substituted by radicals R, where the respective radicals R, together with the C atoms, form a ring of the above-mentioned formula (3).

In a preferred embodiment of the invention, the ligand L either contains precisely one group of the formula (3) or it contains two groups of the formula (3), one of which is bonded to CyC and the other is bonded to CyD. In a particularly preferred embodiment, the ligand L contains precisely one group of the formula (3). The group of the formula (3) may be present either on CyC or on CyD here, where the group of the formula (3) can be bonded in any possible position on CyC or CyD.

In the following groups (CyC-1-1) to (CyC-19-1) and (CyD-1-1) to (CyD-10-1), the preferred positions for adjacent groups X which stand for CR are depicted in each case, where the respective radicals R, together with the C atoms to which they are bonded, form a ring of the above-mentioned formula (3),

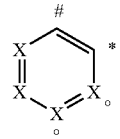
(CyC-1-1)

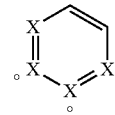
(CyC-1-2)

(CyC-2-1)

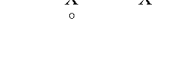
(CyC-2-2)

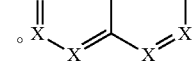
(CyC-2-3)

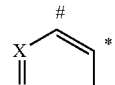
(CyC-3-1)

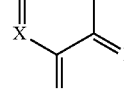
(CyC-3-2)

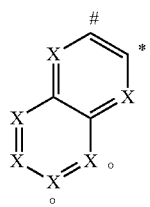 (CyC-4-1)
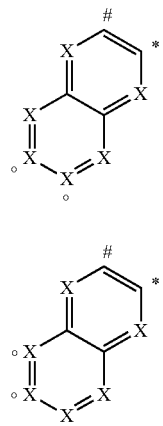 (CyC-4-2)
(CyC-4-3)
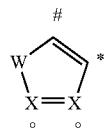 (CyC-5-1)
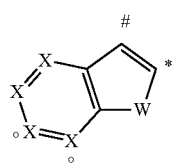 (CyC-7-1)
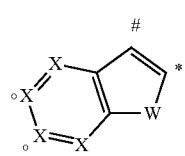 (CyC-7-2)
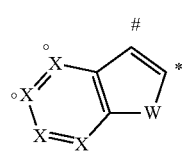 (CyC-7-3)
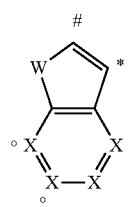 (CyC-8-1)
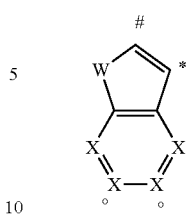 (CyC-8-2)
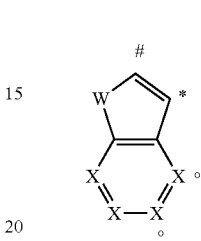 (CyC-8-3)
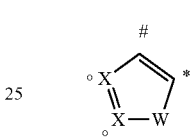 (CyC-9-1)
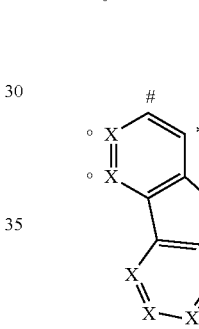 (CyC-14-1)
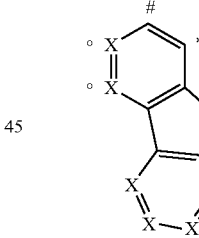 (CyC-15-1)
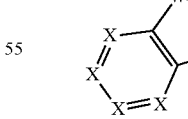 (CyC-16-1)
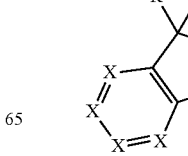 (Cyc-17-1)

-continued
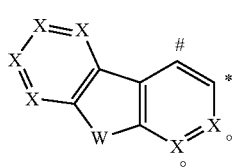 (CyC-18-1)
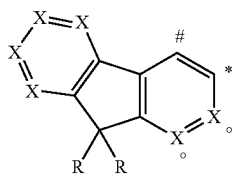 (CyC-19-1)
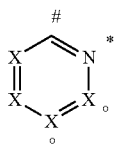 (CyD-1-1)
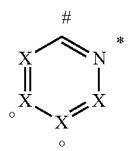 (CyD-1-2)
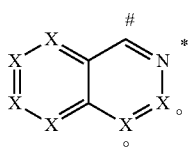 (CyD-2-1)
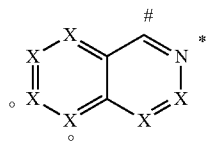 (CyD-2-2)
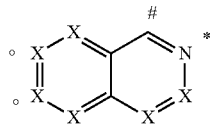 (CyD-2-3)
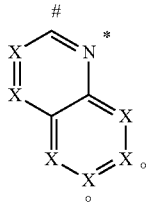 (CyD-3-1)
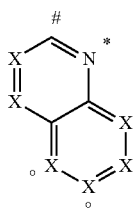 (CyD-3-2)
-continued
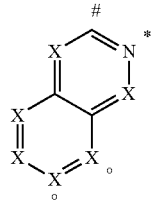 (CyD-4-1)
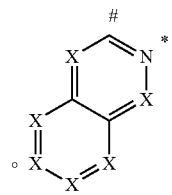 (CyD-4-2)
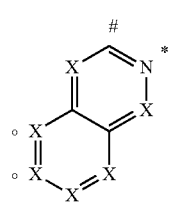 (CyD-4-3)
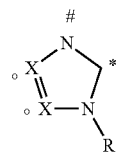 (CyD5-1)
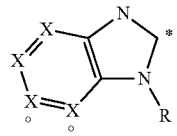 (CyD-6-1)
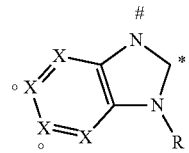 (CyD-6-2)
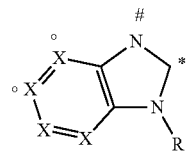 (CyD-6-3)
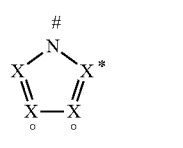 (CyD-7-1)

-continued

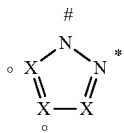
(CyD-7-2)

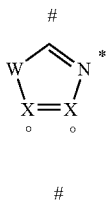
(CyD-8-1)

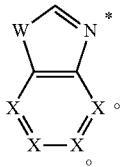
(CyC-9-1)

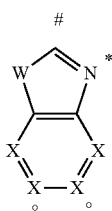
(CyD-9-2)

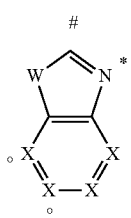
(CyD-9-3)

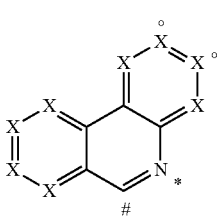
(CyD-10-1)

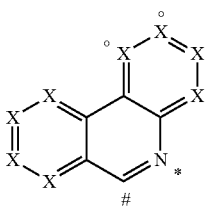
(CyD-10-2)

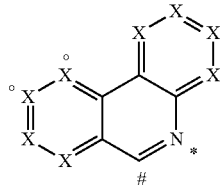
(CyD-10-3)

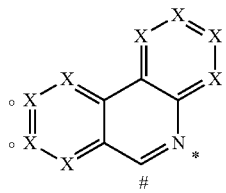
(CyD-10-4)

where the symbols and indices used have the meanings given above, and ° in each case denotes the positions which stand for CR, where the respective radicals R, together with the C atoms to which they are bonded, form a ring of the above-mentioned formula (3).

Likewise, the groups (CyC-1-1) to (CyC-19-1) or (CyD-1-1) to (CyD-10-4) in the two tables shown above are preferred instead of the groups (CyC-1) to (CyC-19) or (CyD-1) to (CyD-19) shown in the tables.

Preferred embodiments of the groups of the formula (3) are shown below. It is essential in the case of the group of the formula (3) that it contains no acidic benzylic protons.

If the index p=2, the group of the formula (3) is a six-membered ring structure of the following formula (4), and if the index p=3, the group of the formula (3) is a seven-membered ring structure of the following formula (5):

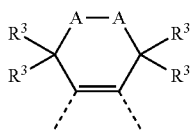
formula (4)

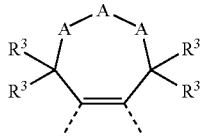
formula (5)

where the symbols used have the meanings given above.

In a preferred embodiment of the invention, p=2, i.e. preference is given to a structure of the formula (4).

In a preferred embodiment of the structure of the formulae (3), (4) and (5), a maximum of one of the groups A stands for a heteroatom, in particular for O or $NR^3$, and the other group A, for p=2, or the other two groups A, for p=3, stand for $C(R^1)_2$. In a particularly preferred embodiment of the invention, A stands, identically or differently on each occurrence, for $C(R^1)_2$.

Preferred embodiments of the formula (4) are thus the structures of the formulae (4-A) and (4-B), where the structure of the formula (4-A) is particularly preferred,

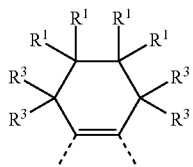
formula (4-A)

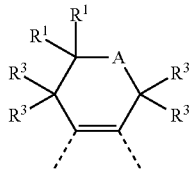
formula (4-B)

where $R^1$ and $R^3$ have the meanings given above, and A stands for O or $NR^3$.

Preferred embodiments of the formula (5) are the structures of the formulae (5-A), (5-B) and (5-C), where the structure of the formula (5-A) is particularly preferred,

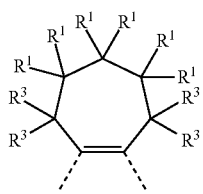
formula (5-A)

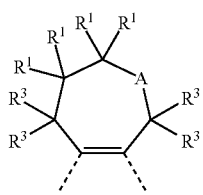
formula (5-B)

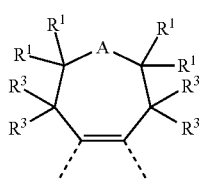
formula (5-C)

where $R^1$ and $R^3$ have the meanings given above, and A stands for O or $NR^3$.

In a preferred embodiment of the formulae (4-A), (4-B), (5-A), (5-B) and (5-C), $R^1$ is, identically or differently on each occurrence, H, D or an alkyl group having 1 to 5 C atoms, particularly preferably methyl, in which, in addition, one or more H atoms may be replaced by F, where two or more adjacent radicals $R^1$ may form an aliphatic ring system with one another. $R^1$ particularly preferably stands for hydrogen.

In a preferred embodiment of the invention, $R^3$ in the group of the formula (3) and in the preferred embodiments stands, identically or differently on each occurrence, for a straight-chain alkyl or alkoxy group having 1 to 10 C atoms or a branched or cyclic alkyl or alkoxy group having 3 to 10 C atoms, where in each case one or more non-adjacent $CH_2$ groups may be replaced by $R^2C=CR^2$ and one or more H atoms may be replaced by D or F, or an aromatic or heteroaromatic ring system having 5 to 14 aromatic ring atoms, which may in each case be substituted by one or more radicals $R^2$; two radicals $R^3$ which are bonded to the same carbon atom may form an aliphatic or aromatic ring system here and thus form a spiro system; furthermore, $R^3$ may form an aliphatic ring system with an adjacent radical R or $R^1$.

In a particularly preferred embodiment of the invention, $R^3$ in the group of the formula (3) and in the preferred embodiments stands, identically or differently on each occurrence, for a straight-chain alkyl or alkoxy group having 1 to 3 C atoms, in particular methyl, or a branched or cyclic alkyl or alkoxy group having 3 to 5 C atoms or an aromatic or heteroaromatic ring system having 6 to 12 aromatic ring atoms, which may in each case be substituted by one or more radicals $R^2$, but is preferably unsubstituted; two radicals $R^3$ which are bonded to the same carbon atom may form an aliphatic or aromatic ring system with one another here and thus form a spiro system; furthermore, $R^3$ may form an aliphatic ring system with an adjacent radical R or $R^1$.

Examples of suitable groups of the formula (4) are the groups (4-1) to (4-16) shown below:

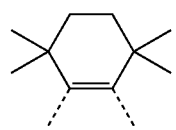
(4-1)

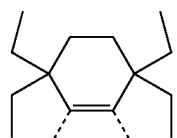
(4-2)

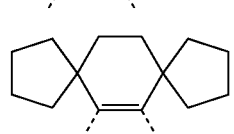
(4-3)

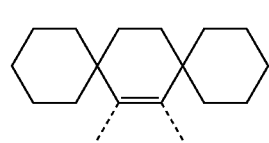
(4-4)

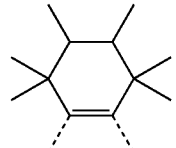
(4-5)

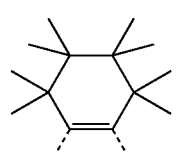
(4-6)

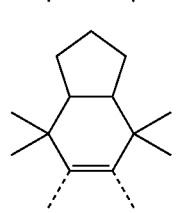
(4-7)

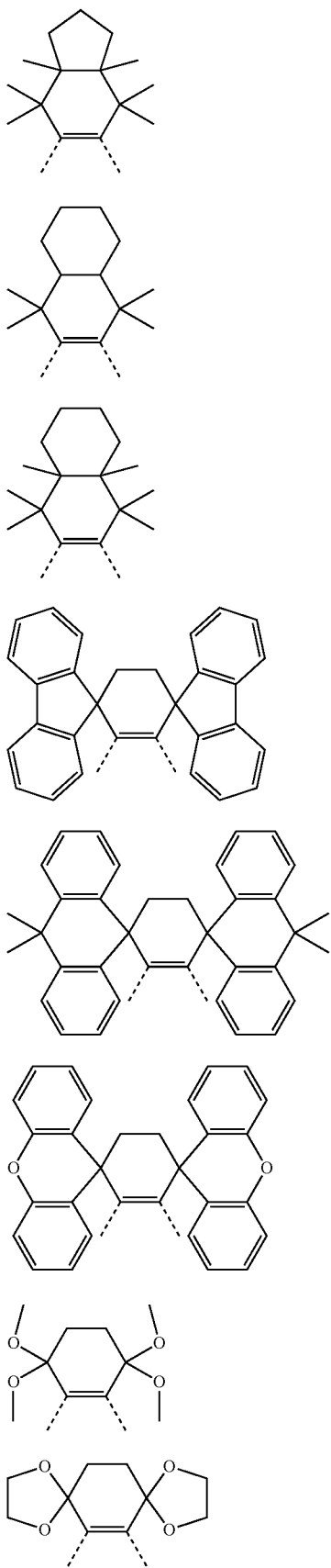
(4-8)
(4-9)
(4-10)
(4-11)
(4-12)
(4-13)
(4-14)
(4-15)
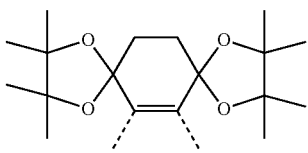
(4-16)
Examples of suitable groups of the formula (5) are the groups (5-1) to (5-11) shown below:
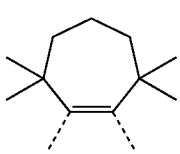
(5-1)
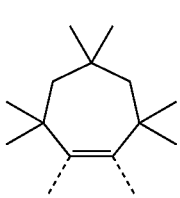
(5-2)
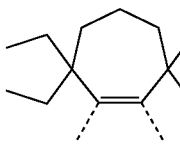
(5-3)
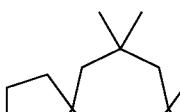
(5-4)
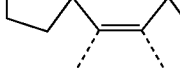
(5-5)
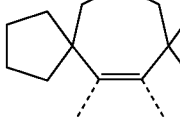
(5-6)
(5-7)

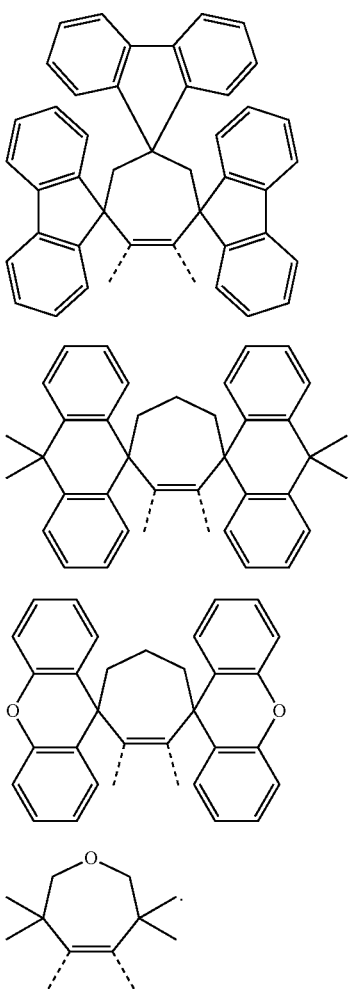

(5-8)

(5-9)

(5-10)

(5-11)

If radicals R are bonded in the moiety of the formula (2), these radicals R are preferably selected on each occurrence, identically or differently, from the group consisting of H, D, F, Br, I, $N(R^1)_2$, CN, $Si(R^1)_3$, $B(OR^1)_2$, $C(=O)R^1$, a straight-chain alkyl group having 1 to 10 C atoms or an alkenyl group having 2 to 10 C atoms or a branched or cyclic alkyl group having 3 to 10 C atoms, each of which may be substituted by one or more radicals $R^1$, where one or more H atoms may be replaced by D or F, or an aromatic or heteroaromatic ring system having 5 to 30 aromatic ring atoms, which may in each case be substituted by one or more radicals $R^1$; two adjacent radical R or R with $R^1$ here may also form a mono- or polycyclic, aliphatic or aromatic ring system with one another. These radicals R are particularly preferably selected on each occurrence, identically or differently, from the group consisting of H, D, F, $N(R^1)_2$, a straight-chain alkyl group having 1 to 6 C atoms or a branched or cyclic alkyl group having 3 to 10 C atoms, where one or more H atoms may be replaced by D or F, or an aromatic or heteroaromatic ring system having 5 to 24 aromatic ring atoms, which may in each case be substituted by one or more radicals $R^1$; two adjacent radicals R or R with $R^1$ here may also form a mono- or polycyclic, aliphatic or aromatic ring system with one another.

Radicals $R^1$ which are bonded to R are on each occurrence, identically or differently, preferably H, D, F, $N(R^2)_2$, CN, a straight-chain alkyl or alkoxy group having 1 to 10 C atoms or an alkenyl group having 2 to 10 C atoms or a branched or cyclic alkyl or alkoxy group having 3 to 10 C atoms, each of which may be substituted by one or more radicals $R^2$, where one or more non-adjacent $CH_2$ groups may be replaced by $R^2C=CR^2$ or O and where one or more H atoms may be replaced by D or F, or an aromatic or heteroaromatic ring system having 5 to 20 aromatic ring atoms, which may in each case be substituted by one or more radicals $R^2$, or a diarylamino group, diheteroarylamino group or arylheteroarylamino group having 10 to 40 aromatic ring atoms, which may be substituted by one or more radicals $R^2$; two or more adjacent radicals $R^1$ here may form a mono- or polycyclic, aliphatic ring system with one another. Particularly preferred radicals $R^1$ which are bonded to R are on each occurrence, identically or differently, H, F, CN, a straight-chain alkyl group having 1 to 5 C atoms or a branched or cyclic alkyl group having 3 to 5 C atoms, each of which may be substituted by one or more radicals $R^2$, or an aromatic or heteroaromatic ring system having 5 to 13 aromatic ring atoms, which may in each case be substituted by one or more radicals $R^2$; two or more adjacent radicals $R^1$ here may form a mono- or polycyclic, aliphatic ring system with one another.

Preferred radicals $R^2$ are on each occurrence, identically or differently, H, F or an aliphatic hydrocarbon radical having 1 to 5 C atoms or an aromatic hydrocarbon radical having 6 to 12 C atoms; two or more substituents $R^2$ here may also form a mono- or polycyclic, aliphatic ring system with one another.

As described above, a bridging unit which links this ligand L to one or more further ligands L or L' may also be present instead of one of the radicals R. In a preferred embodiment of the invention, a bridging unit is present instead of one of the radicals R, in particular instead of the radicals R which are in the ortho- or meta-position to the coordinating atom, so that the ligands have a tridentate or polydentate or polypodal character. It is also possible for two such bridging units to be present. This results in the formation of macrocyclic ligands or in the formation of cryptates.

Preferred structures containing polydentate ligands are the metal complexes of the following formulae (6) to (11),

formula (6)

formula (7)

formula (8)

formula (9)

-continued

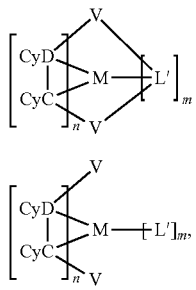

formula (10)

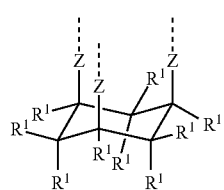

formula (11)

where the symbols and indices used have the above-mentioned meanings.

In the structures of the formulae (6) to (11), V preferably represents a single bond or a bridging unit containing 1 to 80 atoms from the third, fourth, fifth and/or sixth main group (IUPAC group 13, 14, 15 or 16) or a 3- to 6-membered homo- or heterocycle which covalently bonds the part-ligands L to one another or covalently bonds L to L'. The bridging unit V here may also have an asymmetrical structure, i.e. the linking of V to L and L' need not be identical. The bridging unit V can be neutral, singly, doubly or triply negatively charged or singly, doubly or triply positively charged. V is preferably neutral or singly negatively charged or singly positively charged, particularly preferably neutral. The charge of V is preferably selected so that overall a neutral complex forms. The preferences mentioned above for the moiety $ML_n$ apply to the ligands, and n is preferably at least 2.

The precise structure and chemical composition of the group V does not have a significant effect on the electronic properties of the complex since the job of this group is essentially to increase the chemical and thermal stability of the complexes by bridging L to one another or to L'.

If V is a trivalent group, i.e. bridges three ligands L to one another or two ligands L to L' or one ligand L to two ligands L', V is preferably selected, identically or differently on each occurrence, from the group consisting of B, $B(R^1)$—, $B(C(R^1)_2)_3$, $(R^1)B(C(R^1)_2)_3$—, $B(O)_3$, $(R^1)B(O)_3$—, $B(C(R^1)_2C(R^1)_2)_3$, $(R^1)B(C(R^1)_2C(R^1)_2)_3$—, $B(C(R^1)_2O)_3$, $(R^1)B(C(R^1)_2O)_3$—, $B(OC(R^1)_2)_3$, $(R^1)B(OC(R^1)_2)_3$—, $C(R^1)$, $CO$—, $CN(R^1)_2$, $(R^1)C(C(R^1)_2)_3$, $(R^1)C(O)_3$, $(R^1)C(C(R^1)_2C(R^1)_2)_3$, $(R^1)C(C(R^1)_2O)_3$, $(R^1)C(OC(R^1)_2)_3$, $(R^1)C(Si(R^1)_2)_3$, $(R^1)C(Si(R^1)_2C(R^1)_2)_3$, $(R^1)C(C(R^1)_2Si(R^1)_2)_3$, $(R^1)C(Si(R^1)_2Si(R^1)_2)_3$, $Si(R^1)$, $(R^1)Si(C(R^1)_2)_3$, $(R^1)Si(O)_3$, $(R^1)Si(C(R^1)_2C(R^1)_2)_3$, $(R^1)Si(OC(R^1)_2)_3$, $(R^1)Si(C(R^1)_2O)_3$, $(R^1)Si(Si(R^1)_2)_3$, $(R^1)Si(Si(R^1)_2C(R^1)_2)_3$, $(R^1)Si(C(R^1)_2Si(R^1)_2)_3$, $(R^1)Si(Si(R^1)_2Si(R^1)_2)_3$, N, NO, $N(R^1)^+$, $N(C(R^1)_2)_3$, $(R^1)N(C(R^1)_2)_3^+$, $N(C=O)_3$, $N(C(R^1)_2C(R^1)_2)_3$, $(R^1)N(C(R^1)_2C(R^1)_2)_3^+$, P, $P(R^1)^+$, PO, PS, $P(O)_3$, $PO(O)_3$, $P(OC(R^1)_2)_3$, $PO(OC(R^1)_2)_3$, $P(C(R^1)_2)_3$, $P(R^1)(C(R^1)_2)_3^+$, $PO(C(R^1)_2)_3$, $P(C(R^1)_2C(R^1)_2)_3$, $P(R^1)(C(R^1)_2C(R^1)_2)_3^+$, $PO(C(R^1)_2C(R^1)_2)_3$, $S^+$, $S(C(R^1)_2)_3^+$, $S(C(R^1)_2C(R^1)_2)_3^+$, or a unit of the formulae (12) to (16),

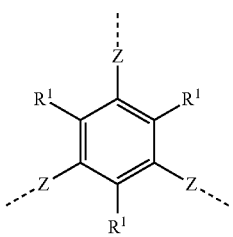

formula (13)

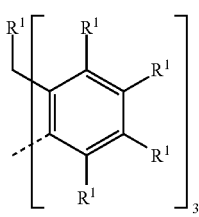

formula (14)

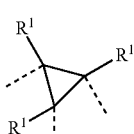

formula (15)

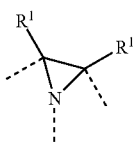

formula (16)

where the dashed bonds in each case indicate the bond to the part-ligands L or L', and Z is selected, identically or differently on each occurrence, from the group consisting of a single bond, O, S, S(=O), $S(=O)_2$, $NR^1$, $PR^1$, $P(=O)R^1$, $C(R^1)_2$, C(=O), $C(=NR^1)$, $C(=C(R^1)_2)$, $Si(R^1)_2$ or $BR^1$. The other symbols used have the meanings given above.

If V stands for a group $CR_2$, the two radicals R may also be linked to one another, and consequently structures such as, for example, 9,9-fluorene, are also suitable groups V.

If V is a divalent group, i.e. bridges two ligands L to one another or one ligand L to L', V is preferably selected, identically or differently on each occurrence, from the group consisting of aus $BR^1$, $B(R^1)_2$—, $C(R^1)_2$, C(=O), $Si(R^1)_2$, $NR^1$, $PR^1$, $P(R^1)_2^+$, $P(=O)(R^1)$, $P(=S)(R^1)$, O, S, Se, or a unit of the formulae (17) to (26),

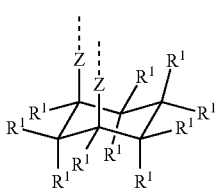

formula (17)

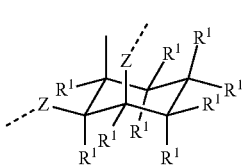

formula (18)

formula (12)

-continued formula (19)

formula (20)

formula (21)

formula (22)

formula (23)

formula (24)

formula (25)

formula (26)

where the dashed bonds in each case indicate the bond to the part-ligands L or L', Y stands on each occurrence, identically or differently, for $C(R^1)_2$, $N(R^1)$, O or S, and the other symbols used each have the meanings indicated above.

Preferred ligands L' as occur in formula (1) are described below. The ligand groups L' can also be selected correspondingly if they are bonded to L via a bridging unit V, as indicated in formulae (6), (8) and (10).

The ligands L' are preferably monoanionic bidentate ligands which are bonded to M via a neutral nitrogen atom and a negatively charged carbon atom or via a neutral carbon atom and a negatively charged carbon atom. It is preferred here for the ligands L' to form a cyclometallated five-membered ring or six-membered ring, in particular a cyclometallated five-membered ring, with the metal. As described above, the ligands L' may also be bonded to L via a bridging group V. The ligands L' are, in particular, ligands as are generally used in the area of phosphorescent metal complexes for organic electroluminescent devices, i.e. ligands of the type phenylpyridine, naphthylpyridine, phenylquinoline, phenylisoquinoline, etc., each of which may be substituted by one or more radicals R. A multiplicity of ligands of this type is known to the person skilled in the art in the area of phosphorescent electroluminescent devices, and he will be able, without inventive step, to select further ligands of this type as ligand L' for compounds of the formula (1). The combination of two groups as depicted by the following formulae (27) to (50) is generally particularly suitable for this purpose, where one group is bonded via a neutral nitrogen atom or a carbene carbon atom and the other group is preferably bonded via a negatively charged carbon atom. The ligand L' can then be formed from the groups of the formulae (27) to (50) through these groups bonding to one another in each case at the position denoted by #. The position at which the groups coordinate to the metal M is denoted by *. These groups may also be bonded to the ligand L via one or two bridging units V.

formula (27)

formula (28)

formula (29)

formula (30)

formula (31)

formula (32)

-continued

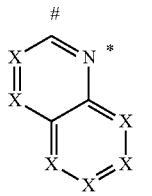
formula (33)

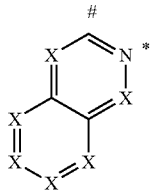
formula (34)

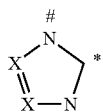
formula (35)

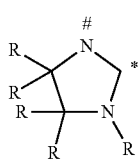
formula (36)

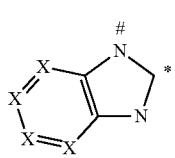
formula (37)

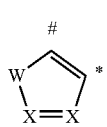
formula (38)

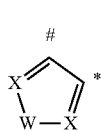
formula (39)

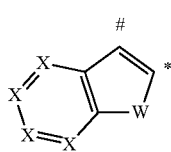
(formula (40))

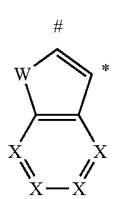
formula (41)

formula (42)

-continued

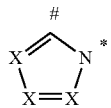
formula (43)

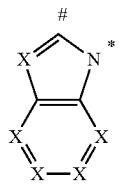
formula (44)

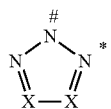
formula (45)

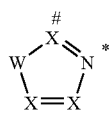
(formula (46))

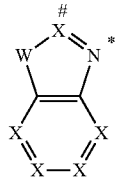
formula (47)

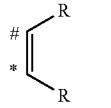
formula (48)

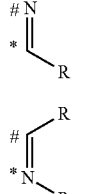
formula (49)

formula (50)

W here has the meaning given above and X stands on each occurrence, identically or differently, for CR or N, where the above-mentioned limitation, that at least two adjacent groups X stand for CR and the radicals R form a ring of the formula (3), does not apply here. R has the same meaning as described above, where two radicals R which are bonded to two different cyclic groups of the above-mentioned formulae (27) to (50) may also form an aromatic ring system with one another here. Preferably, a maximum of three symbols X in each group stand for N, particularly preferably a maximum of two symbols X in each group stand for N, very particularly preferably a maximum of one symbol X in each group stands for N. Especially preferably, all symbols X stand for CR.

If two radicals R in the ligand L' which are bonded to two different rings of the above-mentioned formulae (27) to (50) also form an aromatic ring system with one another, ligands may arise, for example, which overall represent a single larger heteroaryl group, such as, for example, benzo[h]quinoline, etc. Preferred ligands which arise through ring formation of two radicals R on the different rings are the structures of the formulae (51) to (55) shown below:

formula (51)
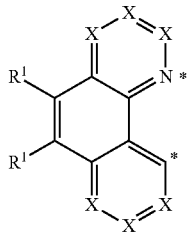

formula (52)
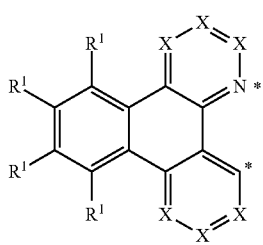

formula (53)
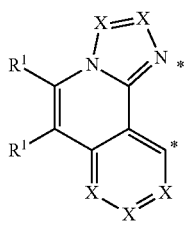

formula (54)
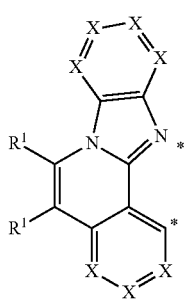

formula (55)
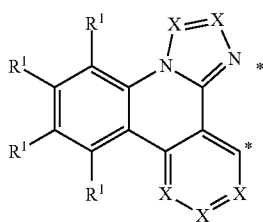

where the symbols used have the meanings given above.

Preferred radicals R in the structures of L' shown above are selected on each occurrence, identically or differently, from the group consisting of H, D, F, Br, $N(R^1)_2$, CN, $B(OR^1)_2$, $C(=O)R^1$, $P(=O)(R^1)_2$, a straight-chain alkyl group having 1 to 10 C atoms or a straight-chain alkenyl or alkynyl group having 2 to 10 C atoms or a branched or cyclic alkyl group having 3 to 10 C atoms, each of which may be substituted by one or more radicals $R^1$, where one or more H atoms may be replaced by D or F, or an aromatic or heteroaromatic ring system having 5 to 14 aromatic ring atoms, which may in each case be substituted by one or more radicals $R^1$; two or more adjacent radicals R here may also form a mono- or polycyclic, aliphatic, aromatic and/or benzo-fused ring system with one another. Particularly preferred radicals R are selected on each occurrence, identically or differently, from the group consisting of H, D, F, Br, CN, $B(OR^1)_2$, a straight-chain alkyl group having 1 to 5 C atoms, in particular methyl, or a branched or cyclic alkyl group having 3 to 5 C atoms, in particular isopropyl or tert-butyl, where one or more H atoms may be replaced by D or F, or an aromatic or heteroaromatic ring system having 5 to 12 aromatic ring atoms, which may in each case be substituted by one or more radicals $R^1$; two or more radicals R here may also form a mono- or polycyclic, aliphatic, aromatic and/or benzo-fused ring system with one another.

Preferred radicals $R^1$ in the structures of L' shown above are defined analogously to the preferred radicals $R^1$ shown above.

The complexes according to the invention can be facial or pseudofacial or they can be meridional or pseudomeridional.

The ligands L and/or L' may also be chiral, depending on the structure. This is the case, in particular, if they contain substituents, for example alkyl, alkoxy, dialkylamino or aralkyl groups, which have one or more stereocentres. Since the basic structure of the complex may also be a chiral structure, the formation of diastereomers and a number of enantiomer pairs is possible. The complexes according to the invention then encompass both the mixtures of the various diastereomers or the corresponding racemates and also the individual isolated diastereomers or enantiomers.

The preferred embodiments indicated above can be combined with one another as desired. In a particularly preferred embodiment of the invention, the preferred embodiments indicated above apply simultaneously.

Examples of suitable compounds of the formula (1) are the structures shown in the following table.

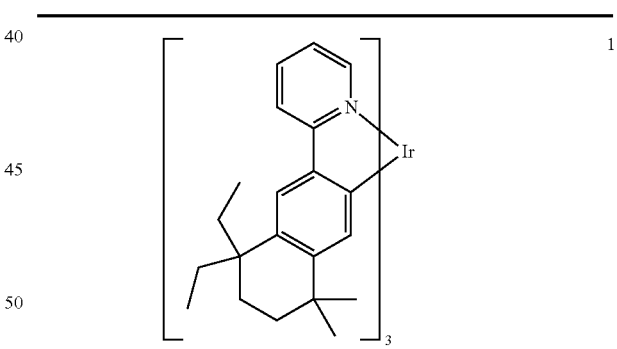

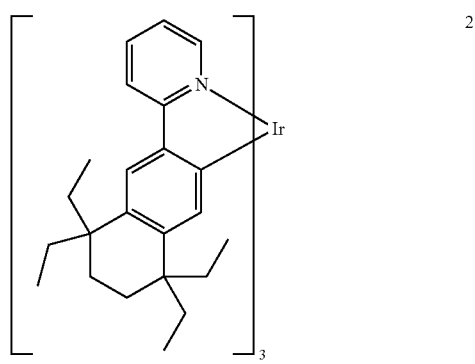

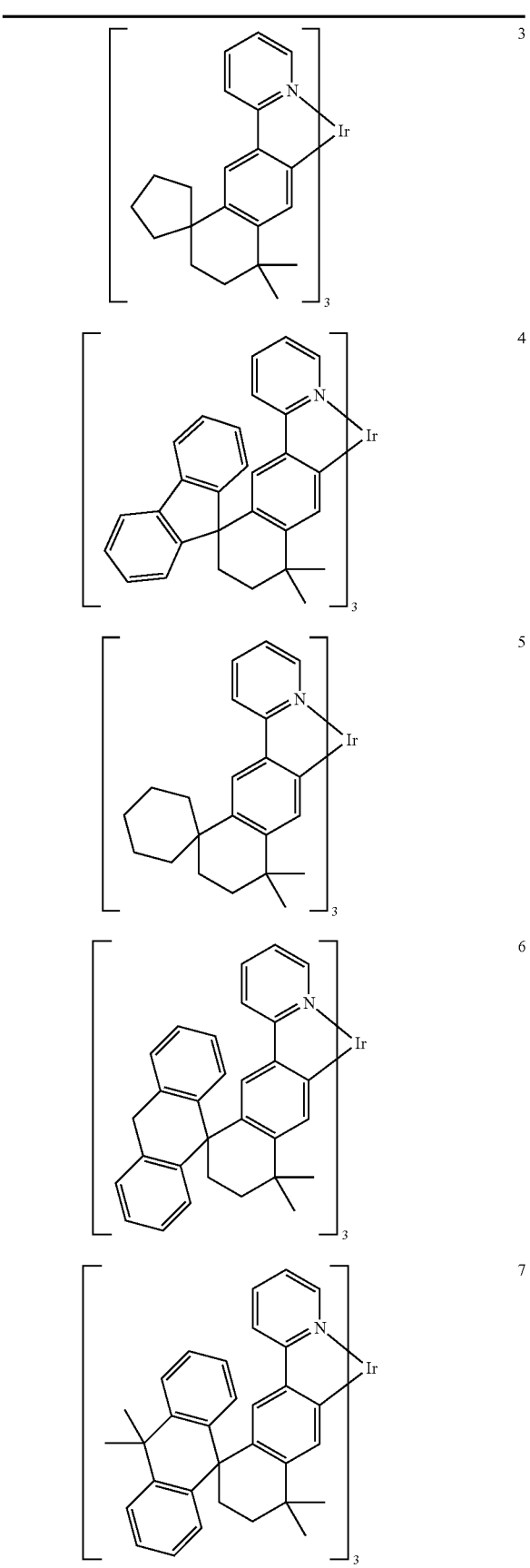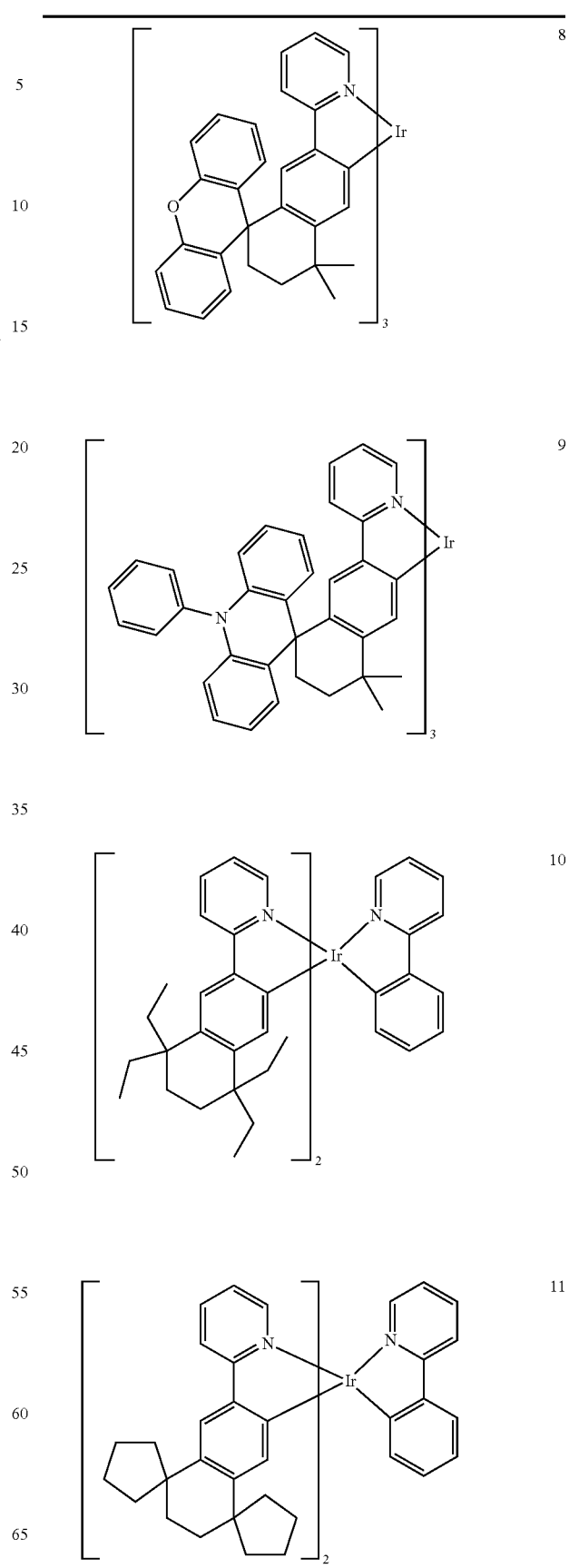

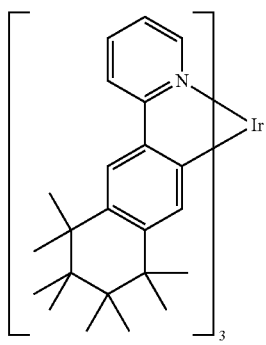
12
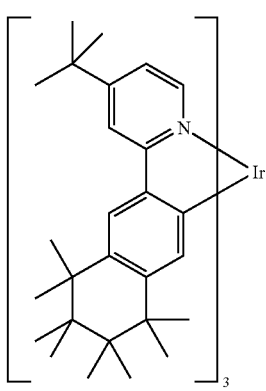
13
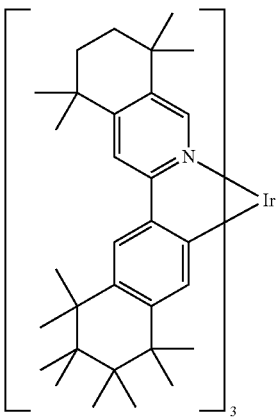
14
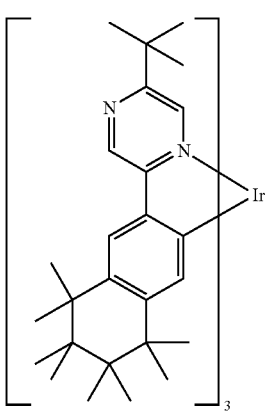
15
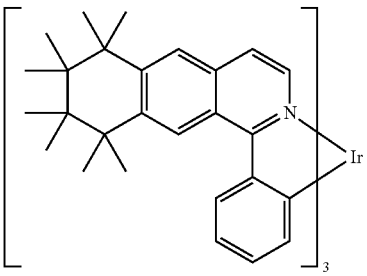
16
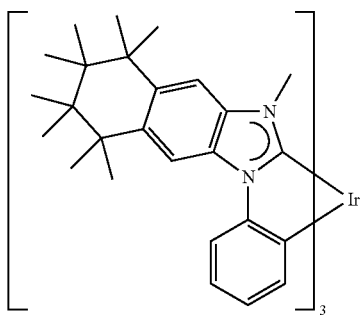
17
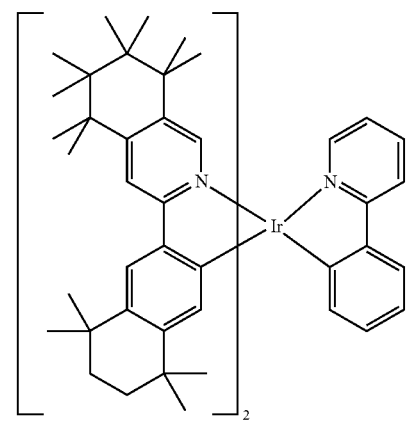
18
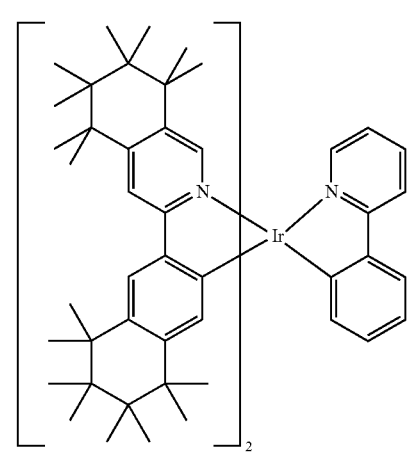
19

20
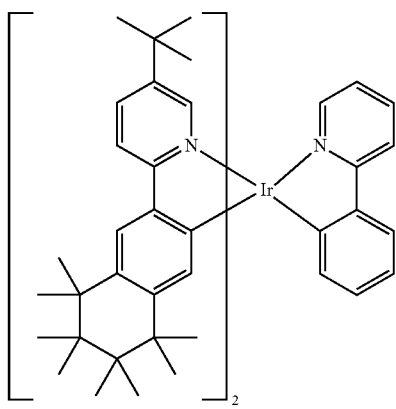
21
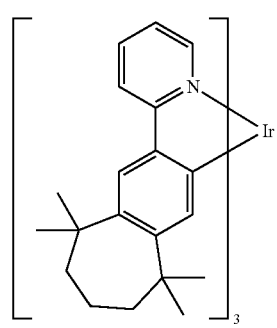
22
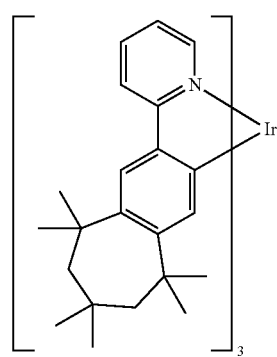
23
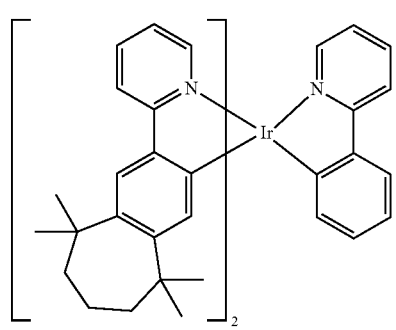
24
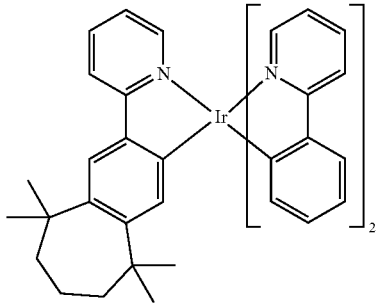
25
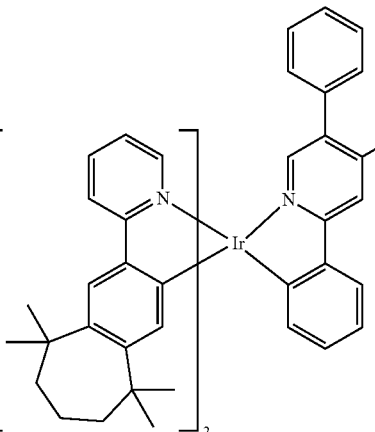
26
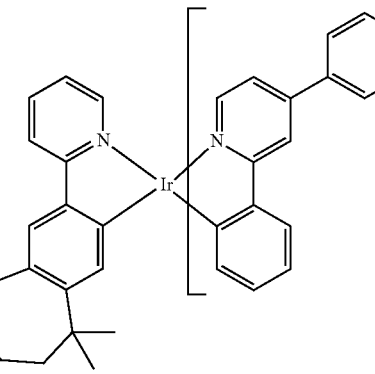
27
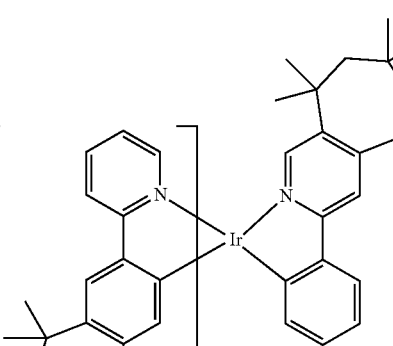

The metal complexes according to the invention can in principle be prepared by various processes. However, the processes described below have proven particularly suitable.

The present invention therefore furthermore relates to a process for the preparation of the metal complex compounds of the formula (1) by reaction of the corresponding free ligands L and optionally L' with metal alkoxides of the formula (67), with metal ketoketonates of the formula (68), with metal halides of the formula (69) or with dimeric metal complexes of the formula (70) or with metal complexes of the formula (71),

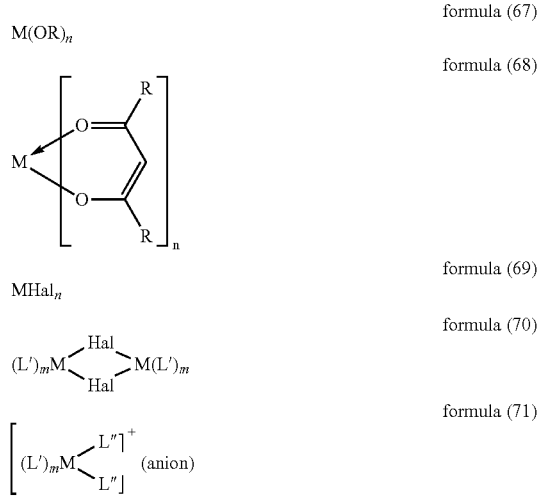

formula (67)
formula (68)
formula (69)
formula (70)
formula (71)

where the symbols M, m, n and R have the meanings indicated above, Hal=F, Cl, Br or I, L" stands for an alcohol, in particular for an alcohol having 1 to 4 C atoms, or a nitrile, in particular acetonitrile or benzonitrile, and (anion) stands for a non-coordinating anion, such as, for example, triflate It is likewise possible to use metal compounds, in particular iridium compounds, which carry both alkoxide and/or halide and/or hydroxyl radicals as well as ketoketonate radicals. These compounds may also be charged. Corresponding iridium compounds which are particularly suitable as starting materials are disclosed in WO 2004/085449. [IrCl$_2$(acac)$_2$]$^-$, for example Na[IrCl$_2$(acac)$_2$], are particularly suitable. Metal complexes with acetylacetonate derivatives as ligand, for example Ir(acac)$_3$ or tris(2,2,6,6-tetramethylheptane-3,5-dionato)iridium, and IrCl$_3$.xH$_2$O, where x usually stands for a number between 2 and 4.

Suitable platinum starting materials are, for example, PtCl$_2$, K$_2$[PtCl$_4$], PtCl$_2$(DMSO)$_2$, Pt(Me)$_2$(DMSO)$_2$ or PtCl$_2$(benzonitrile)$_2$.

The synthesis can also be carried out by reaction of the ligands L with iridium complexes of the formula [Ir(L')$_2$(HOMe)$_2$]A or [Ir(L')$_2$(NCMe)$_2$]A or by reaction of the ligands L' with iridium complexes of the formula [Ir(L)$_2$(HOMe)$_2$]A or [Ir(L)$_2$(NCMe)$_2$]A, where A in each case represents a non-coordinating anion, such as, for example, triflate, tetrafluoroborate, hexafluorophosphate, etc., in dipolar-protic solvents, such as, for example, ethylene glycol, propylene glycol, glycerol, diethylene glycol, triethylene glycol, etc.

The synthesis of the complexes is preferably carried out as described in WO 2002/060910 and in WO 2004/085449. Heteroleptic complexes can also be synthesised, for example, in accordance with WO 05/042548. The synthesis here can also be activated, for example, thermally, photochemically and/or by microwave radiation. The synthesis can furthermore also be carried out in an autoclave under increased pressure and/or at elevated temperature.

The reactions can be carried out without addition of solvents or melting aids in a melt of the corresponding ligands to be o-metallated. If necessary, solvents or melting aids can be added. Suitable solvents are protic or aprotic solvents, such as aliphatic and/or aromatic alcohols (methanol, ethanol, isopropanol, t-butanol, etc.), oligo- and polyalcohols (ethylene glycol, 1,2-propanediol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO) or sulfones (dimethyl sulfone, sulfolane, etc.). Suitable melting aids are compounds which are in solid form at room temperature, but melt on warming of the reaction mixture and dissolve the reactants, so that a homogeneous melt forms. Particularly suitable are biphenyl, m-terphenyl, triphenylene, 1,2-, 1,3-, 1,4-bisphenoxybenzene, triphenylphosphine oxide, 18-crown-6, phenol, 1-naphthol, hydroquinone, etc.

These processes, optionally followed by purification, such as, for example, recrystallisation or sublimation, enable the compounds of the formula (1) according to the invention to be obtained in high purity, preferably greater than 99% (determined by means of $^1$H-NMR and/or HPLC).

The compounds according to the invention can also be rendered soluble by suitable substitution, for example by relatively long alkyl groups (about 4 to 20 C atoms), in particular branched alkyl groups, or optionally substituted aryl groups, for example, xylyl, mesityl or branched terphenyl or quater-phenyl groups. Compounds of this type are then soluble in common organic solvents, such as, for example, toluene or xylene, at room temperature in sufficient concentration to be able to process the complexes from solution. These soluble compounds are particularly suitable for processing from solution, for example by printing processes.

The compounds according to the invention can also be mixed with a polymer. It is likewise possible to incorporate these compounds covalently into a polymer. This is possible, in particular, with compounds which are substituted by reactive leaving groups, such as bromine, iodine, chlorine, boronic acid or boronic acid ester, or by reactive, polymerisable groups, such as olefins or oxetanes. These can be used as monomers for the production of corresponding oligomers, dendrimers or polymers. The oligomerisation or polymerisation here preferably takes place via the halogen functionality or the boronic acid functionality or via the polymerisable group. It is furthermore possible to crosslink the polymers via groups of this type. The compounds and polymers according to the invention can be employed as crosslinked or uncrosslinked layer.

The invention therefore furthermore relates to oligomers, polymers or dendrimers containing one or more of the above-mentioned compounds according to the invention, where one or more bonds are present from the compound according to the invention to the polymer, oligomer or dendrimer. Depending on the linking of the compound according to the invention, this therefore forms a side chain of the oligomer or polymer or is linked in the main chain. The polymers, oligomers or dendrimers may be conjugated, partially conjugated or non-conjugated. The oligomers or polymers may be linear, branched or dendritic. The same preferences as described above apply to the recurring units of the compounds according to the invention in oligomers, dendrimers and polymers.

For the preparation of the oligomers or polymers, the monomers according to the invention are homopolymerised or copolymerised with further monomers. Preference is given to copolymers, where the units of the formula (1) or the preferred embodiments described above are present in amounts of 0.01 to 99.9 mol %, preferably 5 to 90 mol %, particularly preferably 20 to 80 mol %. Suitable and preferred comonomers which form the polymer backbone are selected from fluorenes (for example in accordance with EP 842208 or WO 2000/022026), spirobifluorenes (for example in accordance with EP 707020, EP 894107 or WO 2006/061181), para-phenylenes (for example in accordance with WO 92/18552), carbazoles (for example in accordance with WO 2004/070772 or WO 2004/113468), thiophenes (for example in accordance with EP 1028136), dihydrophenanthrenes (for example in accordance with WO 2005/014689), cis- and trans-indeno-fluorenes (for example in accordance with WO 2004/041901 or WO 2004/113412), ketones (for example in accordance with WO 2005/040302), phenanthrenes (for example in accordance with WO 2005/104264 or WO 2007/017066) or also a plurality of these units. The polymers, oligomers and dendrimers may also contain further units, for example hole-transport units, in particular those based on triarylamines, and/or electron-transport units.

Formulations of the compounds according to the invention are necessary for processing of the compounds according to the invention from the liquid phase, for example by spin coating or by printing processes. These formulations can be, for example, solutions, dispersions or emulsions. It may be preferred to use mixtures of two or more solvents for this purpose. Suitable and preferred solvents are, for example, toluene, anisole, o-, m- or p-xylene, methyl benzoate, mesitylene, tetralin, veratrol, THF, methyl-THF, THP, chlorobenzene, dioxane, phenoxytoluene, in particular 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol mono-butyl ether, tripropylene glycol dimethyl ether, tetraethylene glycol dimethyl ether, 2-isopropylnaphthalene, pentylbenzene, hexylbenzene, heptyl-benzene, octylbenzene, 1,1-bis(3,4-dimethylphenyl)ethane or mixtures of these solvents.

The present invention therefore furthermore relates to a formulation comprising at least one compound according to the invention or at least one oligomer, polymer or dendrimer according to the invention and at least one further compound. The further compound may be, for example, a solvent, in particular one of the above-mentioned solvents or a mixture of these solvents. However, the further compound may also be a further organic or inorganic compound which is likewise employed in the electronic device, for example a matrix material. This further compound may also be polymeric.

The compounds of the formula (1) described above or the preferred embodiments indicated above can be used as active component in the electronic device. The present invention thus furthermore relates to the use of a compound according to the invention in an electronic device. The present invention still furthermore relates to an electronic device comprising at least one compound according to the invention.

An electronic device is taken to mean a device which comprises an anode, a cathode and at least one layer, where this layer comprises at least one organic or organometallic compound. The electronic device according to the invention thus comprises an anode, a cathode and at least one layer which comprises at least one compound of the formula (1) given above. Preferred electronic devices here are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), light-emitting electrochemical cells (LECs) or organic laser diodes (O-lasers), comprising at least one compound of the formula (1) given above in at least one layer. Particular preference is given to organic electroluminescent devices. Active components are generally the organic or inorganic materials which have been introduced between the anode and cathode, for example charge-injection, charge-transport or charge-blocking materials, but in particular emission materials and matrix materials. The compounds according to the invention exhibit particularly good properties as emission material in organic electroluminescent devices. Organic electroluminescent devices are therefore a preferred embodiment of the invention. Furthermore, the compounds according to the invention can be employed for the generation of singlet oxygen or in photocatalysis.

The organic electroluminescent device comprises a cathode, an anode and at least one emitting layer. Apart from these layers, it may also comprise further layers, for example in each case one or more hole-injection layers, hole-transport layers, hole-blocking layers, electron-transport layers, electron-injection layers, exciton-blocking layers, electron-blocking layers, charge-generation layers and/or organic or inorganic p/n junctions. It is possible here for one or more hole-transport layers to be p-doped, for example with metal oxides, such as $MoO_3$ or $WO_3$, or with (per)fluorinated electron-deficient aromatic compounds, and/or for one or more electron-transport layers to be n-doped. Interlayers which have, for example, an exciton-blocking function and/or control the charge balance in the electroluminescent device may likewise be introduced between two emitting layers. However, it should be pointed out that each of these layers does not necessarily have to be present.

The organic electroluminescent device here may comprise one emitting layer or a plurality of emitting layers. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 2005/011013), or systems which have more than three emitting layers. It may also be a hybrid system, where one or more layers fluoresce and one or more other layers phosphoresce.

In a preferred embodiment of the invention, the organic electroluminescent device comprises the compound of the formula (1) or the preferred embodiments indicated above as emitting compound in one or more emitting layers.

If the compound of the formula (1) is employed as emitting compound in an emitting layer, it is preferably employed in combination with one or more matrix materials. The mixture comprising the compound of the formula (1) and the matrix material comprises between 1 and 99% by vol., preferably between 2 and 90% by vol., particularly preferably between 3 and 40% by vol., especially between 5 and 15% by vol., of the compound of the formula (1), based on the mixture as a whole comprising emitter and matrix material. Correspondingly, the mixture comprises between 99.9 and 1% by vol., preferably between 99 and 10% by vol., particularly preferably between 97 and 60% by vol., in particular between 95 and 85% by vol., of the matrix material, based on the mixture as a whole comprising emitter and matrix material.

The matrix material employed can in general be all materials which are known for this purpose in accordance with the prior art. The triplet level of the matrix material is preferably higher than the triplet level of the emitter.

Suitable matrix materials for the compounds according to the invention are ketones, phosphine oxides, sulfoxides and sulfones, for example in accordance with WO 2004/013080, WO 2004/093207, WO 2006/005627 or WO 2010/006680, triarylamines, carbazole derivatives, for example CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example in accordance with WO 2007/063754 or WO 2008/056746, indenocarbazole derivatives, for example in accordance with WO 2010/136109 or WO 2011/000455, azacarbazoles, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, diaza-silole derivatives, for example in accordance with WO 2010/054729, diaza-phosphole derivatives, for example in accordance with WO 2010/054730, triazine derivatives, for example in accordance with WO 2010/015306, WO 2007/063754 or WO 2008/056746, zinc complexes, for example in accordance with EP 652273 or WO 2009/062578, dibenzofuran derivatives, for example in accordance with WO 2009/148015, or bridged carbazole derivatives, for example in accordance with US 2009/0136779, WO 2010/050778, WO 2011/042107 or WO 2011/088877.

It may also be preferred to employ a plurality of different matrix materials as a mixture, in particular at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex according to the invention. Preference is likewise given to the use of a mixture of a charge-transporting matrix material and an electrically inert matrix material which is not involved or not essentially involved in charge transport, as described, for example, in WO 2010/108579.

It is furthermore preferred to employ a mixture of two or more triplet emitters together with a matrix. The triplet emitter having the shorter-wave emission spectrum serves as co-matrix for the triplet-emitter having the longer-wave emission spectrum. Thus, for example, the complexes of the formula (1) according to the invention can be employed as co-matrix for triplet emitters emitting at longer wavelength, for example for green- or red-emitting triplet emitters.

The compounds according to the invention can also be employed in other functions in the electronic device, for example as hole-transport material in a hole-injection or -transport layer, as charge-generation material or as electron-blocking material. The complexes according to the invention can likewise be employed as matrix material for other phosphorescent metal complexes in an emitting layer.

The cathode preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali metal or alkaline-earth metal and silver, for example an alloy comprising magnesium and silver. In the case of multilayered structures, further metals which have a relatively high work function, such as, for example, Ag, may also be used in addition to the said metals, in which case combinations of the metals, such as, for example, Mg/Ag, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, $BaF_2$, MgO, NaF, CsF, $Cs_2CO_3$, etc.). Organic alkali-metal complexes, for example Liq (lithium quinolinate), are likewise suitable for this purpose. The layer thickness of this layer is preferably between 0.5 and 5 nm.

The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent or partially transparent in order either to facilitate irradiation of the organic material (O-SCs) or the coupling-out of light (OLEDs/PLEDs, O-LASERs). Preferred anode materials here are conductive mixed metal oxides. Particular preference is given to indium tin oxide (ITO) or indium zinc oxide (IZO). Preference is furthermore given to conductive, doped organic materials, in particular conductive doped polymers, for example PEDOT, PANI or derivatives of these polymers. It is furthermore preferred for a p-doped hole-transport material to be applied to the anode as hole-injection layer, where suitable p-dopants are metal oxides, for example $MoO_3$ or $WO_3$, or (per)fluorinated electron-deficient aromatic compounds. Further suitable p-dopants are HAT-CN (hexacyanohexaazatriphenylene) or the compound NPD9 from Novaled. A layer of this type simplifies hole injection in materials having a low HOMO, i.e. a large value of the HOMO.

All materials as are used in accordance with the prior art for the layers can generally be used in the further layers, and the person skilled in the art will be able to combine each of these materials with the materials according to the invention in an electronic device without inventive step.

The device is correspondingly structured (depending on the application), provided with contacts and finally hermetically sealed, since the lifetime of such devices is drastically shortened in the presence of water and/or air.

Preference is furthermore given to an organic electroluminescent device, characterised in that one or more layers are applied by means of a sublimation process, in which the materials are vapour-deposited in vacuum sublimation units at an initial pressure of usually less than $10^{-5}$ mbar, preferably less than $10^{-6}$ mbar. It is also possible for the initial pressure to be even lower or even higher, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure of between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing or nozzle printing, but particularly preferably LIT (light induced thermal imaging, thermal transfer printing) or ink-jet printing. Soluble compounds are necessary for this purpose, which are obtained, for example, through suitable substitution.

The organic electroluminescent device may also be produced as a hybrid system by applying one or more layers from solution and applying one or more other layers by vapour deposition. Thus, for example, it is possible to apply an emitting layer comprising a compound of the formula (1) and a matrix material from solution and to apply a hole-blocking layer and/or an electron-transport layer on top by vacuum vapour deposition.

These processes are generally known to the person skilled in the art and can be applied by him without problems to organic electroluminescent devices comprising compounds of the formula (1) or the preferred embodiments indicated above.

The electronic devices according to the invention, in particular organic electroluminescent devices, are distinguished over the prior art by one or more of the following surprising advantages:

1. The metal complexes according to the invention have a reduced sublimation temperature compared with analogous compounds which contain no structural unit of the formula (3). This results in significant advantages during purification of the complexes and during production of vacuum-processed electroluminescent devices, since the thermal stress to which the materials are subjected during sublimation is significantly reduced. Alternatively, higher sublimation rates are possible on use of a higher sublimation temperature, which represents an advantage in the industrial preparation of the complexes. For some tris-ortho-metallated metal complexes, decomposition-free or substantially decomposition-free sublimation is only made possible at all by this, and is otherwise impossible due to the high sublimation temperature.
2. The metal complexes according to the invention have higher solubility compared with analogous compounds which contain no structural unit of the formula (3). Thus, many compounds which are otherwise identical to the compounds according to the invention, but contain no structural unit of the formula (3), have only poor solubility or are only soluble in low concentration in a multiplicity of common organic solvents. By contrast, the compounds according to the invention are soluble in significantly higher concentration in a multiplicity of common organic solvents, which also enables the processing and production of the electroluminescent devices from solution. Higher solubility furthermore represents an advantage in the purification of the complexes in the synthesis.
3. The metal complexes according to the invention in some cases have a very narrow emission spectrum, which results in high colour purity of the emission, as is desirable, in particular, for display applications.
4. Organic electroluminescent devices comprising compounds of the formula (1) as emitting materials have a very good lifetime.
5. Organic electroluminescent devices comprising compounds of the formula (1) as emitting materials have excellent efficiency. In particular, the efficiency is significantly higher compared with analogous compounds which contain no structural unit of the formula (3).
6. The compounds according to the invention have higher oxidation stability, in particular in solution, compared with analogous compounds which contain no structural unit of the formula (3) in which one or more groups $R^3$ stand for hydrogen.

These advantages mentioned above are not accompanied by an impairment of the other electronic properties.

The invention is explained in greater detail by the following examples, without wishing to restrict it thereby. The person skilled in the art will be able to produce further electronic devices on the basis of the descriptions without inventive step and will thus be able to carry out the invention throughout the range claimed.

EXAMPLES

The following syntheses are carried out, unless indicated otherwise, in dried solvents under a protective-gas atmosphere. The metal complexes are additionally handled with exclusion of light or under yellow light. The solvents and reagents can be purchased, for example, from Sigma-ALDRICH or ABCR. The respective numbers in square brackets or the numbers indicated for individual compounds relate to the CAS numbers of the compounds known from the literature.

A: Synthesis of the Synthones S, SP, SH, SB

Example SP1: Pinacolyl 1,1,3,3-Tetramethylindane-5-boronate

Variant 1:

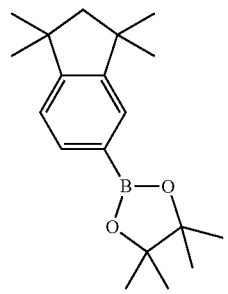

A) 5-Bromo-1,1,3,3-tetramethylindane[169695-24-3], SP1-Br

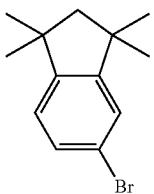

0.6 g of anhydrous iron(III) chloride and then, dropwise with exclusion of light, a mixture of 25.6 ml (500 mol) of bromine and 300 ml of dichloromethane are added to a solution, cooled to 0° C., of 87.2 g (500 mmol) of 1,1,3,3-tetramethylindane [4834-33-7] in 1000 ml of dichloromethane at such a rate that the temperature does not exceed +5° C. The reaction mixture is stirred at room temperature for a further 16 h, 300 ml of saturated sodium sulfite solution are then slowly added, the aqueous phase is separated off, the organic phase is washed three times with 1000 ml of water each time, dried over sodium sulfate, filtered through a short silica-gel column, and the solvent is then stripped off. Finally, the solid is recrystallised once from a little (about 100-150 ml) ethanol. Yield: 121.5 g (480 mmol), 96%; purity: about 95% according to $^1$H-NMR.

B) Pinacolyl 1,1,3,3-tetramethylindane-5-boronate, SP1

A mixture of 25.3 g (100 mmol) of S4-Br, 25.4 g (120 mmol) of bis(pinacolato)diborane [73183-34-3], 29.5 g (300 mmol) of potassium acetate, anhydrous, 561 mg (2 mmol) of tricyclohexylphosphine and 249 mg (1 mmol) of palladium (II) acetate and 400 ml of dioxane is stirred at 80° C. for 16 h. After removal of the solvent in vacuo, the residue is taken up in 500 ml of dichloromethane, filtered through a Celite bed, the filtrate is evaporated in vacuo until crystallisation commences, and finally about 100 ml of methanol are also added dropwise in order to complete the crystallisation. Yield: 27.9 g (93 mmol), 93%; purity: about 95% according to $^1$H-NMR. Boronic acid esters formed as oil can also be reacted further without purification.

Variant 2:

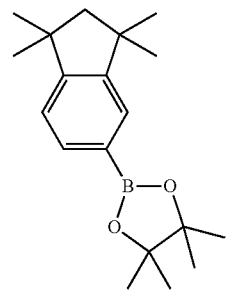

3.3 g (5 mmol) of bis[(1,2,5,6-η)-1,5-cyclooctadiene]di-μ-methoxydiiridium-(I) [12148-71-9], then 2.7 g (10 mmol) of 4,4'-di-tert-butyl-[2,2']bipyridinyl [72914-19-3] and then 5.1 g (10 mmol) of bis(pinacolato)diborane are added to 800 ml of n-heptane, and the mixture is stirred at room temperature for 15 min. 127.0 g (500 mmol) of bis(pinacolato)diborane and then 87.2 g (500 mmol) of 1,1,3,3-tetramethylindane [4834-33-7] are subsequently added, and the mixture is warmed at 80° C. for 12 h (TLC check, heptane: ethyl acetate 5:1). After cooling of the reaction mixture, 300 ml of ethyl acetate are added, the mixture is filtered through a silica-gel bed, and the filtrate is evaporated to dryness in vacuo. The crude product is recrystallised twice from acetone (about 800 ml). Yield: 136.6 g (455 mmol), 91%; purity: about 99% according to $^1$H-NMR.

The following compounds can be prepared analogously:

| Ex. | Starting material | Bromide | Product Boronic acid ester Variant | Yield |
|---|---|---|---|---|
| SP2 | 91324-94-6 | SP2-Br | SP2 | 80% |

-continued

| Ex. | Starting material | Bromide | Product Boronic acid ester Variant | Yield |
|---|---|---|---|---|
| SP2 | 91324-94-6 | — | SP2 1 | 95% |
| SP3 | 142076-41-3 | SP3-Br | SP3 1 | 81% |
| SP4 | 59508-28-0 | SP4-Br | SP4 1 | 78% |
| SP5 | 4486-29-7 | 16499-72-2 SP5-Br | SP5 1 | 80% |

-continued

| Ex. | Starting material | Bromide | Product Boronic acid ester Variant | Yield |
|---|---|---|---|---|
| SP6 | 35185-96-7 | SP6-Br | SP6 1 | 82% |
| SP7 | 113710-83-1 | SP7-Br | SP7 1 | 79% |
| SP7 | 113710-83-1 | — | SP7 2 | 89% |
| SH1 | 6683-46-1 | SH1-Br 27452-17-1 | SH1 1 | 74% |

-continued
| Ex. | Starting material | Bromide | Product Boronic acid ester Variant | Yield |
|---|---|---|---|---|
| SH1 | 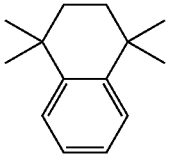<br>6683-46-1 | — | 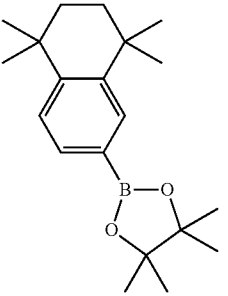<br>2<br>SH1 | 92% |
| SB1 | <br>4175-52-4 | <br>SB1-Br | <br>SB1<br>1 | 80% |
| SB1 | 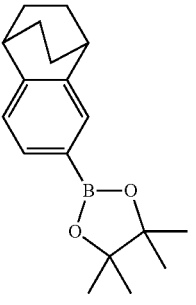 [SMILES: CC1(C)OB(c2ccc3c(c2)C2CCC3CC2)OC1(C)C]<br>4175-52-4 | — | <br>SB1<br>2 | 93% |
| SB2 | 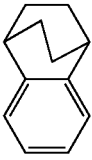 [SMILES: c1ccc2c(c1)C1CCC2CC1]<br>2716-23-6 | 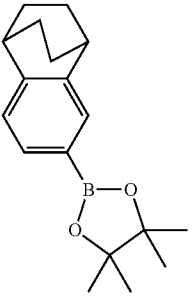 [SMILES: CC1(C)OB(c2ccc3c(c2)C2CCC3CC2)OC1(C)C]<br>SB2-Br | <br>SB2<br>1 | 81% |

-continued
| Ex. | Starting material | Bromide | Product Boronic acid ester Variant | Yield |
|---|---|---|---|---|
| SB2 | 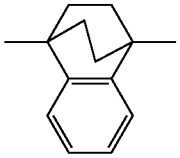<br>2716-23-6 | — | 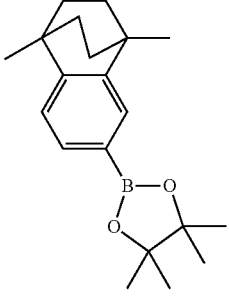<br>SB2<br>2 | 90% |
| SB3 | 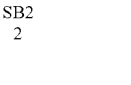<br>60749-53-3 | <br>SB3-Br | <br>SB3<br>1 | 74% |
| SB3 | 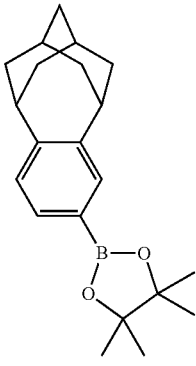 [SMILES: CC1(C)OB(c2ccc3c(c2)C2CC4CC5CC3CC54C2)OC1(C)C]<br>60749-53-3 | — | <br>SB3<br>2 | 94% |

-continued

| Ex. | Starting material | Bromide | Product Boronic acid ester Variant | Yield |
|---|---|---|---|---|
| SH17 | 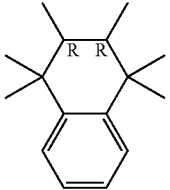<br>853763-39-0 | — | 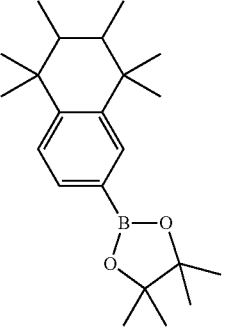<br>SH17<br>2 | 84% |
| SH18 | 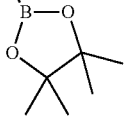<br>872286-95-8 | — | 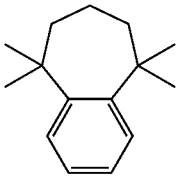<br>SH18<br>2 | 90% |

Example SP8:
5,6-Dibromo-1,1,2,2,3,3-hexamethylindane

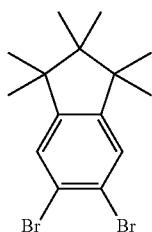

1.3 g of anhydrous iron(III) chloride and then, dropwise with exclusion of light, a mixture of 64.0 ml (1.25 mol) of bromine and 300 ml of dichloromethane are added to a solution of 101.2 g (500 mmol) of 1,1,2,2,3,3-hexamethyl-indane [91324-94-6] in 2000 ml of dichloromethane at such a rate that the temperature does not exceed 25° C. If necessary, the mixture is counter-cooled using a cold-water bath. The reaction mixture is stirred at room temperature for a further 16 h, 500 ml of saturated sodium sulfite solution are then slowly added, the aqueous phase is separated off, the organic phase is washed three times with 1000 ml of water each time, dried over sodium sulfate, filtered through a short silica-gel column, and the solvent is then stripped off. Finally, the solid is recrystallised once from a little (about 100 ml) ethanol. Yield: 135.8 g (377 mmol), 75%; purity: about 95% according to $^1$H-NMR.

The following compounds are prepared analogously:

| Ex. | Starting materials | Product | Yield |
|---|---|---|---|
| SP9 | 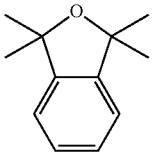<br>113710-83-1 | 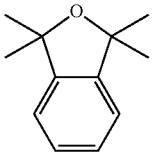<br>SP9 | 80% |
| SH2 | 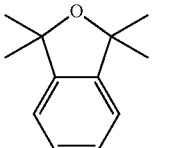<br>6683-46-1 | 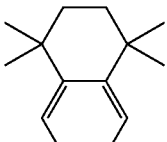<br>184885-74-3<br>SH2 | 76% |

| Ex. | Starting materials | Product | Yield |
|---|---|---|---|
| SB4 | 4175-52-4 | SB4 (Br, Br) | 69% |
| SB5 | 2716-23-6 | SB5 (Br, Br) | 72% |
| SB6 | 60749-53-3 | SB6 (Br, Br) | 78% |

Example SP10:
5,6-Diamino-1,1,2,2,3,3-hexamethylindane

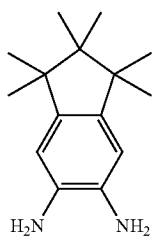

A: 6,6-Dinitro-1,1,2,2,3,3-tetramethylindane, SP10a

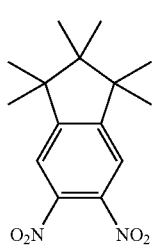

350 ml of 100% by weight nitric acid are slowly added dropwise to a vigorously stirred mixture, cooled to 0° C., of 101.2 g (500 mmol) of 1,1,2,2,3,3-hexamethylindane [91324-94-6] and 350 ml of 95% by weight sulfuric acid at such a rate that the temperature does not exceed +5° C. The reaction mixture is subsequently allowed to warm slowly to room temperature over 2-3 h and is then poured into a vigorously stirred mixture of 6 kg of ice and 2 kg of water. The pH is adjusted to 8-9 by addition of 40% by weight NaOH, the mixture is extracted three times with 1000 ml of ethyl acetate each time, the combined organic phases are washed twice with 1000 ml of water each time, dried over magnesium sulfate, the ethyl acetate is then removed virtually completely in vacuo until crystallisation commences, and the crystallisation is completed by addition of 500 ml of heptane. The beige crystals obtained in this way are filtered off with suction and dried in vacuo. Yield: 136.2 g (466 mmol), 93%; purity: about 94% according to $^1$H-NMR, remainder about 4% of 4,6-dinitro-1,1,3,3-tetramethylindane. About 3% of 4,5-dinitro-1,1,3,3-tetramethylindane, S35b, can be isolated from the mother liquor.

B: 5,6-Diamino-1,1,2,2,3,3-hexamethylindane, S35

136.2 g (466 mmol) of 5,6-dinitro-1,1,2,2,3,3-hexamethylindane, S35a, are hydrogenated at room temperature in 1200 ml of ethanol on 10 g of palladium/carbon at a hydrogen pressure of 3 bar for 24 h. The reaction mixture is filtered twice through a Celite bed, the brown solid obtained after removal of the ethanol is subjected to a bulb-tube distillation (T about 160° C., p about $10^{-4}$ mbar). Yield: 98.5 g (424 mmol), 91%; purity: about 95% according to $^1$H-NMR.

The following compounds are prepared analogously:

| Ex. | Starting materials | Product | Yield |
|---|---|---|---|
| SP11 | 4834-33-7 | SP11 (H$_2$N, NH$_2$) | 84% |
| SP12 | 142076-41-3 | SP11 (H$_2$N, NH$_2$) | 76% |
| SH3 | 6683-46-1 | SH3 (H$_2$N, NH$_2$) | 75% |

-continued

| Ex. | Starting materials | Product | Yield |
|---|---|---|---|
| SB7 | 4175-52-4 | SB7 | 72% |
| SB8 | 2716-23-6 | SB8 | 70% |
| SB9 | 60749-53-3 | SB9 | 74% |

Example SP13: N-[2-(1,1,2,2,3,3-Hexamethylindan-5-yl)ethyl]benzamide

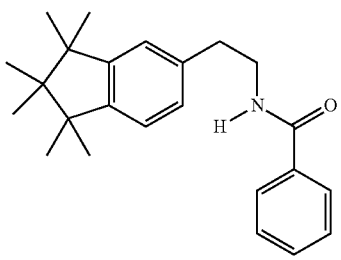 [SMILES: CC1(C)c2ccc(CCNC(=O)c3ccccc3)cc2C(C)(C)C1(C)C]

A: 1,1,2,2,3,3-Hexamethylindane-5-carboxaldehyde, SP13a

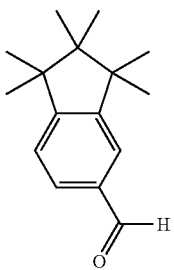 [SMILES: CC1(C)c2ccc(C=O)cc2C(C)(C)C1(C)C]

200 ml (500 mmol) of n-BuLi, 2.5 M in n-hexane, are added dropwise to a vigorously stirred solution, cooled to −78° C., of 140.6 g (500 mmol) of 5-bromo-1,1,2,2,3,3-hexamethylindane, SP2-Br, in 1000 ml of THF at such a rate that the temperature does not exceed −55° C. When the addition is complete, the mixture is stirred for a further 30 min., and a mixture of 42.3 ml (550 mmol) of DMF and 50 ml of THF is then allowed to run in with vigorous stirring. The mixture is stirred at −78° C. for a further 1 h, then allowed to warm to room temperature and quenched by addition of 300 ml of saturated ammonium chloride solution. The organic phase is separated off, the THF is removed in vacuo, the residue is taken up in 500 ml of ethyl acetate, washed once with 300 ml of 5% hydrochloric acid, twice with 300 ml of water each time, once with 300 ml of saturated sodium chloride solution, the organic phase is dried over magnesium sulfate, and the solvent is then removed in vacuo. The residue is employed in step B without further purification. Yield: 107.1 g (465 mmol), 93%; purity: about 95% according to $^1$H-NMR.

The following compounds can be prepared analogously:

| Ex. | Starting material | Product | Yield |
|---|---|---|---|
| SP14a | SP3-Br | SP14a | 91% |
| SH4a | SH1-Br | SH4a | 89% |
| SB10a | SB3-Br | SB10a | 88% |

B: 2-(1,1,2,2,3,3-Hexamethyl-5-Indanyl)ethylamine, SP13b

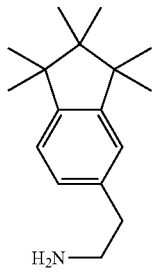

A mixture of 80.6 g (350 mmol) of 1,1,2,2,3,3-hexamethylindane-5-carboxaldehyde, SP13a, 400 ml of nitromethane and 4.6 g (70 mmol) of ammonium acetate, anhydrous, is heated under reflux for 2 h until the starting material has been consumed (TLC check). After cooling, the reaction mixture is poured into 1000 ml of water, extracted three times with 300 ml of dichloromethane each time, the combined organic phases are washed three times with saturated sodium hydrogencarbonate solution, three times with 300 ml of water each time and once with 300 ml of saturated sodium chloride solution, dried over magnesium sulfate, and the solvent is removed in vacuo. The dark oily residue is dissolved in 100 ml of THF and slowly added dropwise with ice-cooling to a solution of 38.0 g (1.0 mol) of lithium aluminium hydride in 1000 ml of THF (care: exothermic reaction?). When the addition is complete, the reaction mixture is allowed to warm to room temperature and is stirred at room temperature for a further 20 h. The reaction mixture is hydrolysed with ice-cooling by slow addition of 500 ml of saturated sodium sulfate solution. The salts are filtered off with suction, rinsed with 500 ml of THF, the THF is removed in vacuo, the residue is taken up in 1000 ml of dichloromethane, the solution is washed three times with 300 ml of water each time, once with 300 ml of saturated sodium chloride solution, dried over magnesium sulfate, and the solvent is then removed in vacuo. The purification is carried out by bulb-tube distillation (p about $10^{-4}$ mbar, T=200° C.). Yield: 67.0 g (273 mmol), 78%; purity: about 95% according to $^1$H-NMR.

The following compounds can be prepared analogously:

| Ex. | Starting material | Product | Yield |
|---|---|---|---|
| SP14b | | | 74% |
| SH4b | | | 70% |
| SB10b | | | 72% |

C: N-[2-(1,1,2,2,3,3-Hexamethylindan-5-yl)ethyl]benzamide, SP13

A solution of 14.1 ml (100 mmol) of benzoyl chloride [98-88-4] in 100 ml of dichloromethane is added dropwise with vigorous stirring at 0° C. to a mixture of 24.5 g (100 mmol) of 2-(1,1,2,2,3,3-hexamethyl-5-indanyl)ethylamine, SP13b, 14.1 ml (100 mmol) of triethylamine and 150 ml of dichloromethane at such a rate that the temperature does not exceed 30° C. The mixture is subsequently stirred at room temperature for a further 1 h. The dichloromethane is removed in vacuo, 100 ml of methanol are added to the colourless solid, which is filtered off with suction, washed three times with 50 ml of methanol and dried in vacuo. Yield: 31.1 g (89 mmol), 89%; purity: about 98% according to $^1$H-NMR.

The following compounds can be prepared analogously:

| Ex. | Starting material | Carboxylic acid chloride | Product | Yield |
|---|---|---|---|---|
| SP14 | SP14b | 6613-441 | SP14 | 74% |
| SP15 | SP13b | 6613-441 | SP15 | 86% |
| SP16 | SP13b | 765314-57-6 | SP16 | 88% |
| SP17 | SP13b | 1710-98-1 | SP17 | 83% |

-continued

| Ex. | Starting material | Carboxylic acid chloride | Product | Yield |
|---|---|---|---|---|
| SP18 | SP13b | 14002-51-8 | SP18 | 80% |
| SH4 | SH4b | 98-88-4 | SH4 | 70% |
| SH5 | SH4b | 1710-98-1 | SH5 | 76% |
| SH6 | SH4b | 14002-51-8 | SH6 | 73% |

-continued

| Ex. | Starting material | Carboxylic acid chloride | Product | Yield |
|---|---|---|---|---|
| SH7 | SH4b | 1005786-37-7 | SH7 | 74% |
| SH8 | SH4b | 104224-50-2 | SH8 | 72% |
| SH9 | SH4b | 104224-50-2 | SH9 | 72% |

| Ex. | Starting material | Carboxylic acid chloride | Product | Yield |
|-----|-------------------|--------------------------|---------|-------|
| SH10 | SH4b | 100793-48-4 | SH10 | 76% |
| SB10 | SB10b | 98-88-4 | SB10 | 82% |

Example SP19: 7-Bromo-1,2,3,4-tetrahydro-1,4-methanonaphthalene-6-carbaldehyde

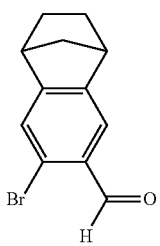

Procedure analogous to L. S. Chen et al., J. Organomet. Chem. 1980, 193, 283-292. 40 mil (100 mmol) of n-BuLi, 2.5 M in hexane, pre-cooled to −110° C., are added to a solution, cooled to −110° C., of 30.2 g (100 mmol) of 6,7-dibromo-1,2,3,4-tetrahydro-1,4-methanonaphthalene [42810-32-2] in a mixture of 1000 ml of THF and 1000 ml of diethyl ether at such a rate that the temperature does not exceed −105° C. The mixture is stirred for a further 30 min., a mixture, pre-cooled to −110° C., of 9.2 ml (120 mmol) of DMF and 100 ml of diethyl ether is then added dropwise, the mixture is then stirred for a further 2 h, allowed to warm to −10° C., 1000 ml of 2 N HCl are added, and the mixture is stirred at room temperature for a further 2 h. The organic phase is separated off, washed once with 500 ml of water, once with 500 ml of saturated sodium chloride solution, dried over magnesium sulfate, the solvent is removed in vacuo, and the residue is subjected to a bulb-tube distillation (T about 90° C., p about $10^{-4}$ mbar). Yield: 15.8 g (63 mmol), 63%; purity: about 95% according to $^1$H-NMR.

| Ex. | Starting materials | Product | Yield |
|-----|--------------------|---------|-------|
| SP20 | SP8 | SP20 | 68% |
| SP21 | SP9 | SP21 | 60% |

-continued

| Ex. | Starting materials | Product | Yield |
|---|---|---|---|
| SH11 | SH2 | SH11 | 60% |
| SB11 | SB4 | SB11 | 55% |
| SB12 | SB5 | SB12 | 50% |

-continued

| Ex. | Starting materials | Product | Yield |
|---|---|---|---|
| SB13 | SB6 | SB13 | 53% |

Example SP22: 7-Phenylethynyl-1,2,3,4-tetrahydro-1,4-methanonaphthalene-6-carbaldehyde 1.6 g (6 mmol) of triphenylphosphine, 674 mg (3 mmol) of palladium(II) acetate, 571 mg (30 mmol) of copper(I) iodide and 15.3 g (150 mmol) of phenylacetylene [536-74-3] are added consecutively to a solution of 25.1 g (100 mmol) of 7-bromo-1,2,3,4-tetrahydro-1,4-methanonaphthalene-6-carbaldehyde, SP19, in a mixture of 200 ml of DMF and 100 ml of triethylamine, and the mixture is stirred at 65° C. for 4 h. After cooling, the precipitated triethylammonium hydrochloride is filtered off with suction, rinsed with 30 ml of DMF. The filtrate is freed from the solvents in vacuo. The oily residue is taken up in 300 ml of ethyl acetate, the solution is washed five times with 100 ml of water each time and once with 100 ml of saturated sodium chloride solution, and the organic phase is dried over magnesium sulfate. After removal of the ethyl acetate in vacuo, the oily residue is chromatographed on silica gel (n-heptane:ethyl acetate 99:1). Yield: 19.6 g (72 mmol), 72%; purity: about 97% according to $^1$H-NMR.

The following derivatives can be prepared analogously:

| Ex. | Bromo-arylaldeyde | Alkyne | Product | Yield |
|---|---|---|---|---|
| SP23 | SP20 | 536-74-3 | SP23 | 69% |
| SP24 | SP20 | 25837-46-1 | S24 | 69% |
| SP25 | SP21 | 2949-26-0 | SP25 | 70% |

-continued
| Ex. | Bromo-arylaldeyde | Alkyne | Product | Yield |
|---|---|---|---|---|
| SH12 | SH11 | 536-74-3 | SH12 | 66% |
| SH13 | SH11 | 188889-51-2 | SH13 | 67% |
| SB14 | SB11 | 536-74-3 | SB14 | 61% |
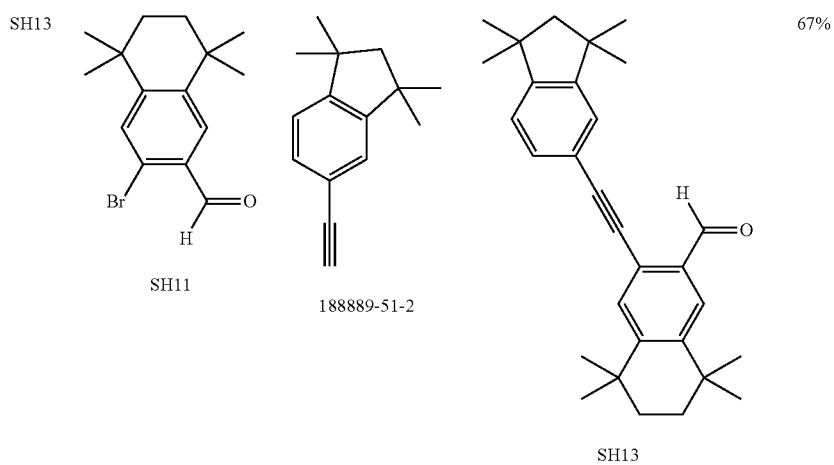
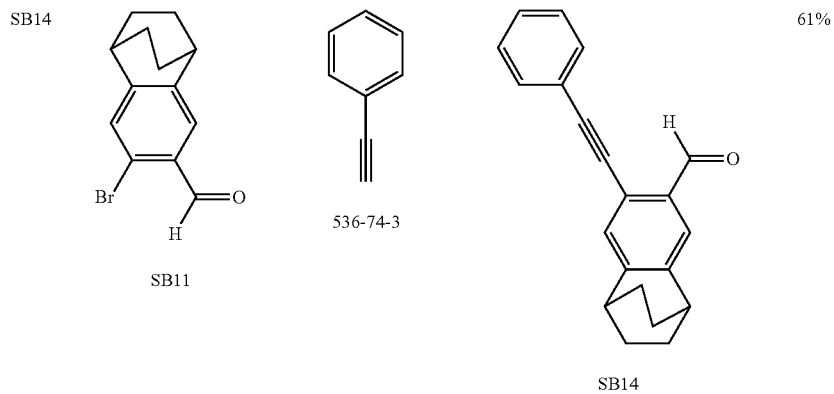

| Ex. | Bromo-arylaldeyde | Alkyne | Product | Yield |
|---|---|---|---|---|
| SB15 | SB12 | 876726-86-2 | SB15 | 63% |
| SB16 | SB13 | 188889-51-2 | SB16 | 73% |

Example SB17

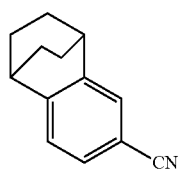

Procedure analogous to G. Zhang et al., Ad. Synth. & Catal., 2011, 353(2+3), 291. A mixture of 28.4 g (100 mmol) of SB1, 9.4 g (105 mmol) of copper(I) cyanide, 41.5 g (300 mmol) of potassium carbonate, 100 g of glass beads (diameter 3 mm) and 400 ml of DMF and 3.6 ml of water is stirred at 70° C. for 10 h. After cooling, the DMF is substantially removed in vacuo, the residue is diluted with 500 ml of dichloromethane, the salts are filtered off through a Celite bed, the filtrate is washed three times with 200 ml of water and once with 100 ml of saturated sodium chloride solution and then dried over magnesium sulfate. The oily residue which remains after removal of the dichloromethane is distilled in a bulb tube. Yield: 11.5 g (63 mmol), 63%; purity: about 97% according to $^1$H NMR.

The following compounds can be prepared analogously:

| Ex. | Starting material | Product | Yield |
|---|---|---|---|
| SP26 SP1 | | SP26 | 58% |
| SP27 SP2 | | SP27 | 60% |
| SP28 SP7 | | S28 | 61% |
| SH14 SH1 | | SH14 | 62% |
| SB18 SB2 | | SB18 | 65% |
| SB19 SB3 | | SB19 | 66% |

Example SH15:
Bis-(1,1,4,4-tetramethyltetrahydronaphth-6-yl) ether

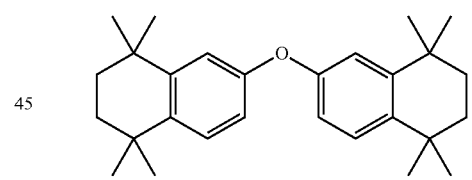

Procedure analogous to G. Chen et al., Tetrahedron Letters 2007, 48, 3, 47. A vigorously stirred mixture of 53.5 g (200 mmol) of 6-bromo-1,1,4,4-tetramethyltetrahydronaphthalene, SH1-Br, 212.2 g (800 mmol) of tripotassium phosphate trihydrate, 300 g of glass beads (diameter 3 mm), 449 mg (2 mmol) of palladium(II) acetate, 809 mg (4 mmol) of tri-tert-butylphosphine and 1000 ml of dioxane is heated under reflux for 20 h. After cooling, the salts are filtered off with suction and rinsed with 300 ml of dioxane, the filtrate is evaporated in vacuo, the residue is taken up in 500 ml of ethyl acetate, the solution is washed three times with 300 ml of water each time, once with 300 ml of saturated sodium chloride solution and dried over magnesium sulfate, and the ethyl acetate is then removed in vacuo. The residue is purified by bulb-tube distillation (p about $10^{-4}$ mbar, T about 180° C.). Yield: 28.1 g (72 mmol), 72%; purity: about 96% according to $^1$H-NMR.

Example S1: 27-Di-tert-butyl-9,9'-(6-bromopyridin-2-yl)xanthene, S1

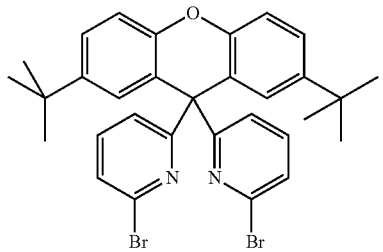 [SMILES: CC(C)(C)c1ccc2c(c1)C(c1cccc(Br)n1)(c1cccc(Br)n1)c1cc(C(C)(C)C)ccc1O2]

120 ml (300 mmol) of n-BuLi, 2.5 M in n-hexane, are added at room temperature to a solution of 84.7 g (300 mmol) of di(4-tert-butylphenyl) ether [24085-65-2] in 1500 ml of diethyl ether, and the mixture is then stirred under reflux for 60 h. After the reaction mixture has been cooled to −10° C., 82.1 g (240 mmol) of bis(6-bromopyridin-2-yl) methanone are added in portions, and the mixture is then stirred at −10° C. for a further 1.5 h. The reaction mixture is quenched by addition of 30 ml of ethanol, the solvent is removed completely in vacuo in a rotary evaporator, the residue is taken up in 1000 ml of glacial acetic acid, 150 ml of acetic anhydride and then, dropwise, 30 ml of conc. sulfuric acid are added with stirring, and the mixture is stirred at 60° C. for a further 3 h. The solvent is then removed in vacuo, the residue is taken up in 1000 ml of dichloromethane, and the mixture is rendered alkaline by addition of 10% by weight aqueous NaOH with ice-cooling. The organic phase is separated off, washed three times with 500 ml of water each time, dried over magnesium sulfate, the organic phase is evaporated to dryness, and the residue is taken up in 500 ml of methanol, homogenised at elevated temperature and then stirred for a further 12 h, during which the product crystallises. The solid obtained after filtration with suction is dissolved in 1000 ml of dichloromethane, the solution is filtered through a Celite bed, the filtrate is evaporated to dryness, the residue is recrystallised twice from toluene:methanol (1:1) and then dried in vacuo. Yield: 56.3 g (87 mmol), 36%; purity: about 95% according to $^1$H-NMR.

The following compound can be prepared analogously:

B: Synthesis of Ligands LP, LH and LB

Example LP1:
2-(1,1,3,3-Tetramethylindan-5-yl)pyridine, LP1

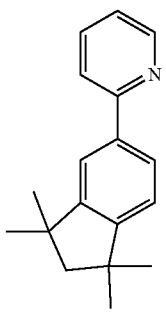 [SMILES: CC1(C)CC(C)(C)c2cc(-c3ccccn3)ccc21]

821 mg (2 mmol) of S-Phos and then 249 mg (1 mmol) of palladium(II) acetate are added to a mixture of 30.0 g (100 mmol) of pinacolyl 1,1,3,3-tetramethylindane-5-boronate, SP-1, 17.4 g (110 mmol) of 2-bromo-pyridine [109-04-6], 46.1 g (200 mmol) of tripotassium phosphate monohydrate, 300 ml of dioxane and 100 ml of water, and the mixture is heated under reflux for 16 h. After cooling, the aqueous phase is separated off, the organic phase is evaporated to dryness, the residue is taken up in 500 ml of ethyl acetate, the organic phase is washed three times with 200 ml of water each time, once with 200 ml of saturated sodium chloride solution, dried over magnesium sulfate, the desiccant is filtered off via a Celite bed, and the filtrate is re-evaporated to dryness. The oil obtained in this way is freed from low-boiling components and non-volatile secondary components by fractional bulb-tube distillation twice. Yield: 15.3 g (61 mmol), 61%; purity: about 99.5% according to $^1$H-NMR.

The following compounds are prepared analogously. Solids are freed from low-boiling components and non-volatile secondary components by recrystallisation and fractional sublimation (p about $10^{-4}$-$10^{-5}$ mbar, T about 160-240° C.). Oils are purified by chromatography, subjected to fractional bulb-tube distillation or dried in vacuo in order to remove low-boiling components.

| Ex. | Starting material | Product | Yield |
|---|---|---|---|
| SH16 | SH15 | SH16 | 30% |

| Ex. | Product Boronic acid ester | Bromide | Ligand | Yield |
|---|---|---|---|---|
| LP2 | 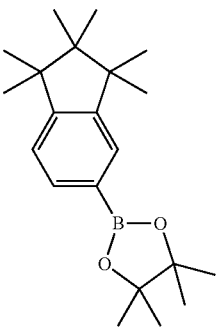<br>SP2 | 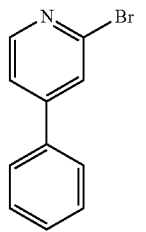<br>54151-74-5 | 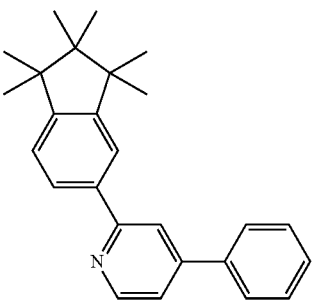 [SMILES: CC1(C)c2ccc(-c3cc(-c4ccccc4)ccn3)cc2C(C)(C)C1(C)C] | 66% |
| LP3 | 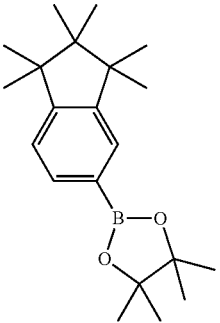<br>SP2 | 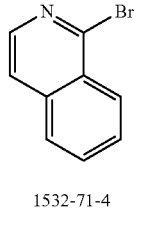<br>1532-71-4 | 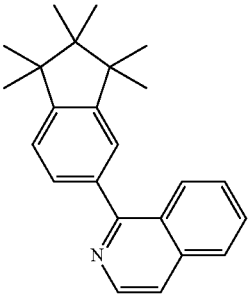 [SMILES: CC1(C)c2ccc(-c3nccc4ccccc34)cc2C(C)(C)C1(C)C] | 67% |
| LP4 | 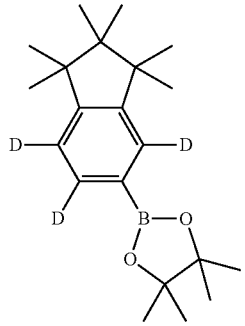 [SMILES: [2H]c1c([2H])c2c(c([2H])c1B1OC(C)(C)C(C)(C)O1)C(C)(C)C(C)(C)C2(C)C]<br>SP3 | 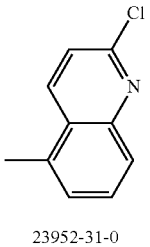<br>23952-31-0 | 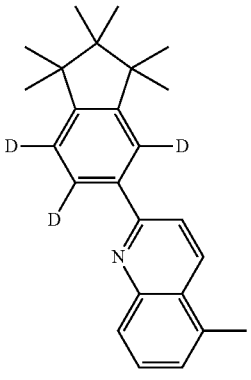 [SMILES: [2H]c1c([2H])c2c(c([2H])c1-c1ccc3c(C)cccc3n1)C(C)(C)C(C)(C)C2(C)C] | 61% |
| LP5 | 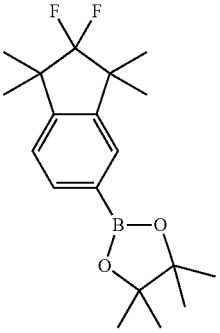<br>SP4 | 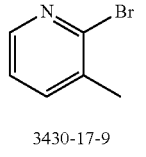<br>3430-17-9 | 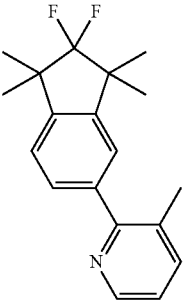 | 63% |

-continued

| Ex. | Product Boronic acid ester | Bromide | Ligand | Yield |
|---|---|---|---|---|
| LP6 | SP5 | 23952-31-0 | | 58% |
| LP7 | SP7 | 132118-28-6 | | 59% |
| LH1 | SH1 | 109-04-6 | | 60% |
| LH2 | SH1 | 107351-82-6 | | 63% |

-continued
| Ex. | Product Boronic acid ester | Bromide | Ligand | Yield |
|---|---|---|---|---|
| LH3 | 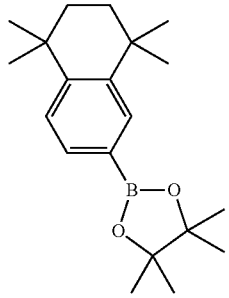 SH1 | 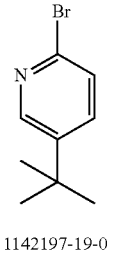 1142197-19-0 | 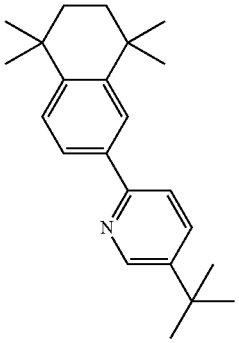 [SMILES: CC(C)(C)c1ccc(-c2ccc3c(c2)C(C)(C)CCC3(C)C)nc1] | 63% |
| LH4 | 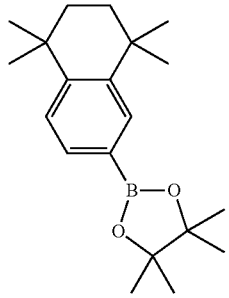 SH1 | 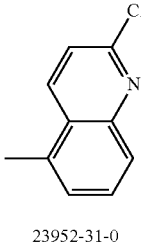 23952-31-0 | 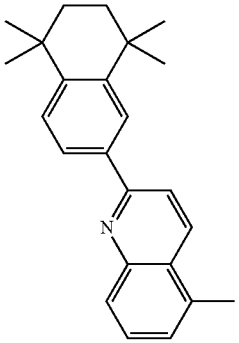 | 64% |
| LH5 | 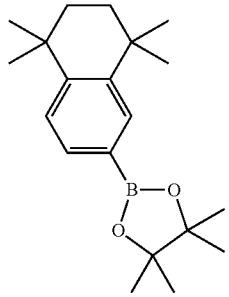 SH1 | 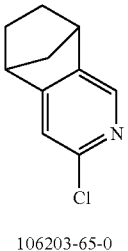 106203-65-0 | 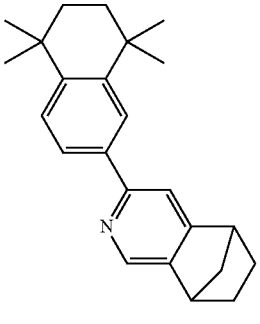 [SMILES: CC1(C)CCC(C)(C)c2cc(-c3cc4c(cn3)C3CCC4C3)ccc21] | 61% |
| LH6 | 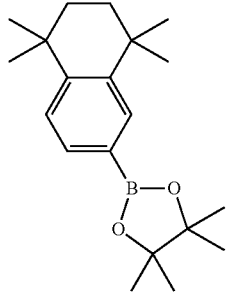 SH1 | 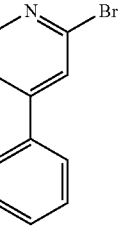 54151-74-5 | 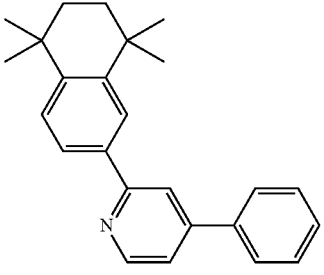 [SMILES: CC1(C)CCC(C)(C)c2cc(-c3cc(-c4ccccc4)ccn3)ccc21] | 59% |

-continued

| Ex. | Product Boronic acid ester | Bromide | Ligand | Yield |
|---|---|---|---|---|
| LH7 | SH1 | 3430-17-9 | | 60% |
| LH8 | SH1 | 959238-69-8 | | 69% |
| LH9 | SH1 | 19493-45-9 | | 63% |
| LH10 | SH1 | 132118-28-6 | | 64% |

-continued
| Ex. | Product Boronic acid ester | Bromide | Ligand | Yield |
|---|---|---|---|---|
| LH11 | 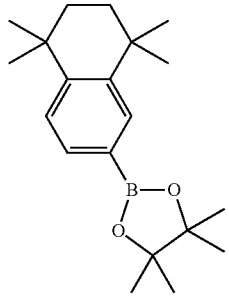 SH1 | 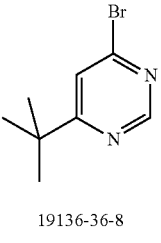 19136-36-8 | 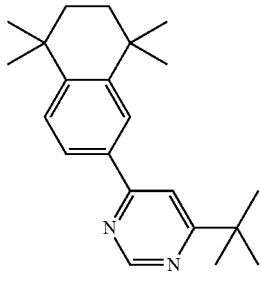 | 67% |
| LH12 | 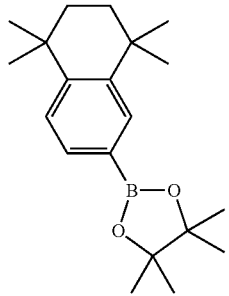 SH1 | 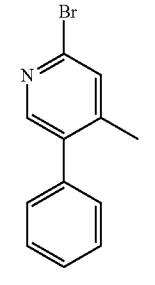 1438809-78-9 | 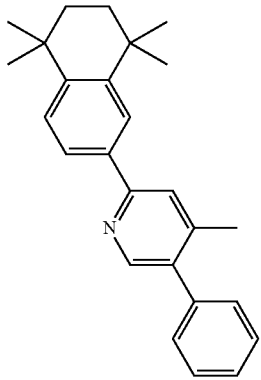 [SMILES: Cc1cc(-c2ccc3c(c2)C(C)(C)CCC3(C)C)ncc1-c1ccccc1] | 60% |
| LH13 | 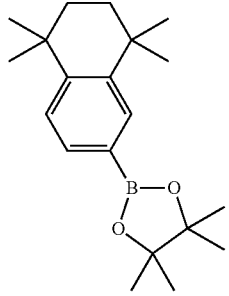 SH1 | 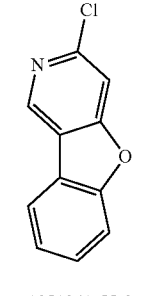 [SMILES: Clc1cc2oc3ccccc3c2cn1] 1251041-55-0 | 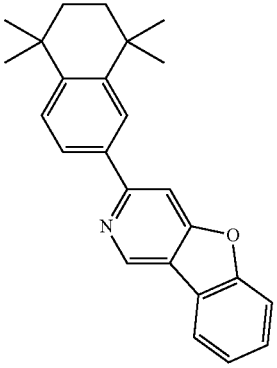 [SMILES: CC1(C)CCC(C)(C)c2cc(-c3cc4oc5ccccc5c4cn3)ccc21] | 62% |
| LH14 | 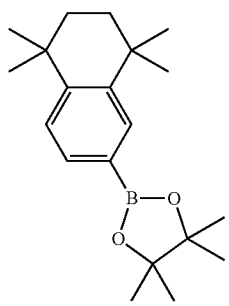 SH1 2.2 eq. of boronic acid | 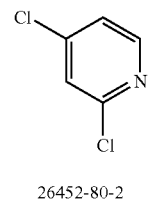 26452-80-2 | 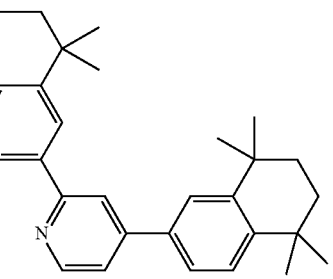 | 65% |

-continued

| Ex. | Product Boronic acid ester | Bromide | Ligand | Yield |
|---|---|---|---|---|
| LH15 | SH1 2.2 eq. of boronic acid | 3430-26-0 | | 63% |
| LB1 | SB1 | 109-04-6 | | 60% |
| LB2 | SB1 | 107351-82-6 | | 55% |
| LB3 | SB1 | 54151-74-5 | | 58% |

-continued

| Ex. | Product Boronic acid ester | Bromide | Ligand | Yield |
|---|---|---|---|---|
| LB4 | SB1 | 1532-71-4 | | 54% |
| LB5 | SB1 | 19493-45-9 | | 50% |
| LB6 | SB1 | 132118-28-6 | | 48% |
| LB7 | SB1 | 959238-69-8 | | 57% |

-continued

| Ex. | Product Boronic acid ester | Bromide | Ligand | Yield |
|---|---|---|---|---|
| LB8 | SB1 | 106203-65-0 | | 55% |
| LB9 | SB1 2.2 eq. of boronic acid | 26452-80-2 | | 48% |
| LB10 | SB2 | 109-04-6 | | 61% |
| LB11 | SB2 | 1438809-789-9 | | 60% |

-continued
| Ex. | Product Boronic acid ester | Bromide | Ligand | Yield |
|---|---|---|---|---|
| LB12 | 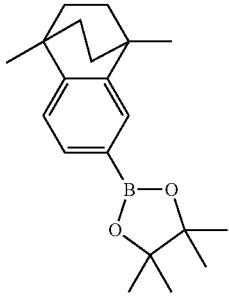<br>SB2 | 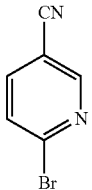<br>139585-70-9 | 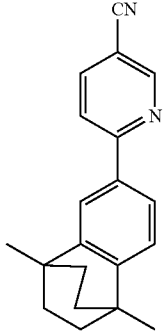 | 57% |
| LB13 | 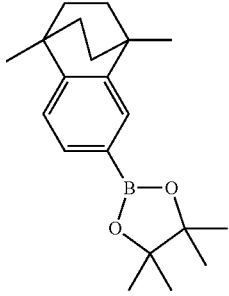<br>SB2 | 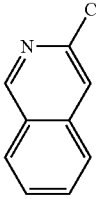<br>19493-45-9 | 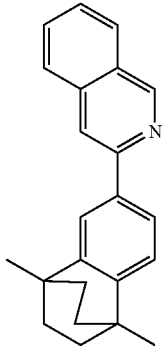 | 56% |
| LB14 | 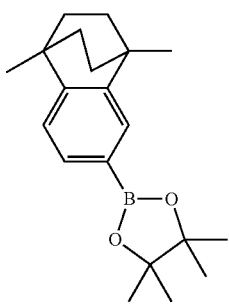<br>SB2 | 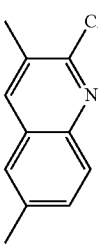<br>132118-28-6 | 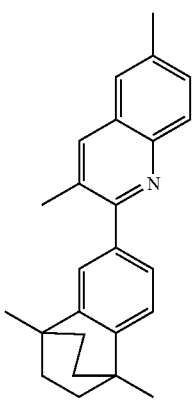 [SMILES: Cc1ccc2nc(-c3ccc4c(c3)C3(C)CCC4(C)CC3)c(C)cc2c1] | 59% |
| LB15 | 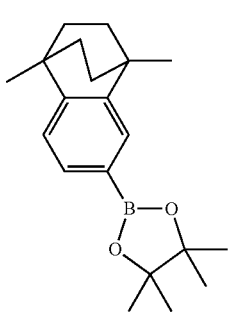<br>SB2 | 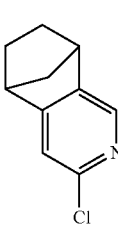<br>106203-65-0 | 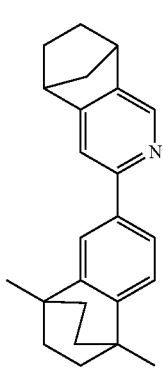 | 53% |

-continued
| Ex. | Product Boronic acid ester | Bromide | Ligand | Yield |
|---|---|---|---|---|
| LB16 | 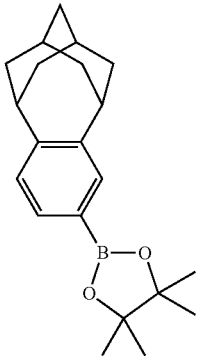 SB3 | 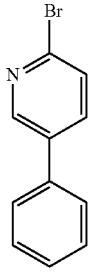 107351-82-6 | 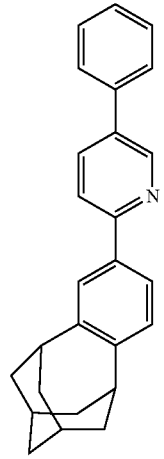 | 62% |
| LB17 | 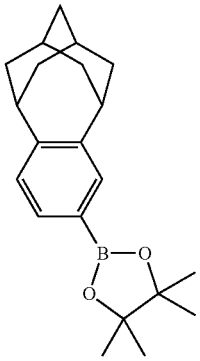 SB3 | 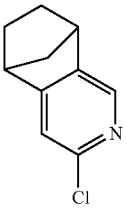 106203-65-0 | 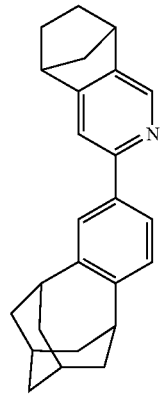 [SMILES: c1cc2c(cc1-c1cc3c(cn1)C1CCC3C1)C1CC3CC4CC2CC43C1] | 59% |
| LB18 | 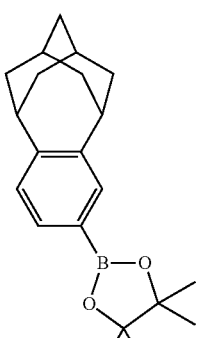 SB3 | 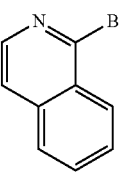 1532-71-4 | 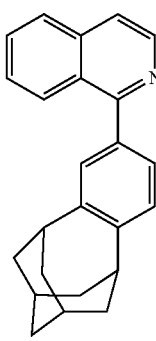 | 57% |

-continued
| Ex. | Product Boronic acid ester | Bromide | Ligand | Yield |
|---|---|---|---|---|
| LB19 | 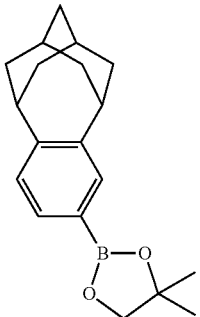 SB4 | 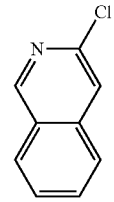 [SMILES: Clc1cc2ccccc2cn1] 19493-45-9 | 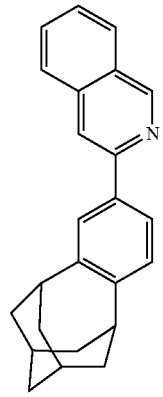 [SMILES: c1ccc2cc(-c3ccc4c(c3)C3CC5CC6CC4CC65C3)ncc2c1] | 60% |
| LB20 | 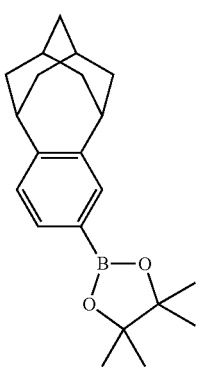 SB3 | 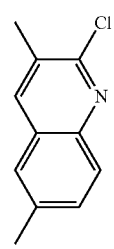 132118-28-6 | 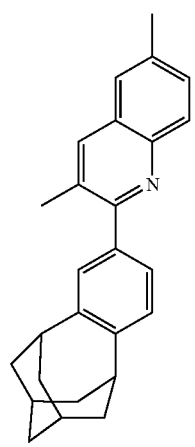 [SMILES: Cc1ccc2nc(-c3ccc4c(c3)C3CC5CC6CC4CC65C3)c(C)cc2c1] | 62% |
| LB21 | 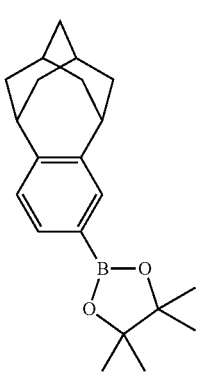 SB4 2.2 eq. of boronic acid | 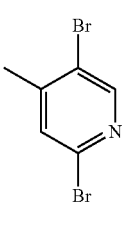 3430-26-0 | 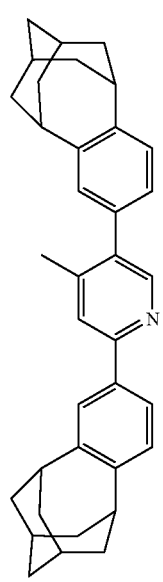 | 47% |

-continued

| Ex. | Product Boronic acid ester | Bromide | Ligand | Yield |
|---|---|---|---|---|
| LH53 | SH17 | 54151-74-5 | | 45% |
| LH54 | SH17 | 1438809-78-9 | | 48% |
| LH55 | SH18 | 54151-74-5 | | 40% |

| Ex. | Product Boronic acid ester | Bromide | Ligand | Yield |
|---|---|---|---|---|
| LH56 | SH18 | 1438809-78-9 | | 42% |

Example LP8: 5,5,7,7-Tetramethyl-3-phenyl-6,7-dihydro-5H-[2]pyridino

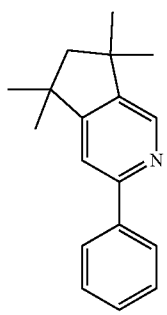

Procedure analogous to A. Mazzanti et al., Eur. J. Org. Chem., 2011, 6725.

40 ml (100 mmol) of n-butyllithium, 2.5 M in n-hexane, are added dropwise to a mixture, cooled to −78° C., of 10.5 ml (100 mmol) of bromobenzene and 500 ml of diethyl ether, and the mixture is stirred for a further 30 min. 17.5 g (100 mmol) of 5,5,7,7-tetramethyl-6,7-dihydro-5H-[2]pyridine [1562418-53-4], are then added dropwise, the mixture is allowed to warm to room temperature, stirred for a further 12 h, quenched by addition of 100 ml of water, the organic phase is separated off, dried over magnesium sulfate. After removal of the solvent, the oily residue is chromatographed on silica gel with diethyl ether:n-heptane (3:7, v:v) and subsequently subjected to fractional bulb-tube distillation twice. Yield: 12.1 g (48 mmol), 48%; purity: about 99.5% according to ¹H-NMR.

The following compounds can be prepared analogously. Solids are freed from low-boiling components and non-volatile secondary components by recrystallisation and fractional sublimation (p about $10^{-4}$-$10^{-5}$ mbar, T about 160-240° C.). Oils are purified by chromatography, subjected to fractional bulb-tube distillation or dried in vacuo in order to remove low-boiling components.

| Ex. | Pyridine | Bromide | Ligand | Yield |
|---|---|---|---|---|
| LH16 | | SH1-Br | | 38% |

Example LP9: 6,6,7,7,8,8-Hexamethyl-2-phenyl-7,8-dihydro-6H-cyclopenta[g]quinoxaline

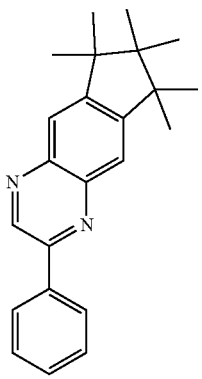 [SMILES: CC1(C)c2cc3ncc(-c4ccccc4)nc3cc2C(C)(C)C1(C)C]

Procedure analogous to S. V. More et al., Tetrahedron Lett. 2005, 46, 6345.

A mixture of 23.2 g (100 mmol) of 1,1,2,2,3,3-hexamethylindane-5,6-diamine, SP10, 13.4 g (100 mmol) of oxo-phenylacetaldehyde [1074-12-0], 767 mg (3 mmol) of iodine and 75 ml of acetonitrile is stirred at room temperature for 16 h. The precipitated solid is filtered off with suction, washed once with 20 ml of acetonitrile, twice with 75 ml of n-heptane each time and then recrystallised twice from ethanolethyl acetate. Finally, the solid is freed from low-boiling components and non-volatile secondary components by fractional sublimation (p about $10^{-4}$-$10^{-5}$ mbar, T about 220° C.). Yield: 22.1 g (67 mmol), 67%; purity: about 99.5% according to $^1$H-NMR.

The following compounds are prepared analogously. Solids are freed from low-boiling components and non-volatile secondary components by recrystallisation and fractional sublimation (p about $10^{-4}$-$10^{-5}$ mbar, T about 160-240° C.). Oils are purified by chromatography, subjected to fractional bulb-tube distillation or dried in vacuo in order to remove low-boiling components.

| Ex. | Diamine | Diketone | Ligand | Yield |
|---|---|---|---|---|
| LP10 | 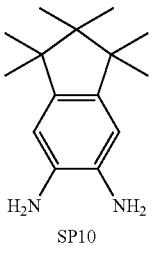 SP10 | 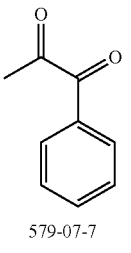 579-07-7 | 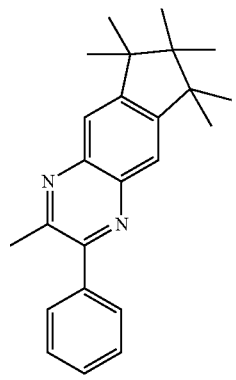 | 58% |
| LH17 | 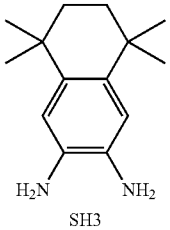 SH3 | 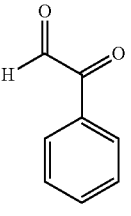 1074-12-0 | 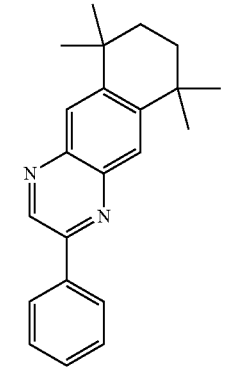 [SMILES: CC1(C)CCC(C)(C)c2cc3nc(-c4ccccc4)cnc3cc21] | 46% |
| LH18 | 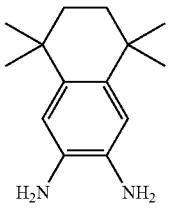 SH3 | 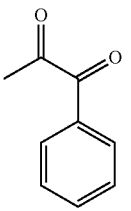 579-07-7 | 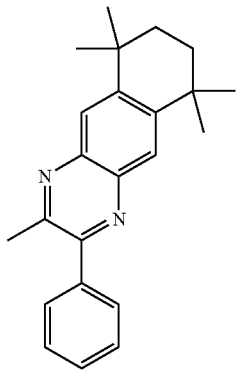 | 49% |

-continued

| Ex. | Diamine | Diketone | Ligand | Yield |
|---|---|---|---|---|
| LH19 | SH3 | 134-81-6 | | 64% |
| LB22 | SB7 | 579-07-7 | | 44% |
| LB23 | SB7 | 134-81-6 | | 67% |
| LB24 | SB9 | 579-07-7 | | 43% |

| Ex. | Diamine | Diketone | Ligand | Yield |
|---|---|---|---|---|
| LB25 | SB9 | 134-81-6 | | 59% |

Example LP11: 5,5,6,6,7,7-Hexamethyl-1,2-diphenyl-1,5,6,7-tetrahydroindeno[5,6-d]imidazole

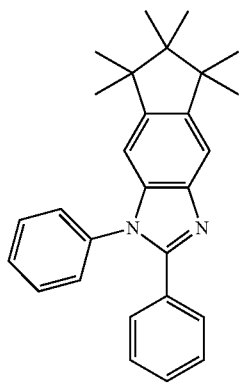 [SMILES: CC1(C)c2cc3nc(-c4ccccc4)n(-c4ccccc4)c3cc2C(C)(C)C1(C)C]

Procedure analogous to D. Zhao et al., Org. Lett., 2011, 13, 24, 6516. A mixture of 36.0 g (100 mmol) of 5,6-dibromo-1,1,2,2,3,3-hexamethylindane SP8, 21.6 g (110 mmol) of N-phenylbenzamidine [1527-91-9], 97.8 g (300 mmol) of caesium carbonate, 100 g of 4 A molecular sieve, 1.2 g (2 mmol) of xantphos, 449 mg (2 mmol) of palladium (II) acetate and 600 ml of o-xylene is heated under reflux with vigorous stirring for 24 h. After cooling, the salts are filtered off with suction via a Celite bed, rinsed with 500 ml of o-xylene, the solvent is removed in vacuo, and the residue is recrystallised three times from cyclohexane/ethyl acetate. Finally, the solid is freed from low-boiling components and non-volatile secondary components by fractional sublimation (p about $10^{-4}$-$10^{-5}$ mbar, T about 230° C.). Yield: 28.0 g (71 mmol), 71%; purity: about 99.5% according to $^1$H-NMR.

The following compounds are prepared analogously. Solids are freed from low-boiling components and non-volatile secondary components by recrystallisation and fractional sublimation (p about $10^{-4}$-$10^{-5}$ mbar, T about 160-240° C.). Oils can be purified by chromatography, subjected to fractional bulb-tube distillation or dried in vacuo in order to remove low-boiling components.

| Ex. | 1,2-Dihalogen compound | Benzamidine | Ligand | Yield |
|---|---|---|---|---|
| LH20 | SH2 | 16239-27-3 | | 41% |

-continued
| Ex. | 1,2-Dihalogen compound | Benzamidine | Ligand | Yield |
|---|---|---|---|---|
| LH21 | <br>SH2 | 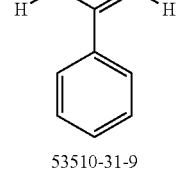<br>53510-31-9 | 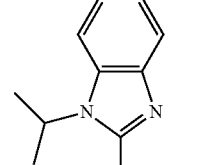 | 36% |
| LH22 | 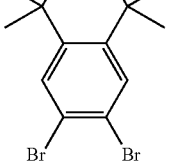<br>SH2 | 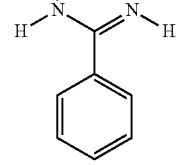<br>34028-17-6 | 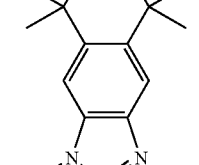 | 40% |
| LB26 | <br>SB4 | 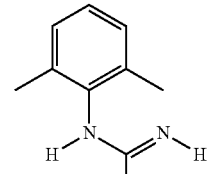<br>16239-27-3 | 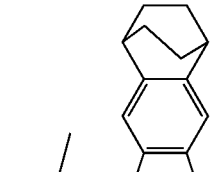 | 44% |

Example LP12: 1,1,5,6,6,7,7-Heptamethyl-3-phenyl-1,5,6,7-tetrahydroindeno[5,6-d]imidazolium iodide, LP12

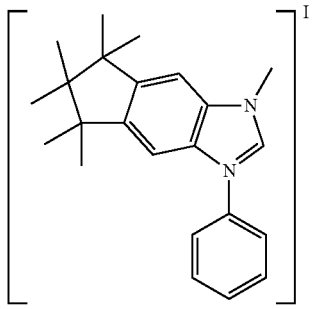

A) 5,6,6,6,7,7-Hexamethyl-1,5,6,7-tetrahydroindeno[5,6-d]imidazole

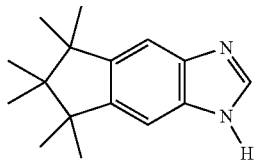 [SMILES: CC1(C)c2cc3nc[nH]c3cc2C(C)(C)C1(C)C]

Procedure analogous to Z.-H. Zhang et al., J. Heterocycl. Chem. 2007, 44, 6, 1509. 1.3 g (5 mmol) of iodine are added to a vigorously stirred mixture of 116.2 g (500 mmol) of 1,1,2,2,3,3-hexamethylindane-5,6-diamine, S35, 90.9 ml (550 mmol) of triethoxymethane [122-51-0] and 400 ml of acetonitrile, and the mixture is stirred at room temperature for 5 h. The precipitated solid is filtered off with suction, washed once with a little acetonitrile, three times with 100 ml of n-heptane each time and dried in vacuo. Yield: 108.8 g (449 mmol), 90%; purity: about 97% according to ¹H-NMR.

B) 5,5,6,6,7,7-Hexamethyl-1-phenyl-1,5,6,7-tetrahydroindeno[5,6-d]-imidazole

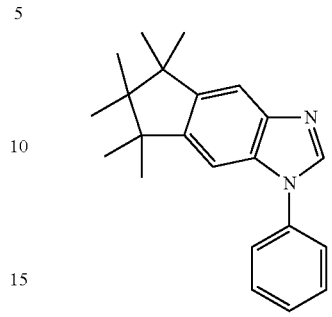

Procedure analogous to S. Zhang et al., Chem. Commun. 2008, 46, 6170. A mixture of 24.2 g (100 mmol) of 5,5,6,6,7,7-hexamethyl-1,5,6,7-tetrahydroindeno[5,6-d]imidazole, A), 12.6 ml (120 mmol) of bromobenzene [108-86-1], 27.6 g (200 mmol) of potassium carbonate, 952 mg (5 mmol) of copper(I) iodide, 1.0 g (10 mmol) of N,N-dimethylglycine, 200 g of glass beads (diameter 3 mm) and 300 ml of DMSO is heated at 120° C. with vigorous stirring for 36 h. After cooling, the salts are filtered off with suction, rinsed with 1000 ml of ethyl acetate, the combined organic phases are washed five times with 500 ml of water each time, once with 500 ml of saturated sodium chloride solution, dried over magnesium sulfate, the solvent is removed in vacuo, and the residue is recrystallised twice from cyclohexane. Yield: 28.3 g (89 mmol), 89%; purity: about 97% according to ¹H-NMR.

C) 1,5,5,6,6,7,7-Heptamethyl-3-phenyl-1,5,6,7-tetrahydroindeno-[5,6-d]imidazolium Iodide 12.6 ml (200 mmol) of methyl iodide [74-88-4] are added with stirring to a suspension of 28.3 g (89 mmol) of 5,5,6,6,7,7-hexamethyl-1-phenyl-1,5,6,7-tetrahydroindeno[5,6-d]imidazole, B), in 100 ml of THF, and the mixture is stirred at 45° C. for 24 h. After cooling, the precipitated solid is filtered off with suction, washed three times with 50 ml of ethanol each time and dried in vacuo. Yield: 23.5 g (51 mmol), 57%; purity: about 99% according to ¹H-NMR.

The following compounds are prepared analogously:

| Ex. | 1,2-Diamine | Brominated aromatic compound Alkyl halide | Ligand | Yield over 3 steps |
|---|---|---|---|---|
| LP13 | SP11 | 623-00-7 MeI | | 46% |

-continued
| Ex. | 1,2-Diamine | Brominated aromatic compound Alkyl halide | Ligand | Yield over 3 steps |
|---|---|---|---|---|
| LH23 | 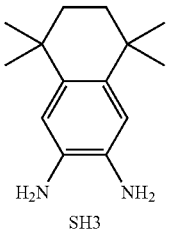<br>SH3 | 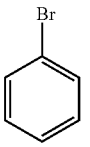<br>108-86-1<br>MeI | 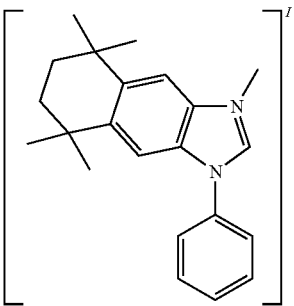 | 40% |
| LH24 | 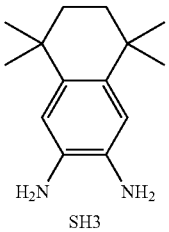<br>SH3 | 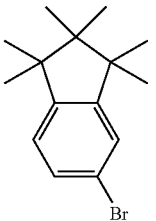<br>SP2-Br<br>MeI | 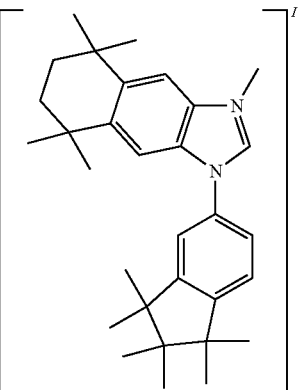 | 38% |
| LB27 | 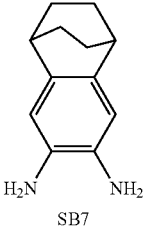<br>SB7 | 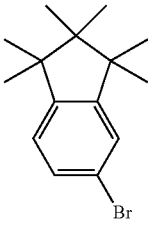<br>SP2-Br<br>MeI | 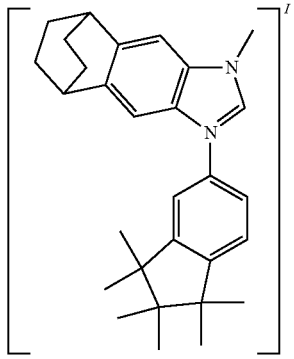 | 37% |
| LB28 | 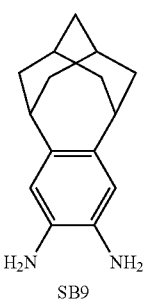<br>SB9 | 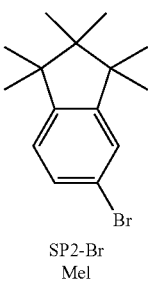<br>SP2-Br<br>MeI | 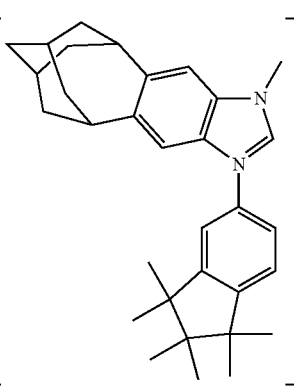 | 39% |

Example LP14: 1,4,4,6,6-Pentamethyl-3-phenyl-1,4,5,6-tetrahydro-cyclopentaimidazolium iodide

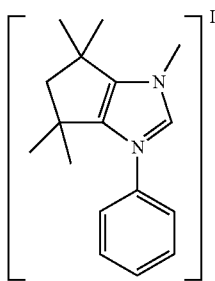

A) 4,4,6,6-Tetramethyl-1,4,5,6-tetrahydrocyclopentaimidazole

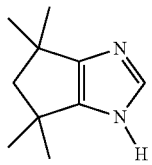

Preparation analogous to G. Bratulescu, Synthesis, 2009, 14, 2319. An intimate mixture of 1.54 g (10.0 mmol) of 3,3,5,5-tetramethylcyclopentane-1,2-dione [20633-06-1], 4.21 g (3.0 mmol) of urotropin, 7.7 g (10 mmol) of ammonium acetate and 0.3 ml of glacial acetic acid is heated in a temperature-controlled microwave until an internal temperature of about 120° C. has been reached, and is then held at this temperature for about 15 min. After cooling, the mass is added to 150 ml of water, the pH is adjusted to 8 using aqueous ammonia solution (10% by weight) with stirring, the precipitated solid is then filtered off with suction and washed with water. After drying, the product is recrystallised from ethanol/ethyl acetate. Yield: 1.17 g (7.1 mmol), 71%; purity: about 98% according to $^1$H-NMR.

B) 4,4,6,6-Tetramethyl-1-phenyl-,4,5,6-tetrahydro-cyclopentaimidazole

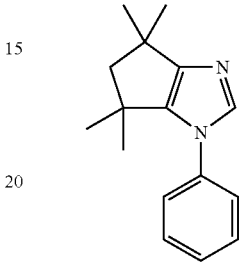

Preparation analogous to LP12, B). Use of 1.64 g (10.0 mmol) of 4,4,6,6-tetramethyl-1,4,5,6-tetrahydrocyclopentaimidazole, A), the remaining starting materials and solvents are correspondingly adapted stoichiometrically. Yield: 1.53 g (6.3 mmol), 63%; purity: about 98% according to $^1$H-NMR.

C) 1,4,4,6,6-Pentamethyl-3-phenyl-1,4,5,6-tetrahydrocyclopenta-imidazolium Iodide Preparation analogous to LP12, C). Use of 2.4 g (10.0 mmol) of 4,4,6,6-tetramethyl-1-phenyl-1,4,5,6-tetrahydro-cyclopentaimidazole, B), the remaining starting materials and solvents are correspondingly adapted stoichiometrically. Yield: 2.26 g (5.9 mmol), 59%; purity: about 99% according to $^1$H-NMR.

The following compounds are prepared analogously:

| Ex. | 1,2-Dione | Brominated aromatic compound Alkyl halide | Ligand | Yield 3 steps |
|---|---|---|---|---|
| LH25 | 20651-89-2 | 108-86-1 | | 28% |

| Ex. | 1,2-Dione | Brominated aromatic compound Alkyl halide | Ligand | Yield 3 steps |
|---|---|---|---|---|
| LB29 | 20651-89-2 | SB1-Br | | 33% |

Example LP15: 1,1,2,2,3,3-Hexamethyl-5-phenyl-2,3-dihydro-1H-6-azacyclopenta[b]naphthalene

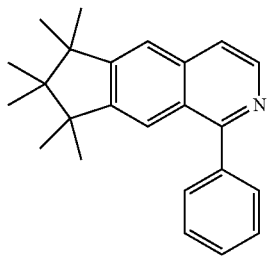 [SMILES: CC1(C)c2cc3ccnc(-c4ccccc4)c3cc2C(C)(C)C1(C)C]

17.0 g (120 mmol) of phosphorus pentoxide are added in portions with vigorous stirring at 90° C. to a solution of 34.8 g (100 mmol) of N-[2-(1,1,2,2,3,3-hexamethylindan-5-yl)ethyl]benzamide, SP13, in 150 ml of o-xylene. 28.0 ml (300 mmol) of phosphoryl chloride are added dropwise to this reaction mixture, which is then stirred under reflux for a further 4 h. The reaction mixture cooled to 80° C. is poured onto 1000 g of ice with vigorous stirring and then rendered alkaline (pH about 12) by addition of solid NaOH. The mixture is extracted three times with 300 ml of toluene each time, the organic phase is washed three times with water, dried over magnesium sulfate, and the solvent is removed in vacuo. The oily residue is dissolved in 200 ml of o-dichlorobenzene, 86.9 g (1 mol) of manganese dioxide are added to the solution, and the mixture is subsequently boiled under reflux on a water separator for 16 h. After cooling, the manganese dioxide is filtered off via a Celite bed, the solid is washed with 500 ml of a mixture of dichloromethane and ethanol (10:1), and the combined filtrates are freed from the solvents in vacuo. The residue is recrystallised from cyclohexane/ethyl acetate and finally freed from low-boiling components and non-volatile secondary components by fractional sublimation (p about $10^{-4}$-$10^{-5}$ mbar, T about 230° C.). Yield: 20.1 g (61 mmol), 61%; purity: about 99.5% according to $^1$H-NMR.

The following compounds can be prepared analogously:

| Ex. | Starting material | Product | Yield |
|---|---|---|---|
| LP16 | SP14 | | 66% |

-continued

| Ex. | Starting material | Product | Yield |
|---|---|---|---|
| LP17 | SP15 | | 67% |
| LP18 | SP16 | | 65% |
| LH6 | SH4 | | 63% |
| LH27 | SH5 | | 60% |

-continued
| Ex. | Starting material | Product | Yield |
|---|---|---|---|
| LH28 | 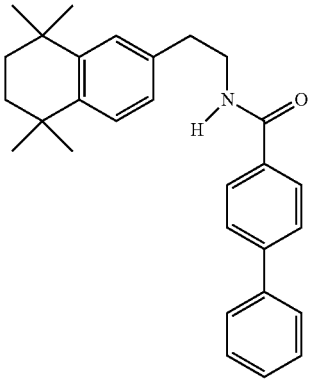 SH6 | 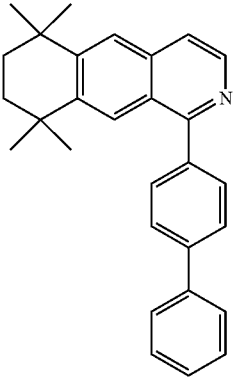 [SMILES: CC1(C)CCC(C)(C)c2cc3c(-c4ccc(-c5ccccc5)cc4)nccc3cc21] | 63% |
| LH29 | 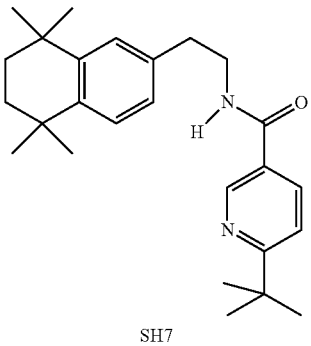 SH7 | 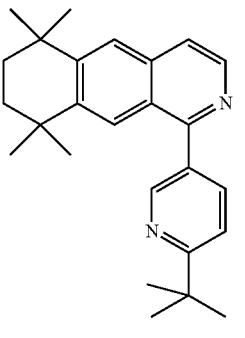 [SMILES: CC(C)(C)c1ccc(-c2nccc3cc4c(cc23)C(C)(C)CCC4(C)C)cn1] | 48% |
| LH30 | 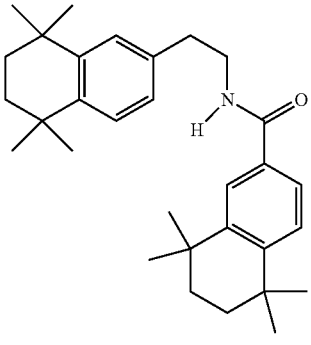 SH8 | 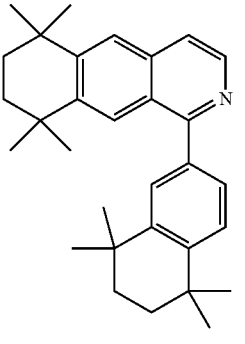 [SMILES: CC1(C)CCC(C)(C)c2cc(-c3nccc4cc5c(cc34)C(C)(C)CCC5(C)C)ccc21] | 65% |
| LH31 | 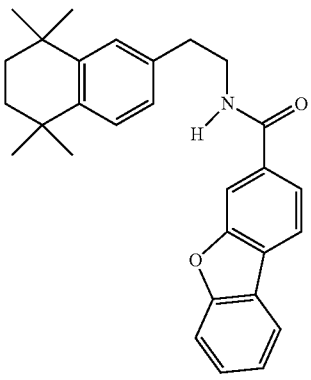 SH9 | 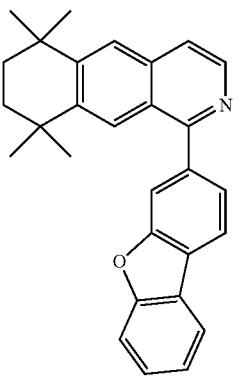 [SMILES: CC1(C)CCC(C)(C)c2cc3c(-c4ccc5c(c4)oc4ccccc45)nccc3cc21] | 61% |

| Ex. | Starting material | Product | Yield |
|---|---|---|---|
| LH32 | 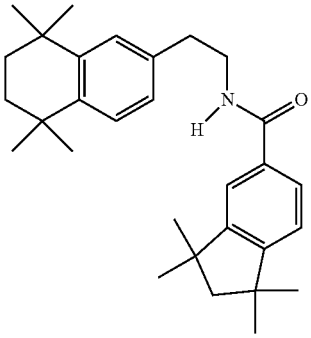 SH10 | 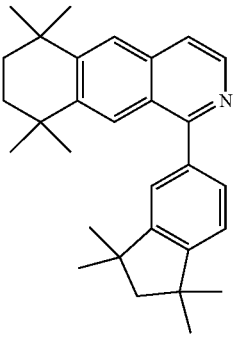 [SMILES: CC1(C)CCC(C)(C)c2cc3c(-c4ccc5c(c4)C(C)(C)CC5(C)C)nccc3cc21] | 66% |
| LB30 | 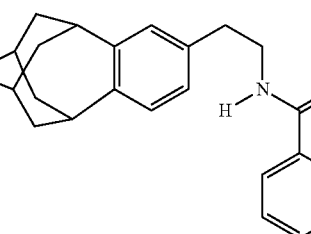 SB10 | 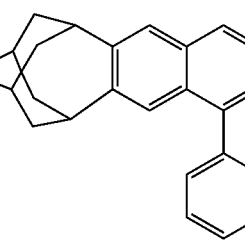 | 63% |

Example LP19: 7,8,9,10-Tetrahydro-7,10-methano-6-phenylphenanthridine

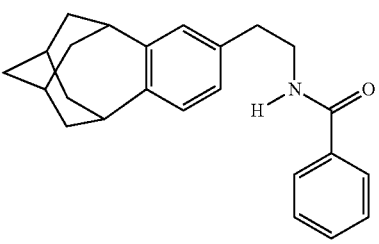

14.2 g (100 mmol) of boron trifluoride etherate are added dropwise to a vigorously stirred mixture of 46.6 g (500 mmol) of aniline, 58.4 g (550 mmol) of benzaldehyde, 94.2 g (1 mol) of norbornene and 1300 ml of dichloromethane, and the mixture is then heated under reflux for 40 h. After cooling, the reaction mixture is washed twice with 400 ml of water each time, the organic phase is dried over magnesium sulfate, and the dichloromethane is then removed in vacuo. The residue is taken up in 1000 ml of o-dichlorobenzene, 435 g (5 mol) of manganese dioxide are added, and the mixture is heated under reflux on a water separator for 16 h. After cooling, 1000 ml of ethyl acetate are added, the manganese dioxide is filtered off with suction via a Celite bed, the manganese dioxide is rinsed with 1000 ml of ethyl acetate, and the combined filtrates are freed from the solvents in vacuo. The residue is recrystallised twice from cyclohexane and finally freed from low-boiling components and non-volatile secondary components by fractional sublimation (p about $10^{-4}$-$10^{-5}$ mbar, T about 230° C.). Yield: 76.0 g (280 mmol), 56%; purity: about 99.5% according to $^1$H-NMR.

The following compounds can be prepared analogously:

| Ex. | Starting material | Product | Yield |
|---|---|---|---|
| LP20 | 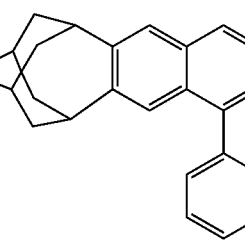 498-66-8, 62-53-3, 5779-95-3 | 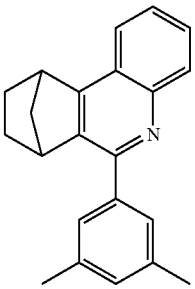 | 66% |
| LB31 | 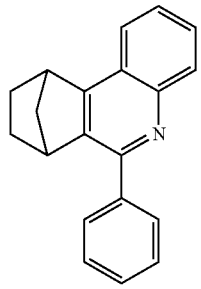 [SMILES: c1ccc(-c2nc3ccccc3c3c2C2CCC3C2)cc1] 931-64-6 | 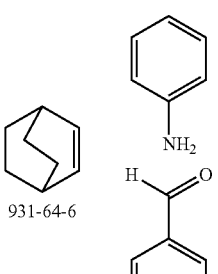 | 27% |

143
-continued

| Ex. | Starting material | Product | Yield |
|---|---|---|---|
| LB32 | 106-49-0 | | 27% |

Example LP21: 5,8-Methano-5,6,7,8-tetrahydro-3-phenyl-2-aza-anthracene

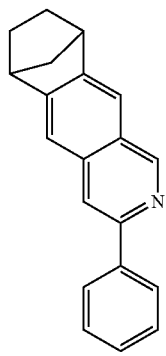 [SMILES: c1ccc(-c2cc3cc4c(cc3cn2)C2CCC4C2)cc1]

A mixture of 13.6 g (50 mmol) of 7-(3,3-dimethylbut-1-ynyl)-1,2,3,4-tetrahydro-1,4-methanonaphthalene-6-carbaldehyde, SP22, and 500 ml of methanolic ammonia solution (2 M) is stirred at 140° C. for 5 h in an autoclave. After cooling, the methanol is removed in vacuo, the oily residue is chromatographed on silica gel (n-heptane:ethyl acetate 95:5) and finally freed from low-boiling components and non-volatile secondary components by fractional sublimation (p about $10^{-4}$-$10^{-5}$ mbar, T about 230° C.). Yield: 5.1 g (17 mmol), 34%; purity: about 99.5% according to $^1$H-NMR.

The following derivatives can be prepared analogously:

| Ex. | Starting material | Product | Yield |
|---|---|---|---|
| LP22 | SP23 | | 37% |
| LP23 | SP24 | | 29% |

-continued
| Ex. | Starting material | Product | Yield |
|---|---|---|---|
| LP24 | | | 30% |
| LH33 | | | 27% |
| LH34 | | | 29% |
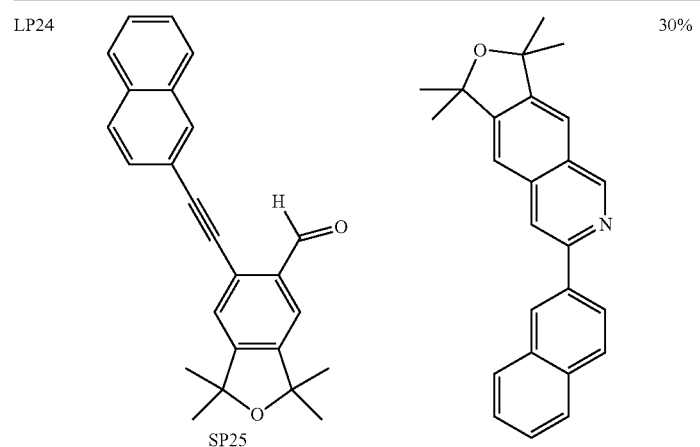
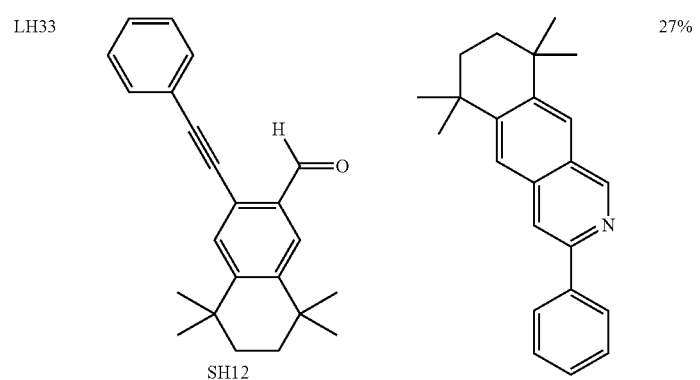
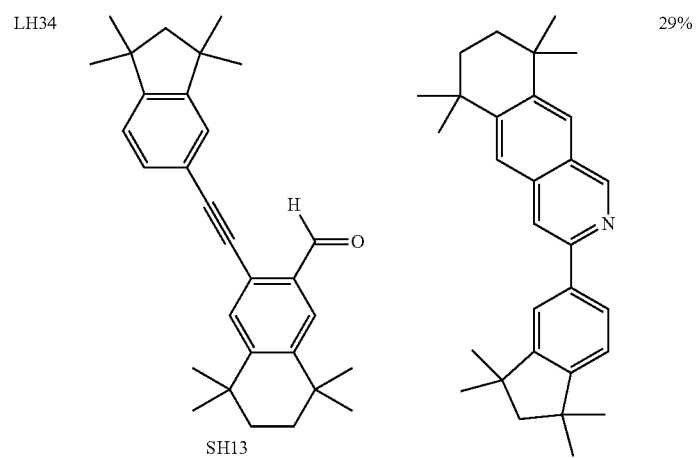

| Ex. | Starting material | Product | Yield |
|---|---|---|---|
| LB33 | 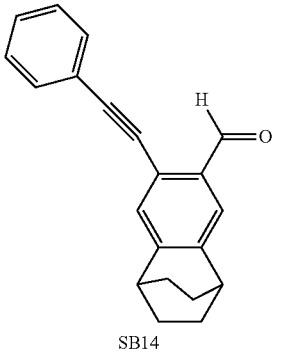 [SMILES: O=Cc1cc2c(cc1C#Cc1ccccc1)C1CCC2CC1 ; "SB14"]<br>SB14 | 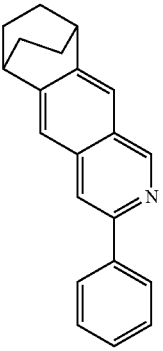 [SMILES: c1ccc(-c2cc3cc4c(cc3cn2)C2CCC4CC2)cc1] | 28% |
| LB34 | 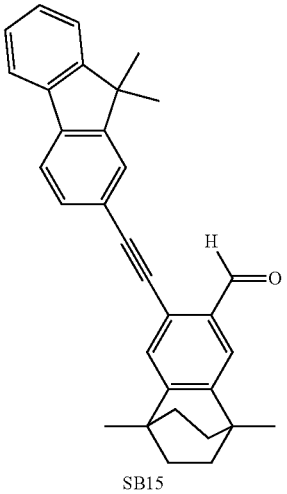 [SMILES: CC12CCC(C)(CC1)c1cc(C=O)c(C#Cc3ccc4c(c3)C(C)(C)c3ccccc3-4)cc12 ; "SB15"]<br>SB15 | 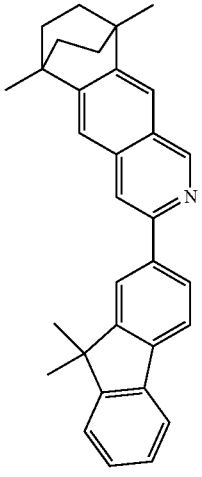 [SMILES: CC12CCC(C)(CC1)c1cc3cc(-c4ccc5c(c4)C(C)(C)c4ccccc4-5)ncc3cc12] | 26% |
| LB35 | 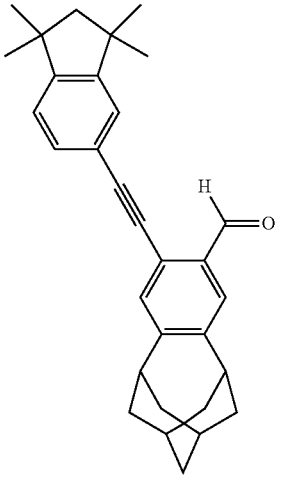<br>SB16 | 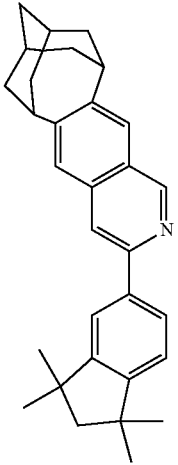 [SMILES: CC1(C)CC(C)(C)c2cc(-c3cc4cc5c(cc4cn3)C3CC4CC6CC5CC46C3)ccc21] | 29% |

Example LP25: 1R,4S-Methano-1,2,3,4-tetrahydro-9-phenyl-10-aza-phenanthrene

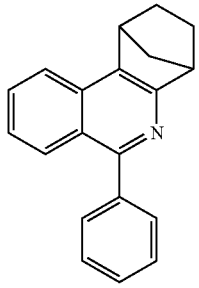 [SMILES: c1ccc(-c2nc3c(c4ccccc24)C2CCC3C2)cc1]

One drop of conc. sulfuric acid is added to a mixture of 26.1 g (100 mmol) of 2-bromophenylphenylmethanone [13047-06-8], 11.1 g (100 mmol) of (1R,2R,4S)-bicyclo[2.2.1]heptan-2-amine [7242-92-4] and 23.3 ml (105 mmol) of tetraethoxysilane [78-10-4], and the mixture is then heated at 160° C. in a water separator for 16 h, during which the ethanol distils off. After cooling, 500 ml of diethyl ether are added to the residue, the mixture is washed twice with 100 ml of saturated sodium hydrogencarbonate solution each time and twice with 300 ml of water each time and then dried over magnesium sulfate. After removal of the diethyl ether, 27.6 g (200 mmol) of potassium carbonate, 5 g of palladium/carbon (5% by weight), 2.6 g (10 mmol) of triphenylphosphine, 100 g of glass beads (diameter 3 mm) and 300 ml of mesitylene are added to the oily residue, and the mixture is again heated under reflux for 16 h. After cooling, the salts are filtered off with suction via a Celite bed, rinsed with 500 ml of toluene, and the combined filtrates are evaporated to dryness in vacuo. The residue is recrystallised three times from DMF/ethanol and finally freed from low-boiling components and non-volatile secondary components by fractional sublimation (p about $10^{-4}$-$10^{-5}$ mbar, T about 230° C.). Yield: 14.9 g (55 mmol), 55%; purity: about 99.5% according to $^1$H-NMR.

The following derivatives can be prepared analogously:

| Ex. | Starting material | Product | Yield |
|---|---|---|---|
| LB36 | 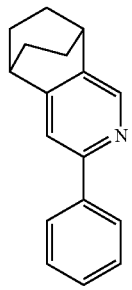 [SMILES: c1ccc(-c2cc3c(cn2)C2CCC3CC2)cc1] 20643-57-6 instead of 7242-92-4 | 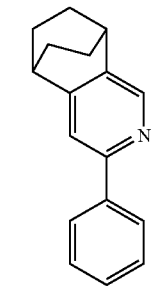 | 35% |

Example LB37

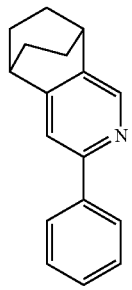 [SMILES: c1ccc(-c2cc3c(cn2)C2CCC3CC2)cc1]

Preparation analogous to M. Ohashi et al., J. Am. Chem. Soc, 2011, 133, 18018.

A mixture of 13.4 g (100 mmol) of 2,3-dimethylenebicyclo[2.2.2]octane [36439-79-9], 5.2 g (50 mmol) of benzonitrile [100-47-0], 1.4 g (5 mmol) of biscyclooctadienenickel(0) [1295-35-8], 5.6 g (20 mmol) of tricyclohexylphosphine [2622-14-2] and 200 ml of o-xylene is heated under gentle reflux for 30 h while a gentle stream of argon is passed in. After cooling, the mixture is filtered through a Celite bed, and the solvent is removed in vacuo. The residue is distilled twice in a bulb tube. Yield: 6.4 g (27 mmol), 54%; purity: about 98% according to $^1$H NMR.

The following compounds can be prepared analogously:

| Ex. | Olefin | Nitrile | Product | Yield |
|---|---|---|---|---|
| LH35 | 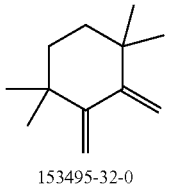<br>153495-32-0 | 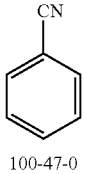<br>100-47-0 | 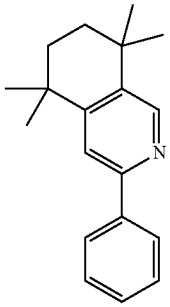 | 22% |
| LH36 | 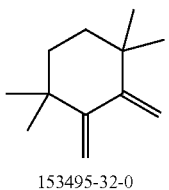<br>153495-32-0 | 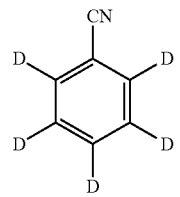<br>2102-15-0 | 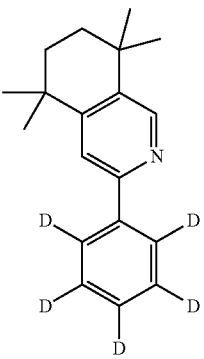 [SMILES: [2H]c1c([2H])c([2H])c(-c2cc3c(cn2)C(C)(C)CCC3(C)C)c([2H])c1[2H]] | 18% |
| LH37 | 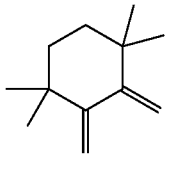<br>153495-32-0 | 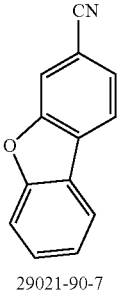<br>29021-90-7 | 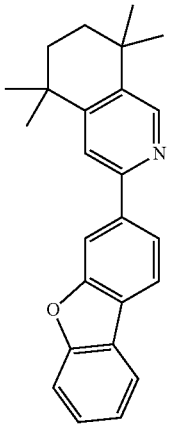 | 24% |
| LH38 | 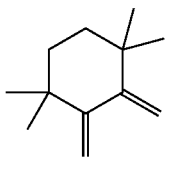<br>153495-32-0 | 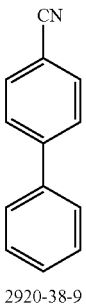 [SMILES: N#Cc1ccc(-c2ccccc2)cc1]<br>2920-38-9 | 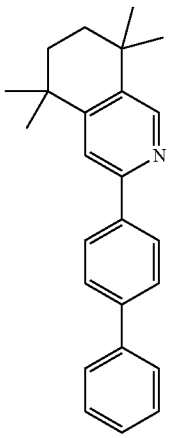 | 20% |

-continued
| Ex. | Olefin | Nitrile | Product | Yield |
|---|---|---|---|---|
| LH39 | | | | 19% |
| LH40 | | | | 17% |
| LH41 | | | | 20% |
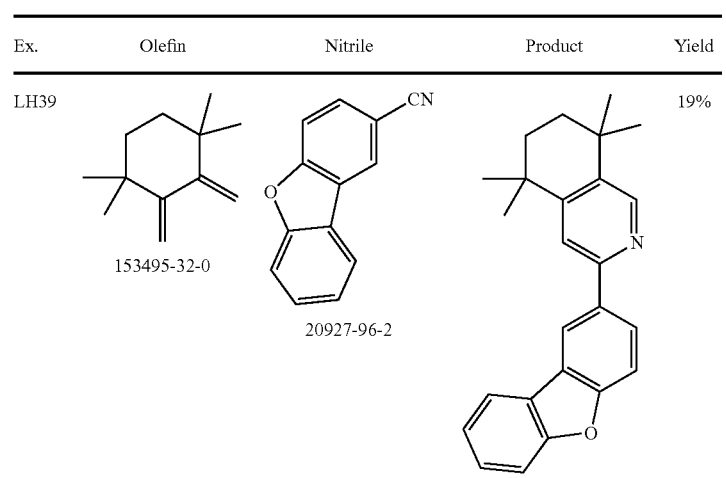
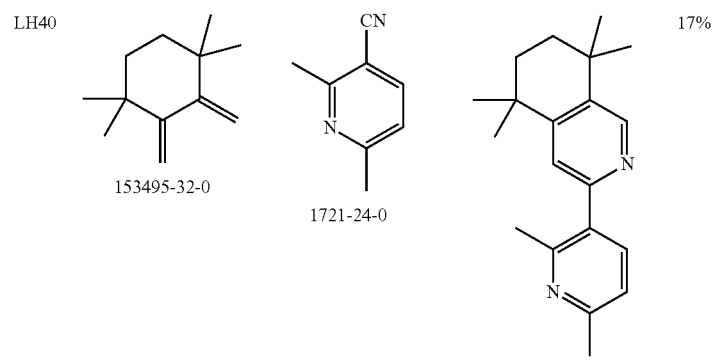
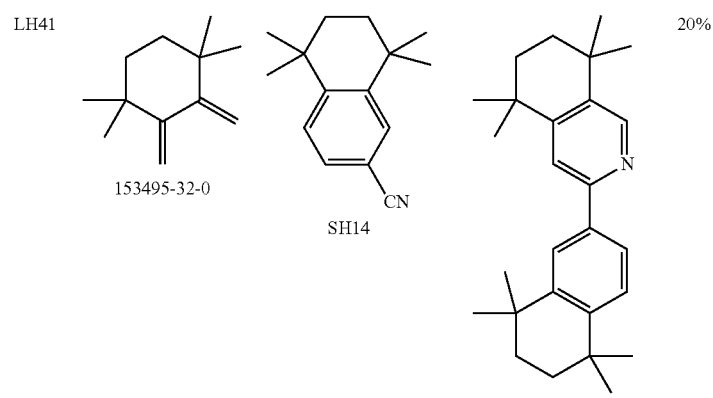

| Ex. | Olefin | Nitrile | Product | Yield |
|---|---|---|---|---|
| LH42 | 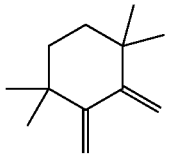<br>153495-32-0 | 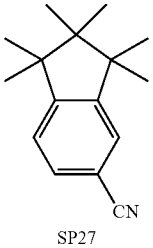<br>SP27 | 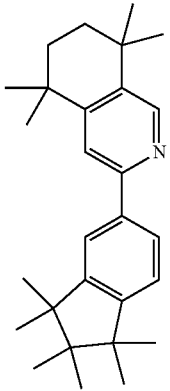 | 22% |
| LB38 | 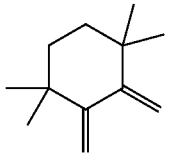<br>153495-32-0 | 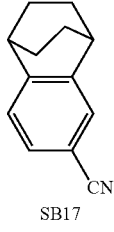 [SMILES: "SB17" ; N#Cc1ccc2c(c1)C1CCC2CC1]<br>SB17 | 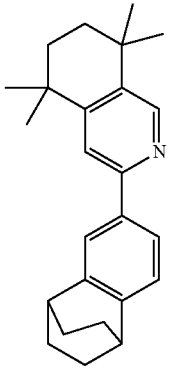 | 24% |

Example LH43: Tetradentate Ligands

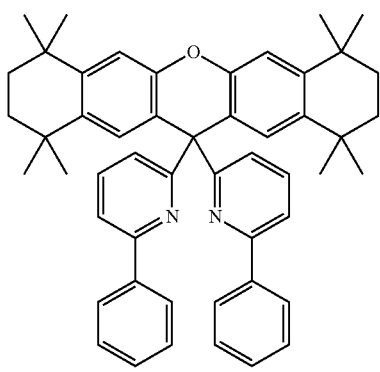 [SMILES: CC1(C)CCC(C)(C)c2cc3c(cc21)Oc1cc2c(cc1C3(c1cccc(-c3ccccc3)n1)c1cccc(-c3ccccc3)n1)C(C)(C)CCC2(C)C]

A mixture of 71.5 g (100 mmol) of SH16, 61.2 g (230 mmol) of phenyl-boronic acid [24388-23-6], 42.4 g (400 mmol) of sodium carbonate, 1.2 g (1 mmol) of tetrakistriphenylphosphinopalladium(0), 300 ml of toluene, 200 ml of dioxane and 300 ml of water is heated under reflux for 30 h. After cooling, the organic phase is separated off, filtered through a Celite bed, with the Celite being rinsed with 300 ml of toluene, the combined filtrates are washed three times with 300 ml of water each time, dried over magnesium sulfate and then freed from toluene in vacuo. The residue is recrystallised three times from ethanol with addition of a little ethyl acetate and finally freed from low-boiling components and non-volatile secondary components by fractional sublimation (p about $10^{-5}$ mbar, T about 310° C.). Yield: 33.3 g (47 mmol), 47%; purity: about 99.5% according to $^1$H-NMR.

The following compounds can be prepared analogously:

| Ex. | Starting material | Starting material | Product | Yield |
|---|---|---|---|---|
| LH44 | 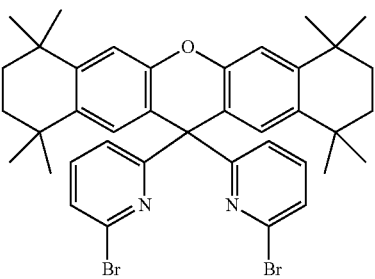 SH16 | 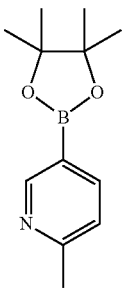 610768-32-6 | 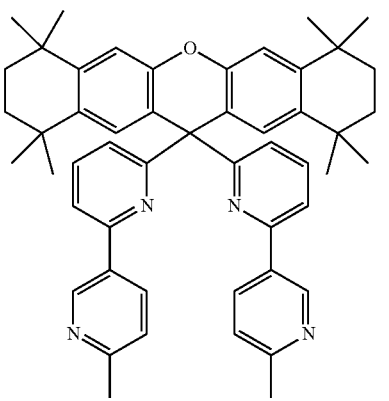 [SMILES: Cc1ccc(-c2cccc(C3(c4cccc(-c5ccc(C)nc5)n4)c4cc5c(cc4Oc4cc6c(cc43)C(C)(C)CCC6(C)C)C(C)(C)CCC5(C)C)n2)cn1] | 46% |
| LH45 | 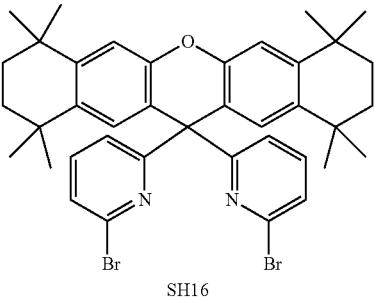 SH16 | 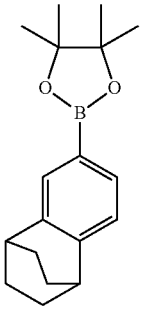 SB1 | 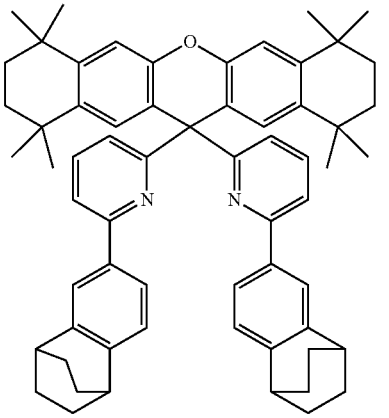 [SMILES: CC1(C)CCC(C)(C)c2cc3c(cc21)Oc1cc2c(cc1C3(c1cccc(-c3ccc4c(c3)C3CCC4CC3)n1)c1cccc(-c3ccc4c(c3)C3CCC4CC3)n1)C(C)(C)CCC2(C)C] | 42% |

Example LH46: Tetradentate Ligands

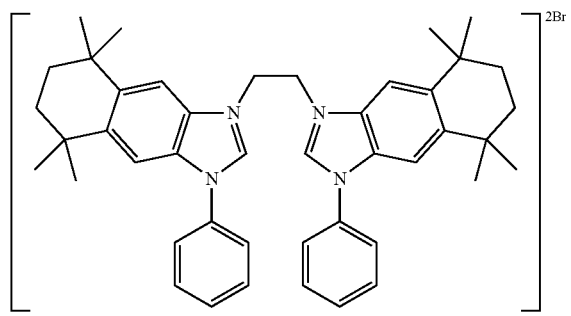

Procedure analogous to C. Cao et al., Synth. Commun. 2012, 42, 380. A mixture of 15.2 g (50 mmol) of LH23 B), and 4.7 g (25 mmol) of 1,2-dibromoethane [106-93-4] is heated at 120° C. for 6 h in an autoclave. After cooling, the solid mass is taken up in 100 ml of tert-butyl methyl ether, homogenised with stirring, the white solid is filtered off, washed twice with 50 ml of tert-butyl methyl ether each time and dried in vacuo. Yield: 15.1 g (19 mmol), 76%; purity: about 98.0% according to $^1$H-NMR.

The following compounds can be prepared analogously:

| Ex. | Imidazole | Ligand | Yield |
|---|---|---|---|
| LH47 LH24 B) | | | 2Br 73% |

Example LH48: Hexadentate Ligands

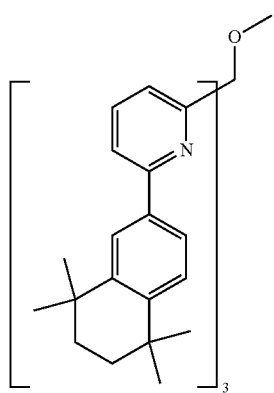

A mixture of 51.4 g (100 mmol) of tris(6-bromopyridin-2-yl)methoxy-methane [336158-91-9], 103.7 g (330 mmol) of SH1, 42.4 g (400 mmol) of sodium carbonate, 1.2 g (1 mmol) of tetrakistriphenylphosphinopalladium(0), 500 ml of toluene, 300 ml of dioxane and 500 ml of water is heated under reflux for 36 h. After cooling, the organic phase is separated off, filtered through a Celite bed, with the Celite being rinsed with 400 ml of toluene, the combined filtrates are washed three times with 300 ml of water each time, dried over magnesium sulfate and then freed from toluene in vacuo. The residue is recrystallised three times from isopropanol with addition of a little ethyl acetate and finally freed from low-boiling components and non-volatile secondary components by fractional sublimation (p about $10^{-5}$ mbar, T about 310° C.). Yield: 38.7 g (44 mmol), 44%; purity: about 99.5% according to $^1$H-NMR.

The following compounds can be prepared analogously:

| Ex. | Starting material | Starting material | Product | Yield |
|---|---|---|---|---|
| LH49 | 760177-68-2 | SH1 | | 47% |

-continued

| Ex. | Starting material | Starting material | Product | Yield |
|---|---|---|---|---|
| LH50 | 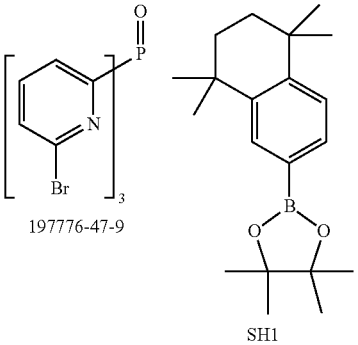<br>197776-47-9 | 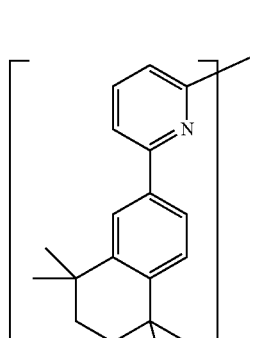<br>SH1 |  | 40% |

Example LH51: Hexadentate Ligands

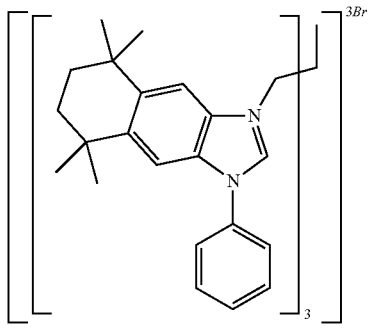

Procedure analogous to LH46, where the 1,2-dibromo-ethane is replaced by 5.2 g (16.7 mmol) of 1,1,1-tris(bromomethyl)ethane [60111-68-4]. Yield: 14.8 g (12 mmol), 72%; purity: about 99.0% according to ¹H-NMR.

Compound LH52 can be prepared analogously:

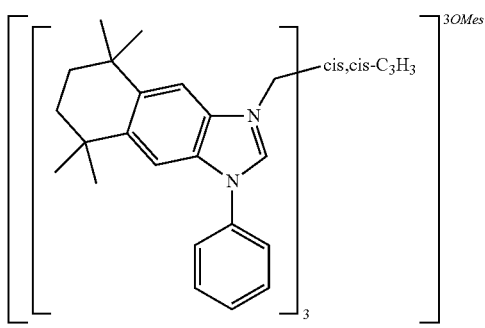

1,1,1-Tris(bromomethyl)ethane is replaced by 6.1 g (16.7 mmol) of cis,cis-1,2,3-cyclopropanetrimethanol trimethane-sulfonate [945230-85-3]. Yield: 14.8 g (11.5 mmol), 69%; purity: about 99.0% according to ¹H-NMR.

Example LH1: 2-(5,5,8,8-Tetramethyl-5,6,7,8-tetra-hydronaphthalen-2-yl)pyridine, LP1

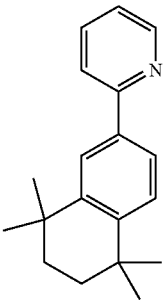

A mixture of 16.4 g (100 mmol) of 1,1,4,4-tetramethyl-2,3-dimethylene-cyclohexane [153495-32-0], 12.4 g (120 mmol) of 2-ethynylpyridine [1945-84-2] and 50 ml of chlorobenzene is stirred at 120° C. for 16 h. 26.1 g (300 mmol) of activated manganese(II) oxide are then added, and the mixture is stirred at 120° C. for a further 3 h. After cooling, the mixture is diluted with 200 ml of ethyl acetate and filtered through a Celite bed, and the solvent and excess 2-ethynylpyridine are removed in vacuo. The oily residue is distilled twice in a bulb tube (p about $10^{-4}$ mbar, T about 190° C.). Yield: 18.8 g (71 mmol), 71%; purity: about 99.0% according to ¹H NMR.

The following compounds can be prepared analogously:

| Ex. | Starting material | Starting material | Product | Yield |
|---|---|---|---|---|
| LH57 | | 30413-54-8 | | 68% |
| LH7 | | 30413-59-3 | | 65% |
| LH58 | | 512197-95-4 | | 73% |
| LH59 | | 512197-93-2 | | 70% |

| Ex. | Starting material | Starting material | Product | Yield |
|---|---|---|---|---|
| LH60 | | 1401685-43-5 | | 63% |
| LH61 | | 86520-96-9 | | 78% |

C: Synthesis of the Metal Complexes

1) Homoleptic tris-facial Iridium complexes of the phenylpyridine, phenylimidazole or phenylbenzimidazole type:

Variant A: Trisacetylacetonatoiridium(III) as Iridium Starting Material

A mixture of 10 mmol of trisacetylacetonatoiridium(III) [15635-87-7] and 40-60 mmol (preferably 40 mmol) of the ligand L, optionally 1-10 g—typically in of an inert high-boiling additive as melting aid or solvent, e.g. hexadecane, m-terphenyl, triphenylene, diphenyl ether, 3-phenoxytoluene, 1,2-, 1,3-, 1,4-bisphenoxybenzene, triphenylphosphine oxide, sulfolane, 18-crown-6, triethylene glckol, glycerol, polyethylene glycols, phenol, 1-naphthol, hydroquinone, etc., and a glass-clad magnetic stirrer bar are melted into a thick-walled 50 ml glass ampoule in vacuo ($10^{-5}$ mbar). The ampoule is heated at the temperature indicated for the time indicated, during which the molten mixture is stirred with the aid of a magnetic stirrer. In order to prevent sublimation of the ligands onto relatively cold parts of the ampoule, the entire ampoule must have the temperature indicated. Alternatively, the synthesis can be carried out in a stirred autoclave with glass insert. After cooling (NOTE: the ampoules are usually under pressure!), the ampoule is opened, the sinter cake is stirred for 3 h with 100 g of glass beads (diameter 3 mm) in 100 ml of a suspension medium (the suspension medium is selected so that the ligand is readily soluble, but the metal complex has low solubility therein, typical suspension media are methanol, ethanol, dichloromethane, acetone, THF, ethyl acetate, toluene, etc.) and mechanically digested in the process. The fine suspension is decanted off from the glass beads, the solid is filtered off with suction, rinsed with 50 ml of the suspension medium and dried in vacuo. The dry solid is placed on a 3-5 cm deep aluminium oxide bed (aluminium oxide, basic, activity grade 1) in a continuous hot extractor and then extracted with an extractant (initially introduced amount about 500 ml, the extractant is selected so that the complex is readily soluble therein at elevated temperature and has low solubility therein when cold, particularly suitable extractants are hydrocarbons, such as toluene, xylenes, mesitylene, naphthalene, o-dichlorobenzene, halogenated aliphatic hydrocarbons are generally unsuitable since they may halogenate or decompose the complexes). When the extraction is complete, the extractant is evaporated to about 100 ml in vacuo. Metal complexes which have excessively good solubility in the extractant are brought to crystallisation by dropwise addition of 200 ml of methanol. The solid of the suspensions obtained in this way is filtered off with suction, washed once with about 50 ml of methanol and dried. After drying, the purity of the metal complex is determined by means of NMR and/or HPLC. If the purity is below 99.5%, the hot extraction step is repeated, omitting the aluminium oxide bed from the 2nd extraction. When a purity of 99.5-99.9% has been reached, the metal complex is heated or sublimed. The heating is carried out in a high vacuum (p about $10^{-6}$ mbar) in the temperature range from about 200-300° C., preferably for complexes having molecular weights greater than about 1300 g/mol. The sublimation is carried out in a high vacuum (p about $10^{-6}$ mbar) in the temperature range from about 230-400° C., with the sublimation preferably being carried out in the form of a fractional sublimation. Complexes which are readily soluble in organic solvents may alternatively also be chromatographed on silica gel.

If chiral ligands are employed, the derived fac-metal complexes are produced in the form of a diastereomer mixture. The enantiomers Λ,Δ in point group C3 generally have significantly lower solubility in the extractant than the enantiomers in point group C1, which are consequently enriched in the mother liquor. Separation of the C3 diastereomers from the C1 diastereomers is frequently possible by this method. In addition, the diastereomers can also be separated by chromatography. If ligands in point group C1 are employed in enantiomerically pure form, a diastereomer pair Λ,Δ in point group C3 is formed. The diastereomers can be separated by crystallisation or chromatography and thus obtained as enantiomerically pure compounds.

Variant B: Tris-(2,2,6,6-tetramethyl-3,5-heptanedionato)iridium(III) as Iridium Starting Material Procedure analogous to variant A, using 10 mmol of tris(2,2,6,6-tetramethyl-3,5-heptanedionato)iridium [99581-86-9] instead of 10 mmol of tris-acetylacetonatoiridium(III) [15635-87-7]. The use of this starting material is advantageous since the purity of the crude products obtained is frequently better than in the case of variant A. In addition, the build-up of pressure in the ampoule is frequently not so pronounced.

Variant C: Sodium [cis,trans-dichloro(bisacetylacetonato)]iridate(III) as Iridium Starting Material A mixture of 10 mmol of sodium [cis,trans-dichloro(bisacetylacetonato)]-iridate(III) [876296-21-8] and 60 mmol of the ligand in 50 ml of ethylene glycol, propylene glycol or diethylene glycol is heated under gentle reflux under a gentle stream of argon for the time indicated. After cooling to 60° C., the reaction mixture is diluted with a mixture of 50 ml of ethanol and 50 ml of 2 N hydrochloric acid with stirring and stirred for a further 1 h, the precipitated solid is filtered off with suction, washed three times with 30 ml of ethanol each time and then dried in vacuo. Purification by hot extraction or chromatography and fractional sublimation, as described under A.

| Ex. | Ligand L | Ir complex Diastereomer | Variant<br>Reaction medium<br>Melting aid<br>Reaction temp.<br>Reaction time<br>Suspension medium<br>Extractant | Yield |
|---|---|---|---|---|
| Ir(LH1)₃ | LH1 | 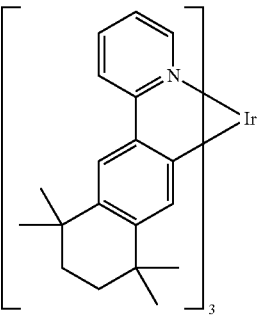 | A<br>—<br>—<br>270° C.<br>24 h<br>EtOH<br>Ethyl acetate | 46% |
| Ir(LH1)₃ | LH1 | 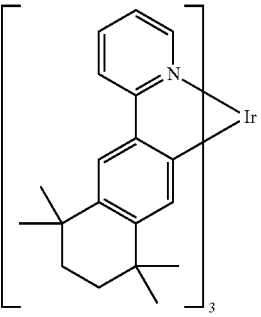 | C<br>Propylene glycol<br>—<br>RF<br>100 h<br>—<br>o-Xylene | 37% |
| Ir(LH2)₃ | LH2 | 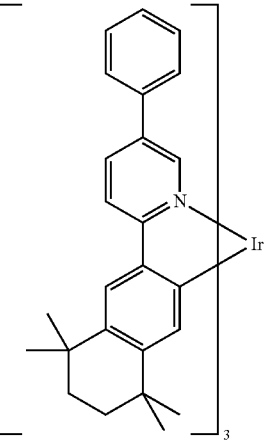 | A<br>—<br>—<br>270° C.<br>24 h<br>EtOH<br>Ethyl acetate | 52% |

-continued

| Ex. | Ligand L | Ir complex Diastereomer | Variant<br>Reaction medium<br>Melting aid<br>Reaction temp.<br>Reaction time<br>Suspension medium<br>Extractant | Yield |
|---|---|---|---|---|
| Ir(LH3)₃ | LH3 | | as for Ir(LH2)₃ | 50% |
| Ir(LH4)₃ | LH4 | | A<br>—<br>Hydroquinone<br>280° C.<br>40 h<br>EtOH<br>Ethyl acetate | 9% |
| Ir(LH5)₃ | LH5 | Λ,Δ-C3 | as for Ir(LH2)₃ | 18% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LH6)$_3$ | LH6 | | as for Ir(LH2)$_3$ | 43% |
| Ir(LH7)$_3$ | LH7 | | as for Ir(LH2)$_3$ | 37% |
| Ir(LH8)$_3$ | LH8 | | A<br>—<br>Hydroquinone<br>280° C.<br>40 h<br>EtOH<br>Ethyl acetate | 24% |
| Ir(LH9)$_3$ | LH9 | | as for Ir(LH2)$_3$ | 37% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LH10)$_3$ | LH10 | | as for Ir(LH4)$_3$ | 10% |
| Ir(LH11)$_3$ | LH11 | | as for Ir(LH8)$_3$ | 31% |
| Ir(LH12)$_3$ | LH12 | | as for Ir(LH2)$_3$ | 35% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LH13)₃ | LH13 | | as for Ir(LH2)₃ | 32% |
| Ir(LH14)₃ | LH14 | | as for Ir(LH2)₃<br>Chromatography<br>Silica gel<br>n-Heptane:DCM 8:1 | 40% |
| Ir(LH15)₃ | LH15 | | as for Ir(LH2)₃<br>Chromatography<br>Silica gel<br>n-Heptane:DCM 8:1 | 37% |

-continued

| Ex. | Ligand L | Ir complex Diastereomer | Variant<br>Reaction medium<br>Melting aid<br>Reaction temp.<br>Reaction time<br>Suspension medium<br>Extractant | Yield |
|---|---|---|---|---|
| Ir(LH16)$_3$ | LH16 | | as for Ir(LH2)$_3$ | 39% |
| Ir(LH20)$_3$ | LH20 | | A<br>—<br>—<br>280° C.<br>30 h<br>EtOH<br>Toluene | 40% |
| Ir(LH21)$_3$ | LH21 | | as for Ir(LH20)$_3$ | 34% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LH22)₃ | LH22 | [structure] | as for Ir(LH20)₃ | 30% |
| Ir(LH26)₃ | LH26 | [structure] | as for Ir(LH2)₃ | 41% |
| Ir(LH27)₃ | LH27 | [structure] | as for Ir(LH2)₃ | 43% |
| Ir(LH28)₃ | LH28 | [structure] | as for Ir(LH2)₃ | 42% |

| Ex. | Ligand L | Ir complex Diastereomer | Variant<br>Reaction medium<br>Melting aid<br>Reaction temp.<br>Reaction time<br>Suspension medium<br>Extractant | Yield |
|---|---|---|---|---|
| Ir(LH29)₃ | LH29 | | A<br>—<br>—<br>280° C.<br>30 h<br>Acetone<br>Toluene | 28% |
| Ir(LH30)₃ | LH30 | | as for Ir(LH2)₃<br>Chromatography<br>Silica gel<br>n-Heptane:DCM 8:1 | 30% |
| Ir(LH31)₃ | LH31 | | as for Ir(LH2)₃ | 36% |
| Ir(LH32)₃ | LH32 | | as for Ir(LH2)₃<br>Chromatography<br>Silica gel<br>n-Heptane:DCM 8:1 | 35% |

| Ex. | Ligand L | Ir complex Diastereomer | Variant Reaction medium Melting aid Reaction temp. Reaction time Suspension medium Extractant | Yield |
|---|---|---|---|---|
| Ir(LH33)$_3$ | LH33 | [structure] | as for Ir(LH2)$_3$ | 41% |
| Ir(LH34)$_3$ | LH34 | [structure] | as for Ir(LH2)$_3$ | 40% |
| Ir(LH35)$_3$ | LH35 | [structure] | as for Ir(LH2)$_3$ | 40% |

| Ex. | Ligand L | Ir complex Diastereomer | Variant Reaction medium Melting aid Reaction temp. Reaction time Suspension medium Extractant | Yield |
|---|---|---|---|---|
| Ir(LH36)$_3$ | LH36 | (structure) | as for Ir(LH2)$_3$ | 28% |
| Ir(LH37)$_3$ | LH37 | (structure) | as for Ir(LH2)$_3$ | 40% |
| Ir(LH38)$_3$ | LH38 | (structure) | as for Ir(LH2)$_3$ | 44% |

| Ex. | Ligand L | Ir complex Diastereomer | Variant Reaction medium Melting aid Reaction temp. Reaction time Suspension medium Extractant | Yield |
|---|---|---|---|---|
| Ir(LH39)$_3$ | LH39 | | as for Ir(LH2)$_3$ | 38% |
| Ir(LH40)$_3$ | LH40 | | A — Hydroquinone 280° C. 35 h Toluene Ethyl acetate | 30% |
| Ir(LH41)$_3$ | LH41 | | as for Ir(LH2)$_3$ Chromatography Silica gel Toluene | 42% |

-continued

| Ex. | Ligand L | Ir complex Diastereomer | Variant<br>Reaction medium<br>Melting aid<br>Reaction temp.<br>Reaction time<br>Suspension medium<br>Extractant | Yield |
|---|---|---|---|---|
| Ir(LH42)₃ | LH42 | | as for Ir(LH2)₃<br>Chromatography<br>Silica gel<br>Toluene | 39% |
| Ir(LH53)₃ | LH53 | | A<br>—<br>—<br>270° C.<br>24 h<br>EtOH<br>Acetonitrile | 38% |
| Ir(LH54)₃ | LH54 | | as for Ir(L53)₃ | 44% |

-continued
| Ex. | Ligand L | Ir complex Diastereomer | Variant<br>Reaction medium<br>Melting aid<br>Reaction temp.<br>Reaction time<br>Suspension medium<br>Extractant | Yield |
|---|---|---|---|---|
| Ir(LH55)₃ | LH55 | 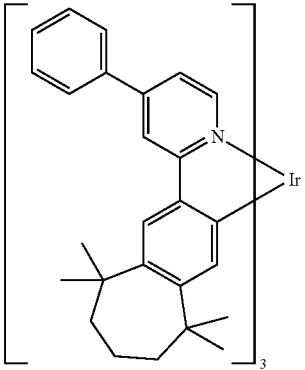 | as for Ir(LH2)₃<br>Chromatography<br>Silica gel<br>Toluene | 33% |
| Ir(LH56)₃ | LH56 | 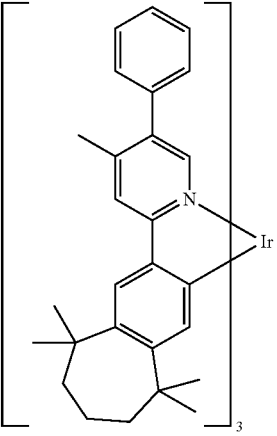 | as for Ir(LH2)₃<br>Chromatography<br>Silica gel<br>Toluene | 37% |
| Ir(LH57)₃ | LH57 | 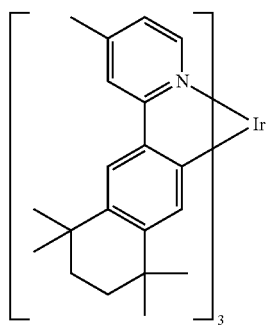 | as for Ir(L53)₃ | 46% |

| Ex. | Ligand L | Ir complex Diastereomer | Variant Reaction medium Melting aid Reaction temp. Reaction time Suspension medium Extractant | Yield |
|---|---|---|---|---|
| Ir(LH58)₃ | LH58 | (structure) | as for Ir(L53)₃ | 43% |
| Ir(LH59)₃ | LH59 | (structure) | as for Ir(L53)₃ | 37% |
| Ir(LH60)₃ | LH60 | (structure) | as for Ir(L53)₃ | 41% |
| Ir(LH61)₃ | LH61 | (structure) | as for Ir(L2)₃ | 47% |

2) Homoleptic Iridium Complexes of the Arduengo Carbene Type:

Preparation analogous to K. Tsuchiya, et al., Eur. J. Inorg. Chem., 2010, 926.

A mixture of 10 mmol of the ligand, 3 mmol of iridium (III) chloride hydrate, 10 mmol of silver carbonate, 10 mmol of sodium carbonate in 75 ml of 2-ethoxyethanol is warmed under reflux for 24 h. After cooling, 300 ml of water are added, the precipitated solid is filtered off with suction, washed once with 30 ml of water and three times with 15 ml of ethanol each time and dried in vacuo. The fac/mer isomer mixture obtained in this way is chromatographed on silica gel. The isomers are subsequently subjected to fractional sublimation or freed from the solvent in a high vacuum.

| Ex. | Ligand L | Ir complex Diastereomer | Yield |
|---|---|---|---|
| fac-Ir(LH23)$_3$ mer-Ir(LH23)$_3$ | LH23 | | 35% 10% |
| fac-Ir(LH24)$_3$ mer-Ir(LH24)$_3$ | LH24 | | 37% 12% |
| fac-Ir(LH25)$_3$ | LH25 | | 33% |
| fac-Ir(LB29)$_3$ | LB29 | | 29% |

3) Iridium Complexes of the [Ir(L)$_2$Cl]$_2$ Type

Variant A:

A mixture of 22 mmol of the ligand, 10 mmol of iridium (III) chloride hydrate, 75 ml of 2-ethoxyethanol and 25 ml of water is heated under reflux for 16-24 h with vigorous stirring. If the ligand does not dissolve or does not dissolve completely in the solvent mixture under reflux, 1,4-dioxane is added until a solution has formed. After cooling, the precipitated solid is filtered off with suction, washed twice with ethanol/water (1:1, vv) and then dried in vacuo. The chloro dimer of the formula [Ir(L)$_2$Cl]$_2$ obtained in this way is reacted further without purification.

Variant B:

A mixture of 10 mmol of sodium bisacetylacetonatodichloroiridate(III) [770720-50-8], 24 mmol of ligand L and a glass-clad magnetic stirrer bar are melted into a thick-walled 50 ml glass ampoule in vacuo ($10^{-5}$ mbar). The ampoule is heated at the temperature indicated for the time indicated, during which the molten mixture is stirred with the aid of a magnetic stirrer. After cooling—NOTE: the ampoules are usually under pressure!—the ampoule is opened, the sinter cake is stirred for 3 h with 100 g of glass beads (diameter 3 mm) in 100 ml of the suspension medium indicated (the suspension medium is selected so that the ligand is readily soluble, but the chloro dimer of the formula [Ir(L)$_2$Cl]$_2$ has low solubility therein, typical suspension media are dichloromethane, acetone, ethyl acetate, toluene, etc.) and mechanically digested at the same time. The fine suspension is decanted off from the glass beads, the solid [Ir(L)$_2$Cl]$_2$ which still contains about 2 eq. of NaCl, referred to below as the crude chloro dimer) is filtered off with suction and dried in vacuo. The crude chloro dimer of the formula [Ir(L)$_2$Cl]$_2$ obtained in this way is reacted further without purification.

| Ex. | Ligand L | Ir complex Variant Temp./time Diastereomer | Yield |
|---|---|---|---|
| [Ir(LP1)₂Cl]₂ | L1 | A | 76% |
| [Ir(LP2)₂Cl]₂ | L2 | Ir[(LP2)Cl]₂<br>A | 81% |
| [Ir(LH1)₂Cl]₂ | LH1 | B<br>245° C./48 h | 76% |
| [Ir(LH2)₂Cl]₂ | LH2 | [Ir(LH2)₂Cl]₂<br>as for [Ir(LH1)₂Cl]₂ | 80% |
| [Ir(LH3)₂Cl]₂ | LH3 | [Ir(LH3)₂Cl]₂<br>as for [Ir(LH1)₂Cl]₂ | 78% |
| [Ir(LH4)₂Cl]₂ | LH4 | [Ir(LH4)₂Cl]₂<br>as for [Ir(LH1)₂Cl]₂ | 81% |
| [Ir(LH5)₂Cl]₂ | LH5 | [Ir(LH5)₂Cl]₂<br>as for [Ir(LH1)₂Cl]₂ | 80% |
| [Ir(LH6)₂Cl]₂ | LH6 | [Ir(LH6)₂Cl]₂<br>as for [Ir(LH1)₂Cl]₂ | 75% |
| [Ir(LH7)₂Cl]₂ | LH7 | [Ir(LH7)₂Cl]₂<br>as for [Ir(LH1)₂Cl]₂ | 77% |
| [Ir(LH9)₂Cl]₂ | LH9 | [Ir(LH9)₂Cl]₂<br>as for [Ir(LH1)₂Cl]₂ | 81% |
| [Ir(LH10)₂Cl]₂ | LH10 | [Ir(LH10)₂Cl]₂<br>as for [Ir(LH1)₂Cl]₂ | 80% |
| [Ir(LH12)₂Cl]₂ | LH12 | [Ir(LH12)₂Cl]₂<br>as for [Ir(LH1)₂Cl]₂ | 76% |
| [Ir(LH14)₂Cl]₂ | LH14 | [Ir(LH14)₂Cl]₂<br>as for [Ir(LH1)₂Cl]₂ | 78% |
| [Ir(LH15)₂Cl]₂ | LH15 | [Ir(LH15)₂Cl]₂<br>as for [Ir(LH1)₂Cl]₂ | 78% |
| [Ir(LH16)₂Cl]₂ | LH16 | [Ir(LH16)₂Cl]₂<br>as for [Ir(LH1)₂Cl]₂ | 79% |
| [Ir(LH17)₂Cl]₂ | LH17 | [Ir(LH17)₂Cl]₂<br>as for [Ir(LH1)₂Cl]₂ | 46% |
| [Ir(LH18)₂Cl]₂ | LH18 | [Ir(LH18)₂Cl]₂<br>as for [Ir(LH1)₂Cl]₂ | 38% |
| [Ir(LH19)₂Cl]₂ | LH19 | [Ir(LH19)₂Cl]₂<br>as for [Ir(LH1)₂Cl]₂ | 40% |

-continued

| Ex. | Ligand L | Ir complex Variant Temp./time Diastereomer | Yield |
|---|---|---|---|
| [Ir(LH20)$_2$Cl]$_2$ | LH20 | B 250° C./80 h | 84% |
| [Ir(LH21)$_2$Cl]$_2$ | LH21 | [Ir(LH21)$_2$Cl]$_2$ as for [Ir(LH20)$_2$Cl]$_2$ | 86% |
| [Ir(LH22)$_2$Cl]$_2$ | LH22 | [Ir(LH22)$_2$Cl]$_2$ as for [Ir(LH20)$_2$Cl]$_2$ | 83% |
| [Ir(LH26)$_2$Cl]$_2$ | LH26 | B 240° C./60 h | 85% |
| [Ir(LH27)$_2$Cl]$_2$ | LH27 | [Ir(LH27)$_2$Cl]$_2$ as for [Ir(LH26)$_2$Cl]$_2$ | 85% |
| [Ir(LH28)$_2$Cl]$_2$ | LH28 | [Ir(LH28)$_2$Cl]$_2$ as for [Ir(LH26)$_2$Cl]$_2$ | 83% |
| [Ir(LH29)$_2$Cl]$_2$ | LH29 | [Ir(LH29)$_2$Cl]$_2$ as for [Ir(LH26)$_2$Cl]$_2$ | 67% |
| [Ir(LH30)$_2$Cl]$_2$ | LH30 | [Ir(LH30)$_2$Cl]$_2$ as for [Ir(LH26)$_2$Cl]$_2$ | 83% |
| [Ir(LH31)$_2$Cl]$_2$ | LH31 | [Ir(LH31)$_2$Cl]$_2$ as for [Ir(LH26)$_2$Cl]$_2$ | 85% |
| [Ir(LH32)$_2$Cl]$_2$ | LH32 | [Ir(LH32)$_2$Cl]$_2$ as for [Ir(LH26)$_2$Cl]$_2$ | 86% |
| [Ir(LH33)$_2$Cl]$_2$ | LH33 | [Ir(LH32)$_2$Cl]$_2$ B 260°C./30 h | 86% |
| [Ir(LH34)$_2$Cl]$_2$ | LH34 | [Ir(LH34)$_2$Cl]$_2$ as for [Ir(LH33)$_2$Cl]$_2$ | 88% |

-continued

| Ex. | Ligand L | Ir complex Variant Temp./time Diastereomer | Yield |
|---|---|---|---|
| [Ir(LH35)$_2$Cl]$_2$ | LH35 | 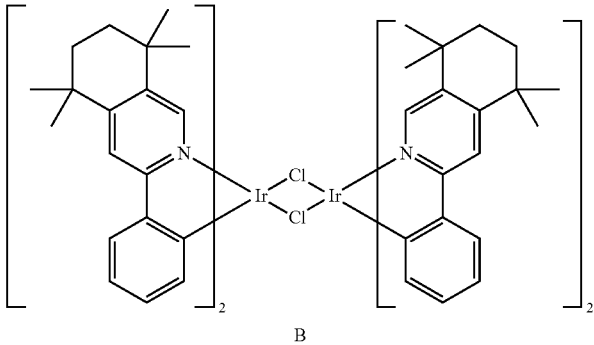<br>B<br>255° C./25 h | 86% |
| [Ir(LH36)$_2$Cl]$_2$ | LH36 | [Ir(LH36)$_2$Cl]$_2$<br>as for [Ir(LH35)$_2$Cl]$_2$ | 90% |
| [Ir(LH37)$_2$Cl]$_2$ | LH37 | [Ir(LH37)$_2$Cl]$_2$<br>as for [Ir(LH35)$_2$Cl]$_2$ | 88% |
| [Ir(LH38)$_2$Cl]$_2$ | LH38 | [Ir(LH38)$_2$Cl]$_2$<br>as for [Ir(LH35)$_2$Cl]$_2$ | 89% |
| [Ir(LH39)$_2$Cl]$_2$ | LH39 | [Ir(LH39)$_2$Cl]$_2$<br>as for [Ir(LH35)$_2$Cl]$_2$ | 87% |
| [Ir(LH40)$_2$Cl]$_2$ | LH40 | [Ir(LH40)$_2$Cl]$_2$<br>B<br>265° C./35 h | 63% |
| [Ir(LH41)$_2$Cl]$_2$ | LH41 | [Ir(LH41)$_2$Cl]$_2$<br>as for [Ir(LH35)$_2$Cl]$_2$ | 89% |
| [Ir(LH42)$_2$Cl]$_2$ | LH42 | [Ir(LH42)$_2$Cl]$_2$<br>as for [Ir(LH35)$_2$Cl]$_2$ | 89% |
| [Ir(LB1)$_2$Cl]$_2$ | LB1 | 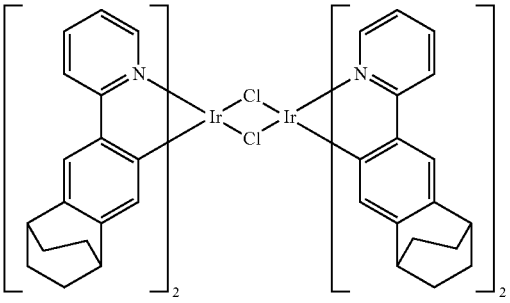<br>A | 76% |
| [Ir(LB2)$_2$Cl]$_2$ | LB2 | 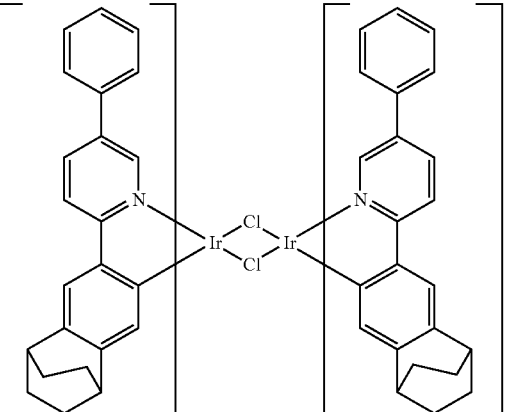<br>B<br>240° C./20 h | 76% |

-continued
| Ex. | Ligand L | Ir complex Variant Temp./time Diastereomer | Yield |
|---|---|---|---|
| [Ir(LB5)$_2$Cl]$_2$ | LB5 | [Ir(L85)$_2$Cl]$_2$<br>as for [Ir(LB1)$_2$Cl]$_2$ | 79% |
| [Ir(LB9)$_2$Cl]$_2$ | LB9 | [Ir(LB9)$_2$Cl]$_2$<br>as for [Ir(LB2)$_2$Cl]$_2$ | 81% |
| [Ir(LB10)$_2$Cl]$_2$ | LB10 | [Ir(LB10)$_2$Cl]$_2$<br>as for [Ir(LB1)$_2$Cl]$_2$ | 76% |
| [Ir(LB16)$_2$Cl]$_2$ | LB16 | [Ir(LB16)$_2$Cl]$_2$<br>as for [Ir(LB2)$_2$Cl]$_2$ | 82% |
| [Ir(LB26)$_2$Cl]$_2$ | LB26 | 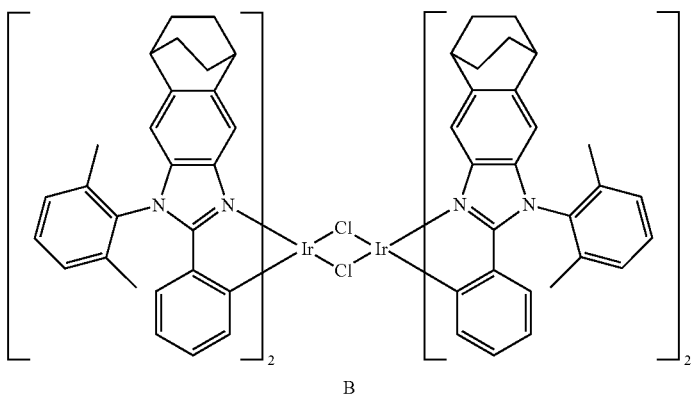<br>B<br>270° C./60 h | 75% |
| [Ir(LB30)$_2$Cl]$_2$ | LB30 | 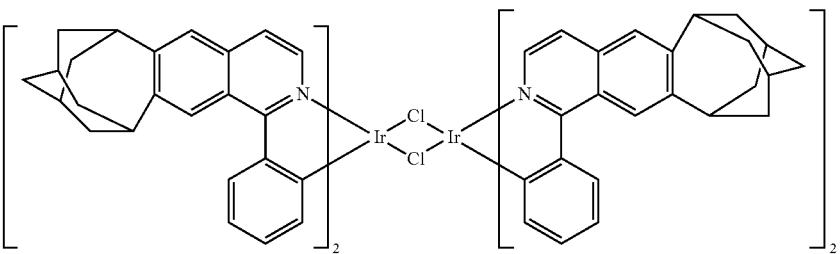<br>B<br>245° C./24 h | 83% |
| [Ir(LB31)$_2$Cl]$_2$ | LB31 | 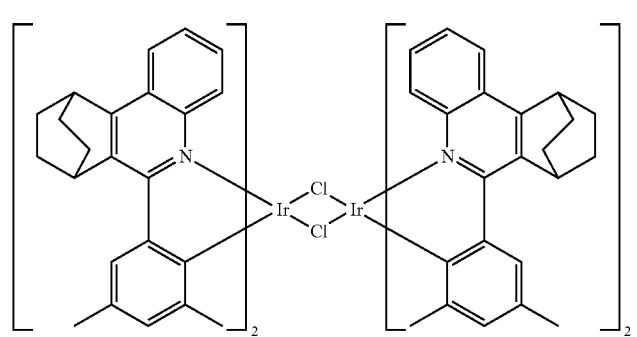<br>B<br>250° C./50 h | 81% |

| Ex. | Ligand L | Ir complex Variant Temp./time Diastereomer | Yield |
|---|---|---|---|
| [Ir(LB33)₂Cl]₂ | LB33 | 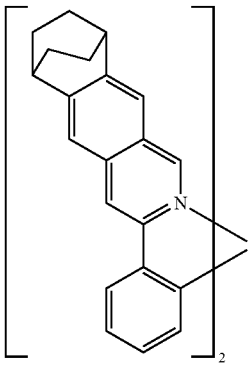<br>B<br>260° C./30 h | 88% |
| [Ir(LB36)₂Cl]₂ | LB36 | 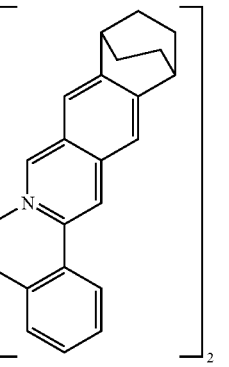<br>B<br>280° C./40 h | 53% |
| [Ir(LB37)₂Cl]₂ | LB37 | 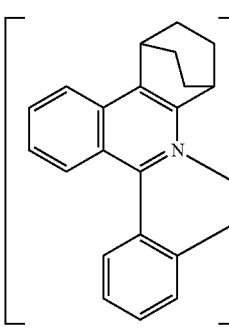<br>B<br>260° C./30 h | 88% |
| [Ir(LB38)₂Cl]₂ | LH42 | [Ir(LB38)₂Cl]₂<br>as for [Ir(LH35)₂Cl]₂ | 87% |

4) Iridium Complexes of the [Ir(L)₂(HOMe)₂]OTf Type 5 ml of methanol and then 10 mmol of silver(I) trifluoromethanesulfonate [2923-28-6] are added to a suspension of 5 mmol of the chloro dimer [Ir(L)₂Cl]₂ in 150 ml of dichloromethane, and the mixture is stirred at room temperature for 18 h. The precipitated silver(I) chloride is filtered off with suction via a Celite bed, the filtrate is evaporated to dryness, the yellow residue is taken up in 30 ml of toluene or cyclohexane, the solid is filtered off, washed with n-heptane and dried in vacuo. The product of the formula [Ir(L)₂(HOMe)₂]OTf obtained in this way is reacted further without purification.

| Ex. | [Ir(L)₂Cl]₂ | [Ir(L)₂(HOMe)₂]OTf | Yield |
|---|---|---|---|
| [Ir(LP1)₂(HOMe)₂]OTf | Ir[(LP1)Cl]₂ | *structure* | 81% |
| [Ir(LP2)₂(HOMe)₂]OTf | [Ir(LP2)₂Cl]₂ | [Ir(LP2)₂(HOMe)₂]OTf | 79% |
| [Ir(LH1)₂(HOMe)₂]OTf | [Ir(LH1)₂Cl]₂ | *structure* | |
| [Ir(LH2)₂(HOMe)₂]OTf | [Ir(LH2)₂Cl]₂ | [Ir(LH2)₂(HOMe)₂]OTf | 80% |
| [Ir(LH3)₂(HOMe)₂]OTf | [Ir(LH3)₂Cl]₂ | [Ir(LH3)₂(HOMe)₂]OTf | 78% |
| [Ir(LH4)₂(HOMe)₂]OTf | [Ir(LH4)₂Cl]₂ | [Ir(LH4)₂(HOMe)₂]OTf | 81% |
| [Ir(LH5)₂(HOMe)₂]OTf | [Ir(LH5)₂Cl]₂ | [Ir(LH5)₂(HOMe)₂]OTf | 83% |
| [Ir(LH6)₂(HOMe)₂]OTf | [Ir(LH6)₂Cl]₂ | [Ir(LH6)₂(HOMe)₂]OTf | 80% |
| [Ir(LH7)₂(HOMe)₂]OTf | [Ir(LH7)₂Cl]₂ | [Ir(LH7)₂(HOMe)₂]OTf | 81% |
| [Ir(LH9)₂(HOMe)₂]OTf | [Ir(LH9)₂Cl]₂ | [Ir(LH9)₂(HOMe)₂]OTf | 81% |
| [Ir(LH10)₂(HOMe)₂]OTf | [Ir(LH10)₂Cl]₂ | [Ir(LH10)₂(HOMe)₂]OTf | 86% |
| [Ir(LH12)₂(HOMe)₂]OTf | [Ir(LH12)₂Cl]₂ | [Ir(LH12)₂(HOMe)₂]OTf | 79% |
| [Ir(LH14)₂(HOMe)₂]OTf | [Ir(LH14)₂Cl]₂ | [Ir(LH14)₂(HOMe)₂]OTf | 80% |
| [Ir(LH15)₂(HOMe)₂]OTf | [Ir(LH15)₂Cl]₂ | [Ir(LH15)₂(HOMe)₂]OTf | 83% |
| [Ir(LH16)₂(HOMe)₂]OTf | [Ir(LH16)₂Cl]₂ | [Ir(LH16)₂(HOMe)₂]OTf | 78% |
| [Ir(LH17)₂(HOMe)₂]OTf | [Ir(LH17)₂Cl]₂ | [Ir(LH17)₂(HOMe)₂]OTf | 80% |
| [Ir(LH18)₂(HOMe)₂]OTf | [Ir(LH18)₂Cl]₂ | [Ir(LH18)₂(HOMe)₂]OTf | 82% |
| [Ir(LH19)₂(HOMe)₂]OTf | [Ir(LH19)₂Cl]₂ | [Ir(LH19)₂(HOMe)₂]OTf | 80% |
| [Ir(LH20)₂(HOMe)₂]OTf | [Ir(LH20)₂Cl]₂ | [Ir(LH20)₂(HOMe)₂]OTf | 85% |
| [Ir(LH21)₂(HOMe)₂]OTf | [Ir(LH21)₂Cl]₂ | [Ir(LH21)₂(HOMe)₂]OTf | 86% |
| [Ir(LH22)₂(HOMe)₂]OTf | [Ir(LH22)₂Cl]₂ | [Ir(LH22)₂(HOMe)₂]OTf | 80% |
| [Ir(LH26)₂(HOMe)₂]OTf | [Ir(LH26)₂Cl]₂ | [Ir(LH26)₂(HOMe)₂]OTf | 85% |
| [Ir(LH27)₂(HOMe)₂]OTf | [Ir(LH27)₂Cl]₂ | [Ir(LH27)₂(HOMe)₂]OTf | 84% |
| [Ir(LH28)₂(HOMe)₂]OTf | [Ir(LH28)₂Cl]₂ | [Ir(LH28)₂(HOMe)₂]OTf | 82% |
| [Ir(LH29)₂(HOMe)₂]OTf | [Ir(LH29)₂Cl]₂ | [Ir(LH29)₂(HOMe)₂]OTf | 85% |
| [Ir(LH30)₂(HOMe)₂]OTf | [Ir(LH30)₂Cl]₂ | [Ir(LH30)₂(HOMe)₂]OTf | 84% |
| [Ir(LH31)₂(HOMe)₂]OTf | [Ir(LH31)₂Cl]₂ | [Ir(LH31)₂(HOMe)₂]OTf | 79% |
| [Ir(LH32)₂(HOMe)₂]OTf | [Ir(LH32)₂Cl]₂ | [Ir(LH32)₂(HOMe)₂]OTf | 80% |
| [Ir(LH33)₂(HOMe)₂]OTf | [Ir(LH33)₂Cl]₂ | [Ir(LH33)₂(HOMe)₂]OTf | 82% |
| [Ir(LH34)₂(HOMe)₂]OTf | [Ir(LH34)₂Cl]₂ | [Ir(LH34)₂(HOMe)₂]OTf | 83% |
| [Ir(LH35)₂(HOMe)₂]OTf | [Ir(LH35)₂Cl]₂ | [Ir(LH35)₂(HOMe)₂]OTf | 85% |
| [Ir(LH36)₂(HOMe)₂]OTf | [Ir(LH36)₂Cl]₂ | [Ir(LH36)₂(HOMe)₂]OTf | 81% |
| [Ir(LH37)₂(HOMe)₂]OTf | [Ir(LH37)₂Cl]₂ | [Ir(LH37)₂(HOMe)₂]OTf | 80% |
| [Ir(LH38)₂(HOMe)₂]OTf | [Ir(LH38)₂Cl]₂ | [Ir(LH38)₂(HOMe)₂]OTf | 85% |
| [Ir(LH39)₂(HOMe)₂]OTf | [Ir(LH39)₂Cl]₂ | [Ir(LH39)₂(HOMe)₂]OTf | 80% |

| Ex. | [Ir(L)₂Cl]₂ | [Ir(L)₂(HOMe)₂]OTf | Yield |
|---|---|---|---|
| [Ir(LH40)₂(HOMe)₂]OTf | [Ir(LH40)₂Cl]₂ | [Ir(LH40)₂(HOMe)₂]OTf | 84% |
| [Ir(LH41)₂(HOMe)₂]OTf | [Ir(LH41)₂Cl]₂ | [Ir(LH41)₂(HOMe)₂]OTf | 84% |
| [Ir(LH42)₂(HOMe)₂]OTf | [Ir(LH42)₂Cl]₂ | [Ir(LH42)₂(HOMe)₂]OTf | 86% |
| [Ir(LB1)₂(HOMe)₂]OTf | [Ir(LB1)₂Cl]₂ | 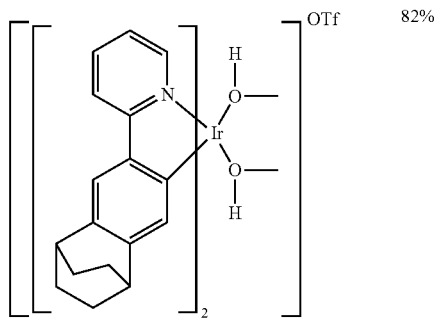<br>[Ir(LB1)₂(HOMe)₂]OTf | 82% |
| [Ir(LB2)₂(HOMe)₂]OTf | [Ir(LB2)₂Cl]₂ | [Ir(LB2)₂(HOMe)₂]OTf | 75% |
| [Ir(LB5)₂(HOMe)₂]OTf | [Ir(LB5)₂Cl]₂ | [Ir(LB5)₂(HOMe)₂]OTf | 78% |
| [Ir(LB9)₂(HOMe)₂]OTf | [Ir(LB9)₂Cl]₂ | [Ir(LB9)₂(HOMe)₂]OTf | 79% |
| [Ir(LB10)₂(HOMe)₂]OTf | [Ir(LB10)₂Cl]₂ | [Ir(LB10)₂(HOMe)₂]OTf | 80% |
| [Ir(LB16)₂(HOMe)₂]OTf | [Ir(LB16)₂Cl]₂ | [Ir(LB16)₂(HOMe)₂]OTf | 78% |
| [Ir(LB26)₂(HOMe)₂]OTf | [Ir(LB26)₂Cl]₂ | [Ir(LB26)₂(HOMe)₂]OTf | 78% |
| [Ir(LB30)₂(HOMe)₂]OTf | [Ir(LB30)₂Cl]₂ | [Ir(LB30)₂(HOMe)₂]OTf | 82% |
| [Ir(LB31)₂(HOMe)₂]OTf | [Ir(LB31)₂Cl]₂ | [Ir(LB31)₂(HOMe)₂]OTf | 82% |
| [Ir(LB33)₂(HOMe)₂]OTf | [Ir(LB33)₂Cl]₂ | [Ir(LB33)₂(HOMe)₂]OTf | 76% |
| [Ir(LB36)₂(HOMe)₂]OTf | [Ir(LB36)₂Cl]₂ | [Ir(LB36)₂(HOMe)₂]OTf | 75% |
| [Ir(LB37)₂(HOMe)₂]OTf | [Ir(LB37)₂Cl]₂ | [Ir(LB37)₂(HOMe)₂]OTf | 77% |
| [Ir(LB38)₂(HOMe)₂]OTf | [Ir(LB38)₂Cl]₂ | [Ir(LB38)₂(HOMe)₂]OTf | 74% |

5) Heteroleptic Iridium Complexes of the Phenylpyridine, Phenylimidazole or Phenylbenzimidazole Type:

A mixture of 10 mmol of the ligand L, 10 mmol of bis(methanol)bis[2-(2-pyridinyl-κN)phenyl-κC]iridium(III) trifluoromethanesulfonate [1215692-14-0] or bis(methanol) bis[2-(6-methyl-2-pyridinyl-κN)phenyl-κC]iridium(II) trifluoromethanesulfonate [1215692-29-7] or iridium complexes of the [Ir(L)₂(HOMe)₂]OTf type according to the invention, 11 mmol of 2,6-dimethylpyridine and 150 ml of ethanol is heated under reflux for 40 h. After cooling, the precipitated solid is filtered off with suction, washed three times with 30 ml of ethanol each time and dried in vacuo. The crude product obtained in this way is chromatographed on silica gel (solvent or mixtures thereof, for example DCM, THF, toluene, n-heptane, cyclohexane) and subjected to fractional sublimation as described under 1) variant A.

| Ex. | [Ir(L)₂(HOMe)₂]OTf Ligand L | Ir complex Diastereomer | Yield |
|---|---|---|---|
| Ir500 | 1215692-14-0<br>LH1 | (structure) | 44% |

-continued

| Ex. | [Ir(L)₂(HOMe)₂]OTf Ligand L | Ir complex Diastereomer | Yield |
|---|---|---|---|
| Ir501 | 1215692-14-0 LH2 | | 43% |
| Ir502 | 1215692-14-0 LH3 | | 45% |
| Ir503 | 1215692-29-7 LH4 | | 27% |

-continued
| Ex. | [Ir(L)₂(HOMe)₂]OTf Ligand L | Ir complex Diastereomer | Yield |
|---|---|---|---|
| Ir504 | 1215692-14-0 LH5 | 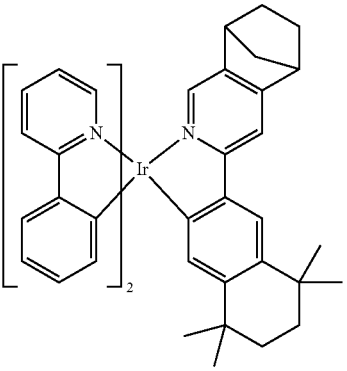 Diastereomer mixture | 38% |
| Ir505 | 1215692-14-0 LH6 | 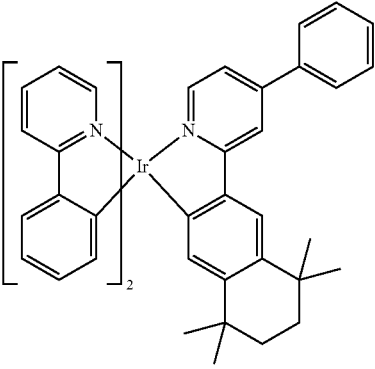 | 50% |
| Ir506 | 1215692-14-0 LH7 | 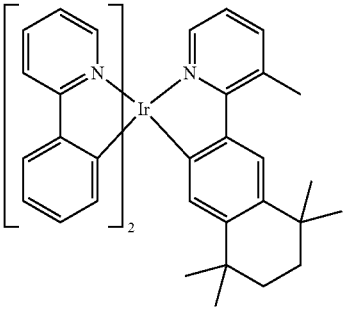 | 48% |
| Ir507 | 1215692-14-0 LH8 | 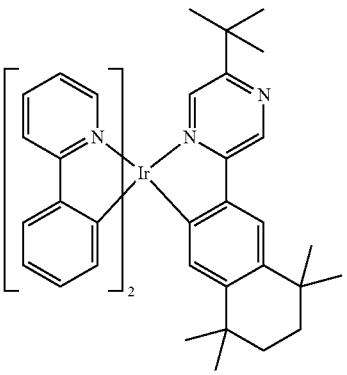 | 24% |

-continued
| Ex. | [Ir(L)₂(HOMe)₂]OTf Ligand L | Ir complex Diastereomer | Yield |
|---|---|---|---|
| IR508 | 1215692-14-0 LH9 | 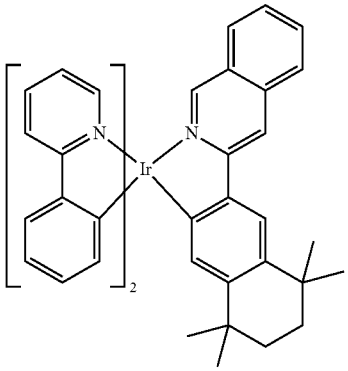 | 42% |
| Ir509 | 1215692-14-0 LH10 | 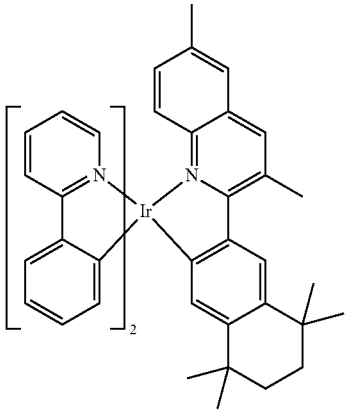 | 23% |
| Ir510 | 1215692-14-0 LH11 | 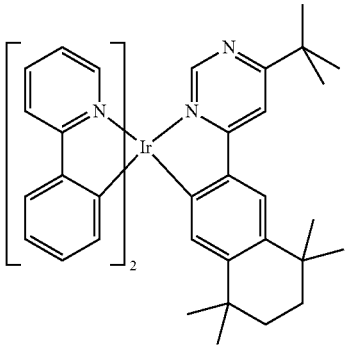 | 26% |

-continued

| Ex. | [Ir(L)₂(HOMe)₂]OTf Ligand L | Ir complex Diastereomer | Yield |
|---|---|---|---|
| Ir511 | 1215692-29-7 LH12 | | 44% |
| Ir512 | 1215692-29-7 LH13 | | 46% |
| Ir513 | 1215692-14-0 LH14 | | 43% |

-continued

| Ex. | [Ir(L)₂(HOMe)₂]OTf Ligand L | Ir complex Diastereomer | Yield |
|---|---|---|---|
| Ir514 | 1215692-14-0 LH15 | | 52% |
| Ir515 | 1215692-14-0 LH16 | | 40% |
| Ir516 | 1215692-14-0 LH17 | | 23% |

-continued

| Ex. | [Ir(L)₂(HOMe)₂]OTf Ligand L | Ir complex Diastereomer | Yield |
|---|---|---|---|
| Ir517 | 1215692-14-0 LH18 | | 21% |
| Ir518 | 1215692-14-0 LH19 | | 25% |
| Ir519 | 1215692-14-0 LH20 | | 25% |
| Ir520 | 1215692-14-0 LH26 | | 45% |

-continued

| Ex. | [Ir(L)₂(HOMe)₂]OTf Ligand L | Ir complex Diastereomer | Yield |
|---|---|---|---|
| Ir521 | 1215692-14-0 LH27 | | 41% |
| Ir522 | 1215692-14-0 LH30 | | 38% |
| Ir523 | 1215692-14-0 LH31 | | 43% |
| Ir524 | 1215692-14-0 LH33 | | 43% |

-continued

| Ex. | [Ir(L)₂(HOMe)₂]OTf Ligand L | Ir complex Diastereomer | Yield |
|---|---|---|---|
| Ir525 | 1215692-14-0 LH34 | | 43% |
| Ir526 | 1215692-14-0 LH35 | | 43% |
| Ir527 | 1215692-14-0 LH36 | | 43% |
| Ir528 | 1215692-14-0 LH37 | | 43% |

-continued

| Ex. | [Ir(L)₂(HOMe)₂]OTf Ligand L | Ir complex Diastereomer | Yield |
|---|---|---|---|
| Ir529 | 1215692-14-0 LH41 | | 43% |
| Ir530 | 1215692-14-0 LH42 | | 43% |
| Ir531 | 1215692-14-0 LB38 | | 43% |
| Ir532 | [Ir(LP1)₂(HOMe)₂]OTf LH1 | | 46% |

| Ex. | [Ir(L)₂(HOMe)₂]OTf<br>Ligand<br>L | Ir complex<br>Diastereomer | Yield |
|---|---|---|---|
| Ir533 | [Ir(LP2)₂(HOMe)₂]OTf<br>LH2 | | 44% |
| Ir534 | [Ir(LH1)₂(HOMe)₂]OTf<br>1008-89-56 | | 46% |
| Ir535 | [Ir(LH2)₂(HOMe)₂]OTf<br>1008-89-56 | | 50% |

-continued

| Ex. | [Ir(L)₂(HOMe)₂]OTf Ligand L | Ir complex Diastereomer | Yield |
|---|---|---|---|
| Ir536 | [Ir(LH3)₂(HOMe)₂]OTf 1008-89-56 | | 43% |
| Ir537 | [Ir(LH6)₂(HOMe)₂]OTf 10273-90-2 | | 45% |
| Ir538 | [Ir(LH7)₂(HOMe)₂]OTf 10273-90-2 | | 38% |
| Ir539 | [Ir(LH9)₂(HOMe)₂]OTf 458541-39-4 | | 46% |

-continued

| Ex. | [Ir(L)₂(HOMe)₂]OTf Ligand L | Ir complex Diastereomer | Yield |
|---|---|---|---|
| Ir540 | [Ir(LH12)₂(HOMe)₂]OTf 1008-89-56 | | 45% |
| Ir541 | [Ir(LH14)₂(HOMe)₂]OTf 1008-89-56 | | 40% |
| Ir542 | [Ir(LH15)₂(HOMe)₂]OTf 1008-89-56 | | 40% |

-continued

| Ex. | [Ir(L)₂(HOMe)₂]OTf Ligand L | Ir complex Diastereomer | Yield |
|---|---|---|---|
| Ir543 | [Ir(LH16)₂(HOMe)₂]OTf LH1 | | 42% |
| Ir544 | [Ir(LH20)₂(HOMe)₂]OTf 340026-65-5 | | 20% |
| Ir545 | [Ir(LH21)₂(HOMe)₂]OTf 1008-89-56 | | 26% |
| Ir546 | [Ir(LH22)₂(HOMe)₂]OTf 4350-51-0 | | 29% |

-continued
| Ex. | [Ir(L)$_2$(HOMe)$_2$]OTf Ligand L | Ir complex Diastereomer | Yield |
|---|---|---|---|
| Ir547 | [Ir(LH26)$_2$(HOMe)$_2$]OTf 1008-89-56 | 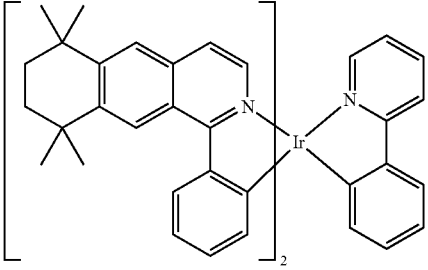 | 45% |
| Ir548 | [Ir(LH27)$_2$(HOMe)$_2$]OTf 37993-76-3 | 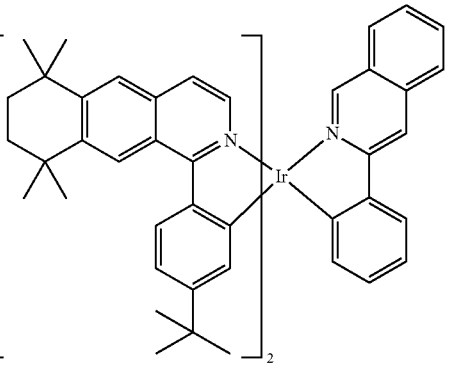 | 43% |
| Ir549 | [Ir(LH28)$_2$(HOMe)$_2$]OTf 37993-76-3 | 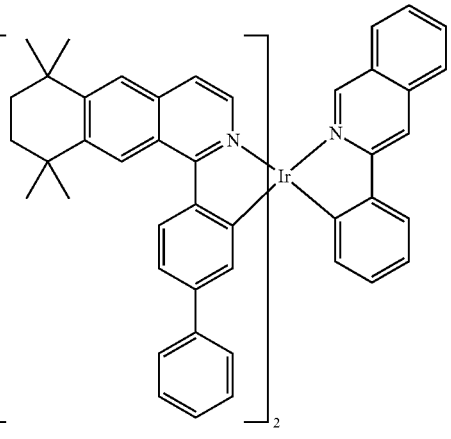 | 43% |
| Ir550 | [Ir(LH29)$_2$(HOMe)$_2$]OTf 230-27-3 | 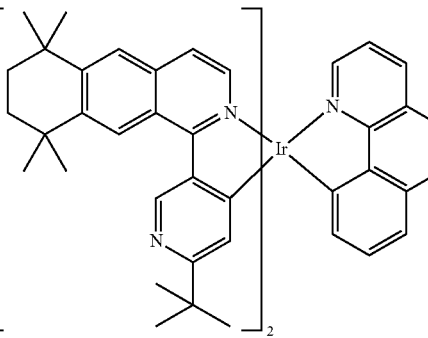 | 21% |

-continued

| Ex. | [Ir(L)₂(HOMe)₂]OTf Ligand L | Ir complex Diastereomer | Yield |
|---|---|---|---|
| Ir551 | [Ir(LH30)₂(HOMe)₂]OTf LP2 | | 38% |
| Ir552 | [Ir(LH31)₂(HOMe)₂]OTf LB18 | | 36% |
| Ir553 | [Ir(LH32)₂(HOMe)₂]OTf LB19 | | 39% |
| Ir554 | [Ir(LH33)₂(HOMe)₂]OTf 1008-89-56 | | 48% |

-continued

| Ex. | [Ir(L)₂(HOMe)₂]OTf Ligand L | Ir complex Diastereomer | Yield |
|---|---|---|---|
| Ir555 | [Ir(LH34)₂(HOMe)₂]OTf LH33 | | 45% |
| Ir556 | [Ir(LH35)₂(HOMe)₂]OTf 1008-89-56 | | 47% |
| Ir557 | [Ir(LH36)₂(HOMe)₂]OTf LH1 | | 36% |

-continued

| Ex. | [Ir(L)₂(HOMe)₂]OTf Ligand L | Ir complex Diastereomer | Yield |
|---|---|---|---|
| Ir558 | [Ir(LH37)₂(HOMe)₂]OTf 26274-35-1 | | 41% |
| Ir559 | [Ir(LH)38₂(HOMe)₂]OTf LB37 | | 45% |
| Ir560 | [Ir(LH39)₂(HOMe)₂]OTf LH6 | | 42% |

-continued

| Ex. | [Ir(L)₂(HOMe)₂]OTf<br>Ligand<br>L | Ir complex<br>Diastereomer | Yield |
|---|---|---|---|
| Ir561 | [Ir(LH40)₂(HOMe)₂]OTf<br>4350-51-0 | | 31% |
| Ir562 | [Ir(LH41)₂(HOMe)₂]OTf<br>1008-89-56 | | 46% |
| Ir563 | [Ir(LH42)₂(HOMe)₂]OTf<br>1008-89-56 | | 45% |
| Ir564 | [Ir(LB1)₂(HOMe)₂]OTf<br>LH1 | | 44% |

-continued

| Ex. | [Ir(L)₂(HOMe)₂]OTf Ligand L | Ir complex Diastereomer | Yield |
|---|---|---|---|
| Ir565 | [Ir(LB2)₂(HOMe)₂]OTf LH38 | | 39% |
| Ir566 | [Ir(LB3)₂(HOMe)₂]OTf LH35 | | 40% |
| Ir567 | [Ir(LB10)₂(HOMe)₂]OTf LH35 | | 41% |

-continued

| Ex. | [Ir(L)₂(HOMe)₂]OTf Ligand L | Ir complex Diastereomer | Yield |
|---|---|---|---|
| Ir568 | [Ir(LB16)₂(HOMe)₂]OTf LH38 | | 39% |
| Ir569 | [Ir(LB33)₂(HOMe)₂]OTf LH1 | | 40% |
| Ir570 | [Ir(LB37)₂(HOMe)₂]OTf LH35 | | 45% |

-continued

| Ex. | [Ir(L)₂(HOMe)₂]OTf Ligand L | Ir complex Diastereomer | Yield |
|---|---|---|---|
| Ir571 | [Ir(LB38)₂(HOMe)₂]OTf 1008-89-56 | | 47% |

6) Heteroleptic Tris-Facial Iridium Complexes Containing Ligands of the Arduengo Carbene Type:

Preparation analogous to A. G. Tennyson et al., Inorg. Chem., 2009, 48, 6924.

A mixture of 22 mmol of the ligand, 10 mmol of iridium chloro dimer [Ir(L)₂Cl]₂, 10 mmol of silver(I) oxide and 300 ml of 1,2-dichloroethane is stirred at 90° C. for 30 h. After cooling, the precipitated solid is filtered off with suction via a Celite bed, washed once with 30 ml of 1,2-dichloroethane, and the filtrate is evaporated to dryness in vacuo. The crude product obtained in this way is chromatographed on silica gel (solvent or mixtures thereof, for example dichloromethane, THF, toluene, n-heptane, cyclohexane) and subjected to fractional sublimation as described under 1) variant A.

| Ex. | [Ir(L)₂Cl]₂ Ligand L | Ir complex Diastereomer | Yield |
|---|---|---|---|
| Ir572 | [Ir(PPy)₂Cl]₂ 603109-48-4 LH23 | | 43% |
| Ir573 | [Ir(LH20)₂Cl]₂ LH24 | | 45% |

7) Platinum Complexes of Tetradentate Ligands:

A mixture of 10 mmol of the ligand L, 10 mmol of K$_2$PtCl$_4$, 400 mmol of lithium acetate, anhydrous, and 200 ml of glacial acetic acid is heated under reflux for 60 h. After cooling and addition of 200 ml of water, the mixture is extracted twice with 250 ml of toluene each time, dried over magnesium sulfate, filtered through a Celite bed, the Celite is rinsed with 200 ml of toluene, and the toluene is then removed in vacuo. The solid obtained in this way is purified as described under 1) variant A by hot extraction and then subjected to fractional sublimation.

| Ex. | Ligand L | Pt complex | Extractant | Yield |
|---|---|---|---|---|
| Pt(LH43) | LH43 |  | Toluene | 40% |
| Pt(LH44) | LH44 | Pt(LH44) | Toluene | 19% |
| Pt(LH45) | LH45 | Pt(LH45) | Cyclohexane | 37% |

10) Platinum Complexes of Tetradentate Ligands of the Arduengo Carbene Type:

A mixture of 10 mmol of the ligand, 10 mmol of silver(I) oxide and 200 ml of dioxane is stirred at room temperature for 16 h, 100 ml of butanone, 20 mmol of sodium carbonate and 10 mmol of cyclooctadienylplatinum dichloride are then added, and the mixture is heated under reflux for 16 h. After removal of the solvent, the solid is extracted by stirring with 500 ml of hot toluene, the suspension is filtered through a Celite bed, and the filtrate is evaporated to dryness. The solid obtained in this way is chromatographed on silica gel with DCM and then subjected to fractional sublimation as described under 1) variant A.

| Ex. | Ligand | Pt complex | Yield |
|---|---|---|---|
| Pt(LH46) | LH46 |  | 25% |
| Pt(LH47) | LH47 | Pt(LH47) | 28% |

11) Iridium Complexes of Hexadentate Ligands:

A mixture of 10 mmol of the ligand L, 10 mmol of sodium bisacetylacetonatodichloroiridate(III) [770720-50-8] and 200 ml of triethylene glycol dimethyl ether is heated at 210° C. on a water separator for 48 h (the acetyl-acetone and thermal cleavage products of the solvent distil off). After cooling and addition of 200 ml of water, the precipitated solid is filtered off with suction and dried in vacuo. The solid is extracted by stirring with 500 ml of hot THF, the suspension is filtered through a Celite bed while still hot, the Celite is rinsed with 200 ml of THF, and the combined filtrates are evaporated to dryness. The solid obtained in this way is purified as described under 1) variant A by hot extraction with toluene and then subjected to fractional sublimation.

| Ex. | Ligand | Ir complex | Yield |
|---|---|---|---|
| Ir(LH48) | LH48 | | 21% |
| Ir(LH49) | LH49 | Ir(LH49) | 22% |
| Ir(LH50) | LH50 | Ir(LH50) | 19% |

12) Iridium Complexes of Hexadentate Ligands of the Arduengo Carbene Type:

Preparation analogous to K. Tsuchiya et al., Eur. J. Inorg. Chem. 2010, 926.

A mixture of 3 mmol of the ligand, 3 mmol of iridium(III) chloride hydrate, 10 mmol of silver carbonate and 10 mmol of sodium carbonate in 75 ml of 2-ethoxyethanol is warmed under reflux for 48 h. After cooling, 300 ml of water are added, the precipitated solid is filtered off with suction, washed once with 30 ml of water and three times with 15 ml of ethanol each time and dried in vacuo. The crude product obtained in this way is chromatographed on silica gel (DCM) and then subjected to fractional sublimation as described under 1) variant A.

| Ex. | Ligand | Ir complex | Yield |
|---|---|---|---|
| Ir(LH51) | LH51 | | 23% |
| Ir(LH52) | LH52 | Ir(LH52) | 17% |

Derivatisation of the Metal Complexes

1) Halogenation of the Fac-Iridium Complexes:

A×10.5 mmol of N-halosuccinimide (halogen: Cl, Br, I) are added to a solution or suspension of 10 mmol of a complex carrying A×C—H groups (where A=1, 2 or 3) in the para-position to the iridium in 500 ml of dichloromethane at 30° C. with exclusion of light and air, and the mixture is stirred for 20 h. Complexes which have low solubility in DCM can also be reacted in other solvents (TCE, THF, DMF, etc.) and at elevated temperature. The solvent is subsequently substantially removed in vacuo. The residue is boiled with 100 ml of methanol, the solid is filtered off with suction, washed three times with 30 ml of methanol and then dried in vacuo, giving the fac-iridium complexes which are brominated in the para-position to the iridium Synthesis of Ir(LH35-Br)₃:

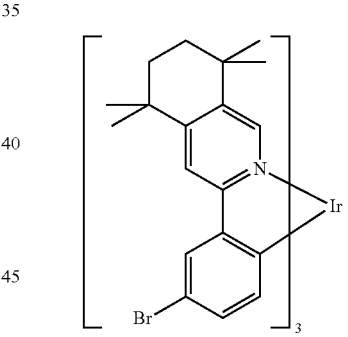

5.6 g (31.5 mmol) of N-bromosuccinimide are added in one portion to a suspension, stirred at 30° C., of 9.8 g (10 mmol) of Ir(LH35)₃ in 500 ml of DCM, and the mixture is then stirred for a further 20 h. After removal of about 450 ml of the DCM in vacuo, 100 ml of methanol are added to the yellow suspension, the solid is filtered off with suction, washed three times with about 30 ml of methanol and then dried in vacuo. Yield: 11.4 g (9.3 mmol), 953%; purity: >99.0% according to NMR.

The following compounds can be prepared analogously:

| Ex. | Complex | Brominated complex | Yield |
|---|---|---|---|
| Ir(LH20-Br)$_3$ | 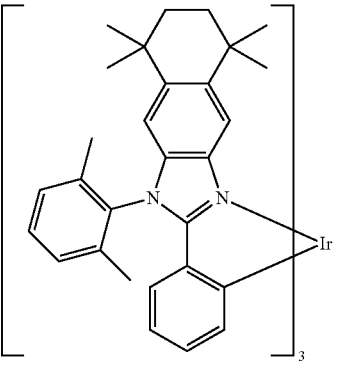<br>Ir(LH20)$_3$ | 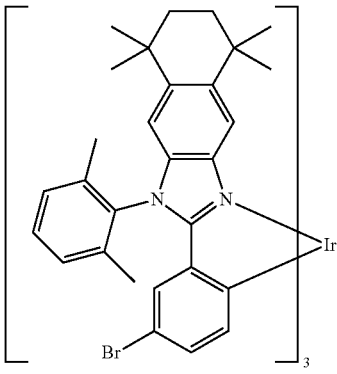<br>Ir(LH20-Br)$_3$ | 90% |
| Ir(LH23-Br)$_3$ | 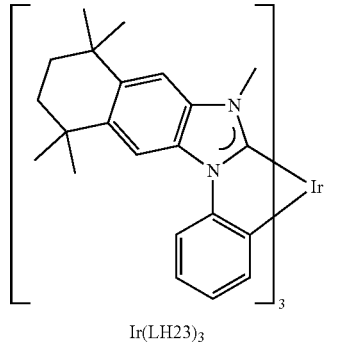<br>Ir(LH23)$_3$ | 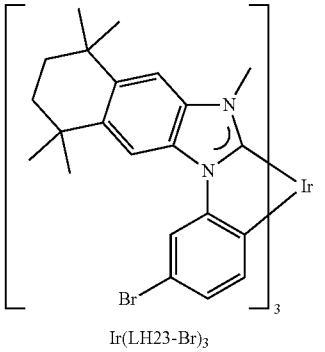<br>Ir(LH23-Br)$_3$ | 88% |
| Ir(LH26-Br)$_3$ | 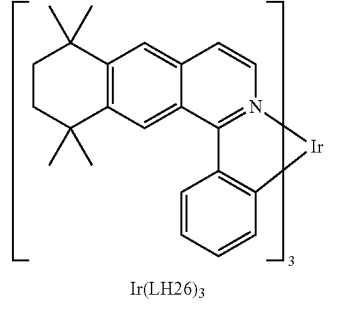<br>Ir(LH26)$_3$ | 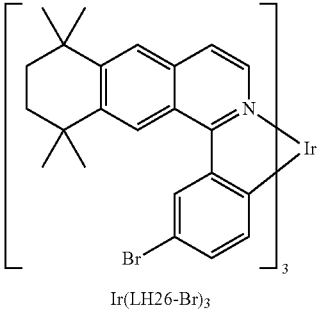<br>Ir(LH26-Br)$_3$ | 85% |
| Ir(LH33-Br)$_3$ | 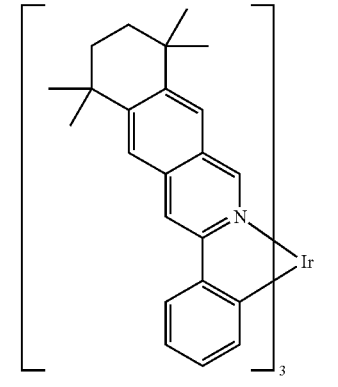<br>Ir(LH33)$_3$ | 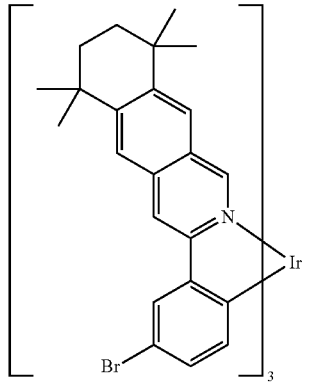<br>Ir(LH33-Br)$_3$ | 87% |

-continued

| Ex. | Complex | Brominated complex | Yield |
|---|---|---|---|
| Ir(LH38-Br)$_3$ | Ir(LH38)$_3$ | Ir(LH38-Br)$_3$ | 90% |
| Ir500-Br$_2$ | Ir500 | Ir500-Br$_2$ | 85% |
| Ir501-Br$_2$ | Ir501 | Ir501-Br$_2$ | 91% |

| Ex. | Complex | Brominated complex | Yield |
|---|---|---|---|
| Ir505-Br$_2$ | 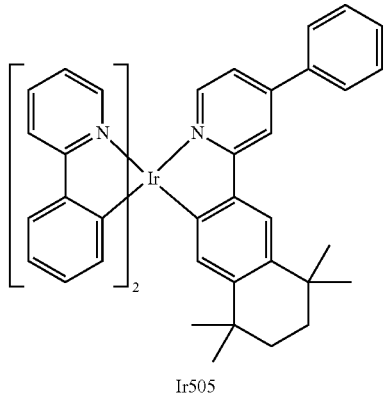 Ir505 | 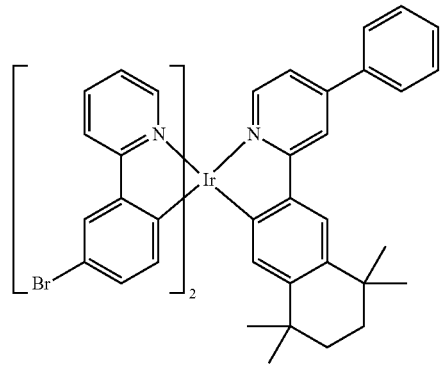 Ir505-Br$_2$ | 90% |
| Ir529-Br$_2$ | 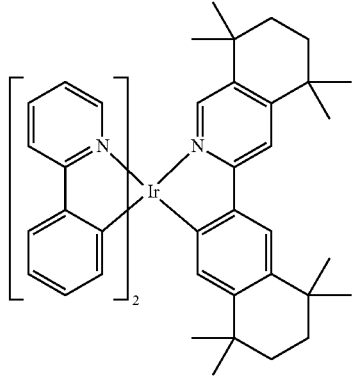 Ir529 | 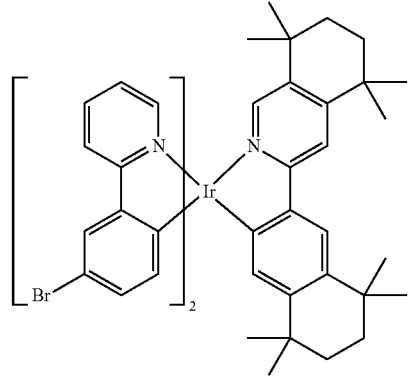 Ir529-Br$_2$ | 88% |
| Ir534-Br | 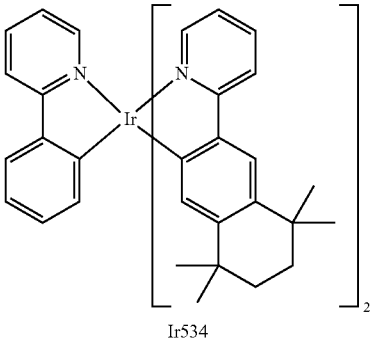 Ir534 | 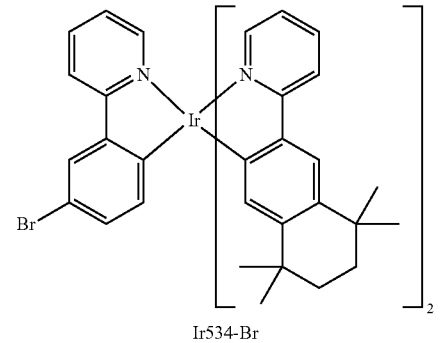 Ir534-Br | 89% |

-continued
| Ex. | Complex | Brominated complex | Yield |
|---|---|---|---|
| Ir535-Br | 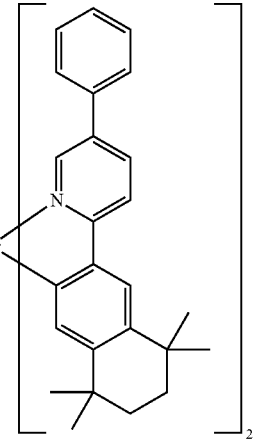Ir535 | 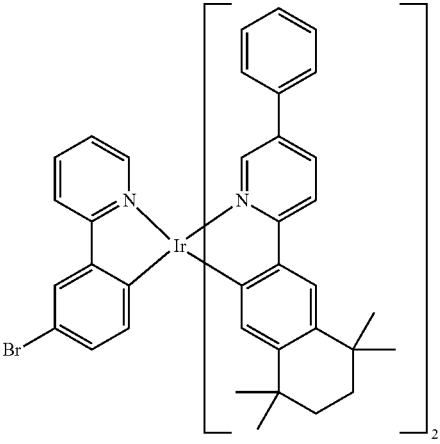Ir535-Br | 91% |
| Ir541-Br | 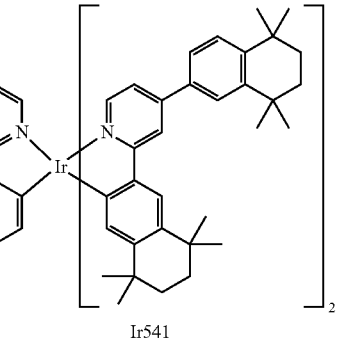Ir541 | 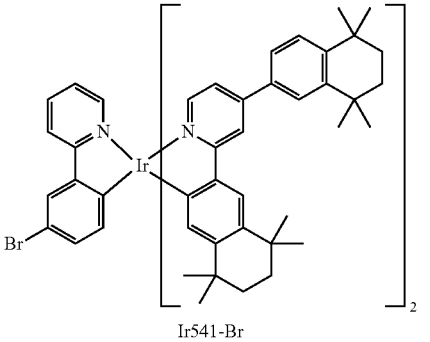Ir541-Br | 85% |
| Ir563-Br | 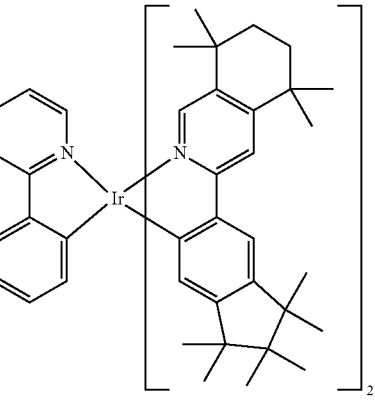Ir563 | 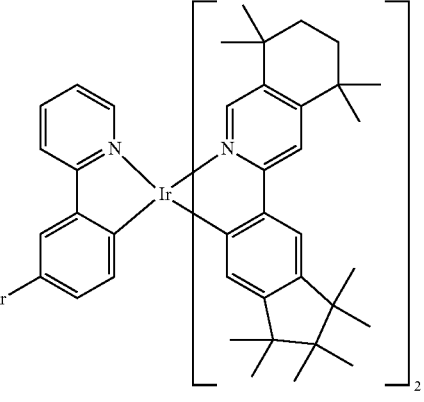Ir563-Br | 87% |

2) Suzuki Coupling to the Brominated Fac-Iridium Complexes:

Variant a, Two-Phase Reaction Mixture:

0.6 mmol of tri-o-tolylphosphine and then 0.1 mmol of palladium(II) acetate are added to a suspension of 10 mmol of a brominated complex, 12-20 mmol of the boronic acid or boronic acid ester per Br function and 40-80 mmol of tripotassium phosphate in a mixture of 300 ml of toluene, 100 ml of dioxane and 300 ml of water, and the mixture is heated under reflux for 16 h. After cooling, 500 ml of water and 200 ml of toluene are added, the aqueous phase is separated off, the organic phase is washed three times with 200 ml of water, once with 200 ml of saturated sodium chloride solution and dried over magnesium sulfate. The solid material is filtered off through a Celite bed and rinsed with toluene, the toluene is removed virtually completely in vacuo, 300 ml of methanol are added, the precipitated crude product is filtered off with suction, washed three times with 50 ml of methanol each time and dried in vacuo. The crude product is passed through a silica-gel column twice. The metal complex is finally heated or sublimed. The heating is carried out in a high vacuum (p about $10^{-6}$ mbar) in the temperature range from about 200-300° C. The sublimation is carried out in a high vacuum (p about $10^{-6}$ mbar) in the temperature range from about 300-400° C., with the sublimation preferably being carried out in the form of a fractional sublimation.

Variant B, One-Phase Reaction Mixture:

0.6 mmol of tri-o-tolylphosphine and then 0.1 mmol of palladium(II) acetate are added to a suspension of 10 mmol of a brominated complex, 12-20 mmol of the boronic acid or boronic acid ester per Br function and 60-100 mmol of the base (potassium fluoride, tripotassium phosphate (anhydrous or monohydrate or trihydrate), potassium carbonate, caesium carbonate, etc.) and 100 g of glass beads (diameter 3 mm) in 100 ml-500 ml of an aprotic solvent (THF, dioxane, xylene, mesitylene, dimethylacetamide, NMP, DMSO, etc.), and the mixture is heated under reflux for 1-24 h. Alternatively, other phosphines, such as tri-tert-butylphosphine, SPhos, XPhos, RuPhos, XanthPhos, etc., can be employed, where the preferred phosphine:palladium ratio in the case of these phosphines is 2:1 to 1.2:1. The solvent is removed in vacuo, the product is taken up in a suitable solvent (toluene, dichloromethane, ethyl acetate, etc.) and purified as described under Variant A.

Synthesis of Ir600:

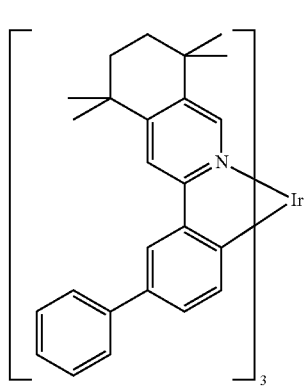

Variant A:

Use of 12.2 g (10.0 mmol) of Ir(LH35-Br)$_3$ and 4.9 g (40.0 mmol) of phenyl-boronic acid [98-80-6], 17.7 (60 mmol) of tripotassium phosphate (anhydrous), 183 mg (0.6 mmol) of tri-o-tolylphosphine [6163-58-2], 23 mg (0.1 mmol) of palladium(II) acetate, 300 ml of toluene, 100 ml of dioxane and 300 ml of water, 100° C., 12 h. Chromatographic separation on silica gel with toluene/ethyl acetate (90:10, w) twice. Yield: 6.3 g (5.2 mmol), 52%; purity: about 99.9% according to HPLC.

The following compounds can be prepared analogously:

| Ex. | Complex Boronic acid Variant | Product | Yield |
|---|---|---|---|
| Ir601 | Ir(LH38-Br)$_3$ 1233200-59-3 A Chromatographic separation using toluene | 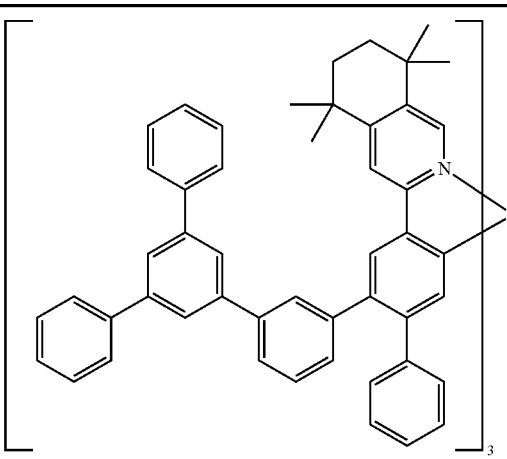 | 57% |

-continued

| Ex. | Complex Boronic acid Variant | Product | Yield |
|---|---|---|---|
| Ir602 | Ir(LH33-Br)₃ 84110-40-7 B SPhos:Pd(ac)₂/2:1 K₃PO₄ * 3H₂O Toluene Chromatographic separation using toluene | 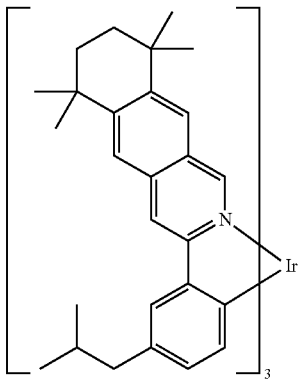 | 53% |
| Ir603 | Ir(LH26-Br)₃ 5122-95-2 A Chromatographic separation using toluene | 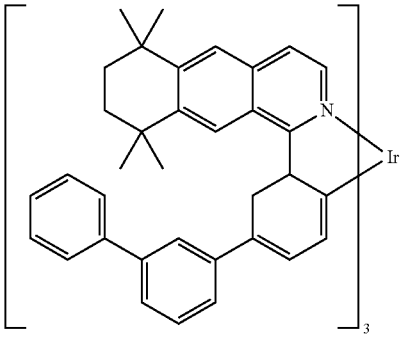 | 64% |
| Ir604 | Ir(LH20-Br)₃ 84110-40-7 B SPhos:Pd(ac)₂/2:1 K₃PO₄ * 3H₂O Toluene Chromatographic separation using toluene | 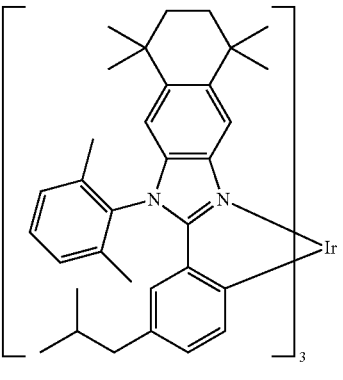 | 61% |
| Ir605 | Ir500-Br₂ 100379-00-8 B SPhos:Pd(ac)₂/2:1 Cs₂CO₃/dioxane Chromatographic separation using tol/DCM (95:5 vv) | 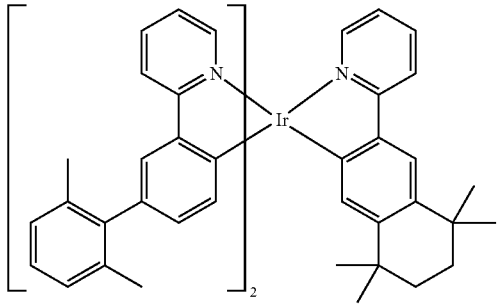 | 33% |

| Ex. | Complex Boronic acid Variant | Product | Yield |
|---|---|---|---|
| Ir606 | Ir529-Br$_2$ 1251825-65-6 A Chromatographic separation using n-heptane/EA (90:10) | | 58% |
| Ir607 | Ir535-Br 654664-63-8 A Chromatographic separation using n-heptane/DCM (90:10) | | 51% |

3) Buchwald Coupling to the Iridium Complexes:

0.4 mmol of tri-tert-butylphosphine and then 0.3 mmol of palladium(II) acetate are added to a mixture of 10 mmol of the brominated complex, 12-20 mmol of the diarylamine or carbazole p[er bromine function, 1.1 molar amount of sodium tert-butoxide per amine employed or 80 mmol of tripotassium phosphate (anhydrous) in the case of carbazoles, 100 g of glass beads (diameter 3 mm) and 300-500 ml of toluene or o-xylene in the case of carbazoles, and the mixture is heated under reflux for 16-30 h with vigorous stirring. After cooling, 500 ml of water are added, the aqueous phase is separated off, and the organic phase is washed twice with 200 ml of water and once with 200 ml of saturated sodium chloride solution and dried over magnesium sulfate. The solid material is filtered off through a Celite bed and rinsed with toluene or o-xylene, the solvent is removed virtually completely in vacuo, 300 ml of ethanol are added, the precipitated crude product is filtered off with suction, washed three times with 50 ml of EtOH each time and dried in vacuo. The crude product is purified by chromatography on silica gel twice. The metal complex is finally heated or sublimed. The heating is carried out in a high vacuum (p about $10^{-6}$ mbar) in the temperature range from about 200-300° C. The sublimation is carried out in a high vacuum (p about $10^{-6}$ mbar) in the temperature range from about 300-400° C., with the sublimation preferably being carried out in the form of a fractional sublimation.

Synthesis of Ir700:

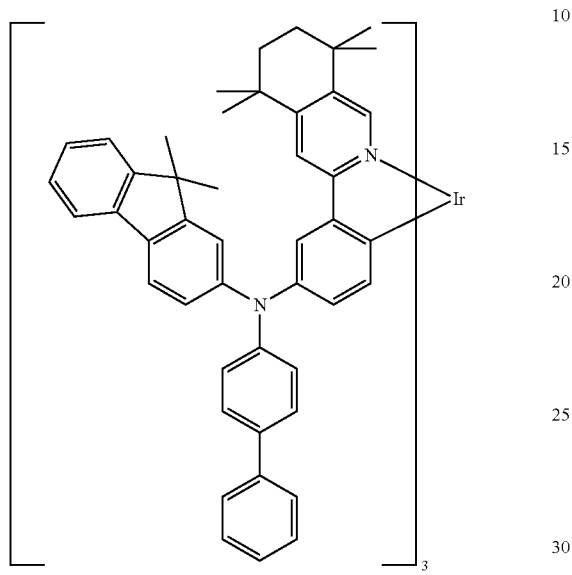

Use of 12.2 g (10 mmol) of Ir(LH35-Br)₃ and 14.5 g (40 mmol) of N-[1,1'-biphenyl]-4-yl-9,9-dimethyl-9H-fluoren-2-amine [897671-69-1]. Heating. Yield: 8.5 g (4.1 mmol), 41%; purity: about 99.8% according to HPLC.

The following compounds can be prepared analogously:

| Ex. | Product<br>Starting material<br>Amine or carbazole | Yield |
|---|---|---|
| Ir701 | Ir505-Br₂<br>[1257220-47-5] | 40% |

-continued
| Ex. | Product Starting material Amine or carbazole | Yield |
|---|---|---|
| Ir702 | 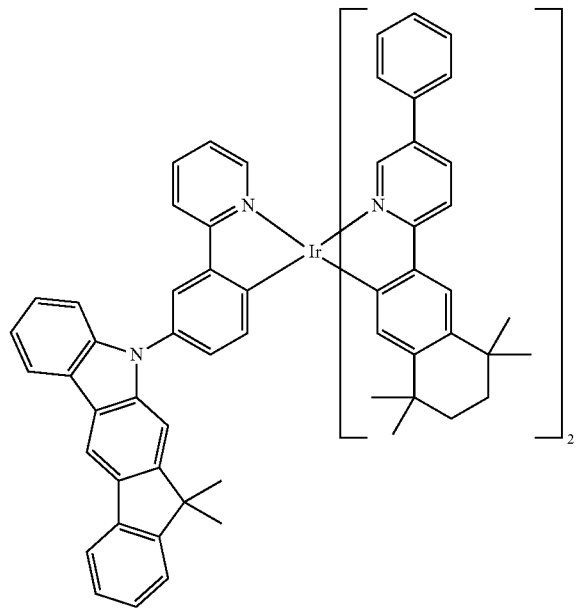<br>Ir535-Br<br>[1257220-47-5] | 45% |
| Ir703 | 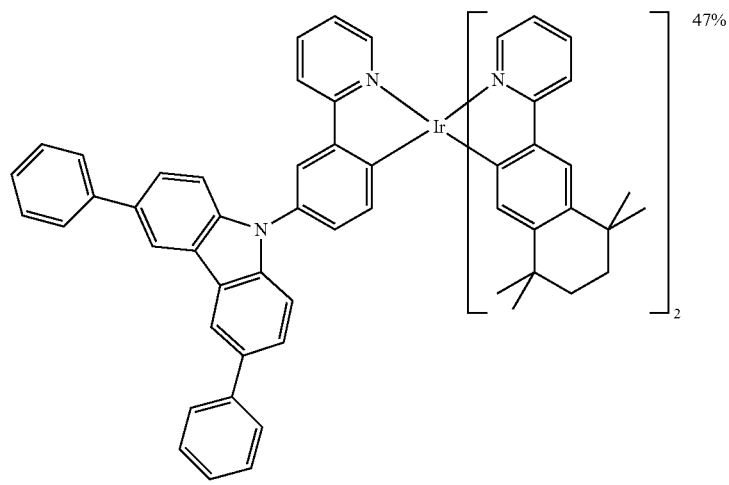<br>Ir534-Br<br>[56525-79-2] | 47% |

| Ex. | Product Starting material Amine or carbazole | Yield |
|---|---|---|
| Ir704 | 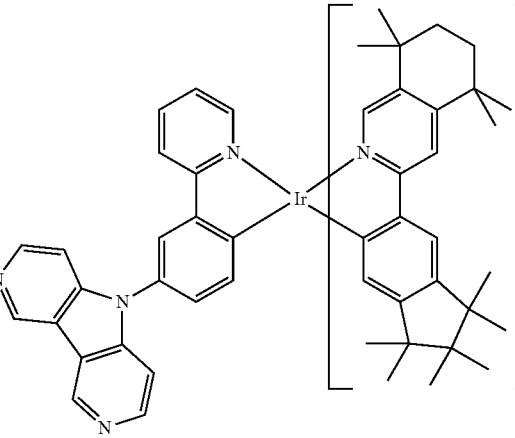<br>Ir563-Br<br>[244-78-0] | 37% |

4) Cyanation of the Iridium Complexes:

A mixture of 10 mmol of the brominated complex, 13 mmol of copper(I) cyanide per bromine function and 300 ml of NMP is stirred at 200° C. for 20 h. After cooling, the solvent is removed in vacuo, the residue is taken up in 500 ml of dichloromethane, the copper salts are filtered off via Celite, the dichloromethane is evaporated virtually to dryness in vacuo, 100 ml of ethanol are added, the precipitated solid is filtered off with suction, washed twice with 50 ml of ethanol each time and dried in vacuo. Chromatography or hot extraction and fractional sublimation of the crude product as described in C: Synthesis of the metal complexes, 1) Homoleptic tris-facial iridium complexes of the phenylpyridine, phenylimidazole or phenylbenzimidazole type: variant A.

Synthesis of Ir800:

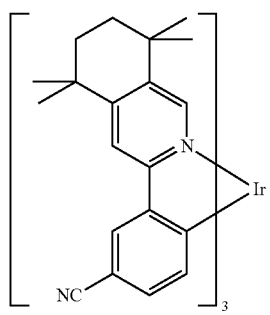

Use of 12.2 g (10 mmol) of Ir(LH35-Br)$_3$ and 3.5 g (39 mmol) of copper(I) cyanide. Sublimation. Yield: 4.6 g (4.3 mmol), 43%; purity: about 99.8% according to HPLC.

The Following Compounds can be Prepared Analogously:

| Ex. | Product Starting material | Yield |
|---|---|---|
| Ir801 | 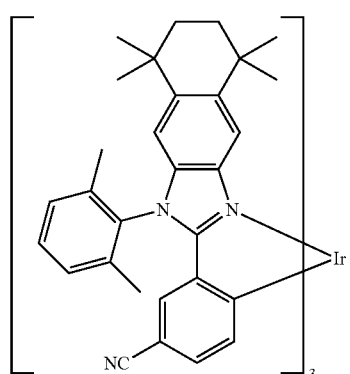<br>Ir(LH20-Br)$_3$ | 35% |
| Ir802 | 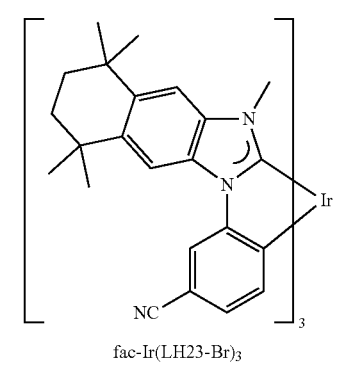<br>fac-Ir(LH23-Br)$_3$ | 37% |

| Ex. | Product Starting material | Yield |
|---|---|---|
| Ir803 | Ir529-Br₂ | 44% |

5) Borylation of the Iridium Complexes:

A mixture of 10 mmol of the brominated complex, 12 mmol of bis(pinacolato)diborane [73183-34-3] per bromine function, 30 mmol of potassium acetate, anhydrous, per bromine function, 0.2 mmol of tricyclohexylphosphine, 0.1 mmol of palladium(II) acetate and 300 ml of solvent (dioxane, DMSO, NMP, etc.) is stirred at 80-160° C. for 4-16 h. After removal of the solvent in vacuo, the residue is taken up in 300 ml of dichloromethane, THF or ethyl acetate, filtered through a Celite bed, the filtrate is evaporated in vacuo until crystallisation commences, and finally about 100 ml of methanol are added dropwise in order to complete the crystallisation. The compounds can be recrystallised from dichloromethane, ethyl acetate or THF with addition of methanol or alternatively from cyclohexane.

Synthesis of Ir900:

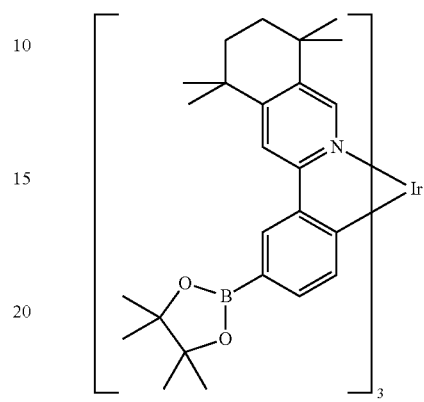

Use of 12.2 g (10 mmol) of Ir(LH35-Br)₃ and 9.1 g (36 mmol) of bis(pinacolato)diborane [73183-34-3], DMSO, 120° C., 6 h, taking-up and Celite filtration in THF, recrystallisation from THF:methanol. Yield: 6.8 g (5.0 mmol), 50%; purity: about 99.8% according to HPLC.

The following compounds can be prepared analogously:

| Ex. | Starting material | Product | Yield |
|---|---|---|---|
| Ir901 | Ir500-Br₂ | Ir901 | 60% |
| Ir902 | Ir505-Br₂ | Ir902 | 64% |

6) Suzuki Coupling to the Borylated Fac-Iridium Complexes:

Variant A, Two-Phase Reaction Mixture:

0.6 mmol of tri-o-tolylphosphine and then 0.1 mmol of palladium(II) acetate are added to a suspension of 10 mmol of a borylated complex, 12-20 mmol of aryl bromide per (RO)$_2$B function and 80 mmol of tripotassium phosphate in a mixture of 300 ml of toluene, 100 ml of dioxane and 300 ml of water, and the mixture is heated under reflux for 16 h. After cooling, 500 ml of water and 200 ml of toluene are added, the aqueous phase is separated off, and the organic phase is washed three times with 200 ml of water, once with 200 ml of saturated sodium chloride solution and dried over magnesium sulfate. The mixture is filtered through a Celite bed, the latter is rinsed with toluene, the toluene is removed virtually completely in vacuo, 300 ml of methanol are added, and the crude product which has precipitated out is filtered off with suction, washed three times with 50 ml of methanol each time and dried in vacuo. The crude product is passed through a silica-gel column twice. The metal complex is finally heated or sublimed. The heating is carried out in a high vacuum (p about 10$^{-6}$ mbar) in the temperature range from about 200-300° C. The sublimation is carried out in a high vacuum (p about 10$^{-6}$ mbar) in the temperature range from about 300-400° C., where the sublimation is preferably carried out in the form of a fractional sublimation.

Variant B, Single-Phase Reaction Mixture:

0.6 mmol of tri-o-tolylphosphine and then 0.1 mmol of palladium(II) acetate are added to a suspension of 10 mmol of a borylated complex, 12-20 mmol of aryl bromide per (RO)$_2$B function and 60-100 mmol of the base (potassium fluoride, tripotassium phosphate (anhydrous, monohydrate or trihydrate), potassium carbonate, caesium carbonate, etc.) and 100 g of glass beads (diameter 3 mm) in 100 ml-500 ml of an aprotic solvent (THF, dioxane, xylene, mesitylene, dimethylacetamide, NMP, DMSO, etc.), and the mixture is heated under reflux for 1-24 h. Alternatively, other phosphines, such as tri-tert-butylphosphine, SPhos, XPhos, RuPhos, XanthPhos, etc., can be employed, where in the case of these phosphines the preferred phosphine:palladium ratio is 2:1 to 1.2:1. The solvent is removed in vacuo, and the product is taken up in a suitable solvent (toluene, dichloromethane, ethyl acetate, etc.) and purified as described under variant A.

Synthesis of Ir600:

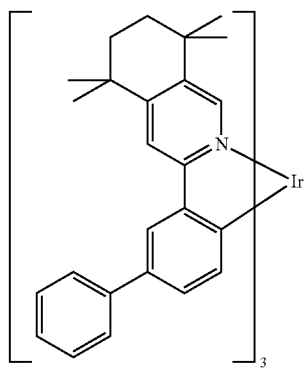

Variant A:

Use of 13.6 g (10.0 mmol) of Ir900 and 4.2 ml (40.0 mmol) of bromobenzene [108-86-1], 17.7 g (60 mmol) of tripotassium phosphate (anhydrous), 183 mg (0.6 mmol) of tri-o-tolylphosphine [6163-58-2], 23 mg (0.1 mmol) of palladium(II) acetate, 300 ml of toluene, 100 ml of dioxane and 300 ml of water, 100° C., 12 h. Chromatographic separation on silica gel using toluene/ethyl acetate (90:10, vv) twice. Yield: 6.3 g (5.2 mmol), 52%; purity: about 99.9% according to HPLC.

The following compounds can be prepared analogously:

| Ex. | Complex Boronic acid Variant | Product | Yield |
|---|---|---|---|
| Ir608 | Ir901 1153-85-1 A Chromatographic separation using toluene | Ir608 | 63% |

| Ex. | Complex Boronic acid Variant | Product | Yield |
|---|---|---|---|
| Ir609 | Ir902 1369587-63-2 A Chromatographic separation using toluene | Ir609 | 55% |

Polymers Containing the Metal Complexes:
General Polymerisation Procedure for the Bromides or Boronic Acid Derivatives as Polymerisable Group, Suzuki Polymerisation Variant A—Two-Phase Reaction Mixture:

The monomers (bromides and boronic acids or boronic acid esters, purity according to HPLC>99.8%) in the composition indicated in the table are dissolved or suspended in a mixture of 2 parts by volume of toluene:6 parts by volume of dioxane:1 part by volume of water in a total concentration of about 100 mmol/l. 2 mol equivalents of tripotassium phosphate per Br functionality employed are then added, the mixture is stirred for a further 5 min., 0.03 to 0.003 mol equivalent of tri-ortho-tolylphosphine and then 0.005 to 0.0005 mol equivalent of palladium(II) acetate (phosphine to Pd ratio preferably 6:1) per Br functionality employed are then added, and the mixture is heated under reflux for 2-3 h with very vigorous stirring. If the viscosity of the mixture increases excessively, it can be diluted with a mixture of 2 parts by volume of toluene:3 parts by volume of dioxane. After a total reaction time of 4-6 h, 0.05 mol equivalent per boronic acid functionality employed of a monobromoaromatic compound are added for end capping, and then, 30 min. later, 0.05 mol equivalent per Br functionality employed of a monoboronic acid or a monoboronic acid ester is added, and the mixture is boiled for a further 1 h. After cooling, the mixture is diluted with 300 ml of toluene. The aqueous phase is separated off, the organic phase is washed twice with 300 ml of water each time, dried over magnesium sulfate, filtered through a Celite bed in order to remove palladium and then evaporated to dryness. The crude polymer is dissolved in THF (concentration about 10-30 g/l), and the solution is allowed to run slowly, with very vigorous stirring, into twice the volume of methanol. The polymer is filtered off with suction and washed three times with methanol. The reprecipitation process is repeated five times, the polymer is then dried to constant weight at 30-50° C. in vacuo.

Variant B—One-Phase Reaction Mixture:

The monomers (bromides and boronic acids or boronic acid esters, purity according to HPLC>99.8%) in the composition indicated in the table are dissolved or suspended in a solvent (THF, dioxane, xylene, mesitylene, dimethylacetamide, NMP, DMSO, etc.) in a total concentration of about 100 mmol/l. 3 mol equivalents of base (potassium fluoride, tripotassium phosphate (anhydrous, monohydrate or trihydrate), potassium carbonate, caesium carbonate, etc., in each case anhydrous) per Br functionality are then added, and the weight equivalent of glass beads (diameter 3 mm) is added, the mixture is stirred for a further 5 min., 0.03 to 0.003 mol equivalent of tri-ortho-tolylphosphine and then 0.005 to 0.0005 mol equivalent of palladium(II) acetate (phosphine to Pd ratio preferably 6:1) per Br functionality are then added, and the mixture is then heated under reflux for 2-3 h with very vigorous stirring. Alternatively, other phosphines, such as tri-tert-butylphosphine, SPhos, XPhos, RuPhos, XanthPhos, etc., can be employed, where the preferred phosphine:palladium ratio in the case of these phosphines is 2:1 to 1.3:1. After a total reaction time of 4-12 h, 0.05 mol equivalent of a monobromoaromatic compound and then, 30 min. later, 0.05 mol equivalent of a monoboronic acid or a monoboronic acid ester is added for end capping, and the mixture is boiled for a further 1 h. The solvent is substantially removed in vacuo, the residue is taken up in toluene, and the polymer is purified as described under variant A.

Monomers M/End Cappers E:

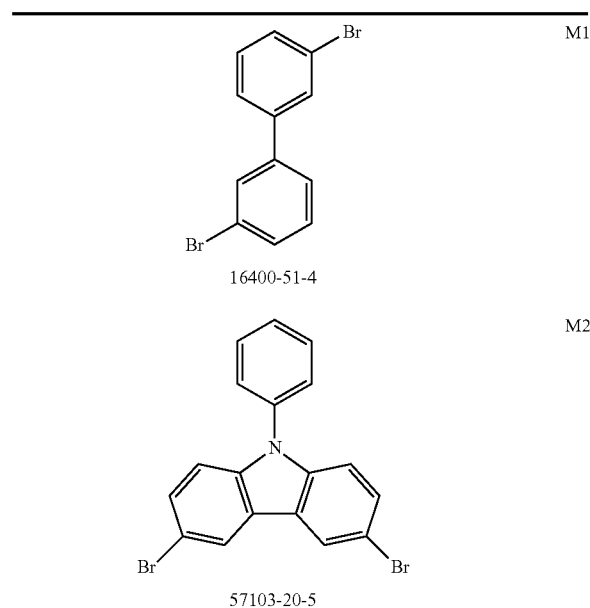

M1
16400-51-4

M2
57103-20-5

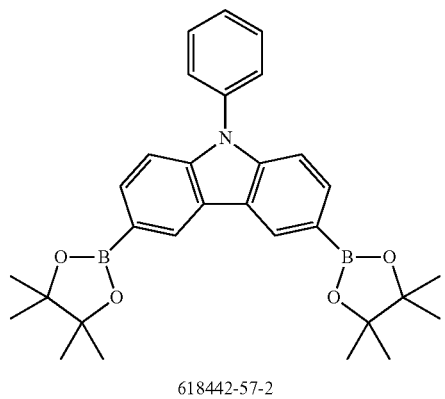

618442-57-2 (M3)

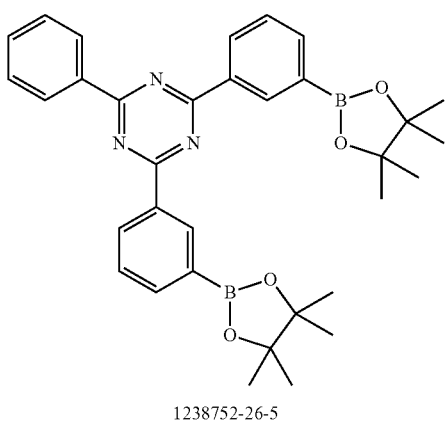 [SMILES: CC1(C)OB(c2cccc(-c3nc(-c4ccccc4)nc(-c4cccc(B5OC(C)(C)C(C)(C)O5)c4)n3)c2)OC1(C)C]

1238752-26-5 (M4)

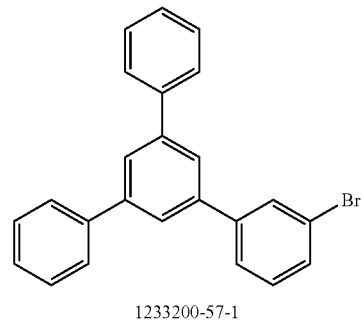 [SMILES: Brc1cccc(-c2cc(-c3ccccc3)cc(-c3ccccc3)c2)c1]

1233200-57-1 (E1)

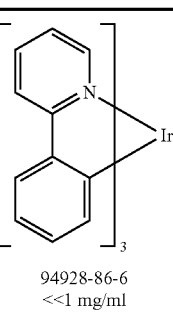

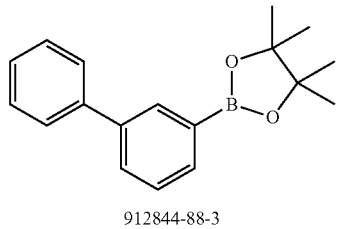 [SMILES: CC1(C)OB(c2cccc(-c3ccccc3)c2)OC1(C)C]

912844-88-3 (E2)

Polymers:

Composition of the Polymers, Mol %:

| Polymer | M1 [%] | M2 [%] | M3 [%] | M4 [%] | Ir complex/[%] |
|---|---|---|---|---|---|
| P1 | — | 30 | — | 45 | Ir(LH35—Br)$_3$/10 |
| P2 | — | 30 | — | 40 | Ir500—Br$_2$/10 |
| P3 | 20 | 30 | 25 | 20 | Ir902/5 |

Molecular Weights and Yield of the Polymers According to the Invention:

| Polymer | Mn [gmol$^{-1}$] | Polydispersity | Yield |
|---|---|---|---|
| P1 | 180,000 | 4.8 | 56% |
| P2 | 250,000 | 2.3 | 61% |
| P3 | 310,000 | 2.4 | 66% |

Comparison of the Solubility of the Complexes in Organic Solvents:

The complexes according to the invention have the solubility shown in the table, in the solvents indicated at 25° C. Comparison with the complexes without the cyclic group according to the invention shows that the solubility of the complexes according to the invention is significantly greater (factor about 5-50).

| Ex. | Solvent | Comparative complex Solubility | Complex Solubility [g/ml] |
|---|---|---|---|
| Sol1 | Toluene | 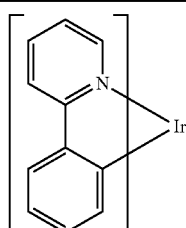 94928-86-6 <<1 mg/ml | 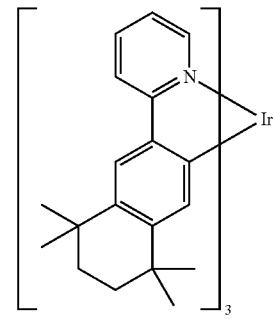 Ir(LH1)$_3$ >15 mg/ml |

| Ex. | Solvent | Comparative complex Solubility | Complex Solubility [g/ml] |
|---|---|---|---|
| Sol2 | o-Xylene | 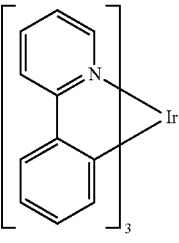<br>94928-86-6<br><<1 mg/ml | 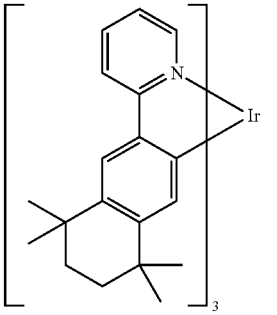<br>Ir(LH1)₃<br>>25 mg/ml |
| Sol3 | 3-Phenoxy-toluene | 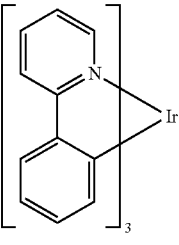<br>94928-86-6<br><5 mg/ml | 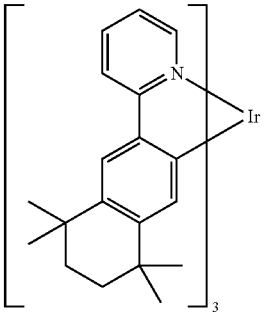<br>Ir(LH1)₃<br>>35 mg/ml |
| Sol4 | Toluene | 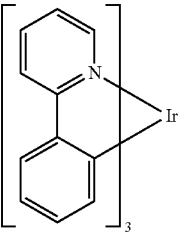<br>94928-86-6<br><<1 mg/ml | 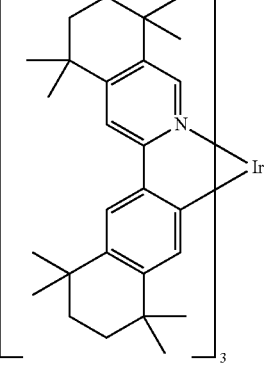<br>Ir(LH41)₃<br>>50 mg/ml |
| Sol5 | Toluene | 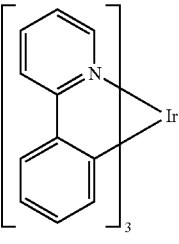<br>94928-86-6<br><<1 mg/ml | 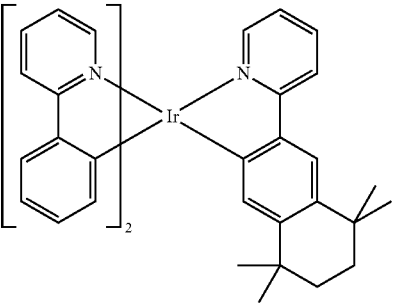<br>Ir500<br>>10 mg/ml |

| Ex. | Solvent | Comparative complex Solubility | Complex Solubility [g/ml] |
|---|---|---|---|
| Sol6 | Toluene | 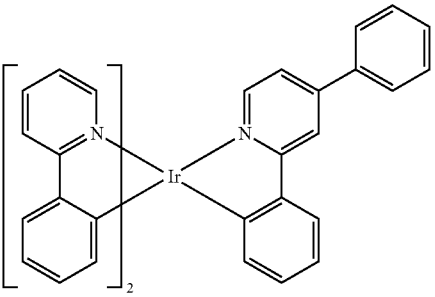<br>1215281-24-5<br><20 mg/ml | 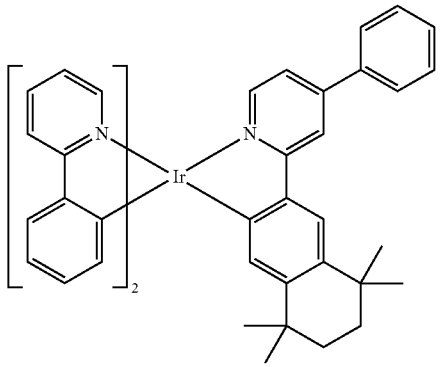<br>Ir505<br>>80 mg/ml |
| Sol7 | Toluene | 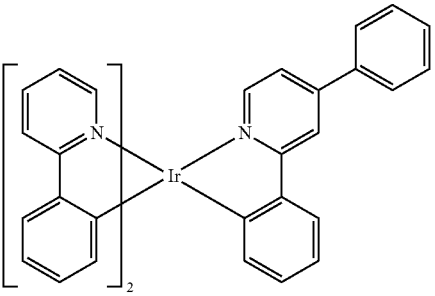<br>1215281-24-5<br><20 mg/ml | 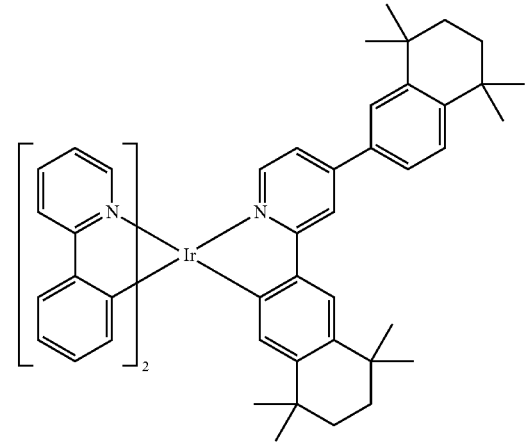<br>Ir513<br>>>200 mg/ml |
| Sol8 | Toluene | 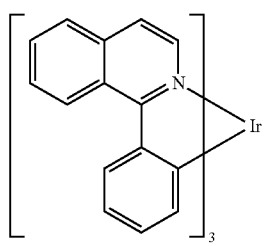<br>435293-93-9<br><2 mg/ml | 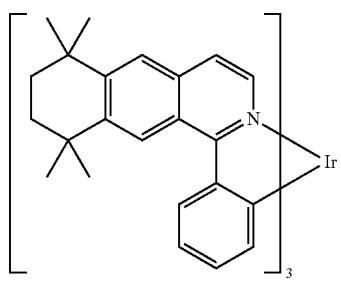<br>Ir(LH26)₃<br>>15 mg/ml |

-continued
| Ex. | Solvent | Comparative complex Solubility | | Complex Solubility [g/ml] | |
|---|---|---|---|---|---|
| Sol9 | Toluene | 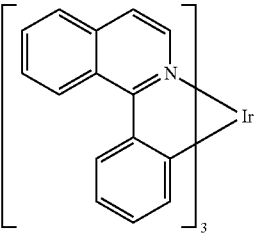 435293-93-9 <2 mg/ml | | 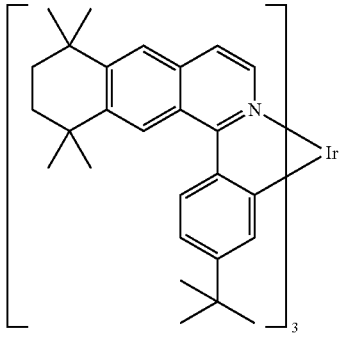 Ir(LH27)₃ >25 mg/ml | |
| Sol10 | Toluene | 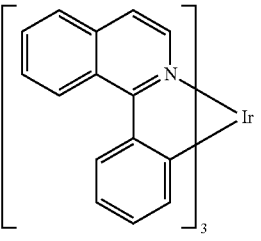 435293-93-9 <2 mg/ml | | 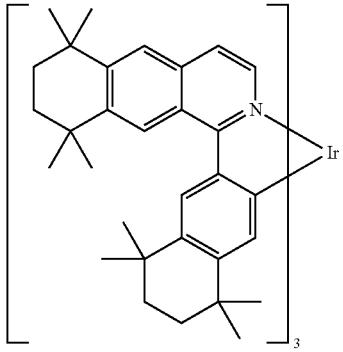 Ir(LH30)₃ >50 mg/ml | |
| Sol11 | Cyclohexane | 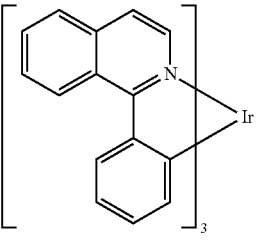 435293-93-9 <<1 mg/ml | | 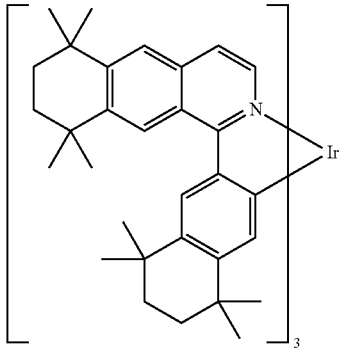 Ir(LH30)₃ >10 mg/ml | |
| Sol12 | Toluene | 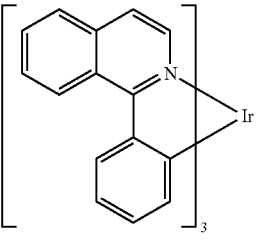 435293-93-9 <2 mg/ml | | 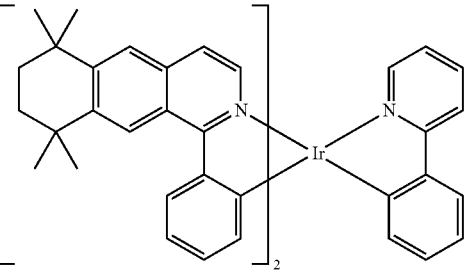 Ir547 >50 mg/ml | |

-continued
| Ex. | Solvent | Comparative complex Solubility | Complex Solubility [g/ml] |
|---|---|---|---|
| Sol13 | Toluene | 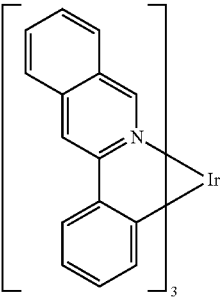<br>863567-55-9<br><2 mg/ml | 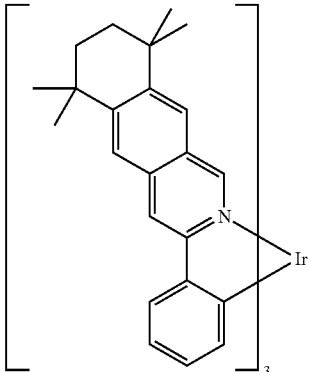<br>Ir(LH33)$_3$<br>>25 mg/ml |
| Sol14 | Toluene | 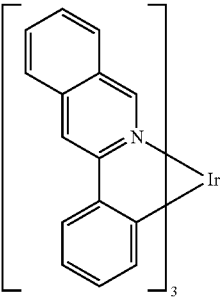<br>863567-55-9<br><2 mg/ml | 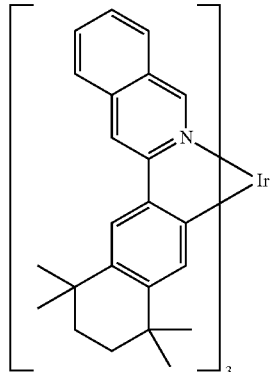<br>Ir(LH9)$_3$<br>>20 mg/ml |
| Sol15 | Toluene | 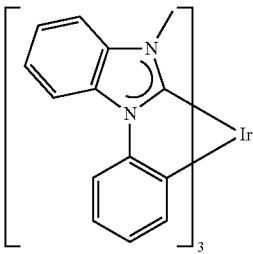<br>869486-05-5<br><2 mg/ml | 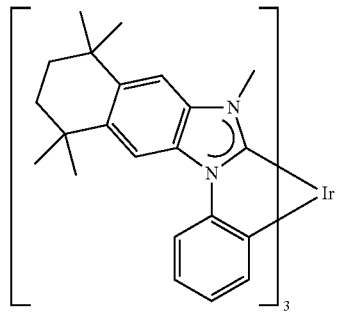<br>Ir(LH23)$_3$<br>>20 mg/ml |

| Ex. | Solvent | Comparative complex Solubility | Complex Solubility [g/ml] |
|---|---|---|---|
| Sol16 | Toluene | 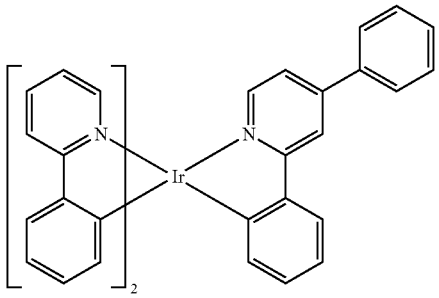<br>1215281-24-5<br><20 mg/ml | 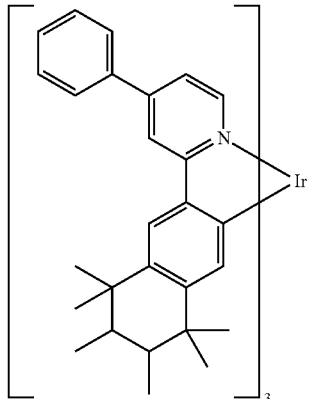<br>Ir(LH53)$_3$<br>>70 mg/ml |
| Sol17 | Toluene | 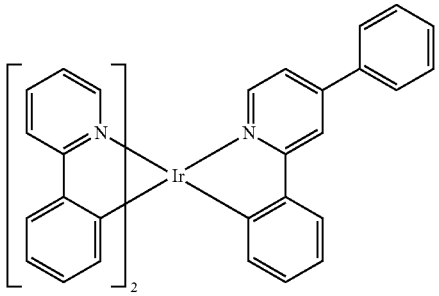<br>1215281-24-5<br><20 mg/ml | 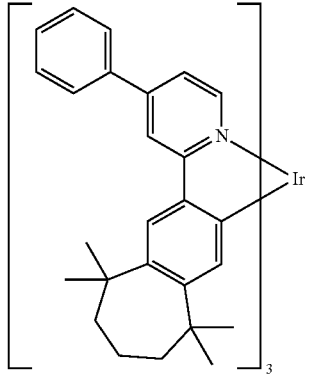<br>Ir(LH55)$_3$<br>>90 mg/ml |

Sublimation of the Complexes:

The complexes according to the invention have the sublimation temperature and rate shown in the table at a base pressure of about $10^{-5}$ mbar. Comparison with complexes without the bicyclic group according to the invention shows that the sublimation temperature of the complexes according to the invention is lower and the sublimation rate is significantly greater. In addition, the complexes according to the invention are stable under the sublimation conditions.

| Ex. | Comparative complex | Complex |
|---|---|---|
| Sub1 | 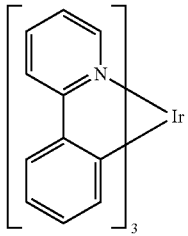<br>94928-86-6<br>T, subl.: 330-340° C.<br>Rate: about 5 g/h | 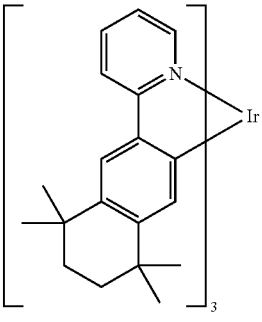<br>Ir(LH1)$_3$<br>T, subl.: 315° C.<br>Rate: about 9 g/h |

| Ex. | Comparative complex | Complex |
|---|---|---|
| Sub2 | 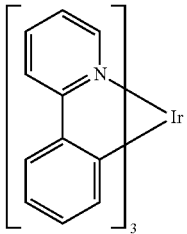<br>94928-86-6<br>T, subl.: 330–340° C.<br>Rate: about 5 g/h | 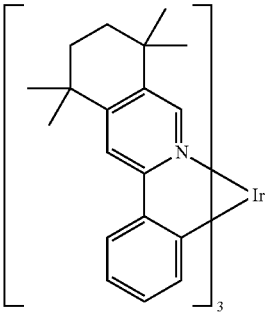<br>Ir(LH35)$_3$<br>T, subl.: 310° C.<br>Rate: about 8 g/h |
| Sub3 | 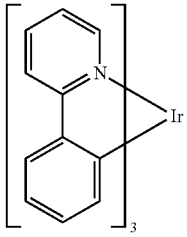<br>94928-86-6<br>T, subl.: 330–340° C.<br>Rate: about 5 g/h | 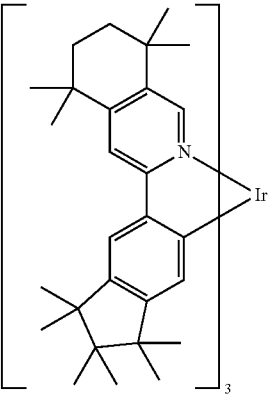<br>Ir(LH42)$_3$<br>T, subl.: 345° C.<br>Rate: about 12 g/h |
| Sub4 | 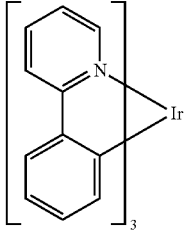<br>94928-86-6<br>T, subl.: 330–340° C.<br>Rate: about 5 g/h | 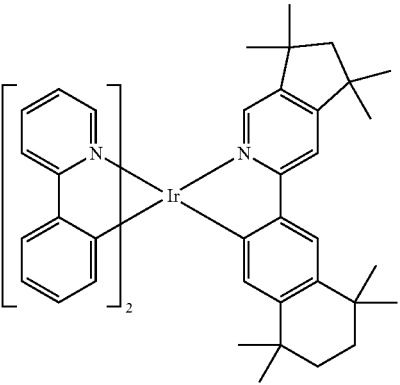<br>Ir515<br>T, subl.: 325° C.<br>Rate: about 10 g/h |

| Ex. | Comparative complex | Complex |
|---|---|---|
| Sub5 | 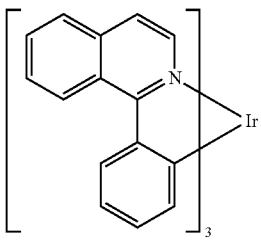<br>435293-93-9<br>T, subl.: 390° C.<br>Rate: <0.5 g/h<br>partial decomposition | 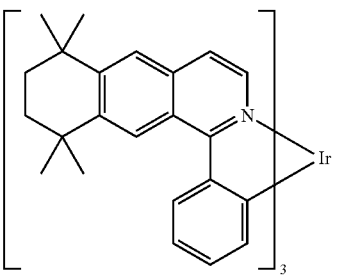<br>Ir(LH26)$_3$<br>T, subl.: 380° C.<br>Rate: ~4 g/h<br>no decomposition |
| Sub6 | 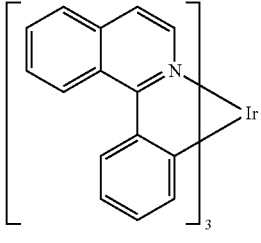<br>435293-93-9<br>T, subl.: 390° C.<br>Rate: <0.5 g/h<br>partial decomposition | 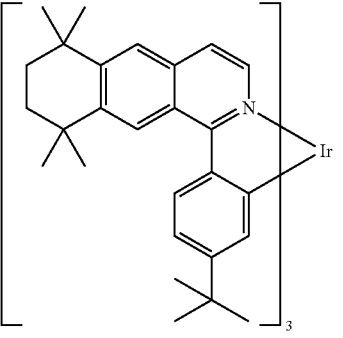<br>Ir(LH27)$_3$<br>T, subl.: 370° C.<br>Rate: ~3 g/h<br>no decomposition |
| Sub7 | 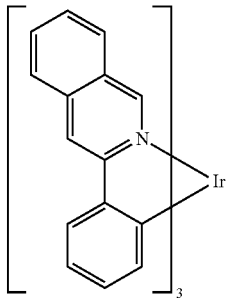<br>863567-55-9<br>T, subl.: 390° C.<br>Rate: <0.5 g/h<br>partial decomposition | 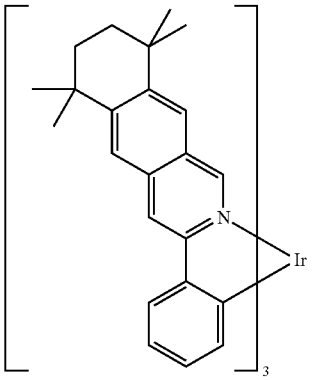<br>Ir(LH33)$_3$<br>T, subl.: 375° C.<br>Rate: ~3 g/h<br>no decomposition |

| Ex. | Comparative complex | Complex |
|---|---|---|
| Sub8 | 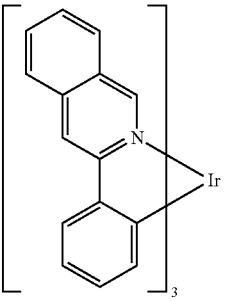<br>863567-55-9<br>T, subl.: 390° C.<br>Rate: <0.5 g/h<br>partial decomposition | 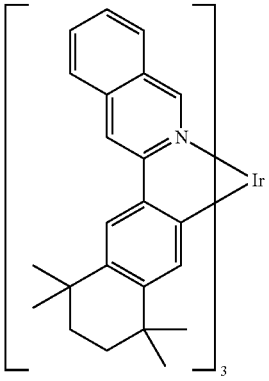<br>Ir(LH9)$_3$<br>T, subl.: 365° C.<br>Rate: ~5 g/h<br>no decomposition |
| Sub9 | 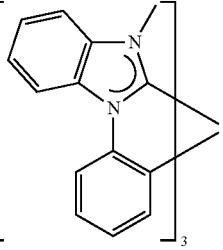<br>Ir(LH23)$_3$<br>T, subl.: 370° C.<br>Rate: <1 g/h<br>partial decomposition and<br>fac > mer isomerisation | 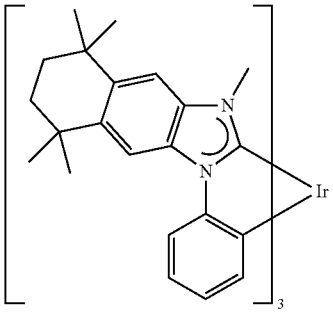<br>Ir(LH23)$_3$<br>T, subl.: 360° C.<br>Rate: ~3 g/h<br>no decomposition<br>no fac > mer isomerisation |

Example: Production of OLEDs

1) Vacuum-Processed Devices:

OLEDs according to the invention and OLEDs in accordance with the prior art are produced by a general process in accordance with WO 2004/058911, which is adapted to the circumstances described here (layer-thickness variation, materials used).

The results of various OLEDs are presented in the following examples. Glass plates with structured ITO (50 nm, indium tin oxide) form the substrates to which the OLEDs are applied. The OLEDs have in principle the following layer structure: substrate/hole-transport layer 1 (HTL1) consisting of HTM doped with 3% of NDP-9 (commercially available from Novaled), 20 nm/hole-transport layer 2 (HTL2)/optional electron-blocking layer (EBL)/emission layer (EML)/optional hole-blocking layer (HBL)/electron-transport layer (ETL)/optional electron-injection layer (EIL) and finally a cathode. The cathode is formed by an aluminium layer with a thickness of 100 nm Firstly, vacuum-processed OLEDs are described. For this purpose, all materials are applied by thermal vapour deposition in a vacuum chamber. The emission layer here always consists of at least one matrix material (host material) and an emitting dopant (emitter), which is admixed with the matrix material or matrix materials in a certain proportion by volume by co-evaporation. An expression such as M3:M2:Ir(LH1)$_3$ (55%:35%:10%) here means that material M3 is present in the layer in a proportion by volume of 55%, M2 is present in the layer in a proportion of 35% and Ir(LH1)$_3$ is present in the layer in a proportion of 10%. Analogously, the electron-transport layer may also consist of a mixture of two materials. The precise structure of the OLEDs is shown in Table 1. The materials used for the production of the OLEDs are shown in Table 7.

The OLEDs are characterised by standard methods. For this purpose, the electroluminescence spectra, the current efficiency (measured in cd/A) and the voltage (measured at 1000 cd/m$^2$ in V) are determined from current/voltage/luminance characteristic lines (IUL characteristic lines). For selected experiments, the lifetime is determined. The lifetime is defined as the time after which the luminous density has dropped to a certain proportion from a certain initial luminous density. The expression LT50 means that the lifetime given is the time at which the luminous density has dropped to 50% of the initial luminous density, i.e. from, for example, 1000 cd/m² to 500 cd/m². Depending on the emission colour, different initial luminances were selected. The values for the lifetime can be converted to a FIGURE for other initial luminous densities with the aid of conversion formulae known to the person skilled in the art. The lifetime for an initial luminous density of 1000 cd/m² is a usual FIGURE here.

Use of Compounds According to the Invention as Emitter Materials in Phosphorescent OLEDs The compounds according to the invention can be employed, inter alia, as phosphorescent emitter materials in the emission layer in OLEDs. The iridium compounds shown in Table 3 are used as comparison in accordance with the prior art. The results for the OLEDs are summarised in Table 2.

TABLE 1

Structure of the OLEDs

| Ex. | HTL2 Thickness | EBL Thickness | EML Thickness | HBL Thickness | ETL Thickness |
|---|---|---|---|---|---|
| Orange - red OLEDs | | | | | |
| D-IrR1 | HTM 270 nm | — | M7:M8:Ir-R1 (65%:30%:5%) 35 nm | — | ETM1:ETM2 (50%:50%) 35 nm |
| D-IrR2 | HTM 270 nm | — | M7:M8:Ir-R2 (60%:30%:10%) 35 nm | — | ETM1:ETM2 (50%:50%) 35 nm |
| D-IrR3 | HTM 270 nm | — | M7:M8:Ir-R3 (60%:30%:10%) 35 nm | — | ETM1:ETM2 (50%:50%) 35 nm |
| D-Ir(LH4)₃ | HTM 270 nm | — | M7:M8:Ir(LH4)₃ (65%:30%:5%) 35 nm | — | ETM1:ETM2 (50%:50%) 35 nm |
| D-Ir(LH9)₃ | HTM 270 nm | — | M7:M8:Ir(LH9)₃ (65%:30%:5%) 35 nm | — | ETM1:ETM2 (50%:50%) 35 nm |
| D-Ir(LH10)₃ | HTM 270 nm | — | M7:M8:Ir(LH10)₃ (65%:30%:5%) 35 nm | — | ETM1:ETM2 (50%:50%) 35 nm |
| D-Ir(LH26)₃ | HTM 270 nm | — | M7:M8:Ir(LH26)₃ (65%:30%:5%) 35 nm | — | ETM1:ETM2 (50%:50%) 35 nm |
| D-Ir(LH27)₃ | HTM 270 nm | — | M7:M8:Ir(LH27)₃ (65%:30%:5%) 35 nm | — | ETM1:ETM2 (50%:50%) 35 nm |
| D-Ir(LH32)₃ | HTM 270 nm | — | M7:M8:Ir(LH32)₃ (65%:30%:5%) 35 nm | — | ETM1:ETM2 (50%:50%) 35 nm |
| D-Ir(LH33)₃ | HTM 270 nm | — | M7:M8:Ir(LH33)₃ (65%:30%:5%) 35 nm | — | ETM1:ETM2 (50%:50%) 35 nm |
| D-Ir(LH61)₃ | HTM 270 nm | — | M7:M8:Ir(LH61)₃ (60%:30%:10%) 35 nm | — | ETM1:ETM2 (50%:50%) 35 nm |
| D-Ir503 | HTM 270 nm | — | M7:M8:Ir503 (65%:30%:5%) 35 nm | — | ETM1:ETM2 (50%:50%) 35 nm |
| D-Ir509 | HTM 270 nm | — | M7:M8:Ir509 (65%:30%:5%) 35 nm | — | ETM1:ETM2 (50%:50%) 35 nm |
| D-Ir516 | HTM 270 nm | — | M7:M8:Ir516 (65%:30%:5%) 35 nm | — | ETM1:ETM2 (50%:50%) 35 nm |
| D-Ir517 | HTM 270 nm | — | M7:M8:Ir517 (65%:30%:5%) 35 nm | — | ETM1:ETM2 (50%:50%) 35 nm |
| D-Ir520 | HTM 270 nm | — | M7:M8:Ir520 (65%:30%:5%) 35 nm | — | ETM1:ETM2 (50%:50%) 35 nm |
| D-Ir521 | HTM 270 nm | — | M7:M8:Ir521 (65%:30%:5%) 35 nm | — | ETM1:ETM2 (50%:50%) 35 nm |
| D-Ir522 | HTM 270 nm | — | M7:M8:Ir522 (65%:30%:5%) 35 nm | — | ETM1:ETM2 (50%:50%) 35 nm |
| D-Ir523 | HTM 270 nm | — | M7:M8:Ir523 (65%:30%:5%) 35 nm | — | ETM1:ETM2 (50%:50%) 35 nm |
| D-Ir524 | HTM 270 nm | — | M7:M8:Ir524 (65%:30%:5%) 35 nm | — | ETM1:ETM2 (50%:50%) 35 nm |

TABLE 1-continued

Structure of the OLEDs

| Ex. | HTL2 Thickness | EBL Thickness | EML Thickness | HBL Thickness | ETL Thickness |
|---|---|---|---|---|---|
| D-Ir539 | HTM 270 nm | — | M7:M8:Ir539 (65%:30%:5%) 35 nm | — | ETM1:ETM2 (50%:50%) 35 nm |
| D-Ir547 | HTM 270 nm | — | M7:M8:Ir547 (65%:30%:5%) 35 nm | — | ETM1:ETM2 (50%:50%) 35 nm |
| D-Ir548 | HTM 270 nm | — | M7:M8:Ir548 (65%:30%:5%) 35 nm | — | ETM1:ETM2 (50%:50%) 35 nm |
| D-Ir554 | HTM 270 nm | — | M7:M8:Ir554 (65%:30%:5%) 35 nm | — | ETM1:ETM2 (50%:50%) 35 nm |
| Yellow OLEDs | | | | | |
| D-Ir-Y1 | HTM 240 nm | — | M7:M8:Ir-Y1 (58%:30%:12%) 25 nm | — | ETM1:ETM2 (50%:50%) 40 nm |
| D-Ir-Y2 | HTM 240 nm | — | M7:M8:Ir-Y2 (62%:30%:8%) 25 nm | — | ETM1:ETM2 (50%:50%) 40 nm |
| D-Ir(LH6)$_3$ | HTM 240 nm | — | M7:M8:Ir(LH6)$_3$ (62%:30%:8%) 25 nm | — | ETM1:ETM2 (50%:50%) 40 nm |
| D-Ir(LH8)$_3$ | HTM 240 nm | — | M7:M8:Ir(LH8)$_3$ (60%:30%:10%) 25 nm | — | ETM1:ETM2 (50%:50%) 40 nm |
| D-Ir505 | HTM 240 nm | — | M7:M8:Ir505 (62%:30%:8%) 25 nm | — | ETM1:ETM2 (50%:50%) 40 nm |
| D-Ir508 | HTM 240 nm | — | M7:M8:Ir508 (62%:30%:8%) 25 nm | — | ETM1:ETM2 (50%: 50%) 40 nm |
| D-Ir512 | HTM 240 nm | — | M7:M8:Ir512 (62%:30%:8%) 25 nm | — | ETM1:ETM2 (50%:50%) 40 nm |
| D-Ir537 | HTM 240 nm | — | M7:M8:Ir537 (62%:30%:8%) 25 nm | — | ETM1:ETM2 (50%:50%) 40 nm |
| Green OLEDs | | | | | |
| D-Ir-G1 | HTM 220 nm | — | M7:M8:Ir-G1 (65%:30%:5%) 25 nm | HBM2 10 nm | ETM1:ETM2 (50%:50%) 30 nm |
| D-Ir-G2 | HTM 220 nm | — | M7:M8:Ir-G2 (65%:30%:5%) 25 nm | HBM2 10 nm | ETM1:ETM2 (50%:50%) 30 nm |
| D-Ir-G4 | HTM 220 nm | — | M7:M8:Ir-G4 (65%:30%:5%) 25 nm | HBM2 10 nm | ETM1:ETM2 (50%:50%) 30 nm |
| D-Ir-G4b | NPB 40 nm | — | CBP:Ir-G4 (80%:20%) 30 nm | BCP 10 nm | AlQ (20 nm) LiQ (2 nm) |
| D-Ir(LH1)$_3$ | HTM 220 nm | — | M7:M8:Ir(LH1)$_3$ (65%:30%:5%) 25 nm | HBM2 10 nm | ETM1:ETM2 (50%:50%) 30 nm |
| D-Ir(LH1)$_3$ | HTM 220 nm | — | M7:M8:Ir(LH1)$_3$ (55%:30%:15%) 25 nm | HBM2 10 nm | ETM1:ETM2 (50%:50%) 30 nm |
| D-Ir(LH3)$_3$ | HTM 220 nm | — | M7:M8:Ir(LH3)$_3$ (65%:30%:5%) 25 nm | HBM2 10 nm | ETM1:ETM2 (50%:50%) 30 nm |
| D-Ir(LH7)$_3$ | HTM 220 nm | — | M7:M8:Ir(LH7)$_3$ (65%:30%:5%) 25 nm | HBM2 10 nm | ETM1:ETM2 (50%:50%) 30 nm |
| D-Ir(LH16)$_3$ | HTM 220 nm | — | M7:M8:Ir(LH16)$_3$ (65%:30%:5%) 25 nm | HBM2 10 nm | ETM1:ETM2 (50%:50%) 30 nm |
| D-Ir(LH35)$_3$ | HTM 220 nm | — | M7:M8:Ir(LH35)$_3$ (65%:30%:5%) 25 nm | HBM2 10 nm | ETM1:ETM2 (50%:50%) 30 nm |
| D-Ir(LH36)$_3$ | HTM 220 nm | — | M7:M8:Ir(LH36)$_3$ (65%:30%:5%) 25 nm | HBM2 10 nm | ETM1:ETM2 (50%:50%) 30 nm |

TABLE 1-continued

Structure of the OLEDs

| Ex. | HTL2 Thickness | EBL Thickness | EML Thickness | HBL Thickness | ETL Thickness |
|---|---|---|---|---|---|
| D-Ir(LH41)$_3$ | HTM 220 nm | — | M7:M8:Ir(LH41)$_3$ (65%:30%:5%) 25 nm | HBM2 10 nm | ETM1:ETM2 (50%:50%) 30 nm |
| D-Ir(LH42)$_3$ | HTM 220 nm | — | M7:M8:Ir(LH42)$_3$ (65%:30%:5%) 25 nm | HBM2 10 nm | ETM1:ETM2 (50%:50%) 30 nm |
| D-Ir(LH49)$_3$ | HTM 220 nm | — | M7:M8:Ir(LH49)$_3$ (62%:30%:8%) 30 nm | HBM2 10 nm | ETM1:ETM2 (50%:50%) 30 nm |
| D-Ir(LH57)$_3$ | HTM 220 nm | — | M7:M8:Ir(LH57)$_3$ (62%:30%:8%) 30 nm | HBM2 10 nm | ETM1:ETM2 (50%:50%) 30 nm |
| D-Ir(LH58)$_3$ | HTM 220 nm | — | M7:M8:Ir(LH58)$_3$ (62%:30%:8%) 30 nm | HBM2 10 nm | ETM1:ETM2 (50%:50%) 30 nm |
| D-Ir(LH59)$_3$ | HTM 220 nm | — | M7:M8:Ir(LH59)$_3$ (62%:30%:8%) 30 nm | HBM2 10 nm | ETM1:ETM2 (50%:50%) 30 nm |
| D-Ir(LH60)$_3$ | HTM 220 nm | — | M7:M8:Ir(LH60)$_3$ (62%:30%:8%) 30 nm | HBM2 10 nm | ETM1:ETM2 (50%:50%) 30 nm |
| D-Ir500 | HTM 220 nm | — | M7:M8:Ir500 (65%:30%:5%) 25 nm | HBM2 10 nm | ETM1:ETM2 (50%:50%) 30 nm |
| D-Ir501 | HTM 220 nm | — | M7:M8:Ir501 (65%:30%:5%) 25 nm | HBM2 10 nm | ETM1:ETM2 (50%:50%) 30 nm |
| D-Ir502 | HTM 220 nm | — | M7:M8:Ir502 (65%:30%:5%) 25 nm | HBM2 10 nm | ETM1:ETM2 (50%:50%) 30 nm |
| D-Ir506 | HTM 220 nm | — | M7:M8:Ir506 (65%:30%:5%) 25 nm | HBM2 10 nm | ETM1:ETM2 (50%:50%) 30 nm |
| D-Ir507 | HTM 220 nm | — | M7:M8:Ir507 (65%:30%:5%) 25 nm | HBM2 10 nm | ETM1:ETM2 (50%:50%) 30 nm |
| D-Ir510 | HTM 220 nm | — | M7:M8:Ir510 (65%:30%:5%) 25 nm | HBM2 10 nm | ETM1:ETM2 (50%:50%) 30 nm |
| D-Ir511 | HTM 220 nm | — | M7:M8:Ir511 (65%:30%:5%) 25 nm | HBM2 10 nm | ETM1:ETM2 (50%:50%) 30 nm |
| D-Ir519 | HTM 220 nm | — | M7:M8:Ir519 (65%:30%:5%) 25 nm | HBM2 10 nm | ETM1:ETM2 (50%:50%) 30 nm |
| D-Ir526 | HTM 220 nm | — | M7:M8:Ir526 (65%:30%:5%) 25 nm | HBM2 10 nm | ETM1:ETM2 (50%:50%) 30 nm |
| D-Ir527 | HTM 220 nm | — | M7:M8:Ir527 (65%:30%:5%) 25 nm | HBM2 10 nm | ETM1:ETM2 (50%:50%) 30 nm |
| D-Ir529 | HTM 220 nm | — | M7:M8:Ir529 (65%:30%:5%) 25 nm | HBM2 10 nm | ETM1:ETM2 (50%:50%) 30 nm |
| D-Ir530 | HTM 220 nm | — | M7:M8:Ir530 (65%:30%:5%) 25 nm | HBM2 10 nm | ETM1:ETM2 (50%:50%) 30 nm |
| D-Ir531 | HTM 220 nm | — | M7:M8:Ir531 (65%:30%:5%) 25 nm | HBM2 10 nm | ETM1:ETM2 (50%:50%) 30 nm |
| D-Ir532 | HTM 220 nm | — | M7:M8:Ir532 (65%:30%:5%) 25 nm | HBM2 10 nm | ETM1:ETM2 (50%:50%) 30 nm |
| D-Ir533 | HTM 220 nm | — | M7:M8:Ir533 (65%:30%:5%) 25 nm | HBM2 10 nm | ETM1:ETM2 (50%:50%) 30 nm |
| D-Ir534 | HTM 220 nm | — | M7:M8:Ir534 (65%:30%:5%) 25 nm | HBM2 10 nm | ETM1:ETM2 (50%:50%) 30 nm |

TABLE 1-continued

| | | | Structure of the OLEDs | | |
|---|---|---|---|---|---|
| Ex. | HTL2 Thickness | EBL Thickness | EML Thickness | HBL Thickness | ETL Thickness |
| D-Ir536 | HTM 220 nm | — | M7:M8:Ir536 (65%:30%:5%) 25 nm | HBM2 10 nm | ETM1:ETM2 (50%:50%) 30 nm |
| D-Ir538 | HTM 220 nm | — | M7:M8:Ir538 (65%:30%:5%) 25 nm | HBM2 10 nm | ETM1:ETM2 (50%:50%) 30 nm |
| D-Ir543 | HTM 220 nm | — | M7:M8:Ir543 (65%:30%:5%) 25 nm | HBM2 10 nm | ETM1:ETM2 (50%:50%) 30 nm |
| D-Ir556 | HTM 220 nm | — | M7:M8:Ir556 (65%:30%:5%) 25 nm | HBM2 10 nm | ETM1:ETM2 (50%:50%) 30 nm |
| D-Ir557 | HTM 220 nm | — | M7:M8:Ir557 (65%:30%:5%) 25 nm | HBM2 10 nm | ETM1:ETM2 (50%:50%) 30 nm |
| D-Ir562 | HTM 220 nm | — | M7:M8:Ir562 (65%:30%:5%) 25 nm | HBM2 10 nm | ETM1:ETM2 (50%:50%) 30 nm |
| D-Ir563 | HTM 220 nm | — | M7:M8:Ir563 (65%:30%:5%) 25 nm | HBM2 10 nm | ETM1:ETM2 (50%:50%) 30 nm |
| D-Ir570 | HTM 220 nm | — | M7:M8:Ir570 (65%:30%:5%) 25 nm | HBM2 10 nm | ETM1:ETM2 (50%:50%) 30 nm |
| D-Ir571 | HTM 220 nm | — | M7:M8:Ir571 (65%:30%:5%) 25 nm | HBM2 10 nm | ETM1:ETM2 (50%:50%) 30 nm |
| D-Ir572 | HTM 220 nm | — | M7:M8:Ir572 (65%:30%:5%) 25 nm | HBM2 10 nm | ETM1:ETM2 (50%:50%) 30 nm |
| D-Pt(LH43) | HTM 220 nm | — | M7:M8:Pt(LH43) (60%:30%:10%) 30 nm | HBM2 10 nm | ETM1:ETM2 (50%:50%) 30 nm |
| D-Pt(LH45) | HTM 220 nm | — | M7:M8:Pt(LH45) (60%:30%:10%) 30 nm | HBM2 10 nm | ETM1:ETM2 (50%:50%) 30 nm |
| Blue OLEDs | | | | | |
| D-Ir-B1 | HTM 180 nm | EBM 10 nm | M1:M4:Ir-B1 (60%:35%:5%) 25 nm | HBM1 10 nm | ETM1:ETM2 (50%:50%) 20 nm |
| D-Ir-B2 | HTM 180 nm | EBM 10 nm | M10:M4:Ir-B2 (45%:45%:10%) 25 nm | HBM1 10 nm | ETM1:ETM2 (50%:50%) 20 nm |
| D-Ir(LH23)$_3$ | HTM 180 nm | EBM 10 nm | M10:M4:fac-Ir(LH23)$_3$ (45%:45%:10%) 25 nm | HBM1 10 nm | ETM1:ETM2 (50%:50%) 20 nm |
| D-Ir(LH25)$_3$ | HTM 180 nm | EBM 10 nm | M10:M4:fac-Ir(LH25)$_3$ (45%:45%:10%) 25 nm | HBM1 10 nm | ETM1:ETM2 (50%:50%) 20 nm |
| D-Ir(LH40)$_3$ | HTM 180 nm | EBM 10 nm | M1:M4:Ir(LH40)$_3$ (60%:35%:5%) 25 nm | HBM1 10 nm | ETM1:ETM2 (50%:50%) 20 nm |
| D-Ir561 | HTM 180 nm | EBM 10 nm | M1:M4:Ir561 (60%:35%:5%) 25 nm | HBM1 10 nm | ETM1:ETM2 (50%:50%) 20 nm |
| D-Pt(LH44) | HTM 180 nm | EBM 10 nm | M10:M4:Pt(LH44) (45%:45%:10%) 25 nm | HBM1 10 nm | ETM1:ETM2 (50%:50%) 20 nm |
| D-Pt(LH46) | HTM 180 nm | EBM 10 nm | M10:M4:Pt(LH46) (45%:45%:10%) 25 nm | HBM1 10 nm | ETM1:ETM2 (50%:50%) 20 nm |
| D-Pt(LH47) | HTM 180 nm | EBM 10 nm | M10:M4 Pt(LH47) (45%:45%:10%) 25 nm | HBM1 10 nm | ETM1:ETM2 (50%:50%) 20 nm |
| D-Ir(LH51) | HTM 180 nm | EBM 10 nm | M10:M4:Ir(LH51) (45%:45%:10%) 25 nm | HBM1 10 nm | ETM1:ETM2 (50%:50%) 20 nm |
| D-Ir(LH52) | HTM 180 nm | EBM 10 nm | M10:M4:Ir(LH52) (45%:45%:10%) 25 nm | HBM1 10 nm | ETM1:ETM2 (50%:50%) 20 nm |

TABLE 2

Results of the vacuum-processed OLEDs

| Ex. | EQE (%) 1000 cd/m² | Voltage (V) 1000 cd/m² | CIE x/y 1000 cd/m² | LT80 (h) 1000 cd/m² |
|---|---|---|---|---|
| Orange - red OLEDs | | | | |
| D-IrR1 | 13.2 | 2.9 | 0.67/0.33 | 13000 |
| D-IrR2 | 19.1 | 3.2 | 0.66/0.35 | 23000 |
| D-IrR3 | 15.1 | 3.3 | 0.68/0.31 | 8000 |
| D-Ir(LH4)$_3$ | 18.5 | 3.1 | 0.69/0.30 | — |
| D-Ir(LH9)$_3$ | 19.6 | 3.0 | 0.65/0.34 | 17000 |
| D-Ir(LH10)$_3$ | 18.9 | 3.1 | 0.69/0.30 | — |
| D-Ir(LH26)$_3$ | 18.5 | 3.0 | 0.69/0.30 | 19000 |
| D-Ir(LH27)$_3$ | 18.4 | 3.0 | 0.69/0.30 | 18000 |
| D-Ir(LH32)$_3$ | 18.9 | 3.2 | 0.70/0.30 | 18000 |
| D-Ir(LH33)$_3$ | 19.2 | 3.1 | 0.64/0.35 | 14000 |
| D-Ir(LH61)$_3$ | 18.0 | 3.0 | 0.70/0.30 | 21000 |
| D-Ir503 | 19.3 | 3.0 | 0.64/0.35 | 22000 |
| D-Ir509 | 19.5 | 3.1 | 0.64/0.35 | 23000 |
| D-Ir516 | 17.1 | 3.1 | 0.63/0.36 | — |
| D-Ir517 | 17.4 | 3.2 | 0.65/0.34 | 11000 |
| D-Ir520 | 17.2 | 3.1 | 0.63/0.36 | 18000 |
| D-Ir521 | 17.8 | 3.1 | 0.63/0.36 | 18000 |
| D-Ir522 | 18.2 | 3.1 | 0.63/0.36 | 20000 |
| D-Ir523 | 18.0 | 3.0 | 0.66/0.33 | 22000 |
| D-Ir524 | 19.3 | 3.0 | 0.65/0.34 | 21000 |
| D-Ir539 | 19.5 | 3.1 | 0.66/0.34 | — |
| D-Ir547 | 18.9 | 3.0 | 0.67/0.31 | 20000 |
| D-Ir548 | 19.5 | 3.0 | 0.68/0.32 | 22000 |
| D-Ir554 | 19.688 | 3.0 | 0.64/0.35 | 19000 |
| Yellow OLEDs | | | | |
| D-Ir-Y1 | 19.6 | 2.8 | 0.39/0.62 | 35000 |
| D-Ir-Y2 | 22.1 | 2.9 | 0.44/0.56 | 34000 |
| D-Ir(LH6)$_3$ | 23.7 | 3.0 | 0.47/0.52 | 38000 |
| D-Ir(LH8)$_3$ | 21.3 | 3.0 | 0.45/0.55 | — |
| D-Ir505 | 23.9 | 2.9 | 0.44/0.55 | 41000 |
| D-Ir508 | 22.6 | 3.0 | 0.59/0.38 | — |
| D-Ir537 | 22.1 | 2.9 | 0.46/0.52 | 40000 |
| Green OLEDs | | | | |
| D-Ir-G1 | 18.1 | 3.3 | 0.32/0.64 | 7000 |
| D-Ir-G2 | 19.2 | 3.2 | 0.35/0.62 | 16000 |
| D-Ir-G4 | 16.3 | 3.7 | 0.34/0.63 | 600 |
| D-Ir-G4b | 14.6 | 5.8 | 0.34/0.63 | 160 |
| D-Ir(LH1)$_3$ | 23.3 | 3.2 | 0.33/0.64 | 18000 |
| D-Ir(LH1)$_3$ | 22.9 | 3.3 | 0.36/0.61 | 16000 |
| D-Ir(LH3)$_3$ | 24.1 | 3.3 | 0.35/0.62 | 20000 |
| D-Ir(LH7)$_3$ | 23.7 | 3.3 | 0.34/0.64 | 21000 |
| D-Ir(LH16)$_3$ | 24.3 | 3.3 | 0.35/0.63 | 24000 |
| D-Ir(LH35)$_3$ | 22.8 | 3.2 | 0.33/0.64 | 22000 |
| D-Ir(LH36)$_3$ | 23.4 | 3.2 | 0.33/0.65 | 25000 |
| D-Ir(LH41)$_3$ | 24.5 | 3.3 | 0.35/0.62 | 25000 |
| D-Ir(LH42)$_3$ | 24.3 | 3.3 | 0.35/0.61 | 24000 |
| D-Ir(LH49)$_3$ | 20.7 | 3.4 | 0.41/0.56 | — |
| D-Ir(LH57)$_3$ | 22.3 | 3.3 | 0.34/0.64 | 21000 |
| D-Ir(LH58)$_3$ | 23.0 | 3.2 | 0.32/0.65 | 23000 |
| D-Ir(LH59)$_3$ | 22.9 | 3.3 | 0.34/0.63 | — |
| D-Ir(LH60)$_3$ | 21.4 | 3.3 | 0.39/0.58 | — |
| D-Ir500 | 23.3 | 3.2 | 0.33/0.63 | 22000 |
| D-Ir501 | 24.0 | 3.1 | 0.35/0.62 | 27000 |
| D-Ir502 | 23.9 | 3.2 | 0.33/0.63 | 20000 |
| D-Ir506 | 24.0 | 3.1 | 0.33/0.63 | 20000 |
| D-Ir507 | 22.8 | 3.2 | 0.38/0.59 | 20000 |
| D-Ir510 | 23.3 | 3.3 | 0.39/0.58 | 18000 |
| D-Ir511 | 24.1 | 3.2 | 0.34/0.63 | 23000 |
| D-Ir519 | 23.1 | 3.4 | 0.18/0.53 | — |
| D-Ir526 | 24.4 | 3.2 | 0.34/0.63 | 23000 |
| D-Ir527 | 24.5 | 3.2 | 0.34/0.62 | 24000 |
| D-Ir529 | 24.3 | 3.2 | 0.33/0.63 | 25000 |
| D-Ir530 | 24.2 | 3.2 | 0.33/0.63 | 24000 |
| D-Ir531 | 24.4 | 3.2 | 0.33/0.63 | 25000 |
| D-Ir532 | 24.6 | 3.2 | 0.33/0.63 | 23000 |
| D-Ir533 | 24.5 | 3.1 | 0.35/0.62 | 26000 |
| D-Ir534 | 24.1 | 3.2 | 0.33/0.63 | — |
| D-Ir536 | 24.4 | 3.2 | 0.33/0.62 | 25000 |
| D-Ir538 | 24.0 | 3.2 | 0.35/0.61 | 24000 |
| D-Ir543 | 24.3 | 3.3 | 0.33/0.63 | 25000 |
| D-Ir556 | 22.8 | 3.2 | 0.33/0.63 | 22000 |
| D-Ir557 | 23.9 | 3.2 | 0.33/0.62 | 22000 |
| D-Ir562 | 24.0 | 3.3 | 0.33/0.63 | 25000 |
| D-Ir563 | 24.3 | 3.3 | 0.33/0.63 | — |
| D-Ir570 | 23.9 | 3.2 | 0.33/0.62 | 20000 |
| D-Ir571 | 24.1 | 3.2 | 0.34/0.62 | 22000 |
| D-Ir572 | 20.4 | 3.3 | 0.26/0.51 | — |
| D-Pt(LH43) | 19.9 | 3.2 | 0.35/0.61 | 16000 |
| D-Pt(LH45) | 20.9 | 3.2 | 0.35/0.61 | 18000 |
| Blue OLEDs | | | | LT50 (h) 1000 cd/m² |
| D-Ir-B1 | 16.1 | 4.9 | 0.18/0.37 | 1100 |
| D-Ir-B2 | 3.0 | 5.2 | 0.16/0.07 | 60 |
| D-Ir(LH23)$_3$ | 9.4 | 5.4 | 0.15/0.17 | 100 |
| D-Ir(LH25)$_3$ | 6.5 | 5.9 | 0.15/0.11 | — |
| D-Ir(LH40)$_3$ | 21.9 | 4.1 | 0.15/0.26 | 500 |
| D-Ir561 | 21.0 | 4.3 | 0.16/0.29 | 700 |
| D-Pt(LH44) | 19.5 | 3.5 | 0.18/0.38 | 16000 |
| D-Pt(LH46) | 12.5 | 5.3 | 0.16/0.25 | — |
| D-Pt(LH47) | 12.1 | 5.1 | 0.16/0.26 | — |
| D-Ir(LH51) | 13.9 | 5.1 | 0.15/0.23 | — |
| D-Ir(LH52) | 14.4 | 5.0 | 0.15/0.22 | — |

2) Solution-Processed Devices:

A: From Soluble Functional Materials

The iridium complexes according to the invention can also be processed from solution, where they result in OLEDs which are significantly simpler as far as the process is concerned, compared with the vacuum-processed OLEDs, with nevertheless good properties. The production of components of this type is based on the production of polymeric light-emitting diodes (PLEDs), which has already been described many times in the literature (for example in WO 2004/037887). The structure is composed of substrate/ITO/PEDOT (80 nm)/interlayer (80 nm)/emission layer (80 nm)/cathode. To this end, use is made of substrates from Technoprint (soda-lime glass), to which the ITO structure (indium tin oxide, a transparent, conductive anode) is applied. The substrates are cleaned with DI water and a detergent (Deconex 15 PF) in a clean room and then activated by a UV/ozone plasma treatment. An 80 nm layer of PEDOT (PEDOT is a polythiophene derivative (Baytron P VAI 4083sp.) from H. C. Starck, Goslar, which is supplied as an aqueous dispersion) is then applied as buffer layer by spin coating, likewise in the clean room. The spin rate required depends on the degree of dilution and the specific spin coater geometry (typically for 80 nm: 4500 rpm). In order to remove residual water from the layer, the substrates are dried by heating on a hotplate at 180° C. for 10 minutes. The interlayer used serves for hole injection, in this case HIL-012 from Merck is used. The interlayer may alternatively also be replaced by one or more layers, which merely have to satisfy the condition of not being detached again by the subsequent processing step of EML deposition from solution. In order to produce the emission layer, the emitters according to the invention are dissolved in toluene together with the matrix materials. The typical solids content of such solutions is between 16 and 25 g/l if, as here, the typical layer thickness of 80 nm for a device is to be achieved by means of spin coating. The solution-processed devices of type 1 comprise an emission layer comprising (polystyrene): M5:M6:Ir(LH)$_3$ (20%:35%:35%:10%) and those of type 2 comprise an emission layer comprising (polystyrene):M5: M6:Ir(LH6)$_3$:Ir(LH)$_3$ (20%:25%:40%:10%:5%). The emission layer is applied by spin coating in an inert-gas atmosphere, in the present case argon, and dried by heating at 130° C. for 30 min. Finally, a cathode is applied by vapour deposition from barium (5 nm) and then aluminium (100 nm) (high-purity metals from Aldrich, particularly barium 99.99% (Order No. 474711); vapour-deposition equipment from Lesker, inter alia, typical vapour-deposition pressure $5\times10^{-6}$ mbar). Optionally, firstly a hole-blocking layer and then an electron-transport layer and only then the cathode (for example Al or LiF/Al) can be applied by vacuum vapour deposition. In order to protect the device against air and atmospheric moisture, the device is finally encapsulated and then characterised. The OLED examples given have not yet been optimised, Table 4 summarises the data obtained.

TABLE 3

Results with solution-processed materials

| Ex. | Emitter Device | EQE (%) 1000 cd/m² | Voltage (V) 1000 cd/m² | CIE x/y | LT50 (h) 1000 cd/m² |
|---|---|---|---|---|---|
| Orange and red OLEDs | | | | | |
| Sol-D-Ir-R2 | Ir-R2 Type 2 | 18.8 | 3.6 | 0.67/0.33 | 20000 |
| Sol-D-Ir(LH28)$_3$ | Ir(LH28)$_3$ Type 1 | 18.8 | 3.9 | 0.65/0.35 | 150000 |
| Sol-D-Ir(LH29)$_3$ | Ir(LH29)$_3$ Type 1 | 19.5 | 3.7 | 0.61/0.38 | — |
| Sol-D-Ir(LH30)$_3$ | Ir(LH30)$_3$ Type 2 | 19.1 | 3.7 | 0.69/0.30 | 180000 |
| Sol-D-Ir(LH31)$_3$ | Ir(LH31)$_3$ Type 1 | 19.5 | 3.6 | 0.68/0.31 | — |
| Sol-D-Ir(LH34)$_3$ | Ir(LH34)$_3$ Type 1 | 19.9 | 3.7 | 0.65/0.35 | — |
| Sol-D-Ir518 | Ir518 Type 1 | 17.1 | 3.7 | 0.70/0.30 | — |
| Sol-D-Ir523 | Ir523 Type 2 | 19.1 | 3.8 | 0.64/0.35 | 160000 |
| Sol-D-Ir525 | Ir525 Type 2 | 19.8 | 3.8 | 0.63/0.36 | — |
| Sol-D-Ir549 | Ir549 Type 2 | 19.5 | 3.8 | 0.65/0.35 | — |
| Sol-D-Ir550 | Ir550 Type 2 | 19.0 | 3.9 | 0.62/0.35 | 170000 |
| Sol-D-Ir551 | Ir551 Type 2 | 20.0 | 3.8 | 0.67/0.33 | 200000 |
| Sol-D-Ir552 | Ir552 Type 2 | 19.7 | 3.9 | 0.68/0.32 | — |
| Sol-D-Ir553 | Ir553 Type 2 | 20.0 | 3.9 | 0.68/0.32 | — |
| Sol-D-Ir555 | Ir555 Type 2 | 20.5 | 3.8 | 0.65/0.34 | — |
| Sol-D-Ir569 | Ir569 Type 2 | 20.2 | 3.8 | 0.65/0.33 | — |
| Sol-D-Ir602 | Ir602 Type 2 | 19.0 | 4.0 | 0.63/0.36 | — |
| Sol-D-Ir603 | Ir603 Type 2 | 18.1 | 3.9 | 0.66/0.33 | — |
| Sol-D-Ir700 | Ir700 Type 2 | 17.0 | 3.7 | 0.62/0.37 | — |
| Yellow OLEDs of type 1 | | | | | |
| Sol-D-Ir-Y3 | Ir-Y3 | 19.7 | 3.9 | 0.48/0.49 | 120000 |
| Sol-D-Ir(LH6)$_3$ | Ir(LH6)$_3$ | 21.5 | 4.1 | 0.45/0.54 | 200000 |
| Sol-D-Ir(LH11)$_3$ | Ir(L11)$_3$ | 22.1 | 4.3 | 0.53/0.46 | — |
| Sol-D-Ir(LH53)$_3$ | Ir(L53)$_3$ | 21.0 | 4.3 | 0.44/0.54 | 140000 |
| Sol-D-Ir(LH55)$_3$ | Ir(L55)$_3$ | 21.2 | 4.4 | 0.43/0.55 | — |
| Sol-D-Ir513 | Ir513 | 22.4 | 4.2 | 0.44/0.55 | 250000 |
| Sol-D-Ir541 | Ir541 | 22.1 | 4.1 | 0.45/0.54 | — |
| Sol-D-Ir558 | Ir558 | 21.4 | 4.1 | 0.46/0.53 | — |
| Sol-D-Ir560 | Ir560 | 21.7 | 4.1 | 0.47/0.48 | — |
| Sol-D-Ir566 | Ir566 | 21.9 | 4.1 | 0.46/0.53 | — |
| Sol-D-Ir608 | Ir608 | 19.1 | 3.9 | 0.38/0.57 | — |
| Sol-D-Ir609 | Ir609 | 20.9 | 4.2 | 0.42/0.54 | — |
| Sol-D-Ir701 | Ir701 | 19.8 | 4.0 | 0.41/0.56 | 220000 |
| Green - cyan OLEDs of type 1 | | | | | |
| Sol-D-Ir-G3 | Ir-G3 | 18.8 | 4.4 | 0.33/0.63 | 100000 |
| Sol-D-Ir-G5 | Ir-G5 | 18.3 | 4.6 | 0.34/0.62 | 3000 |
| Sol-D-Ir-G6 | Ir-G6 | 21.3 | 4.7 | 0.33/0.63 | 27000 |
| Sol-D-Ir-G7 | Ir-G7 | 21.6 | 4.7 | 0.33/0.63 | 60000 |
| Sol-D-Ir(LH1)$_3$ | Ir(LH1)$_3$ | 22.2 | 4.6 | 0.33/0.65 | 190000 |
| Sol-D-Ir(LH5)$_3$ | Ir(LH5)$_3$ | 22.7 | 4.7 | 0.33/0.64 | 220000 |

TABLE 3-continued

Results with solution-processed materials

| Ex. | Emitter Device | EQE (%) 1000 cd/m² | Voltage (V) 1000 cd/m² | CIE x/y | LT50 (h) 1000 cd/m² |
|---|---|---|---|---|---|
| Sol-D-Ir(LH12)₃ | Ir(LH12)₃ | 21.9 | 4.6 | 0.34/0.62 | — |
| Sol-D-Ir(LH13)₃ | Ir(LH13)₃ | 21.8 | 4.6 | 0.44/0.52 | 220000 |
| Sol-D-Ir(LH15)₃ | Ir(LH15)₃ | 22.1 | 4.6 | 0.34/0.61 | 200000 |
| Sol-D-Ir(LH20)₃ | Ir(LH20)₃ | 19.3 | 4.6 | 0.22/0.42 | — |
| Sol-D-Ir(LH21)₃ | Ir(LH21)₃ | 19.1 | 4.7 | 0.21/0.43 | — |
| Sol-D-Ir(LH37)₃ | Ir(LH37)₃ | 21.1 | 4.6 | 0.36/0.61 | 190000 |
| Sol-D-Ir(LH38)₃ | Ir(LH38)₃ | 21.6 | 4.6 | 0.35/0.63 | — |
| Sol-D-Ir(LH39)₃ | Ir(LH39)₃ | 21.3 | 4.6 | 0.37/0.61 | — |
| Sol-D-Ir(LH54)₃ | Ir(LH54)₃ | 21.6 | 4.6 | 0.34/0.63 | 200000 |
| Sol-D-Ir(LH56)₃ | Ir(LH56)₃ | 21.7 | 4.7 | 0.35/0.62 | 210000 |
| Sol-D-Ir514 | Ir514 | 22.3 | 4.5 | 0.34/0.63 | 210000 |
| Sol-D-Ir515 | Ir515 | 22.1 | 4.6 | 0.34/0.63 | — |
| Sol-D-Ir528 | Ir528 | 21.5 | 4.7 | 0.35/0.62 | — |
| Sol-D-Ir535 | Ir535 | 21.8 | 4.7 | 0.36/0.61 | — |
| Sol-D-Ir540 | Ir540 | 22.2 | 4.6 | 0.34/0.63 | — |
| Sol-D-Ir542 | Ir542 | 22.5 | 4.6 | 0.34/0.63 | — |
| Sol-D-Ir545 | Ir545 | 21.4 | 4.6 | 0.28/0.49 | — |
| Sol-D-Ir546 | Ir546 | 20.5 | 4.5 | 0.23/0.46 | — |
| Sol-D-Ir564 | Ir564 | 21.8 | 4.6 | 0.33/0.64 | — |
| Sol-D-Ir565 | Ir565 | 21.3 | 4.5 | 0.45/0.52 | — |
| Sol-D-Ir567 | Ir567 | 22.3 | 4.7 | 0.33/0.63 | 180000 |
| Sol-D-Ir568 | Ir568 | 21.5 | 4.6 | 0.45/0.52 | — |
| Sol-D-Ir600 | Ir600 | 20.2 | 4.5 | 0.34/0.64 | — |
| Sol-D-Ir601 | Ir601 | 20.0 | 4.6 | 0.35/0.63 | — |
| Sol-D-Ir604 | Ir604 | 19.8 | 4.6 | 0.23/0.46 | — |
| Sol-D-Ir605 | Ir605 | 21.8 | 4.6 | 0.33/0.63 | — |
| Sol-D-Ir606 | Ir606 | 20.9 | 4.5 | 0.23/0.46 | — |
| Sol-D-Ir607 | Ir607 | 19.9 | 4.5 | 0.35/0.62 | — |
| Sol-D-Ir702 | Ir702 | 20.8 | 4.6 | 0.45/0.52 | — |
| Sol-D-Ir703 | Ir703 | 20.3 | 4.6 | 0.33/0.63 | — |
| Sol-D-Ir704 | Ir704 | 19.7 | 4.4 | 0.32/0.62 | — |
| Sol-D-Ir800 | Ir800 | 16.1 | 4.3 | 0.16/0.35 | — |
| Sol-D-Ir801 | Ir801 | 16.7 | 4.5 | 0.17/0.40 | — |
| Sol-D-Ir803 | Ir803 | 19.2 | 4.5 | 0.17/0.38 | — |

B: From Polymeric Functional Materials:

Production of the OLEDs as described under A: For the production of the emission layer, the polymers according to the invention are dissolved in toluene. The typical solids content of such solutions is between 10 and 15 g/l if, as here, the typical layer thickness of 80 nm for a device is to be achieved by means of spin coating. The said OLED examples have not yet been optimised, Table 5 summarises the data obtained.

TABLE 4

Results with solution-processed materials

| Ex. | Polymer | EQE (%) 1000 cd/m² | Voltage (V) 1000 cd/m² | CIE x/y 1000 cd/m² |
|---|---|---|---|---|
| Yellow OLEDs ||||| 
| D-P3 | P3 | 20.1 | 3.7 | 0.42/0.57 |
| Green OLEDs ||||| 
| D-P1 | P1 | 20.5 | 4.0 | 0.33/0.61 |
| D-P2 | P2 | 20.6 | 4.1 | 0.32/0.63 |

3) White-Emitting OLED9

A white-emitting OLED having the following layer structure is produced in accordance with the general processes from 1):

TABLE 5

Structure of the white OLEDs

| Ex. | HTL2 Thickness | EML Red Thickness | EML Blue Thickness | EML Green Thickness | HBL Thickness | ETL Thickness |
|---|---|---|---|---|---|---|
| D-W1 | HTM 230 nm | EBM:Ir521 (97%:3%) 10 nm | M1:M4:Ir(LH40)₃ (65%:30%:5%) 8 nm | M3:Ir(LH1)₃ (95%:5%) 7 nm | M3 10 nm | ETM1:ETM2 (50%:50%) 30 nm |

TABLE 6
Device results
| Ex. | EQE (%) 1000 cd/m² | Voltage (V) 1000 cd/m² | CIE x/y 1000 cd/m² | LT50 (h) 1000 cd/m² |
|---|---|---|---|---|
| D-W1 | 20.9 | 5.7 | 0.42/0.38 | 5000 |
TABLE 7
Structural formulae of the materials used
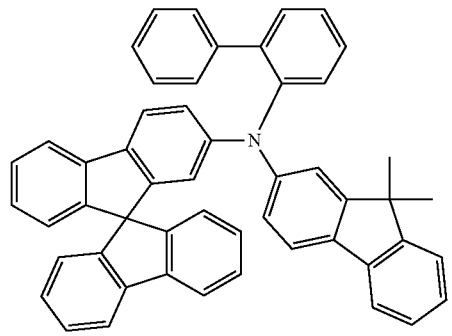
HTM
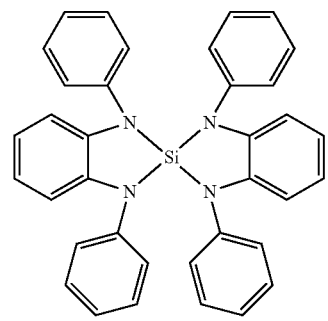
EBM = M10
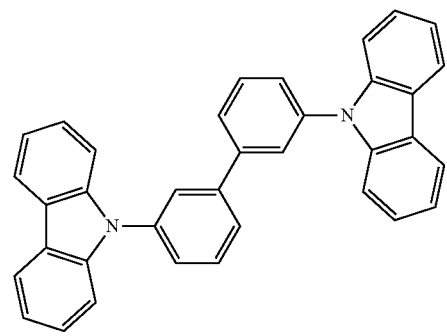
M1
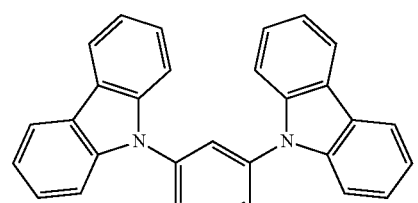
M2
TABLE 7-continued
Structural formulae of the materials used
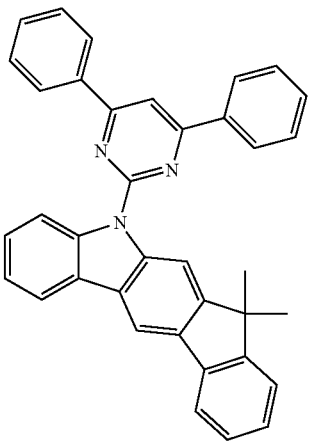
M3 = HBM2
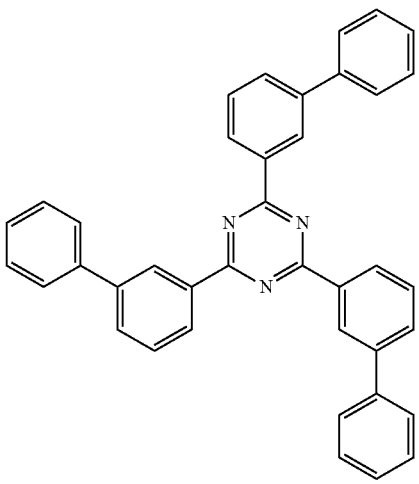
M4 = HBM1
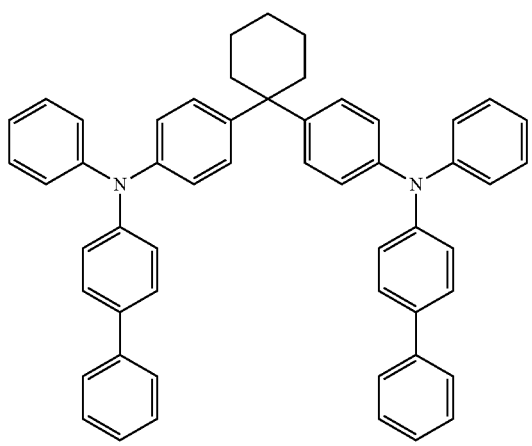
M5

TABLE 7-continued
Structural formulae of the materials used
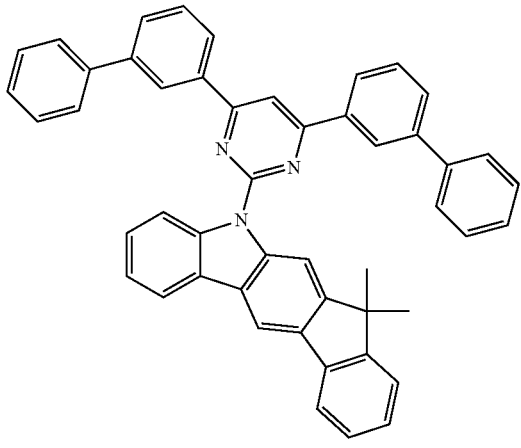
M6
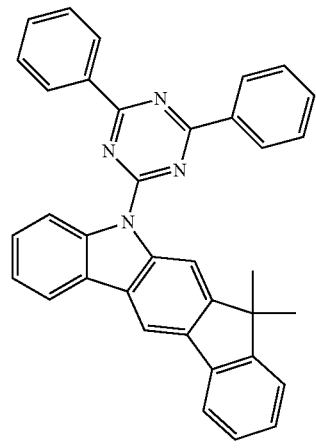
M7
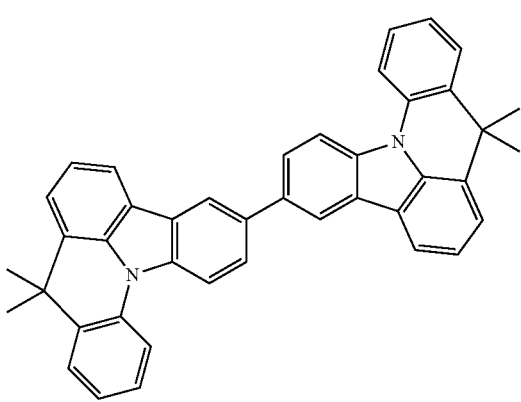
M8
TABLE 7-continued
Structural formulae of the materials used
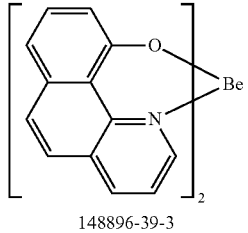
148896-39-3
M9
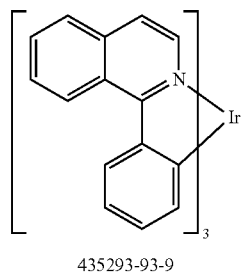
435293-93-9
Ir-R1
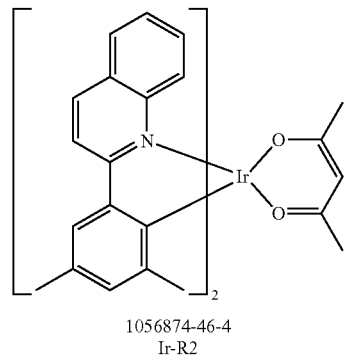
1056874-46-4
Ir-R2
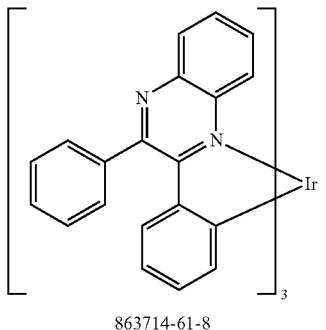
863714-61-8
Ir-R3

TABLE 7-continued
Structural formulae of the materials used
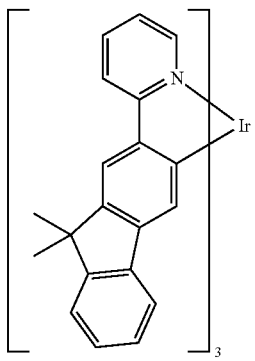
458532-65-5
Ir-Y1
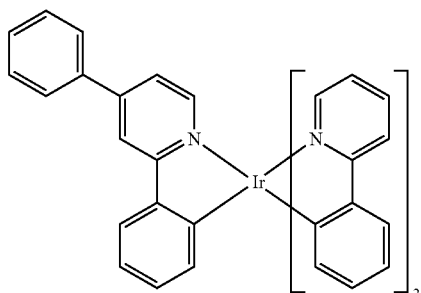
1215281-24-5
Ir-Y2
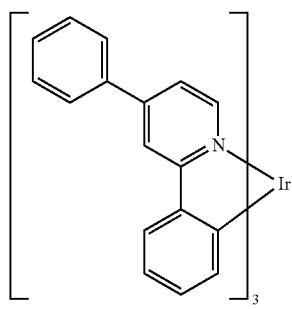
459133-57-4
Ir-Y3
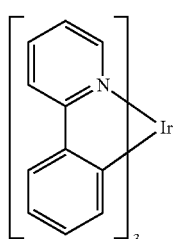
693794-98-8
Ir-G1
TABLE 7-continued
Structural formulae of the materials used
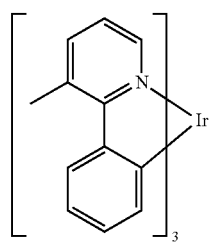
359014-71-4
Ir-G2
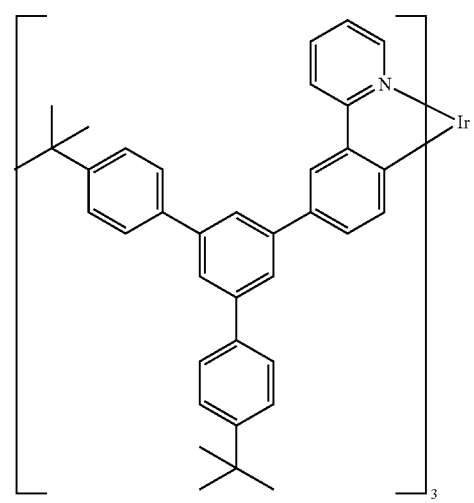
856219-87-9
Ir-G3
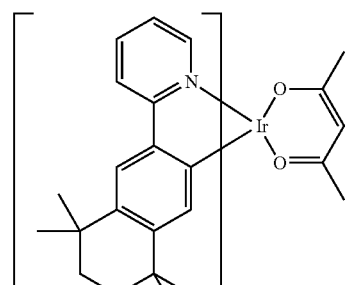
Ir-G4

TABLE 7-continued
Structural formulae of the materials used
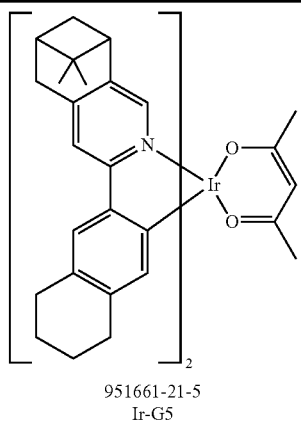
951661-21-5
Ir-G5
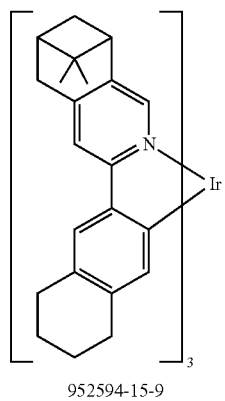
952594-15-9
Ir-G6
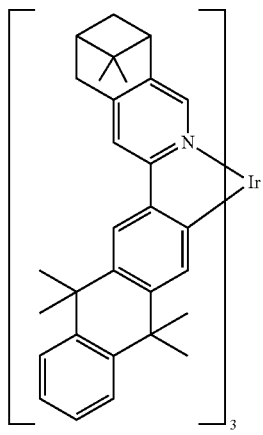
Ir-G7
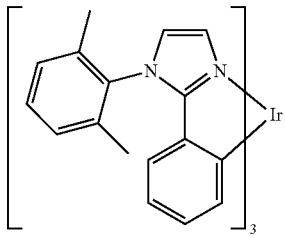
1013022-35-9
Ir-B1
TABLE 7-continued
Structural formulae of the materials used
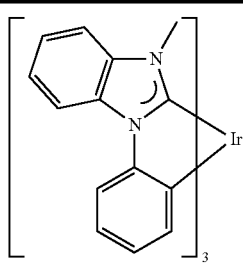
869486-05-5
Ir-B2
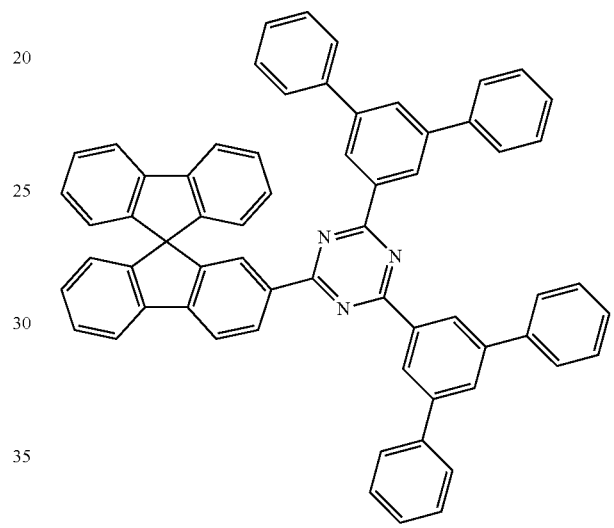
1233200-52-6
ETM1
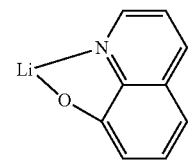
25387-93-3
ETM2/Liq
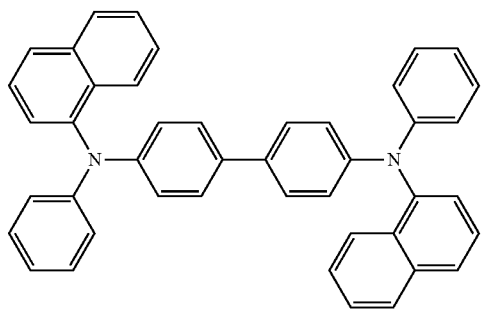
123847-85-8
NPB TABLE 7-continued Structural formulae of the materials used

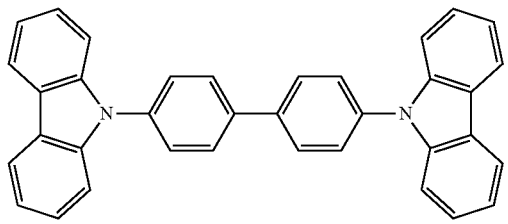

58328-31-7
CBP

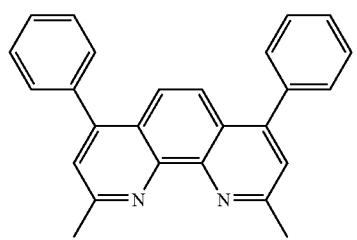

4733-39-5
BCP

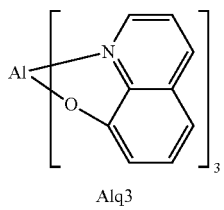

Alq3

The invention claimed is:

1. A compound of formula (1):

M(L)$_n$(L')$_m$   formula (1)

comprising a moiety M(L)$_n$ of formula (2):

$$\left[\begin{matrix} CyD \\ | \\ CyC \end{matrix} \right\rangle M \right]_n \quad (2)$$

wherein

M is iridium or platinum;

CyC is an aryl or heteroaryl group having 5 to 18 aromatic ring atoms or a fluorene group, each of which is coordinated to M via a carbon atom, each of which is optionally substituted by one or more radicals R, and each of which is connected to CyD via a covalent bond;

CyD is a heteroaryl group having 5 to 18 aromatic ring atoms, which is coordinated to M via a neutral nitrogen atom, and which is optionally substituted by one or more radicals R, and which is connected to CyC via a covalent bond;

R is on each occurrence, identically or differently, H, D, F, Cl, Br, I, N(R$^1$)$_2$, CN, NO$_2$, OH, COOH, C(=O)N(R)$_2$, Si(R$^1$)$_3$, B(OR$^1$)$_2$, OSO$_2$R$^1$, a straight-chain alkyl, alkoxy, or thioalkoxy group having 1 to 20 C atoms or an alkenyl or alkynyl group having 2 to 20 C atoms or a branched or cyclic alkyl, alkoxy, or thioalkoxy group having 3 to 20 C atoms, each of which is optionally substituted by one or more radicals R$^1$, wherein one or more non-adjacent CH$_2$ groups is optionally replaced by R$^1$C=CR$^1$, C≡C, Si(R$^1$)$_2$, C=O, NR$^1$, S, or CONR$^1$, and wherein one or more H atoms is optionally replaced by D, F, Cl, Br, I, or CN, an aromatic or heteroaromatic ring system having 5 to 60 aromatic ring atoms, which is optionally substituted by one or more radicals R$^1$, an aryloxy or heteroaryloxy group having 5 to 40 aromatic ring atoms, which is optionally substituted by one or more radicals R$^1$, an aralkyl or heteroaralkyl group having 5 to 40 aromatic ring atoms, which is optionally substituted by one or more radicals R$^1$, or a diarylamino group, diheteroarylamino group, or arylheteroarylamino group having 10 to 40 aromatic ring atoms, which is optionally substituted by one or more radicals R$^1$;

R$^1$ is on each occurrence, identically or differently, H, D, F, Cl, Br, I, N(R$^2$)$_2$, CN, NO$_2$, Si(R$^2$)$_3$, B(OR$^2$)$_2$, C(=O)R$^2$, P(=O)(R$^2$)$_2$, S(=O)R$^2$, S(=O)$_2$R$^2$, OSO$_2$R$^2$, a straight-chain alkyl, or thioalkoxy group having 1 to 20 C atoms or an alkenyl or alkynyl group having 2 to 20 C atoms or a branched or cyclic alkyl, or thioalkoxy group having 3 to 20 C atoms, each of which is optionally substituted by one or more radicals R$^2$, wherein one or more non-adjacent CH$_2$ groups are optionally replaced by R$^2$C=CR$^2$, C≡C, Si(R$^2$)$_2$, C=O, NR$^2$, O, S, or CONR$^2$, and wherein one or more H atoms are optionally replaced by D, F, Cl, Br, I, CN, or NO$_2$, an aromatic or heteroaromatic ring system having 5 to 60 aromatic ring atoms, which is optionally substituted by one or more radicals R$^2$, or an aralkyl or heteroaralkyl group having 5 to 40 aromatic ring atoms, which is optionally substituted by one or more radicals R$^2$, or a diarylamino group, diheteroarylamino group, or arylheteroarylamino group having 10 to 40 aromatic ring atoms, which is optionally substituted by one or more radicals R$^2$; and wherein two or more adjacent radicals R$^1$ optionally define a mono- or polycyclic, aliphatic ring system with one another;

R$^2$ is on each occurrence, identically or differently, H, D, F, or an aliphatic, aromatic, and/or heteroaromatic hydrocarbon radical having 1 to 20 C atoms, wherein one or more H atoms are optionally replaced by F; and wherein two or more substituents R$^2$ optionally define a mono- or polycyclic, aliphatic ring system with one another;

L' is, identically or differently on each occurrence, a bidentate ligand which is bonded to M via one carbon atom and one nitrogen atom or via two carbon atoms;

n is 1, 2, or 3 when M is iridium and is 1 or 2 when M is platinum;

m is 0, 1, or 2 when M is iridium and is 0 or 1 when M is platinum;

wherein

CyC and CyD are optionally linked to one another via a group selected from the group consisting of C(R$^1$)$_2$, C(R$^1$)$_2$—C(R$^1$)$_2$, NR$^1$, O, and S;

a plurality of ligands L are optionally linked to one another or L may be linked to L' via a single bond or a divalent or trivalent bridge so as to form a tetradentate or hexadentate ligand system; and CyD contains two adjacent carbon atoms, each of which is substituted by radicals R, where the respective radicals R, together with the C atoms, form a ring of formula (3):

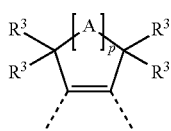
(3)

wherein
$R^1$ and $R^2$ are as defined above;
the dashed bonds indicate the linking of the two carbon atoms in the ligand;
A is, identically or differently on each occurrence, $C(R^1)_2$, O, S, $NR^3$, or C(=O), with the proviso that two heteroatoms in the group -(A)$_p$- are not bonded directly to one another;
$R^3$ is, identically or differently on each occurrence, a straight-chain alkyl or alkoxy group having 1 to 20 C atoms or a branched or cyclic alkyl or alkoxy group having 3 to 20 C atoms, each of which is optionally substituted by one or more radicals $R^2$, wherein one or more non-adjacent $CH_2$ groups are optionally replaced by $R^2C=CR^2$, C≡C, $Si(R^2)_2$, C=O, $NR^2$, O, S, or $CONR^2$, and wherein one or more H atoms are optionally replaced by D or F, an aromatic or heteroaromatic ring system having 5 to 24 aromatic ring atoms, which is optionally substituted by one or more radicals $R^2$, an aryloxy or hetero aryloxy group having 5 to 24 aromatic ring atoms, which is optionally substituted by one or more radicals $R^2$, or an aralkyl or heteroaralkyl group having 5 to 24 aromatic ring atoms, which is optionally substituted by one or more radicals $R^2$; wherein two radicals $R^3$ which are bonded to the same carbon atom optionally define an aliphatic or aromatic ring system with one another so as to form a spiro system; and wherein $R^3$ optionally defines an aliphatic ring system with an adjacent radical R or $R^1$;
p is, identically or differently on each occurrence, 2 or 3.

2. The compound of claim 1, wherein the CyC is selected from the group consisting of structures of formulae (CyC-1) through (CyC-19), wherein CyC is in each case bonded to CyD at the position denoted by # and coordinated to M at the position denoted by *:

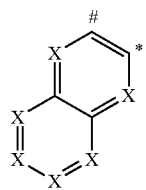
(CyC-1)

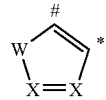
(CyC-2)

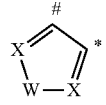
(CyC-3)

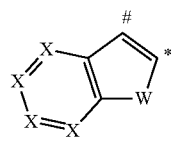
(CyC-4)

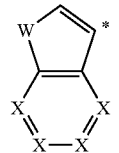
(CyC-5)

(CyC-6)

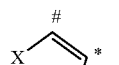
(CyC-7)

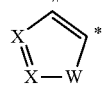
(CyC-8)

(CyC-9)

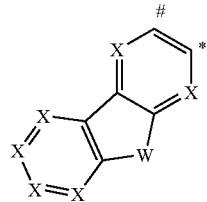
(CyC-10)

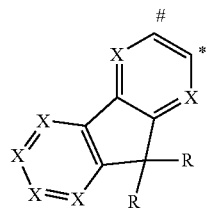
(CyC-11)

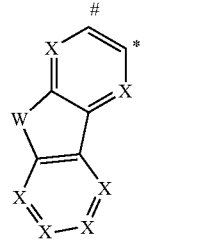
(CyC-12)

(CyC-13) 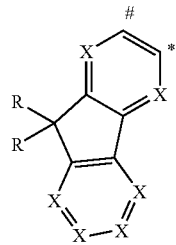
(CyC-14) 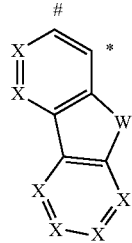
(CyC-15) 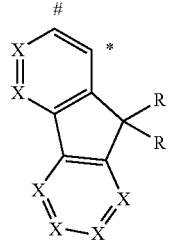
(CyC-16) 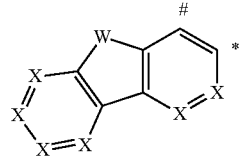
(CyC-17) 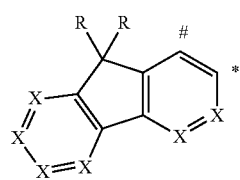
(CyC-18) 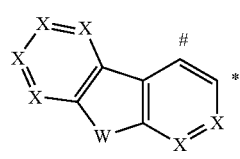
(CyC-19) 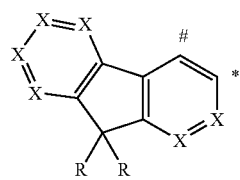
and wherein CyD is selected from the group consisting of structures of formulae (CyD-1) through (CyD-4) and (CyD-7) through (CyD-10), wherein the group CyD is in each case bonded to CyC at the position denoted by # and coordinated to M at the position denoted by *
(CyD-1) 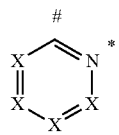
(CyD-2) 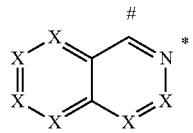
(CyD-3) 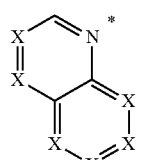
(CyD-4) 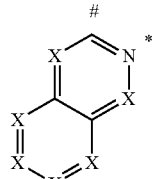
(CyD-5) 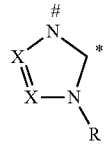
(CyD-6) 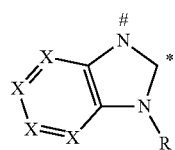
(CyD-7) 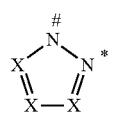
(CyD-8)
(CyD-9) 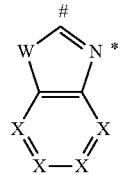

(CyD-10)

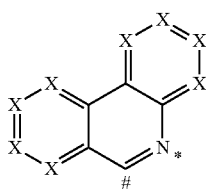

wherein

X is on each occurrence, identically or differently, CR or N;

W is on each occurrence, identically or differently, NR, O or S; and two adjacent groups X in CyC and/or in CyD are each CR and, together with the radicals R which are bonded to these carbon atoms, form a group of formula (3).

3. The compound of claim 1, wherein CyC is selected from the group consisting of structures of formulae (CyC-1a) through (CyC-19a), wherein CyC is in each case bonded to CyD at the position denoted by # and coordinated to M at the position denoted by *:

(CyC-1a)

(CyC-1b)

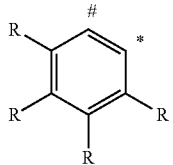

(CyC-1c)

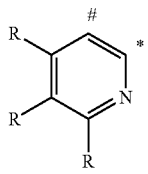

(CyC-1d)

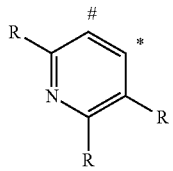

(CyC-2a)

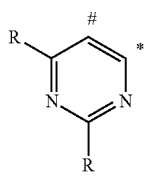

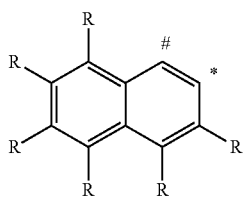

(CyC-2b)

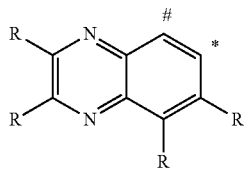

(CyC-3a)

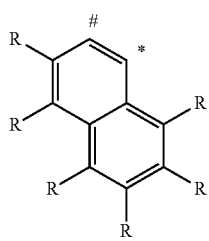

(CyC-3b)

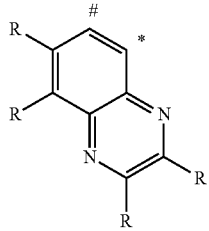

(CyC-4a)

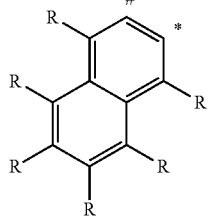

(CyC-4b)

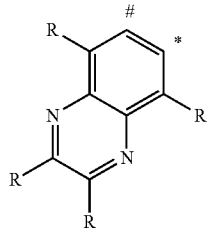

(CyC-5a)

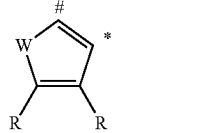

(CyC-6a)

-continued
(CyC-7a)
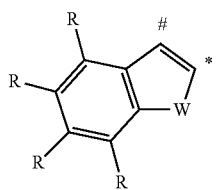
(CyC-8a)
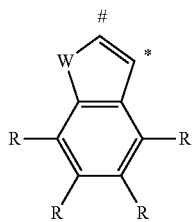
(CyC-9a)
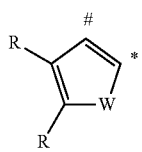
(CyC-10a)
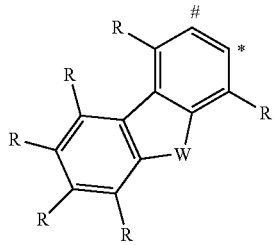
(CyC-11a)
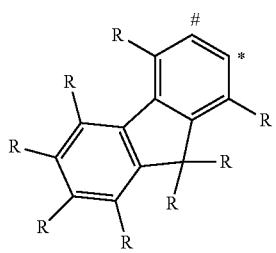
(CyC-12a)
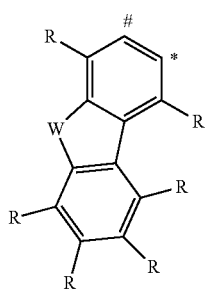
-continued
(CyC-13a)
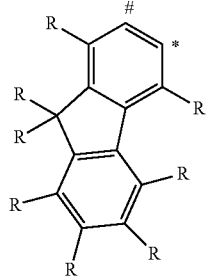
(CyC-14a)
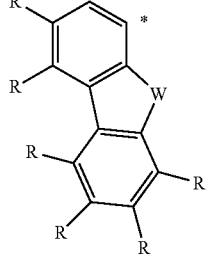
(CyC-15a)
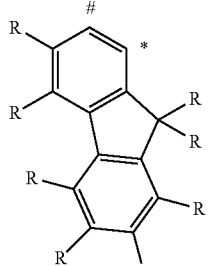
(CyC-16a)
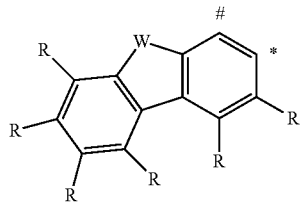
(CyC-17a)
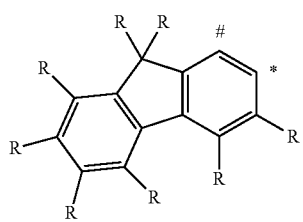
(CyC-18a)
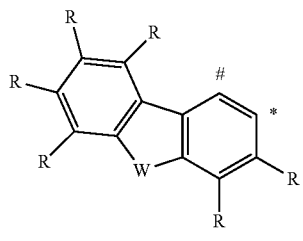

-continued

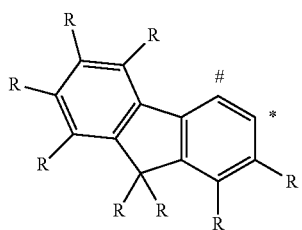
(CyC-19a)

and wherein CyD is selected from the group consisting of structures of formulae (CyD-1a) through (CyD-4a) and (CyD-7a) through (CyD-10a), wherein CyD is in each case bonded to CyC at the position denoted by # and coordinated to M at the position denoted by *:

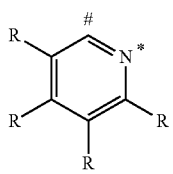
(CyD-1a)

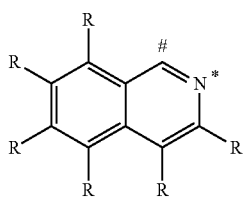
(CyD-2a)

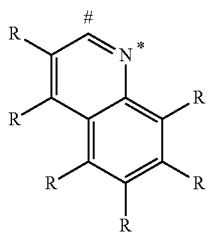
(CyD-3a)

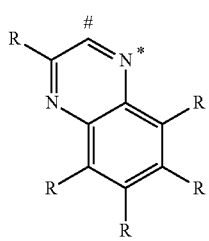
(CyD-3b)

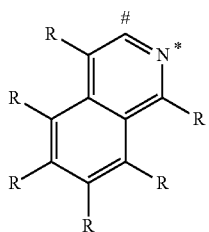
(CyD-4a)

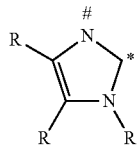
(CyD-5a)

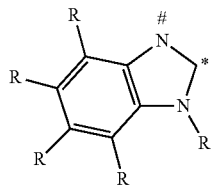
(CyD-6a)

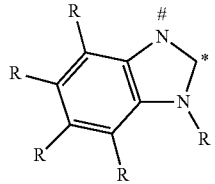
(CyD-7a)

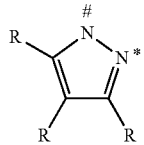
(CyD-8a)

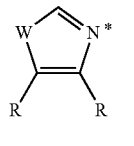
(CyD-9a)

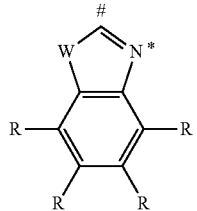
(CyD-10a)

wherein two adjacent radicals R in at least one of the groups CyC and/or CyD, together with the carbon atoms to which they are bonded, form a ring of formula (3).

4. The compound of claim 1, wherein the group of formula (3), when p is 2, is selected from the group consisting of structures of formulae (4-A) and (4-B) and, when p is 3, is selected from the group consisting of structures of formulae (5-A), (5-B), and (5-C):

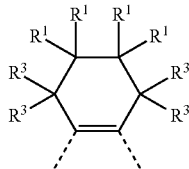

(4-A)

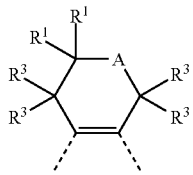

(4-B)

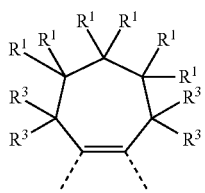

(5-A)

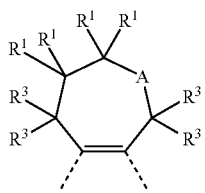

(5-B)

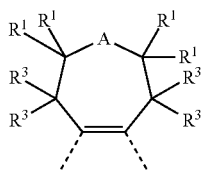

(5-C)

wherein A is O or NR³.

5. The compound of claim 4, wherein R¹ in formulae (3), (4-A), (4-B), (5-A), (5-B), and (5-C) is, identically or differently on each occurrence, H, D, or an alkyl group having 1 to 5 C atoms, wherein one or more H atoms are optionally replaced by F and wherein two or more adjacent radicals R¹ optionally define an aliphatic ring system with one another.

6. The compound of claim 1, wherein the compound is selected from the group consisting of compounds of formulae (6) through (11):

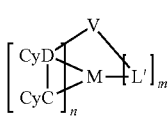

(6)

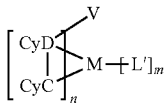

(7)

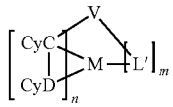

(8)

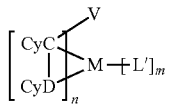

(9)

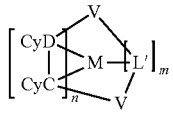

(10)

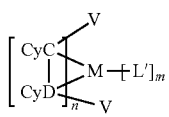

(11)

wherein V is a single bond or a bridging unit containing 1 to 80 atoms from the third, fourth, fifth, and/or sixth main group or a 3- to 6-membered homo- or heterocycle which covalently bonds the sub-ligands L to one another or covalently bonds L to L'.

7. The compound of claim 2, wherein L' is a monoanionic bidentate ligand which is bonded to M via a neutral nitrogen atom and a negatively charged carbon atom or via a neutral carbon atom and a negatively charged carbon atom.

8. The compound of claim 7, wherein L' is a combination of two groups selected from the group consisting of structures of formulae (27) through (50):

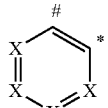

(27)

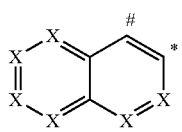

(28)

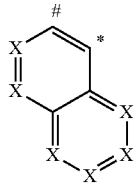

(29)

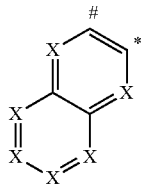

(30)

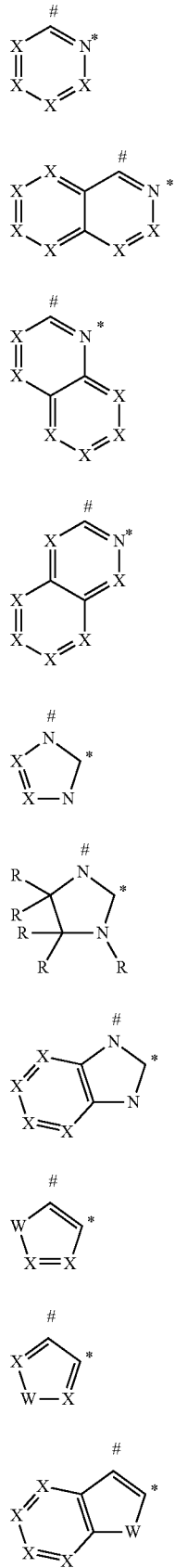
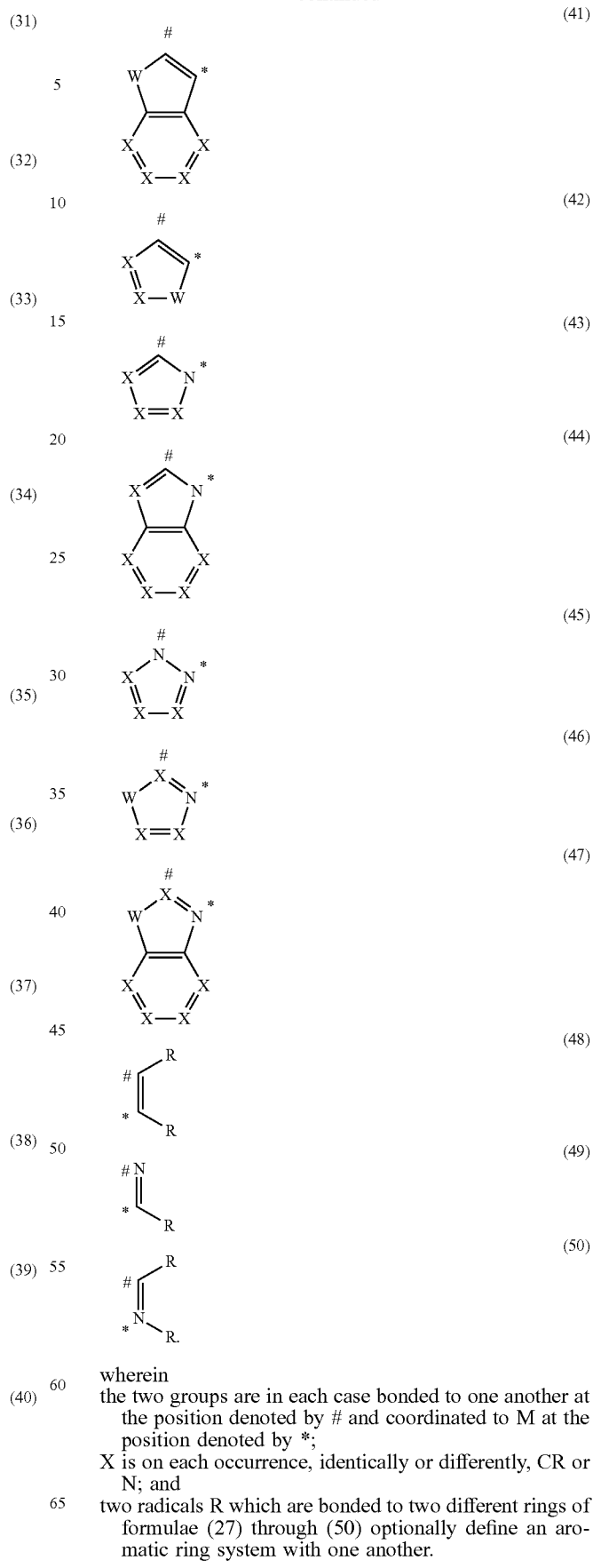
wherein
the two groups are in each case bonded to one another at the position denoted by # and coordinated to M at the position denoted by *;
X is on each occurrence, identically or differently, CR or N; and
two radicals R which are bonded to two different rings of formulae (27) through (50) optionally define an aromatic ring system with one another.

9. A formulation comprising one or more compounds of claim 1 and at least one further compound.

10. The formulation of claim 9, wherein the at least one further compound is a solvent.

11. An electronic device comprising, in at least one layer, at least one compound of claim 1.

12. The electronic device of claim 11, wherein the device is selected from the group consisting of organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electrochemical cells, and organic laser diodes.

13. The electronic device of claim 12, wherein the electronic device is an organic electroluminescent device and the compound of claim 1 is employed as an emitting compound in one or more emitting layers.

14. The electronic device of claim 13, wherein the emitting layer comprises one or more matrix materials selected from the group consisting of ketones, phosphine oxides, sulfoxides, sulfones, triarylamines, carbazoles, indolocarbazoles, indenocarbazoles, azacarbazoles, bipolar matrix materials, silanes, azaboroles, boronic esters, diazasiloles, diazaphospholes, triazines, zinc complexes, dibenzofurans, and bridged carbazoles.

* * * * *